US008001448B2

(12) United States Patent
Toda

(10) Patent No.: US 8,001,448 B2
(45) Date of Patent: Aug. 16, 2011

(54) SEMICONDUCTOR MEMORY DEVICE

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1022 days.

(21) Appl. No.: 11/845,999

(22) Filed: Aug. 28, 2007

(65) Prior Publication Data

US 2008/0082901 A1 Apr. 3, 2008

(30) Foreign Application Priority Data

Aug. 28, 2006 (JP) ................................ 2006-230375

(51) Int. Cl.
*H03M 13/00* (2006.01)

(52) U.S. Cl. ........................ 714/784; 714/785; 714/774

(58) Field of Classification Search .................. 714/784, 714/785, 774
See application file for complete search history.

(56) References Cited

U.S. PATENT DOCUMENTS 3,418,629 A * 12/1968 Chien .......................... 714/782
4,058,851 A * 11/1977 Scheuneman ..................... 714/6
4,099,160 A * 7/1978 Flagg ............................ 714/785
4,142,174 A * 2/1979 Chen et al. .................... 714/784
4,498,175 A * 2/1985 Nagumo et al. ............. 714/756
4,509,172 A * 4/1985 Chen ............................ 714/759
4,567,568 A * 1/1986 Inagawa et al. .............. 708/650
4,567,594 A * 1/1986 Deodhar ....................... 714/769
4,574,361 A * 3/1986 Inagawa et al. .............. 708/492
4,608,692 A * 8/1986 Nagumo et al. ............. 714/756
4,677,622 A * 6/1987 Okamoto et al. ............ 714/756
4,782,490 A * 11/1988 Tenengolts ................... 714/756
4,841,300 A * 6/1989 Yoshida et al. ................ 341/94
4,958,349 A * 9/1990 Tanner et al. ................ 714/759
5,040,179 A * 8/1991 Chen ............................ 714/759
5,155,734 A * 10/1992 Kashida et al. .............. 714/785
5,459,740 A * 10/1995 Glaise .......................... 714/755
5,537,429 A * 7/1996 Inoue ........................... 714/755
5,710,782 A * 1/1998 Weng ........................... 714/785
5,745,508 A 4/1998 Prohofsky
5,754,753 A 5/1998 Smelser
5,761,102 A * 6/1998 Weng ........................... 708/492
5,970,075 A * 10/1999 Wasada ........................ 714/784
5,974,583 A * 10/1999 Joo .............................. 714/784
5,978,956 A * 11/1999 Weng et al. .................. 714/784
6,199,188 B1 * 3/2001 Shen et al. ................... 714/782
6,343,305 B1 * 1/2002 Koç et al. ..................... 708/492
6,343,367 B1 * 1/2002 Shen et al. ................... 714/782
6,360,348 B1 * 3/2002 Yang ............................ 714/784
6,584,594 B1 6/2003 Walters, Jr.
7,076,722 B2 * 7/2006 Shibata ........................ 714/763

(Continued)

OTHER PUBLICATIONS

U.S. Appl. No. 11/674,342, filed Feb. 13, 2007, Haruki Toda, et al.

(Continued)

*Primary Examiner* — Joseph D Torres
(74) *Attorney, Agent, or Firm* — Oblon, Spivak, McClelland, Maier & Neustadt, L.L.P.

(57) ABSTRACT

A semiconductor memory device including an error detecting and correcting system, wherein the error detecting and correcting system includes a 3EC system configured to be able to detect and correct 3-bit errors, and wherein the 3EC system is configured to search errors in such a manner that 3-degree error searching equation is divided into a first part containing only unknown numbers and a second part calculative with syndromes via variable transformation by use of two or more parameters, and previously nominated solution indexes collected in a table and syndrome indexes are compared to each other.

5 Claims, 99 Drawing Sheets

U.S. PATENT DOCUMENTS

| | | | | |
|---|---|---|---|---|
| 7,228,467 | B2 * | 6/2007 | Ball | 714/710 |
| 2003/0101405 | A1 * | 5/2003 | Shibata | 714/763 |
| 2007/0198626 | A1 | 8/2007 | Toda | |
| 2007/0198902 | A1 | 8/2007 | Toda | |
| 2007/0266291 | A1 * | 11/2007 | Toda et al. | 714/746 |

OTHER PUBLICATIONS

U.S. Appl. No. 11/691,636, filed Mar. 27, 2007, Haruki Toda, et al.
U.S. Appl. No. 12/190,191, filed Aug. 12, 2008, Toda.
U.S. Appl. No. 12/555,507, filed Sep. 8, 2009, Toda.

* cited by examiner

FIG. 3A

| number of co."1" | | rn(x)=∑x**m=x**n mod g(x) | | | | | | | | | | | | | | | | | | | | | | | |
|---|---|---|---|---|---|---|---|---|---|---|---|---|---|---|---|---|---|---|---|---|---|---|---|---|---|
| | m= | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
| | | 103 | 105 | 106 | 108 | 113 | 122 | 123 | 116 | 130 | 113 | 114 | 108 | 109 | 110 | 111 | 111 | 130 | 131 | 131 | 115 | 116 | 117 | 102 | 103 |
| 1 | | 24 | 25 | 24 | 24 | 24 | 25 | 24 | 24 | 24 | 25 | 24 | 28 | 27 | 26 | 25 | 24 | 26 | 25 | 24 | 24 | 25 | 24 | 25 | 24 |
| 2 | | 25 | 27 | 26 | 32 | 25 | 27 | 26 | 28 | 25 | 26 | 25 | 29 | 28 | 27 | 26 | 25 | 30 | 29 | 28 | 25 | 26 | 25 | 26 | 25 |
| 3 | | 28 | 30 | 29 | 37 | 28 | 31 | 30 | 32 | 27 | 27 | 26 | 30 | 29 | 28 | 27 | 26 | 31 | 30 | 29 | 27 | 28 | 27 | 27 | 26 |
| 4 | | 29 | 31 | 30 | 38 | 29 | 32 | 31 | 33 | 28 | 33 | 32 | 31 | 30 | 29 | 28 | 27 | 32 | 31 | 30 | 32 | 29 | 28 | 30 | 29 |
| 5 | | 30 | 32 | 31 | 39 | 30 | 35 | 34 | 34 | 29 | 34 | 33 | 33 | 32 | 31 | 30 | 29 | 33 | 32 | 31 | 33 | 30 | 29 | 31 | 30 |
| 6 | | 32 | 39 | 38 | 40 | 31 | 36 | 35 | 35 | 30 | 35 | 34 | 34 | 33 | 32 | 31 | 30 | 36 | 35 | 34 | 34 | 31 | 30 | 32 | 31 |
| 7 | | 40 | 40 | 39 | 43 | 32 | 37 | 36 | 36 | 31 | 36 | 35 | 36 | 35 | 34 | 33 | 32 | 37 | 36 | 35 | 37 | 33 | 32 | 34 | 33 |
| 8 | | 42 | 41 | 40 | 45 | 36 | 38 | 37 | 37 | 33 | 38 | 37 | 38 | 37 | 36 | 35 | 34 | 40 | 39 | 38 | 41 | 36 | 35 | 42 | 41 |
| 9 | | 43 | 44 | 43 | 48 | 37 | 39 | 38 | 38 | 34 | 40 | 39 | 41 | 40 | 39 | 38 | 37 | 43 | 42 | 41 | 44 | 42 | 41 | 44 | 43 |
| 10 | | 44 | 46 | 45 | 50 | 38 | 40 | 39 | 40 | 35 | 42 | 41 | 42 | 41 | 40 | 39 | 38 | 44 | 43 | 42 | 45 | 45 | 44 | 45 | 44 |
| 11 | | 47 | 47 | 46 | 51 | 39 | 43 | 42 | 41 | 36 | 43 | 42 | 47 | 46 | 45 | 44 | 43 | 45 | 44 | 43 | 46 | 47 | 46 | 46 | 45 |
| 12 | | 50 | 49 | 48 | 52 | 40 | 44 | 43 | 43 | 37 | 45 | 44 | 50 | 49 | 48 | 47 | 46 | 46 | 45 | 44 | 49 | 48 | 47 | 49 | 48 |
| 13 | | 54 | 50 | 49 | 53 | 43 | 47 | 46 | 44 | 39 | 46 | 45 | 51 | 50 | 49 | 48 | 47 | 48 | 47 | 46 | 50 | 49 | 48 | 52 | 51 |
| 14 | | 56 | 53 | 52 | 54 | 49 | 48 | 47 | 45 | 45 | 53 | 52 | 52 | 51 | 50 | 49 | 48 | 49 | 48 | 47 | 51 | 51 | 50 | 56 | 55 |
| 15 | | 57 | 54 | 53 | 57 | 51 | 51 | 50 | 46 | 46 | 54 | 53 | 53 | 52 | 51 | 50 | 49 | 50 | 49 | 48 | 52 | 52 | 51 | 58 | 57 |
| 16 | | 58 | 55 | 54 | 58 | 52 | 52 | 51 | 47 | 47 | 55 | 54 | 54 | 53 | 52 | 51 | 50 | 52 | 51 | 50 | 53 | 54 | 53 | 59 | 58 |
| 17 | | 64 | 58 | 57 | 61 | 53 | 53 | 52 | 49 | 48 | 58 | 57 | 57 | 56 | 55 | 54 | 53 | 54 | 53 | 52 | 58 | 56 | 55 | 60 | 59 |
| 18 | | 67 | 63 | 62 | 62 | 54 | 54 | 53 | 51 | 51 | 60 | 59 | 60 | 59 | 58 | 57 | 56 | 55 | 54 | 53 | 59 | 59 | 58 | 66 | 65 |
| 19 | | 70 | 64 | 63 | 65 | 58 | 56 | 55 | 52 | 54 | 62 | 61 | 63 | 62 | 61 | 60 | 59 | 56 | 55 | 54 | 60 | 61 | 60 | 69 | 68 |
| 20 | | 74 | 66 | 65 | 68 | 60 | 58 | 57 | 62 | 56 | 65 | 64 | 64 | 63 | 62 | 61 | 60 | 57 | 56 | 55 | 62 | 62 | 61 | 72 | 71 |
| 21 | | 75 | 67 | 66 | 70 | 61 | 59 | 58 | 64 | 57 | 67 | 66 | 65 | 64 | 63 | 62 | 61 | 59 | 58 | 57 | 63 | 66 | 65 | 76 | 75 |
| 22 | | 76 | 69 | 68 | 71 | 69 | 60 | 59 | 65 | 58 | 70 | 69 | 67 | 66 | 65 | 64 | 63 | 60 | 59 | 58 | 65 | 68 | 67 | 77 | 76 |
| 23 | | 77 | 70 | 69 | 74 | 73 | 64 | 63 | 66 | 61 | 71 | 70 | 68 | 67 | 66 | 65 | 64 | 62 | 61 | 60 | 67 | 69 | 68 | 78 | 77 |
| 24 | | 79 | 73 | 72 | 77 | 74 | 67 | 66 | 67 | 63 | 73 | 72 | 69 | 68 | 67 | 66 | 65 | 63 | 62 | 61 | 68 | 71 | 70 | 79 | 78 |
| 25 | | 80 | 77 | 76 | 78 | 75 | 68 | 67 | 68 | 65 | 75 | 74 | 70 | 69 | 68 | 67 | 66 | 65 | 64 | 63 | 69 | 72 | 71 | 81 | 80 |
| 26 | | 82 | 78 | 77 | 83 | 79 | 70 | 69 | 71 | 66 | 76 | 75 | 71 | 70 | 69 | 68 | 67 | 66 | 65 | 64 | 70 | 74 | 73 | 82 | 81 |
| 27 | | 85 | 80 | 79 | 84 | 80 | 72 | 71 | 73 | 72 | 81 | 80 | 73 | 72 | 71 | 70 | 69 | 67 | 66 | 65 | 71 | 76 | 75 | 84 | 83 |
| 28 | | 87 | 81 | 80 | 86 | 83 | 73 | 72 | 77 | 74 | 82 | 81 | 75 | 74 | 73 | 72 | 71 | 68 | 67 | 66 | 72 | 77 | 76 | 87 | 86 |
| 29 | | 89 | 82 | 81 | 87 | 86 | 75 | 74 | 78 | 75 | 84 | 83 | 76 | 75 | 74 | 73 | 72 | 71 | 70 | 69 | 73 | 80 | 79 | 89 | 88 |
| 30 | | 90 | 84 | 83 | 88 | 91 | 76 | 75 | 79 | 78 | 85 | 84 | 77 | 76 | 75 | 74 | 73 | 72 | 71 | 70 | 76 | 82 | 81 | 91 | 90 |
| 31 | | 92 | 85 | 84 | 90 | 92 | 77 | 76 | 80 | 80 | 86 | 85 | 83 | 82 | 81 | 80 | 79 | 74 | 73 | 72 | 80 | 83 | 82 | 92 | 91 |
| 32 | | 93 | 86 | 85 | 91 | 93 | 78 | 77 | 82 | 81 | 87 | 86 | 84 | 83 | 82 | 81 | 80 | 75 | 74 | 73 | 84 | 86 | 85 | 94 | 93 |
| 33 | | 96 | 87 | 86 | 92 | 96 | 80 | 79 | 90 | 82 | 89 | 88 | 93 | 92 | 91 | 90 | 89 | 76 | 75 | 74 | 86 | 87 | 86 | 95 | 94 |

FIG. 3B

| number of co."1" | | rn(x)=∑x**m=x**n mod g(x) | | | | | | | | | | | | | | | | | | | | | | | |
|---|---|---|---|---|---|---|---|---|---|---|---|---|---|---|---|---|---|---|---|---|---|---|---|---|
| | m= | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
| | | 103 | 105 | 106 | 108 | 113 | 122 | 123 | 116 | 130 | 113 | 114 | 108 | 109 | 110 | 111 | 111 | 130 | 131 | 131 | 115 | 116 | 117 | 102 | 103 |
| 34 | | 97 | 88 | 87 | 98 | 99 | 87 | 86 | 91 | 85 | 91 | 90 | 95 | 94 | 93 | 92 | 91 | 77 | 76 | 75 | 87 | 92 | 91 | 98 | 97 |
| 35 | | 98 | 90 | 89 | 99 | 103 | 89 | 88 | 92 | 87 | 92 | 91 | 98 | 97 | 96 | 95 | 94 | 78 | 77 | 76 | 90 | 93 | 92 | 99 | 98 |
| 36 | | 100 | 91 | 90 | 100 | 104 | 91 | 90 | 94 | 91 | 94 | 93 | 99 | 98 | 97 | 96 | 95 | 80 | 79 | 78 | 91 | 95 | 94 | 100 | 99 |
| 37 | | 101 | 93 | 92 | 101 | 106 | 93 | 92 | 95 | 92 | 97 | 96 | 100 | 99 | 98 | 97 | 96 | 82 | 81 | 80 | 96 | 96 | 95 | 102 | 101 |
| 38 | | 105 | 95 | 94 | 102 | 107 | 95 | 94 | 96 | 94 | 98 | 97 | 102 | 101 | 100 | 99 | 98 | 85 | 84 | 83 | 100 | 97 | 96 | 103 | 102 |
| 39 | | 106 | 98 | 97 | 104 | 109 | 96 | 95 | 97 | 95 | 99 | 98 | 103 | 102 | 101 | 100 | 99 | 87 | 86 | 85 | 101 | 98 | 97 | 107 | 106 |
| 40 | | 111 | 99 | 98 | 105 | 110 | 97 | 96 | 99 | 97 | 101 | 100 | 110 | 109 | 108 | 107 | 106 | 88 | 87 | 86 | 104 | 99 | 98 | 108 | 107 |
| 41 | | 112 | 101 | 100 | 106 | 111 | 100 | 99 | 105 | 100 | 103 | 102 | 111 | 110 | 109 | 108 | 107 | 89 | 88 | 87 | 105 | 101 | 100 | 113 | 112 |
| 42 | | 115 | 104 | 103 | 108 | 114 | 101 | 100 | 107 | 101 | 104 | 103 | 112 | 111 | 110 | 109 | 108 | 92 | 91 | 90 | 107 | 103 | 102 | 114 | 113 |
| 43 | | 119 | 106 | 105 | 110 | 116 | 102 | 101 | 108 | 104 | 105 | 104 | 114 | 113 | 112 | 111 | 110 | 94 | 93 | 92 | 108 | 104 | 103 | 117 | 116 |
| 44 | | 125 | 110 | 109 | 111 | 118 | 103 | 102 | 109 | 105 | 107 | 106 | 115 | 114 | 113 | 112 | 111 | 95 | 94 | 93 | 109 | 105 | 104 | 121 | 120 |
| 45 | | 127 | 112 | 111 | 113 | 119 | 108 | 107 | 110 | 107 | 108 | 107 | 118 | 117 | 116 | 115 | 114 | 96 | 95 | 94 | 110 | 107 | 106 | 127 | 126 |
| 46 | | 128 | 114 | 113 | 115 | 121 | 109 | 108 | 112 | 108 | 112 | 111 | 120 | 119 | 118 | 117 | 116 | 100 | 99 | 98 | 111 | 108 | 107 | 129 | 128 |
| 47 | | 129 | 115 | 114 | 116 | 122 | 110 | 109 | 116 | 109 | 116 | 115 | 121 | 120 | 119 | 118 | 117 | 101 | 100 | 99 | 112 | 109 | 108 | 130 | 129 |
| 48 | | 131 | 118 | 117 | 117 | 123 | 111 | 110 | 117 | 112 | 120 | 119 | 122 | 121 | 120 | 119 | 118 | 107 | 106 | 105 | 113 | 110 | 109 | 131 | 130 |
| 49 | | 137 | 119 | 118 | 119 | 124 | 112 | 111 | 118 | 116 | 121 | 120 | 124 | 123 | 122 | 121 | 120 | 109 | 108 | 107 | 114 | 113 | 112 | 133 | 132 |
| 50 | | 138 | 124 | 123 | 122 | 125 | 113 | 112 | 120 | 117 | 122 | 121 | 125 | 124 | 123 | 122 | 121 | 110 | 109 | 108 | 115 | 114 | 113 | 139 | 138 |
| 51 | | 139 | 125 | 124 | 123 | 127 | 117 | 116 | 121 | 120 | 123 | 122 | 126 | 125 | 124 | 123 | 122 | 111 | 110 | 109 | 117 | 115 | 114 | 140 | 139 |
| 52 | | 150 | 126 | 125 | 124 | 128 | 118 | 117 | 122 | 121 | 124 | 123 | 127 | 126 | 125 | 124 | 123 | 112 | 111 | 110 | 118 | 116 | 115 | 141 | 140 |
| 53 | | 152 | 129 | 128 | 125 | 129 | 119 | 118 | 123 | 122 | 126 | 125 | 135 | 134 | 133 | 132 | 131 | 113 | 112 | 111 | 122 | 117 | 116 | 152 | 151 |
| 54 | | 153 | 130 | 129 | 131 | 130 | 120 | 119 | 124 | 123 | 128 | 127 | 138 | 137 | 136 | 135 | 134 | 116 | 115 | 114 | 124 | 119 | 118 | 154 | 153 |
| 55 | | 154 | 131 | 130 | 134 | 131 | 121 | 120 | 125 | 124 | 130 | 129 | 140 | 139 | 138 | 137 | 136 | 117 | 116 | 115 | 126 | 121 | 120 | 155 | 154 |
| 56 | | 155 | 136 | 135 | 138 | 133 | 122 | 121 | 127 | 125 | 131 | 130 | 141 | 140 | 139 | 138 | 137 | 120 | 119 | 118 | 129 | 123 | 122 | 156 | 155 |
| 57 | | 165 | 139 | 138 | 139 | 139 | 123 | 122 | 130 | 126 | 133 | 132 | 142 | 141 | 140 | 139 | 138 | 121 | 120 | 119 | 130 | 127 | 126 | 157 | 156 |
| 58 | | 166 | 149 | 148 | 147 | 146 | 124 | 123 | 131 | 127 | 137 | 136 | 143 | 142 | 141 | 140 | 139 | 122 | 121 | 120 | 131 | 130 | 129 | 167 | 166 |
| 59 | | 167 | 150 | 149 | 148 | 147 | 125 | 124 | 135 | 128 | 139 | 138 | 145 | 144 | 143 | 142 | 141 | 125 | 124 | 123 | 132 | 132 | 131 | 168 | 167 |
| 60 | | 168 | 151 | 150 | 149 | 148 | 126 | 125 | 138 | 130 | 141 | 140 | 149 | 148 | 147 | 146 | 145 | 127 | 126 | 125 | 133 | 135 | 134 | 169 | 168 |
| 61 | | 169 | 155 | 154 | 150 | 149 | 130 | 129 | 139 | 131 | 142 | 141 | 151 | 150 | 149 | 148 | 147 | 128 | 127 | 126 | 136 | 139 | 138 | 170 | 169 |
| 62 | | 171 | 164 | 163 | 152 | 150 | 131 | 130 | 143 | 134 | 143 | 142 | 152 | 151 | 150 | 149 | 148 | 129 | 128 | 127 | 138 | 140 | 139 | 171 | 170 |
| 63 | | 174 | 169 | 168 | 154 | 151 | 132 | 131 | 144 | 139 | 144 | 143 | 155 | 154 | 153 | 152 | 151 | 130 | 129 | 128 | 139 | 142 | 141 | 173 | 172 |
| 64 | | 175 | 170 | 169 | 155 | 152 | 137 | 136 | 145 | 142 | 145 | 144 | 157 | 156 | 155 | 154 | 153 | 131 | 130 | 129 | 141 | 143 | 142 | 176 | 175 |
| 65 | | 179 | 171 | 170 | 162 | 155 | 139 | 138 | 146 | 143 | 147 | 146 | 161 | 160 | 159 | 158 | 157 | 133 | 132 | 131 | 143 | 152 | 151 | 177 | 176 |
| 66 | | 182 | 173 | 172 | 165 | 161 | 145 | 144 | 147 | 144 | 151 | 150 | 167 | 166 | 165 | 164 | 163 | 135 | 134 | 133 | 144 | 155 | 154 | 181 | 180 |

FIG. 3C

| number of co."1" | | rn(x)=∑x**m=x**n mod g(x) | | | | | | | | | | | | | | | | | | | | | | | |
|---|---|---|---|---|---|---|---|---|---|---|---|---|---|---|---|---|---|---|---|---|---|---|---|---|
| | m= | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
| | | 103 | 105 | 106 | 108 | 113 | 122 | 123 | 116 | 130 | 113 | 114 | 108 | 109 | 110 | 111 | 111 | 130 | 131 | 131 | 115 | 116 | 117 | 102 | 103 |
| 67 | | 183 | 175 | 174 | 166 | 164 | 146 | 145 | 149 | 145 | 152 | 151 | 168 | 167 | 166 | 165 | 164 | 136 | 135 | 134 | 151 | 158 | 157 | 184 | 183 |
| 68 | | 184 | 178 | 177 | 173 | 166 | 147 | 146 | 151 | 146 | 153 | 152 | 170 | 169 | 168 | 167 | 166 | 139 | 138 | 137 | 154 | 159 | 158 | 185 | 184 |
| 69 | | 189 | 179 | 178 | 174 | 167 | 148 | 147 | 152 | 148 | 155 | 154 | 171 | 170 | 169 | 168 | 167 | 140 | 139 | 138 | 155 | 167 | 166 | 186 | 185 |
| 70 | | 191 | 181 | 180 | 175 | 168 | 149 | 148 | 154 | 151 | 156 | 155 | 172 | 171 | 170 | 169 | 168 | 144 | 143 | 142 | 159 | 168 | 167 | 191 | 190 |
| 71 | | 192 | 184 | 183 | 176 | 169 | 151 | 150 | 155 | 152 | 159 | 158 | 174 | 173 | 172 | 171 | 170 | 146 | 145 | 144 | 160 | 172 | 171 | 193 | 192 |
| 72 | | 193 | 188 | 187 | 177 | 171 | 152 | 151 | 158 | 155 | 163 | 162 | 177 | 176 | 175 | 174 | 173 | 147 | 146 | 145 | 166 | 175 | 174 | 194 | 193 |
| 73 | | 196 | 189 | 188 | 183 | 172 | 153 | 152 | 161 | 157 | 167 | 166 | 178 | 177 | 176 | 175 | 174 | 153 | 152 | 151 | 167 | 176 | 175 | 195 | 194 |
| 74 | | 197 | 190 | 189 | 184 | 173 | 155 | 154 | 165 | 160 | 168 | 167 | 181 | 180 | 179 | 178 | 177 | 154 | 153 | 152 | 170 | 177 | 176 | 198 | 197 |
| 75 | | 198 | 193 | 192 | 186 | 176 | 160 | 159 | 166 | 164 | 171 | 170 | 182 | 181 | 180 | 179 | 178 | 155 | 154 | 153 | 172 | 178 | 177 | 199 | 198 |
| 76 | | 199 | 195 | 194 | 187 | 179 | 163 | 162 | 169 | 166 | 172 | 171 | 184 | 183 | 182 | 181 | 180 | 156 | 155 | 154 | 173 | 179 | 178 | 200 | 199 |
| 77 | | 201 | 199 | 198 | 188 | 184 | 169 | 168 | 170 | 167 | 174 | 173 | 185 | 184 | 183 | 182 | 181 | 162 | 161 | 160 | 175 | 181 | 180 | 201 | 200 |
| 78 | | 203 | 200 | 199 | 189 | 185 | 170 | 169 | 171 | 170 | 177 | 176 | 186 | 185 | 184 | 183 | 182 | 163 | 162 | 161 | 177 | 183 | 182 | 203 | 202 |
| 79 | | 206 | 201 | 200 | 192 | 186 | 172 | 171 | 172 | 173 | 179 | 178 | 187 | 186 | 185 | 184 | 183 | 168 | 167 | 166 | 178 | 184 | 183 | 205 | 204 |
| 80 | | 207 | 202 | 201 | 196 | 187 | 174 | 173 | 174 | 176 | 180 | 179 | 188 | 187 | 186 | 185 | 184 | 171 | 170 | 169 | 179 | 185 | 184 | 208 | 207 |
| 81 | | 209 | 203 | 202 | 200 | 188 | 178 | 177 | 175 | 178 | 181 | 180 | 189 | 188 | 187 | 186 | 185 | 172 | 171 | 170 | 182 | 187 | 186 | 209 | 208 |
| 82 | | 210 | 205 | 204 | 205 | 189 | 179 | 178 | 176 | 181 | 183 | 182 | 192 | 191 | 190 | 189 | 188 | 173 | 172 | 171 | 183 | 188 | 187 | 211 | 210 |
| 83 | | 211 | 207 | 206 | 207 | 192 | 182 | 181 | 177 | 182 | 185 | 184 | 197 | 196 | 195 | 194 | 193 | 174 | 173 | 172 | 186 | 191 | 190 | 212 | 211 |
| 84 | | 213 | 208 | 207 | 211 | 193 | 185 | 184 | 179 | 183 | 187 | 186 | 199 | 198 | 197 | 196 | 195 | 175 | 174 | 173 | 188 | 194 | 193 | 213 | 212 |
| 85 | | 214 | 211 | 210 | 215 | 195 | 186 | 185 | 180 | 185 | 188 | 187 | 200 | 199 | 198 | 197 | 196 | 176 | 175 | 174 | 189 | 196 | 195 | 215 | 214 |
| 86 | | 215 | 212 | 211 | 216 | 196 | 187 | 186 | 182 | 186 | 189 | 188 | 201 | 200 | 199 | 198 | 197 | 177 | 176 | 175 | 190 | 197 | 196 | 216 | 215 |
| 87 | | 217 | 215 | 214 | 217 | 197 | 188 | 187 | 185 | 188 | 190 | 189 | 205 | 204 | 203 | 202 | 201 | 180 | 179 | 178 | 193 | 198 | 197 | 217 | 216 |
| 88 | | 218 | 216 | 215 | 218 | 198 | 189 | 188 | 186 | 189 | 193 | 192 | 207 | 206 | 205 | 204 | 203 | 181 | 180 | 179 | 194 | 199 | 198 | 219 | 218 |
| 89 | | 222 | 218 | 217 | 219 | 201 | 193 | 192 | 187 | 191 | 195 | 194 | 208 | 207 | 206 | 205 | 204 | 187 | 186 | 185 | 195 | 202 | 201 | 220 | 219 |
| 90 | | 224 | 221 | 220 | 220 | 203 | 194 | 193 | 189 | 192 | 198 | 197 | 209 | 208 | 207 | 206 | 205 | 189 | 188 | 187 | 202 | 207 | 206 | 224 | 223 |
| 91 | | 225 | 222 | 221 | 221 | 204 | 195 | 194 | 200 | 193 | 200 | 199 | 210 | 209 | 208 | 207 | 206 | 191 | 190 | 189 | 203 | 208 | 207 | 226 | 225 |
| 92 | | 228 | 223 | 222 | 222 | 207 | 198 | 197 | 201 | 196 | 202 | 201 | 211 | 210 | 209 | 208 | 207 | 193 | 192 | 191 | 204 | 209 | 208 | 227 | 226 |
| 93 | | 229 | 225 | 224 | 223 | 209 | 199 | 198 | 203 | 197 | 205 | 204 | 215 | 214 | 213 | 212 | 211 | 194 | 193 | 192 | 207 | 210 | 209 | 230 | 229 |
| 94 | | 230 | 227 | 226 | 224 | 211 | 200 | 199 | 205 | 198 | 207 | 206 | 216 | 215 | 214 | 213 | 212 | 195 | 194 | 193 | 209 | 212 | 211 | 231 | 230 |
| 95 | | 233 | 230 | 229 | 229 | 213 | 201 | 200 | 212 | 200 | 208 | 207 | 222 | 221 | 220 | 219 | 218 | 197 | 196 | 195 | 212 | 214 | 213 | 232 | 231 |
| 96 | | 241 | 232 | 231 | 231 | 216 | 202 | 201 | 213 | 201 | 210 | 209 | 224 | 223 | 222 | 221 | 220 | 198 | 197 | 196 | 213 | 216 | 215 | 235 | 234 |
| 97 | | 243 | 233 | 232 | 233 | 219 | 207 | 206 | 214 | 202 | 215 | 214 | 227 | 226 | 225 | 224 | 223 | 199 | 198 | 197 | 214 | 218 | 217 | 243 | 242 |
| 98 | | 244 | 240 | 239 | 238 | 220 | 208 | 207 | 221 | 203 | 216 | 215 | 230 | 229 | 228 | 227 | 226 | 200 | 199 | 198 | 216 | 220 | 219 | 245 | 244 |
| 99 | | 246 | 241 | 240 | 239 | 221 | 209 | 208 | 222 | 204 | 218 | 217 | 232 | 231 | 230 | 229 | 228 | 201 | 200 | 199 | 217 | 221 | 220 | 246 | 245 |

FIG. 3D

| number of co."1" | | rn(x)=Σx**m=x**n mod g(x) | | | | | | | | | | | | | | | | | | | | | | | |
|---|---|---|---|---|---|---|---|---|---|---|---|---|---|---|---|---|---|---|---|---|---|---|---|---|---|
| | m= | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
| | | 103 | 105 | 106 | 108 | 113 | 122 | 123 | 116 | 130 | 113 | 114 | 108 | 109 | 110 | 111 | 111 | 130 | 131 | 131 | 115 | 116 | 117 | 102 | 103 |
| 100 | | 247 | 242 | 241 | 240 | 223 | 211 | 210 | 223 | 206 | 219 | 218 | 235 | 234 | 233 | 232 | 231 | 202 | 201 | 200 | 218 | 222 | 221 | 248 | 247 |
| 101 | | 248 | 244 | 243 | 241 | 224 | 212 | 211 | 224 | 207 | 220 | 219 | 237 | 236 | 235 | 234 | 233 | 204 | 203 | 202 | 221 | 224 | 223 | 249 | 248 |
| 102 | | 253 | 245 | 244 | 242 | 225 | 213 | 212 | 225 | 209 | 227 | 226 | 240 | 239 | 238 | 237 | 236 | 205 | 204 | 203 | 222 | 227 | 226 | 250 | 249 |
| 103 | | 254 | 248 | 247 | 244 | 229 | 214 | 213 | 227 | 210 | 229 | 228 | 241 | 240 | 239 | 238 | 237 | 207 | 206 | 205 | 226 | 228 | 227 | | 254 |
| 104 | | | 252 | 251 | 247 | 232 | 217 | 216 | 231 | 212 | 230 | 229 | 243 | 242 | 241 | 240 | 239 | 209 | 208 | 207 | 228 | 229 | 228 | | |
| 105 | | | 254 | 253 | 248 | 233 | 219 | 218 | 233 | 214 | 231 | 230 | 244 | 243 | 242 | 241 | 240 | 213 | 212 | 211 | 232 | 230 | 229 | | |
| 106 | | | | 254 | 250 | 237 | 220 | 219 | 234 | 215 | 234 | 233 | 248 | 247 | 246 | 245 | 244 | 214 | 213 | 212 | 235 | 231 | 230 | | |
| 107 | | | | | 252 | 238 | 223 | 222 | 235 | 217 | 235 | 234 | 250 | 249 | 248 | 247 | 246 | 215 | 214 | 213 | 236 | 233 | 232 | | |
| 108 | | | | | 254 | 239 | 225 | 224 | 236 | 218 | 237 | 236 | 254 | 253 | 252 | 251 | 250 | 218 | 217 | 216 | 238 | 234 | 233 | | |
| 109 | | | | | | 240 | 229 | 228 | 237 | 220 | 239 | 238 | | 254 | 253 | 252 | 251 | 219 | 218 | 217 | 242 | 235 | 234 | | |
| 110 | | | | | | 244 | 230 | 229 | 239 | 221 | 242 | 241 | | | 254 | 253 | 252 | 224 | 223 | 222 | 245 | 237 | 236 | | |
| 111 | | | | | | 248 | 231 | 230 | 241 | 223 | 248 | 247 | | | | 254 | 253 | 227 | 226 | 225 | 249 | 243 | 242 | | |
| 112 | | | | | | 249 | 232 | 231 | 242 | 225 | 249 | 248 | | | | | | 228 | 227 | 226 | 250 | 246 | 245 | | |
| 113 | | | | | | 251 | 233 | 232 | 243 | 226 | 252 | 251 | | | | | | 229 | 228 | 227 | 252 | 247 | 246 | | |
| 114 | | | | | | | 236 | 235 | 246 | 228 | | 254 | | | | | | 232 | 231 | 230 | 253 | 249 | 248 | | |
| 115 | | | | | | | 237 | 236 | 247 | 229 | | | | | | | | 233 | 232 | 231 | 254 | 251 | 250 | | |
| 116 | | | | | | | 238 | 237 | 251 | 232 | | | | | | | | 235 | 234 | 233 | | 252 | 251 | | |
| 117 | | | | | | | 239 | 238 | | 234 | | | | | | | | 236 | 235 | 234 | | | 254 | | |
| 118 | | | | | | | 241 | 240 | | 235 | | | | | | | | 238 | 237 | 236 | | | | | |
| 119 | | | | | | | 244 | 243 | | 236 | | | | | | | | 239 | 238 | 237 | | | | | |
| 120 | | | | | | | 246 | 245 | | 238 | | | | | | | | 241 | 240 | 239 | | | | | |
| 121 | | | | | | | 250 | 249 | | 240 | | | | | | | | 244 | 243 | 242 | | | | | |
| 122 | | | | | | | 253 | 252 | | 242 | | | | | | | | 245 | 244 | 243 | | | | | |
| 123 | | | | | | | | 254 | | 243 | | | | | | | | 246 | 245 | 244 | | | | | |
| 124 | | | | | | | | | | 244 | | | | | | | | 247 | 246 | 245 | | | | | |
| 125 | | | | | | | | | | 245 | | | | | | | | 248 | 247 | 246 | | | | | |
| 126 | | | | | | | | | | 247 | | | | | | | | 249 | 248 | 247 | | | | | |
| 127 | | | | | | | | | | 248 | | | | | | | | 250 | 249 | 248 | | | | | |
| 128 | | | | | | | | | | 250 | | | | | | | | 251 | 250 | 249 | | | | | |
| 129 | | | | | | | | | | 253 | | | | | | | | 252 | 251 | 250 | | | | | |
| 130 | | | | | | | | | | 254 | | | | | | | | 253 | 252 | 251 | | | | | |
| 131 | | | | | | | | | | | | | | | | | | | 254 | 253 | | | | | |
| 132 | | | | | | | | | | | | | | | | | | | | | | | | | |

FIG. 8A

| number of co."1" | pn(x)=x**n mod m1(x) | | | | | | | | |
|---|---|---|---|---|---|---|---|---|---|
| | m= | 7 | 6 | 5 | 4 | 3 | 2 | 1 | 0 |
| | | 128 | 128 | 128 | 128 | 128 | 128 | 128 | 128 |
| 1 | | 7 | 6 | 5 | 4 | 3 | 2 | 1 | 0 |
| 2 | | 11 | 10 | 9 | 8 | 8 | 8 | 9 | 8 |
| 3 | | 12 | 11 | 10 | 9 | 9 | 10 | 13 | 12 |
| 4 | | 13 | 12 | 11 | 10 | 11 | 12 | 14 | 13 |
| 5 | | 17 | 16 | 15 | 14 | 12 | 13 | 15 | 14 |
| 6 | | 20 | 19 | 18 | 17 | 16 | 15 | 19 | 18 |
| 7 | | 22 | 21 | 20 | 19 | 17 | 16 | 22 | 21 |
| 8 | | 23 | 22 | 21 | 20 | 18 | 18 | 24 | 23 |
| 9 | | 24 | 23 | 22 | 21 | 19 | 20 | 25 | 24 |
| 10 | | 31 | 30 | 29 | 28 | 22 | 21 | 26 | 25 |
| 11 | | 32 | 31 | 30 | 29 | 23 | 24 | 33 | 32 |
| 12 | | 35 | 34 | 33 | 32 | 24 | 26 | 34 | 33 |
| 13 | | 38 | 37 | 36 | 35 | 27 | 27 | 37 | 36 |
| 14 | | 41 | 40 | 39 | 38 | 28 | 32 | 40 | 39 |
| 15 | | 42 | 41 | 40 | 39 | 32 | 33 | 43 | 42 |
| 16 | | 44 | 43 | 42 | 41 | 34 | 34 | 44 | 43 |
| 17 | | 45 | 44 | 43 | 42 | 35 | 35 | 46 | 45 |
| 18 | | 46 | 45 | 44 | 43 | 37 | 36 | 47 | 46 |
| 19 | | 49 | 48 | 47 | 46 | 40 | 38 | 48 | 47 |
| 20 | | 55 | 54 | 53 | 52 | 44 | 39 | 51 | 50 |
| 21 | | 57 | 56 | 55 | 54 | 46 | 41 | 57 | 56 |
| 22 | | 59 | 58 | 57 | 56 | 49 | 42 | 59 | 58 |
| 23 | | 60 | 59 | 58 | 57 | 51 | 43 | 61 | 60 |
| 24 | | 62 | 61 | 60 | 59 | 53 | 44 | 62 | 61 |
| 25 | | 63 | 62 | 61 | 60 | 56 | 46 | 64 | 63 |
| 26 | | 65 | 64 | 63 | 62 | 57 | 48 | 65 | 64 |
| 27 | | 67 | 66 | 65 | 64 | 58 | 49 | 67 | 66 |
| 28 | | 68 | 67 | 66 | 65 | 60 | 50 | 69 | 68 |
| 29 | | 71 | 70 | 69 | 68 | 61 | 52 | 70 | 69 |
| 30 | | 73 | 72 | 71 | 70 | 62 | 56 | 73 | 72 |
| 31 | | 74 | 73 | 72 | 71 | 64 | 61 | 75 | 74 |
| 32 | | 79 | 78 | 77 | 76 | 65 | 62 | 76 | 75 |
| 33 | | 80 | 79 | 78 | 77 | 68 | 64 | 81 | 80 |
| 34 | | 81 | 80 | 79 | 78 | 69 | 65 | 82 | 81 |
| 35 | | 82 | 81 | 80 | 79 | 70 | 69 | 83 | 82 |
| 36 | | 83 | 82 | 81 | 80 | 71 | 70 | 84 | 83 |
| 37 | | 85 | 84 | 83 | 82 | 73 | 71 | 85 | 84 |
| 38 | | 86 | 85 | 84 | 83 | 74 | 72 | 87 | 86 |
| 39 | | 88 | 87 | 86 | 85 | 75 | 75 | 88 | 87 |
| 40 | | 89 | 88 | 87 | 86 | 76 | 76 | 90 | 89 |
| 41 | | 90 | 89 | 88 | 87 | 77 | 77 | 91 | 90 |
| 42 | | 91 | 90 | 89 | 88 | 78 | 80 | 92 | 91 |
| 43 | | 93 | 92 | 91 | 90 | 80 | 81 | 93 | 92 |

FIG. 8B

| number of co."1" | pn(x)=x**n mod m1(x) | | | | | | | | |
|---|---|---|---|---|---|---|---|---|---|
| | m= | 7 | 6 | 5 | 4 | 3 | 2 | 1 | 0 |
| | | 128 | 128 | 128 | 128 | 128 | 128 | 128 | 128 |
| 44 | | 95 | 94 | 93 | 92 | 83 | 85 | 95 | 94 |
| 45 | | 96 | 95 | 94 | 93 | 84 | 87 | 97 | 96 |
| 46 | | 97 | 96 | 95 | 94 | 87 | 88 | 98 | 97 |
| 47 | | 99 | 98 | 97 | 96 | 88 | 90 | 99 | 98 |
| 48 | | 103 | 102 | 101 | 100 | 90 | 93 | 101 | 100 |
| 49 | | 108 | 107 | 106 | 105 | 92 | 97 | 105 | 104 |
| 50 | | 109 | 108 | 107 | 106 | 96 | 99 | 110 | 109 |
| 51 | | 111 | 110 | 109 | 108 | 97 | 102 | 111 | 110 |
| 52 | | 112 | 111 | 110 | 109 | 103 | 104 | 113 | 112 |
| 53 | | 116 | 115 | 114 | 113 | 104 | 106 | 114 | 113 |
| 54 | | 117 | 116 | 115 | 114 | 105 | 109 | 118 | 117 |
| 55 | | 118 | 117 | 116 | 115 | 107 | 110 | 119 | 118 |
| 56 | | 119 | 118 | 117 | 116 | 109 | 111 | 120 | 119 |
| 57 | | 122 | 121 | 120 | 119 | 111 | 113 | 121 | 120 |
| 58 | | 123 | 122 | 121 | 120 | 113 | 114 | 124 | 123 |
| 59 | | 124 | 123 | 122 | 121 | 114 | 115 | 125 | 124 |
| 60 | | 127 | 126 | 125 | 124 | 115 | 117 | 126 | 125 |
| 61 | | 128 | 127 | 126 | 125 | 116 | 118 | 129 | 128 |
| 62 | | 132 | 131 | 130 | 129 | 117 | 121 | 130 | 129 |
| 63 | | 134 | 133 | 132 | 131 | 120 | 122 | 134 | 133 |
| 64 | | 135 | 134 | 133 | 132 | 122 | 123 | 136 | 135 |
| 65 | | 137 | 136 | 135 | 134 | 127 | 124 | 137 | 136 |
| 66 | | 140 | 139 | 138 | 137 | 130 | 126 | 139 | 138 |
| 67 | | 144 | 143 | 142 | 141 | 131 | 127 | 142 | 141 |
| 68 | | 146 | 145 | 144 | 143 | 132 | 128 | 146 | 145 |
| 69 | | 149 | 148 | 147 | 146 | 133 | 129 | 148 | 147 |
| 70 | | 151 | 150 | 149 | 148 | 134 | 130 | 151 | 150 |
| 71 | | 153 | 152 | 151 | 150 | 135 | 131 | 153 | 152 |
| 72 | | 156 | 155 | 154 | 153 | 136 | 133 | 155 | 154 |
| 73 | | 157 | 156 | 155 | 154 | 137 | 136 | 158 | 157 |
| 74 | | 158 | 157 | 156 | 155 | 142 | 137 | 159 | 158 |
| 75 | | 160 | 159 | 158 | 157 | 144 | 140 | 160 | 159 |
| 76 | | 161 | 160 | 159 | 158 | 145 | 141 | 162 | 161 |
| 77 | | 162 | 161 | 160 | 159 | 146 | 143 | 163 | 162 |
| 78 | | 164 | 163 | 162 | 161 | 147 | 145 | 164 | 163 |
| 79 | | 165 | 164 | 163 | 162 | 151 | 149 | 166 | 165 |
| 80 | | 168 | 167 | 166 | 165 | 152 | 150 | 167 | 166 |
| 81 | | 169 | 168 | 167 | 166 | 154 | 156 | 170 | 169 |
| 82 | | 170 | 169 | 168 | 167 | 162 | 157 | 171 | 170 |
| 83 | | 171 | 170 | 169 | 168 | 166 | 158 | 172 | 171 |
| 84 | | 173 | 172 | 171 | 170 | 167 | 160 | 173 | 172 |
| 85 | | 174 | 173 | 172 | 171 | 168 | 162 | 175 | 174 |
| 86 | | 175 | 174 | 173 | 172 | 172 | 164 | 176 | 175 |

FIG. 8C

| number of co."1" | pn(x)=x**n mod m1(x) | | | | | | | | |
|---|---|---|---|---|---|---|---|---|---|
| | m= | 7 | 6 | 5 | 4 | 3 | 2 | 1 | 0 |
| | | 128 | 128 | 128 | 128 | 128 | 128 | 128 | 128 |
| 87 | | 176 | 175 | 174 | 173 | 175 | 166 | 177 | 176 |
| 88 | | 177 | 176 | 175 | 174 | 177 | 167 | 178 | 177 |
| 89 | | 178 | 177 | 176 | 175 | 178 | 168 | 179 | 178 |
| 90 | | 180 | 179 | 178 | 177 | 179 | 169 | 180 | 179 |
| 91 | | 183 | 182 | 181 | 180 | 186 | 170 | 182 | 181 |
| 92 | | 184 | 183 | 182 | 181 | 187 | 173 | 185 | 184 |
| 93 | | 187 | 186 | 185 | 184 | 190 | 175 | 186 | 185 |
| 94 | | 188 | 187 | 186 | 185 | 193 | 180 | 189 | 188 |
| 95 | | 190 | 189 | 188 | 187 | 196 | 183 | 190 | 189 |
| 96 | | 192 | 191 | 190 | 189 | 197 | 184 | 192 | 191 |
| 97 | | 196 | 195 | 194 | 193 | 199 | 185 | 194 | 193 |
| 98 | | 197 | 196 | 195 | 194 | 200 | 186 | 198 | 197 |
| 99 | | 203 | 202 | 201 | 200 | 201 | 187 | 199 | 198 |
| 100 | | 204 | 203 | 202 | 201 | 204 | 188 | 205 | 204 |
| 101 | | 205 | 204 | 203 | 202 | 210 | 189 | 206 | 205 |
| 102 | | 207 | 206 | 205 | 204 | 212 | 190 | 207 | 206 |
| 103 | | 209 | 208 | 207 | 206 | 214 | 195 | 209 | 208 |
| 104 | | 211 | 210 | 209 | 208 | 215 | 197 | 211 | 210 |
| 105 | | 213 | 212 | 211 | 210 | 217 | 198 | 213 | 212 |
| 106 | | 214 | 213 | 212 | 211 | 218 | 199 | 215 | 214 |
| 107 | | 215 | 214 | 213 | 212 | 220 | 200 | 216 | 215 |
| 108 | | 216 | 215 | 214 | 213 | 222 | 204 | 217 | 216 |
| 109 | | 217 | 216 | 215 | 214 | 223 | 205 | 218 | 217 |
| 110 | | 220 | 219 | 218 | 217 | 226 | 207 | 219 | 218 |
| 111 | | 222 | 221 | 220 | 219 | 228 | 215 | 222 | 221 |
| 112 | | 227 | 226 | 225 | 224 | 229 | 219 | 224 | 223 |
| 113 | | 230 | 229 | 228 | 227 | 234 | 220 | 229 | 228 |
| 114 | | 231 | 230 | 229 | 228 | 235 | 221 | 232 | 231 |
| 115 | | 232 | 231 | 230 | 229 | 236 | 225 | 233 | 232 |
| 116 | | 233 | 232 | 231 | 230 | 237 | 228 | 234 | 233 |
| 117 | | 234 | 233 | 232 | 231 | 238 | 230 | 235 | 234 |
| 118 | | 235 | 234 | 233 | 232 | 240 | 231 | 236 | 235 |
| 119 | | 236 | 235 | 234 | 233 | 241 | 232 | 237 | 236 |
| 120 | | 237 | 236 | 235 | 234 | 243 | 239 | 238 | 237 |
| 121 | | 242 | 241 | 240 | 239 | 244 | 240 | 239 | 238 |
| 122 | | 244 | 243 | 242 | 241 | 245 | 243 | 244 | 243 |
| 123 | | 245 | 244 | 243 | 242 | 246 | 246 | 246 | 245 |
| 124 | | 246 | 245 | 244 | 243 | 248 | 249 | 247 | 246 |
| 125 | | 247 | 246 | 245 | 244 | 250 | 250 | 248 | 247 |
| 126 | | 251 | 250 | 249 | 248 | 251 | 252 | 249 | 248 |
| 127 | | 252 | 251 | 250 | 249 | 252 | 253 | 253 | 252 |
| 128 | | 254 | 253 | 252 | 251 | 254 | 254 | 254 | 253 |
| 129 | | | | | | | | | |

FIG. 11A

| number of co."1" | p3n(x)=x**3n mod m1(x) | | | | | | | | |
|---|---|---|---|---|---|---|---|---|---|
| | m= | 7 | 6 | 5 | 4 | 3 | 2 | 1 | 0 |
| | | 120 | 120 | 144 | 120 | 120 | 144 | 120 | 144 |
| 1 | | 4 | 2 | 3 | 3 | 1 | 4 | 3 | 0 |
| 2 | | 8 | 4 | 5 | 7 | 3 | 5 | 5 | 4 |
| 3 | | 14 | 7 | 6 | 13 | 4 | 6 | 8 | 6 |
| 4 | | 15 | 10 | 7 | 14 | 6 | 7 | 11 | 7 |
| 5 | | 19 | 15 | 10 | 18 | 8 | 8 | 16 | 8 |
| 6 | | 20 | 16 | 11 | 19 | 9 | 9 | 17 | 11 |
| 7 | | 21 | 18 | 12 | 20 | 17 | 11 | 19 | 12 |
| 8 | | 27 | 22 | 13 | 26 | 19 | 12 | 23 | 13 |
| 9 | | 30 | 24 | 14 | 29 | 20 | 13 | 25 | 14 |
| 10 | | 31 | 26 | 19 | 30 | 23 | 14 | 27 | 15 |
| 11 | | 32 | 27 | 20 | 31 | 25 | 16 | 28 | 20 |
| 12 | | 33 | 28 | 21 | 32 | 26 | 23 | 29 | 21 |
| 13 | | 36 | 29 | 22 | 35 | 28 | 24 | 30 | 22 |
| 14 | | 37 | 30 | 23 | 36 | 29 | 25 | 31 | 23 |
| 15 | | 39 | 32 | 24 | 38 | 30 | 27 | 33 | 24 |
| 16 | | 41 | 34 | 26 | 40 | 32 | 29 | 35 | 25 |
| 17 | | 44 | 36 | 27 | 43 | 35 | 30 | 37 | 27 |
| 18 | | 45 | 37 | 28 | 44 | 37 | 31 | 38 | 28 |
| 19 | | 48 | 39 | 29 | 47 | 38 | 33 | 40 | 29 |
| 20 | | 51 | 41 | 31 | 50 | 39 | 34 | 42 | 30 |
| 21 | | 52 | 42 | 38 | 51 | 40 | 37 | 43 | 32 |
| 22 | | 54 | 50 | 39 | 53 | 44 | 38 | 51 | 39 |
| 23 | | 55 | 52 | 40 | 54 | 45 | 39 | 53 | 40 |
| 24 | | 56 | 53 | 42 | 55 | 48 | 41 | 54 | 41 |
| 25 | | 57 | 56 | 44 | 56 | 49 | 42 | 57 | 43 |
| 26 | | 58 | 58 | 45 | 57 | 54 | 43 | 59 | 45 |
| 27 | | 59 | 59 | 46 | 58 | 56 | 47 | 60 | 46 |
| 28 | | 60 | 61 | 48 | 59 | 59 | 50 | 62 | 47 |
| 29 | | 61 | 62 | 49 | 60 | 62 | 52 | 63 | 49 |
| 30 | | 64 | 63 | 52 | 63 | 67 | 54 | 64 | 50 |
| 31 | | 68 | 65 | 53 | 67 | 68 | 56 | 66 | 53 |
| 32 | | 69 | 68 | 54 | 68 | 70 | 60 | 69 | 54 |
| 33 | | 71 | 70 | 56 | 70 | 74 | 61 | 71 | 55 |
| 34 | | 72 | 71 | 57 | 71 | 76 | 62 | 72 | 57 |
| 35 | | 74 | 72 | 58 | 73 | 78 | 63 | 73 | 58 |
| 36 | | 77 | 73 | 62 | 76 | 79 | 65 | 74 | 59 |
| 37 | | 78 | 77 | 65 | 77 | 80 | 66 | 78 | 63 |
| 38 | | 79 | 78 | 67 | 78 | 81 | 68 | 79 | 66 |
| 39 | | 82 | 81 | 69 | 81 | 82 | 69 | 82 | 68 |
| 40 | | 84 | 82 | 71 | 83 | 84 | 73 | 83 | 70 |
| 41 | | 89 | 87 | 75 | 88 | 86 | 75 | 88 | 72 |
| 42 | | 93 | 89 | 76 | 92 | 88 | 76 | 90 | 76 |
| 43 | | 99 | 92 | 77 | 98 | 89 | 77 | 93 | 77 |
| 44 | | 100 | 95 | 78 | 99 | 91 | 80 | 96 | 78 |
| 45 | | 104 | 100 | 80 | 103 | 93 | 81 | 101 | 79 |
| 46 | | 105 | 101 | 81 | 104 | 94 | 82 | 102 | 81 |
| 47 | | 106 | 103 | 83 | 105 | 102 | 83 | 104 | 82 |
| 48 | | 112 | 107 | 84 | 111 | 104 | 84 | 108 | 84 |

FIG. 11B

| number of co."1" | p3n(x)=x**3n mod m1(x) | | | | | | | | |
|---|---|---|---|---|---|---|---|---|---|
| | m= | 7 | 6 | 5 | 4 | 3 | 2 | 1 | 0 |
| | | 120 | 120 | 144 | 120 | 120 | 144 | 120 | 144 |
| 49 | | 115 | 109 | 88 | 114 | 105 | 89 | 110 | 85 |
| 50 | | 116 | 111 | 90 | 115 | 108 | 90 | 112 | 89 |
| 51 | | 117 | 112 | 91 | 116 | 110 | 91 | 113 | 91 |
| 52 | | 118 | 113 | 92 | 117 | 111 | 92 | 114 | 92 |
| 53 | | 121 | 114 | 95 | 120 | 113 | 93 | 115 | 93 |
| 54 | | 122 | 115 | 96 | 121 | 114 | 94 | 116 | 96 |
| 55 | | 124 | 117 | 97 | 123 | 115 | 96 | 118 | 97 |
| 56 | | 126 | 119 | 98 | 125 | 117 | 97 | 120 | 98 |
| 57 | | 129 | 121 | 99 | 128 | 120 | 98 | 122 | 99 |
| 58 | | 130 | 122 | 104 | 129 | 122 | 99 | 123 | 100 |
| 59 | | 133 | 124 | 105 | 132 | 123 | 101 | 125 | 105 |
| 60 | | 136 | 126 | 106 | 135 | 124 | 108 | 127 | 106 |
| 61 | | 137 | 127 | 107 | 136 | 125 | 109 | 128 | 107 |
| 62 | | 139 | 135 | 108 | 138 | 129 | 110 | 136 | 108 |
| 63 | | 140 | 137 | 109 | 139 | 130 | 112 | 138 | 109 |
| 64 | | 141 | 138 | 111 | 140 | 133 | 114 | 139 | 110 |
| 65 | | 142 | 141 | 112 | 141 | 134 | 115 | 142 | 112 |
| 66 | | 143 | 143 | 113 | 142 | 139 | 116 | 144 | 113 |
| 67 | | 144 | 144 | 114 | 143 | 141 | 118 | 145 | 114 |
| 68 | | 145 | 146 | 116 | 144 | 144 | 119 | 147 | 115 |
| 69 | | 146 | 147 | 123 | 145 | 147 | 122 | 148 | 117 |
| 70 | | 149 | 148 | 124 | 148 | 152 | 123 | 149 | 124 |
| 71 | | 153 | 150 | 125 | 152 | 153 | 124 | 151 | 125 |
| 72 | | 154 | 153 | 127 | 153 | 155 | 126 | 154 | 126 |
| 73 | | 156 | 155 | 129 | 155 | 159 | 127 | 156 | 128 |
| 74 | | 157 | 156 | 130 | 156 | 161 | 128 | 157 | 130 |
| 75 | | 159 | 157 | 131 | 158 | 163 | 132 | 158 | 131 |
| 76 | | 162 | 158 | 133 | 161 | 164 | 135 | 159 | 132 |
| 77 | | 163 | 162 | 134 | 162 | 165 | 137 | 163 | 134 |
| 78 | | 164 | 163 | 137 | 163 | 166 | 139 | 164 | 135 |
| 79 | | 167 | 166 | 138 | 166 | 167 | 141 | 167 | 138 |
| 80 | | 169 | 167 | 139 | 168 | 169 | 145 | 168 | 139 |
| 81 | | 174 | 172 | 141 | 173 | 171 | 146 | 173 | 140 |
| 82 | | 178 | 174 | 142 | 177 | 173 | 147 | 175 | 142 |
| 83 | | 184 | 177 | 143 | 183 | 174 | 148 | 178 | 143 |
| 84 | | 185 | 180 | 147 | 184 | 176 | 150 | 181 | 144 |
| 85 | | 189 | 185 | 150 | 188 | 178 | 151 | 186 | 148 |
| 86 | | 190 | 186 | 152 | 189 | 179 | 153 | 187 | 151 |
| 87 | | 191 | 188 | 154 | 190 | 187 | 154 | 189 | 153 |
| 88 | | 197 | 192 | 156 | 196 | 189 | 158 | 193 | 155 |
| 89 | | 200 | 194 | 160 | 199 | 190 | 160 | 195 | 157 |
| 90 | | 201 | 196 | 161 | 200 | 193 | 161 | 197 | 161 |
| 91 | | 202 | 197 | 162 | 201 | 195 | 162 | 198 | 162 |
| 92 | | 203 | 198 | 163 | 202 | 196 | 165 | 199 | 163 |
| 93 | | 206 | 199 | 165 | 205 | 198 | 166 | 200 | 164 |
| 94 | | 207 | 200 | 166 | 206 | 199 | 167 | 201 | 166 |
| 95 | | 209 | 202 | 168 | 208 | 200 | 168 | 203 | 167 |
| 96 | | 211 | 204 | 169 | 210 | 202 | 169 | 205 | 169 |

FIG. 11C

| number of co."1" | p3n(x)=x**3n mod m1(x) | | | | | | | | |
|---|---|---|---|---|---|---|---|---|---|
| | m= | 7 | 6 | 5 | 4 | 3 | 2 | 1 | 0 |
| | | 120 | 120 | 144 | 120 | 120 | 144 | 120 | 144 |
| 97 | | 214 | 206 | 173 | 213 | 205 | 174 | 207 | 170 |
| 98 | | 215 | 207 | 175 | 214 | 207 | 175 | 208 | 174 |
| 99 | | 218 | 209 | 176 | 217 | 208 | 176 | 210 | 176 |
| 100 | | 221 | 211 | 177 | 220 | 209 | 177 | 212 | 177 |
| 101 | | 222 | 212 | 180 | 221 | 210 | 178 | 213 | 178 |
| 102 | | 224 | 220 | 181 | 223 | 214 | 179 | 221 | 181 |
| 103 | | 225 | 222 | 182 | 224 | 215 | 181 | 223 | 182 |
| 104 | | 226 | 223 | 183 | 225 | 218 | 182 | 224 | 183 |
| 105 | | 227 | 226 | 184 | 226 | 219 | 183 | 227 | 184 |
| 106 | | 228 | 228 | 189 | 227 | 224 | 184 | 229 | 185 |
| 107 | | 229 | 229 | 190 | 228 | 226 | 186 | 230 | 190 |
| 108 | | 230 | 231 | 191 | 229 | 229 | 193 | 232 | 191 |
| 109 | | 231 | 232 | 192 | 230 | 232 | 194 | 233 | 192 |
| 110 | | 234 | 233 | 193 | 233 | 237 | 195 | 234 | 193 |
| 111 | | 238 | 235 | 194 | 237 | 238 | 197 | 236 | 194 |
| 112 | | 239 | 238 | 196 | 238 | 240 | 199 | 239 | 195 |
| 113 | | 241 | 240 | 197 | 240 | 244 | 200 | 241 | 197 |
| 114 | | 242 | 241 | 198 | 241 | 246 | 201 | 242 | 198 |
| 115 | | 244 | 242 | 199 | 243 | 248 | 203 | 243 | 199 |
| 116 | | 247 | 243 | 201 | 246 | 249 | 204 | 244 | 200 |
| 117 | | 248 | 247 | 208 | 247 | 250 | 207 | 248 | 202 |
| 118 | | 249 | 248 | 209 | 248 | 251 | 208 | 249 | 209 |
| 119 | | 252 | 251 | 210 | 251 | 252 | 209 | 252 | 210 |
| 120 | | 254 | 252 | 212 | 253 | 254 | 211 | 253 | 211 |
| 121 | | | | 214 | | | 212 | | 213 |
| 122 | | | | 215 | | | 213 | | 215 |
| 123 | | | | 216 | | | 217 | | 216 |
| 124 | | | | 218 | | | 220 | | 217 |
| 125 | | | | 219 | | | 222 | | 219 |
| 126 | | | | 222 | | | 224 | | 220 |
| 127 | | | | 223 | | | 226 | | 223 |
| 128 | | | | 224 | | | 230 | | 224 |
| 129 | | | | 226 | | | 231 | | 225 |
| 130 | | | | 227 | | | 232 | | 227 |
| 131 | | | | 228 | | | 233 | | 228 |
| 132 | | | | 232 | | | 235 | | 229 |
| 133 | | | | 235 | | | 236 | | 233 |
| 134 | | | | 237 | | | 238 | | 236 |
| 135 | | | | 239 | | | 239 | | 238 |
| 136 | | | | 241 | | | 243 | | 240 |
| 137 | | | | 245 | | | 245 | | 242 |
| 138 | | | | 246 | | | 246 | | 246 |
| 139 | | | | 247 | | | 247 | | 247 |
| 140 | | | | 248 | | | 250 | | 248 |
| 141 | | | | 250 | | | 251 | | 249 |
| 142 | | | | 251 | | | 252 | | 251 |
| 143 | | | | 253 | | | 253 | | 252 |
| 144 | | | | 254 | | | 254 | | 254 |

FIG. 13A

| number of co."1" | p5n(x)=x**5n mod m1(x) | | | | | | | | |
|---|---|---|---|---|---|---|---|---|---|
| | m= | 7 | 6 | 5 | 4 | 3 | 2 | 1 | 0 |
| | | 120 | 120 | 160 | 120 | 120 | 160 | 120 | 120 |
| 1 | | 4 | 2 | 1 | 2 | 7 | 2 | 3 | 0 |
| 2 | | 7 | 6 | 2 | 4 | 8 | 3 | 5 | 5 |
| 3 | | 9 | 8 | 3 | 7 | 12 | 4 | 8 | 9 |
| 4 | | 11 | 9 | 4 | 12 | 13 | 7 | 13 | 10 |
| 5 | | 12 | 14 | 6 | 13 | 14 | 10 | 14 | 12 |
| 6 | | 13 | 16 | 8 | 14 | 15 | 13 | 15 | 15 |
| 7 | | 16 | 17 | 11 | 16 | 16 | 14 | 17 | 16 |
| 8 | | 17 | 18 | 12 | 17 | 18 | 15 | 18 | 18 |
| 9 | | 18 | 19 | 13 | 18 | 21 | 16 | 19 | 20 |
| 10 | | 19 | 22 | 16 | 20 | 23 | 17 | 21 | 22 |
| 11 | | 27 | 23 | 19 | 21 | 24 | 18 | 22 | 24 |
| 12 | | 28 | 29 | 22 | 23 | 26 | 22 | 24 | 25 |
| 13 | | 32 | 30 | 23 | 24 | 27 | 23 | 25 | 27 |
| 14 | | 33 | 31 | 24 | 25 | 29 | 26 | 26 | 29 |
| 15 | | 34 | 32 | 25 | 30 | 35 | 28 | 31 | 30 |
| 16 | | 35 | 34 | 26 | 31 | 38 | 29 | 32 | 33 |
| 17 | | 36 | 35 | 27 | 33 | 40 | 30 | 34 | 34 |
| 18 | | 38 | 39 | 31 | 34 | 42 | 32 | 35 | 35 |
| 19 | | 41 | 42 | 32 | 35 | 43 | 34 | 36 | 37 |
| 20 | | 43 | 43 | 35 | 36 | 44 | 35 | 37 | 41 |
| 21 | | 44 | 46 | 37 | 37 | 47 | 36 | 38 | 42 |
| 22 | | 46 | 47 | 38 | 40 | 48 | 37 | 41 | 43 |
| 23 | | 47 | 49 | 39 | 42 | 49 | 38 | 43 | 47 |
| 24 | | 49 | 50 | 41 | 46 | 50 | 39 | 47 | 49 |
| 25 | | 55 | 53 | 43 | 53 | 58 | 40 | 54 | 51 |
| 26 | | 58 | 57 | 44 | 55 | 59 | 41 | 56 | 56 |
| 27 | | 60 | 59 | 45 | 58 | 63 | 43 | 59 | 60 |
| 28 | | 62 | 60 | 46 | 63 | 64 | 44 | 64 | 61 |
| 29 | | 63 | 65 | 47 | 64 | 65 | 45 | 65 | 63 |
| 30 | | 64 | 67 | 48 | 65 | 66 | 46 | 66 | 66 |
| 31 | | 67 | 68 | 49 | 67 | 67 | 48 | 68 | 67 |
| 32 | | 68 | 69 | 50 | 68 | 69 | 50 | 69 | 69 |
| 33 | | 69 | 70 | 52 | 69 | 72 | 53 | 70 | 71 |
| 34 | | 70 | 73 | 53 | 71 | 74 | 54 | 72 | 73 |
| 35 | | 78 | 74 | 54 | 72 | 75 | 55 | 73 | 75 |
| 36 | | 79 | 80 | 55 | 74 | 77 | 58 | 75 | 76 |
| 37 | | 83 | 81 | 57 | 75 | 78 | 61 | 76 | 78 |
| 38 | | 84 | 82 | 59 | 76 | 80 | 64 | 77 | 80 |
| 39 | | 85 | 83 | 62 | 81 | 86 | 65 | 82 | 81 |
| 40 | | 86 | 85 | 63 | 82 | 89 | 66 | 83 | 84 |
| 41 | | 87 | 86 | 64 | 84 | 91 | 67 | 85 | 85 |
| 42 | | 89 | 90 | 67 | 85 | 93 | 68 | 86 | 86 |
| 43 | | 92 | 93 | 70 | 86 | 94 | 69 | 87 | 88 |
| 44 | | 94 | 94 | 73 | 87 | 95 | 73 | 88 | 92 |
| 45 | | 95 | 97 | 74 | 88 | 98 | 74 | 89 | 93 |
| 46 | | 97 | 98 | 75 | 91 | 99 | 77 | 92 | 94 |
| 47 | | 98 | 100 | 76 | 93 | 100 | 79 | 94 | 98 |
| 48 | | 100 | 101 | 77 | 97 | 101 | 80 | 98 | 100 |
| 49 | | 106 | 104 | 78 | 104 | 109 | 81 | 105 | 102 |
| 50 | | 109 | 108 | 82 | 106 | 110 | 83 | 107 | 107 |
| 51 | | 111 | 110 | 83 | 109 | 114 | 85 | 110 | 111 |
| 52 | | 113 | 111 | 86 | 114 | 115 | 86 | 115 | 112 |
| 53 | | 114 | 116 | 88 | 115 | 116 | 87 | 116 | 114 |
| 54 | | 115 | 118 | 89 | 116 | 117 | 88 | 117 | 117 |

FIG. 13B

| number of co."1" | p5n(x)=x**5n mod m1(x) | | | | | | | |
|---|---|---|---|---|---|---|---|---|
| | m= | 7 | 6 | 5 | 4 | 3 | 2 | 1 | 0 |
| | | 120 | 120 | 160 | 120 | 120 | 160 | 120 | 120 |
| 55 | | 118 | 119 | 90 | 118 | 118 | 89 | 119 | 118 |
| 56 | | 119 | 120 | 92 | 119 | 120 | 90 | 120 | 120 |
| 57 | | 120 | 121 | 94 | 120 | 123 | 91 | 121 | 122 |
| 58 | | 121 | 124 | 95 | 122 | 125 | 92 | 123 | 124 |
| 59 | | 129 | 125 | 96 | 123 | 126 | 94 | 124 | 126 |
| 60 | | 130 | 131 | 97 | 125 | 128 | 95 | 126 | 127 |
| 61 | | 134 | 132 | 98 | 126 | 129 | 96 | 127 | 129 |
| 62 | | 135 | 133 | 99 | 127 | 131 | 97 | 128 | 131 |
| 63 | | 136 | 134 | 100 | 132 | 137 | 99 | 133 | 132 |
| 64 | | 137 | 136 | 101 | 133 | 140 | 101 | 134 | 135 |
| 65 | | 138 | 137 | 103 | 135 | 142 | 104 | 136 | 136 |
| 66 | | 140 | 141 | 104 | 136 | 144 | 105 | 137 | 137 |
| 67 | | 143 | 144 | 105 | 137 | 145 | 106 | 138 | 139 |
| 68 | | 145 | 145 | 106 | 138 | 146 | 109 | 139 | 143 |
| 69 | | 146 | 148 | 108 | 139 | 149 | 112 | 140 | 144 |
| 70 | | 148 | 149 | 110 | 142 | 150 | 115 | 143 | 145 |
| 71 | | 149 | 151 | 113 | 144 | 151 | 116 | 145 | 149 |
| 72 | | 151 | 152 | 114 | 148 | 152 | 117 | 149 | 151 |
| 73 | | 157 | 155 | 115 | 155 | 160 | 118 | 156 | 153 |
| 74 | | 160 | 159 | 118 | 157 | 161 | 119 | 158 | 158 |
| 75 | | 162 | 161 | 121 | 160 | 165 | 120 | 161 | 162 |
| 76 | | 164 | 162 | 124 | 165 | 166 | 124 | 166 | 163 |
| 77 | | 165 | 167 | 125 | 166 | 167 | 125 | 167 | 165 |
| 78 | | 166 | 169 | 126 | 167 | 168 | 128 | 168 | 168 |
| 79 | | 169 | 170 | 127 | 169 | 169 | 130 | 170 | 169 |
| 80 | | 170 | 171 | 128 | 170 | 171 | 131 | 171 | 171 |
| 81 | | 171 | 172 | 129 | 171 | 174 | 132 | 172 | 173 |
| 82 | | 172 | 175 | 133 | 173 | 176 | 134 | 174 | 175 |
| 83 | | 180 | 176 | 134 | 174 | 177 | 136 | 175 | 177 |
| 84 | | 181 | 182 | 137 | 176 | 179 | 137 | 177 | 178 |
| 85 | | 185 | 183 | 139 | 177 | 180 | 138 | 178 | 180 |
| 86 | | 186 | 184 | 140 | 178 | 182 | 139 | 179 | 182 |
| 87 | | 187 | 185 | 141 | 183 | 188 | 140 | 184 | 183 |
| 88 | | 188 | 187 | 143 | 184 | 191 | 141 | 185 | 186 |
| 89 | | 189 | 188 | 145 | 186 | 193 | 142 | 187 | 187 |
| 90 | | 191 | 192 | 146 | 187 | 195 | 143 | 188 | 188 |
| 91 | | 194 | 195 | 147 | 188 | 196 | 145 | 189 | 190 |
| 92 | | 196 | 196 | 148 | 189 | 197 | 146 | 190 | 194 |
| 93 | | 197 | 199 | 149 | 190 | 200 | 147 | 191 | 195 |
| 94 | | 199 | 200 | 150 | 193 | 201 | 148 | 194 | 196 |
| 95 | | 200 | 202 | 151 | 195 | 202 | 150 | 196 | 200 |
| 96 | | 202 | 203 | 152 | 199 | 203 | 152 | 200 | 202 |
| 97 | | 208 | 206 | 154 | 206 | 211 | 155 | 207 | 204 |
| 98 | | 211 | 210 | 155 | 208 | 212 | 156 | 209 | 209 |
| 99 | | 213 | 212 | 156 | 211 | 216 | 157 | 212 | 213 |
| 100 | | 215 | 213 | 157 | 216 | 217 | 160 | 217 | 214 |
| 101 | | 216 | 218 | 159 | 217 | 218 | 163 | 218 | 216 |
| 102 | | 217 | 220 | 161 | 218 | 219 | 166 | 219 | 219 |
| 103 | | 220 | 221 | 164 | 220 | 220 | 167 | 221 | 220 |
| 104 | | 221 | 222 | 165 | 221 | 222 | 168 | 222 | 222 |
| 105 | | 222 | 223 | 166 | 222 | 225 | 169 | 223 | 224 |
| 106 | | 223 | 226 | 169 | 224 | 227 | 170 | 225 | 226 |
| 107 | | 231 | 227 | 172 | 225 | 228 | 171 | 226 | 228 |
| 108 | | 232 | 233 | 175 | 227 | 230 | 175 | 228 | 229 |

FIG. 13C

| number of co."1" | p5n(x)=x**5n mod m1(x) | | | | | | | | |
|---|---|---|---|---|---|---|---|---|---|
| | m= | 7 | 6 | 5 | 4 | 3 | 2 | 1 | 0 |
| | | 120 | 120 | 160 | 120 | 120 | 160 | 120 | 120 |
| 109 | | 236 | 234 | 176 | 228 | 231 | 176 | 229 | 231 |
| 110 | | 237 | 235 | 177 | 229 | 233 | 179 | 230 | 233 |
| 111 | | 238 | 236 | 178 | 234 | 239 | 181 | 235 | 234 |
| 112 | | 239 | 238 | 179 | 235 | 242 | 182 | 236 | 237 |
| 113 | | 240 | 239 | 180 | 237 | 244 | 183 | 238 | 238 |
| 114 | | 242 | 243 | 184 | 238 | 246 | 185 | 239 | 239 |
| 115 | | 245 | 246 | 185 | 239 | 247 | 187 | 240 | 241 |
| 116 | | 247 | 247 | 188 | 240 | 248 | 188 | 241 | 245 |
| 117 | | 248 | 250 | 190 | 241 | 251 | 189 | 242 | 246 |
| 118 | | 250 | 251 | 191 | 244 | 252 | 190 | 245 | 247 |
| 119 | | 251 | 253 | 192 | 246 | 253 | 191 | 247 | 251 |
| 120 | | 253 | 254 | 194 | 250 | 254 | 192 | 251 | 253 |
| 121 | | | | 196 | | | 193 | | |
| 122 | | | | 197 | | | 194 | | |
| 123 | | | | 198 | | | 196 | | |
| 124 | | | | 199 | | | 197 | | |
| 125 | | | | 200 | | | 198 | | |
| 126 | | | | 201 | | | 199 | | |
| 127 | | | | 202 | | | 201 | | |
| 128 | | | | 203 | | | 203 | | |
| 129 | | | | 205 | | | 206 | | |
| 130 | | | | 206 | | | 207 | | |
| 131 | | | | 207 | | | 208 | | |
| 132 | | | | 208 | | | 211 | | |
| 133 | | | | 210 | | | 214 | | |
| 134 | | | | 212 | | | 217 | | |
| 135 | | | | 215 | | | 218 | | |
| 136 | | | | 216 | | | 219 | | |
| 137 | | | | 217 | | | 220 | | |
| 138 | | | | 220 | | | 221 | | |
| 139 | | | | 223 | | | 222 | | |
| 140 | | | | 226 | | | 226 | | |
| 141 | | | | 227 | | | 227 | | |
| 142 | | | | 228 | | | 230 | | |
| 143 | | | | 229 | | | 232 | | |
| 144 | | | | 230 | | | 233 | | |
| 145 | | | | 231 | | | 234 | | |
| 146 | | | | 235 | | | 236 | | |
| 147 | | | | 236 | | | 238 | | |
| 148 | | | | 239 | | | 239 | | |
| 149 | | | | 241 | | | 240 | | |
| 150 | | | | 242 | | | 241 | | |
| 151 | | | | 243 | | | 242 | | |
| 152 | | | | 245 | | | 243 | | |
| 153 | | | | 247 | | | 244 | | |
| 154 | | | | 248 | | | 245 | | |
| 155 | | | | 249 | | | 247 | | |
| 156 | | | | 250 | | | 248 | | |
| 157 | | | | 251 | | | 249 | | |
| 158 | | | | 252 | | | 250 | | |
| 159 | | | | 253 | | | 252 | | |
| 160 | | | | 254 | | | 254 | | |
| 161 | | | | | | | | | |
| 162 | | | | | | | | | |

FIG. 16A

| pn(x) | pre_dec index | | |
|---|---|---|---|
| m= 7 6 5 4 3 2 1 0 | A B C D | n | 17n(15) |
| 1 1 0 1 1 1 1 1 | 3 3 1 3 | 90 | 0 |
| 1 1 0 0 0 0 0 1 | 1 0 0 3 | 45 | 0 |
| 1 0 1 1 1 0 0 1 | 1 2 3 2 | 60 | 0 |
| 1 0 1 0 1 0 0 1 | 1 2 2 2 | 135 | 0 |
| 1 0 0 1 0 0 0 1 | 1 0 1 2 | 165 | 0 |
| 1 0 0 1 0 1 1 0 | 2 1 1 2 | 180 | 0 |
| 0 1 1 0 0 0 0 0 | 0 0 2 1 | 30 | 0 |
| 0 1 1 0 0 1 0 0 | 0 1 2 1 | 195 | 0 |
| 0 1 0 1 0 1 0 1 | 1 1 1 1 | 150 | 0 |
| 0 1 0 1 1 0 0 1 | 1 2 1 1 | 210 | 0 |
| 0 0 1 1 1 0 1 1 | 3 2 3 0 | 120 | 0 |
| 0 0 1 0 1 1 0 0 | 0 3 2 0 | 240 | 0 |
| 0 0 1 0 0 1 1 0 | 2 1 2 0 | 15 | 0 |
| 0 0 1 0 0 1 0 0 | 0 1 2 0 | 225 | 0 |
| 0 0 0 1 1 0 1 0 | 2 2 1 0 | 105 | 0 |
| 0 0 0 0 1 1 1 1 | 3 3 0 0 | 75 | 0 |
| 0 0 0 0 0 0 0 1 | 1 0 0 0 | 0 | 0 |
| 1 1 1 1 0 1 1 0 | 2 1 3 3 | 173 | 1 |
| 1 1 1 1 0 0 1 1 | 3 0 3 3 | 233 | 1 |
| 1 1 1 0 0 0 0 0 | 0 0 2 3 | 203 | 1 |
| 1 1 0 0 1 0 0 1 | 1 2 0 3 | 23 | 1 |
| 1 0 1 1 1 0 1 1 | 3 2 3 2 | 83 | 1 |
| 1 0 1 1 0 1 1 1 | 3 1 3 2 | 158 | 1 |
| 1 0 1 0 0 1 0 1 | 1 1 2 2 | 188 | 1 |
| 1 0 0 1 1 0 0 1 | 1 2 1 2 | 68 | 1 |
| 1 0 0 1 0 1 0 0 | 0 1 1 2 | 38 | 1 |
| 1 0 0 0 0 1 0 1 | 1 1 0 2 | 128 | 1 |
| 0 1 0 1 0 1 0 0 | 0 1 1 1 | 143 | 1 |
| 0 1 0 0 0 0 1 1 | 3 0 0 1 | 98 | 1 |
| 0 0 1 0 1 0 0 0 | 0 2 2 0 | 53 | 1 |
| 0 0 1 0 1 0 1 1 | 3 2 2 0 | 218 | 1 |
| 0 0 0 1 1 1 0 1 | 1 3 1 0 | 8 | 1 |
| 0 0 0 1 1 1 1 1 | 3 3 1 0 | 113 | 1 |
| 0 0 0 1 1 0 1 1 | 3 2 1 0 | 248 | 1 |
| 1 1 0 0 1 0 0 0 | 0 2 0 3 | 196 | 2 |
| 1 1 0 0 0 0 0 0 | 0 0 0 3 | 31 | 2 |
| 1 0 1 1 0 0 1 0 | 2 0 3 2 | 211 | 2 |
| 1 0 1 0 1 0 1 0 | 2 2 2 2 | 151 | 2 |
| 1 0 1 0 0 0 1 1 | 3 0 2 2 | 91 | 2 |
| 1 0 0 1 1 1 1 1 | 3 3 1 2 | 46 | 2 |
| 0 1 1 1 0 1 1 0 | 2 1 3 1 | 121 | 2 |
| 0 1 1 0 1 1 1 1 | 3 3 2 1 | 61 | 2 |
| 0 1 0 1 1 0 0 0 | 0 2 1 1 | 241 | 2 |
| 0 1 0 0 1 1 0 0 | 0 3 0 1 | 16 | 2 |
| 0 1 0 0 1 1 1 1 | 3 3 0 1 | 136 | 2 |
| 0 1 0 0 1 0 0 0 | 0 2 0 1 | 226 | 2 |
| 0 0 0 1 1 1 1 0 | 2 3 1 0 | 76 | 2 |
| 0 0 0 0 0 0 1 0 | 2 0 0 0 | 1 | 2 |
| 0 0 1 1 1 1 1 1 | 3 3 3 0 | 166 | 2 |
| 0 0 1 1 0 1 0 0 | 0 1 3 0 | 106 | 2 |
| 0 0 1 1 0 0 0 1 | 1 0 3 0 | 181 | 2 |

| pn(x) | pre_dec index | | |
|---|---|---|---|
| m= 7 6 5 4 3 2 1 0 | A B C D | n | 17n(15) |
| 1 1 1 1 1 0 1 1 | 3 2 3 3 | 234 | 3 |
| 1 1 1 1 0 0 0 1 | 1 0 3 3 | 174 | 3 |
| 1 1 0 1 1 1 0 1 | 1 3 1 3 | 204 | 3 |
| 1 0 1 0 1 0 0 0 | 0 2 2 2 | 144 | 3 |
| 1 0 0 0 1 1 1 1 | 3 3 0 2 | 24 | 3 |
| 1 0 0 0 0 1 1 0 | 2 1 0 2 | 99 | 3 |
| 0 1 1 1 0 0 1 1 | 3 0 3 1 | 159 | 3 |
| 0 1 1 0 1 0 1 1 | 3 2 2 1 | 84 | 3 |
| 0 1 0 1 0 0 0 0 | 0 0 1 1 | 54 | 3 |
| 0 1 0 1 0 1 1 1 | 3 1 1 1 | 189 | 3 |
| 0 1 0 1 0 1 1 0 | 2 1 1 1 | 219 | 3 |
| 0 0 1 1 1 0 1 0 | 2 2 3 0 | 9 | 3 |
| 0 0 1 1 1 1 1 0 | 2 3 3 0 | 114 | 3 |
| 0 0 1 1 0 1 0 1 | 1 1 3 0 | 39 | 3 |
| 0 0 1 1 0 1 1 0 | 2 1 3 0 | 249 | 3 |
| 0 0 1 0 1 1 1 1 | 3 3 2 0 | 69 | 3 |
| 0 0 0 1 0 1 1 1 | 3 1 1 0 | 129 | 3 |
| 1 1 1 0 1 1 0 0 | 0 3 2 3 | 122 | 4 |
| 1 1 0 1 1 1 1 0 | 2 3 1 3 | 62 | 4 |
| 1 0 1 1 0 0 0 0 | 0 0 3 2 | 242 | 4 |
| 1 0 0 1 1 0 0 0 | 0 2 1 2 | 17 | 4 |
| 1 0 0 1 1 1 0 1 | 1 3 1 2 | 32 | 4 |
| 1 0 0 1 1 1 1 0 | 2 3 1 2 | 137 | 4 |
| 1 0 0 1 0 0 0 0 | 0 0 1 2 | 227 | 4 |
| 1 0 0 0 1 1 0 1 | 1 3 0 2 | 197 | 4 |
| 0 1 1 1 1 1 1 0 | 2 3 3 1 | 167 | 4 |
| 0 1 1 1 1 0 0 1 | 1 2 3 1 | 212 | 4 |
| 0 1 1 0 1 0 0 0 | 0 2 2 1 | 107 | 4 |
| 0 1 1 0 0 0 1 0 | 2 0 2 1 | 182 | 4 |
| 0 1 0 1 1 0 1 1 | 3 2 1 1 | 92 | 4 |
| 0 1 0 0 1 0 0 1 | 1 2 0 1 | 152 | 4 |
| 0 0 1 1 1 1 0 0 | 0 3 3 0 | 77 | 4 |
| 0 0 1 0 0 0 1 1 | 3 0 2 0 | 47 | 4 |
| 0 0 0 0 0 1 0 0 | 0 1 0 0 | 2 | 4 |
| 1 1 1 1 1 1 1 1 | 3 3 3 3 | 175 | 5 |
| 1 1 1 0 1 0 1 1 | 3 2 2 3 | 235 | 5 |
| 1 1 1 0 0 1 1 0 | 2 1 2 3 | 160 | 5 |
| 1 1 0 1 0 1 1 0 | 2 1 1 3 | 85 | 5 |
| 1 0 1 0 1 1 1 0 | 2 3 2 2 | 190 | 5 |
| 1 0 1 0 1 1 0 0 | 0 3 2 2 | 220 | 5 |
| 1 0 1 0 0 0 0 0 | 0 0 2 2 | 55 | 5 |
| 1 0 1 0 0 1 1 1 | 3 1 2 2 | 205 | 5 |
| 0 1 1 1 1 1 0 0 | 0 3 3 1 | 115 | 5 |
| 0 1 1 1 0 1 0 0 | 0 1 3 1 | 10 | 5 |
| 0 1 1 0 1 0 1 0 | 2 2 2 1 | 40 | 5 |
| 0 1 1 0 1 1 0 0 | 0 3 2 1 | 250 | 5 |
| 0 1 0 1 1 1 1 0 | 2 3 1 1 | 70 | 5 |
| 0 1 0 0 1 1 0 1 | 1 3 0 1 | 145 | 5 |
| 0 0 1 0 1 1 1 0 | 2 3 2 0 | 130 | 5 |
| 0 0 0 1 0 0 0 1 | 1 0 1 0 | 100 | 5 |
| 0 0 0 0 0 0 1 1 | 3 0 0 0 | 25 | 5 |

FIG. 16B

| pn(x) | pre_dec index | | |
|---|---|---|---|
| m= 7 6 5 4 3 2 1 0 | A B C D | n | 17n(15) |
| 1 1 1 1 1 1 0 0 | 0 3 3 3 | 168 | 6 |
| 1 1 1 1 0 0 1 0 | 2 0 3 3 | 213 | 6 |
| 1 1 0 1 0 0 0 0 | 0 0 1 3 | 108 | 6 |
| 1 1 0 0 0 1 0 1 | 1 1 0 3 | 123 | 6 |
| 1 1 0 0 0 1 0 0 | 0 1 0 3 | 183 | 6 |
| 1 0 1 1 0 1 1 0 | 2 1 3 2 | 93 | 6 |
| 1 0 1 0 0 0 0 1 | 1 0 2 2 | 63 | 6 |
| 1 0 0 1 0 0 1 0 | 2 0 1 2 | 153 | 6 |
| 0 1 1 1 1 0 0 0 | 0 2 3 1 | 78 | 6 |
| 0 1 1 1 1 1 0 1 | 1 3 3 1 | 243 | 6 |
| 0 1 0 0 0 1 1 0 | 2 1 0 1 | 48 | 6 |
| 0 0 1 1 1 1 0 1 | 1 3 3 0 | 228 | 6 |
| 0 0 1 0 1 1 0 1 | 1 3 2 0 | 18 | 6 |
| 0 0 1 0 0 1 1 1 | 3 1 2 0 | 33 | 6 |
| 0 0 1 0 0 0 0 1 | 1 0 2 0 | 138 | 6 |
| 0 0 0 0 1 0 0 0 | 0 2 0 0 | 3 | 6 |
| 0 0 0 0 0 1 1 1 | 3 1 0 0 | 198 | 6 |
| 1 1 1 1 1 0 0 0 | 0 2 3 3 | 116 | 7 |
| 1 1 1 0 1 0 0 0 | 0 2 2 3 | 11 | 7 |
| 1 1 1 0 0 0 1 1 | 3 0 2 3 | 176 | 7 |
| 1 1 0 1 1 0 0 0 | 0 2 1 3 | 251 | 7 |
| 1 1 0 1 0 1 0 0 | 0 1 1 3 | 41 | 7 |
| 1 1 0 1 0 0 0 1 | 1 0 1 3 | 161 | 7 |
| 1 1 0 0 1 0 1 1 | 3 2 0 3 | 236 | 7 |
| 1 0 1 1 1 1 0 0 | 0 3 3 2 | 71 | 7 |
| 1 0 1 1 0 0 0 1 | 1 0 3 2 | 86 | 7 |
| 1 0 0 1 1 0 1 0 | 2 2 1 2 | 146 | 7 |
| 0 0 1 0 0 0 1 0 | 2 0 2 0 | 101 | 7 |
| 0 1 0 1 1 1 0 1 | 1 3 1 1 | 56 | 7 |
| 0 1 0 1 1 1 0 0 | 0 3 1 1 | 131 | 7 |
| 0 1 0 1 0 0 1 1 | 3 0 1 1 | 206 | 7 |
| 0 1 0 0 0 0 0 1 | 1 0 0 1 | 191 | 7 |
| 0 1 0 0 0 1 0 1 | 1 1 0 1 | 221 | 7 |
| 0 0 0 0 0 1 1 0 | 2 1 0 0 | 26 | 7 |
| 1 1 1 1 1 0 0 1 | 1 2 3 3 | 214 | 8 |
| 1 1 1 1 1 0 1 0 | 2 2 3 3 | 244 | 8 |
| 1 1 1 1 0 0 0 0 | 0 0 3 3 | 79 | 8 |
| 1 1 1 0 0 1 0 1 | 1 1 2 3 | 169 | 8 |
| 1 0 1 1 1 1 0 1 | 1 3 3 2 | 109 | 8 |
| 1 0 0 1 0 1 1 1 | 3 1 1 2 | 124 | 8 |
| 1 0 0 1 0 1 0 1 | 1 1 1 2 | 184 | 8 |
| 1 0 0 0 1 1 0 0 | 0 3 0 2 | 49 | 8 |
| 0 1 1 1 1 0 1 0 | 2 2 3 1 | 229 | 8 |
| 0 1 1 1 0 0 0 1 | 1 0 3 1 | 94 | 8 |
| 0 1 0 1 1 0 1 0 | 2 2 1 1 | 19 | 8 |
| 0 1 0 1 1 1 1 1 | 3 3 1 1 | 64 | 8 |
| 0 1 0 0 1 1 1 0 | 2 3 0 1 | 34 | 8 |
| 0 1 0 0 0 0 1 0 | 2 0 0 1 | 139 | 8 |
| 0 0 1 1 1 0 0 1 | 1 2 3 0 | 154 | 8 |
| 0 0 0 1 0 0 0 0 | 0 0 1 0 | 4 | 8 |
| 0 0 0 0 1 1 1 0 | 2 3 0 0 | 199 | 8 |

| pn(x) | pre_dec index | | |
|---|---|---|---|
| m= 7 6 5 4 3 2 1 0 | A B C D | n | 17n(15) |
| 1 1 1 0 1 1 0 1 | 1 3 2 3 | 117 | 9 |
| 1 1 0 1 1 0 1 1 | 3 2 1 3 | 177 | 9 |
| 1 1 0 0 1 1 0 1 | 1 3 0 3 | 12 | 9 |
| 1 0 1 1 1 0 1 0 | 2 2 3 2 | 57 | 9 |
| 1 0 1 1 1 0 0 0 | 0 2 3 2 | 132 | 9 |
| 1 0 1 1 1 1 1 1 | 3 3 3 2 | 162 | 9 |
| 1 0 1 1 0 1 0 1 | 1 1 3 2 | 42 | 9 |
| 1 0 1 0 1 1 0 1 | 1 3 2 2 | 252 | 9 |
| 1 0 1 0 0 1 1 0 | 2 1 2 2 | 207 | 9 |
| 1 0 0 0 1 0 1 0 | 2 2 0 2 | 222 | 9 |
| 1 0 0 0 1 0 1 1 | 3 2 0 2 | 237 | 9 |
| 1 0 0 0 0 0 1 0 | 2 0 0 2 | 192 | 9 |
| 0 1 1 1 1 1 1 1 | 3 3 3 1 | 87 | 9 |
| 0 1 1 0 0 1 0 1 | 1 1 2 1 | 72 | 9 |
| 0 1 0 0 0 1 0 0 | 0 1 0 1 | 102 | 9 |
| 0 0 1 0 1 0 0 1 | 1 2 2 0 | 147 | 9 |
| 0 0 0 0 1 1 0 0 | 0 3 0 0 | 27 | 9 |
| 1 1 1 1 1 1 0 1 | 1 3 3 3 | 80 | 10 |
| 1 1 1 1 0 1 0 0 | 0 1 3 3 | 230 | 10 |
| 1 1 1 0 1 1 1 1 | 3 3 2 3 | 215 | 10 |
| 1 1 1 0 1 0 0 1 | 1 2 2 3 | 245 | 10 |
| 1 1 1 0 0 0 1 0 | 2 0 2 3 | 95 | 10 |
| 1 1 0 1 0 1 1 1 | 3 1 1 3 | 170 | 10 |
| 1 0 1 1 1 1 1 0 | 2 3 3 2 | 65 | 10 |
| 1 0 1 1 0 1 0 0 | 0 1 3 2 | 20 | 10 |
| 1 0 0 1 1 1 0 0 | 0 3 1 2 | 35 | 10 |
| 1 0 0 0 0 1 0 0 | 0 1 0 2 | 140 | 10 |
| 0 1 1 1 0 0 1 0 | 2 0 3 1 | 155 | 10 |
| 0 1 1 0 0 1 1 1 | 3 1 2 1 | 110 | 10 |
| 0 0 1 1 0 0 1 1 | 3 0 3 0 | 125 | 10 |
| 0 0 1 1 0 1 1 1 | 3 1 3 0 | 185 | 10 |
| 0 0 1 0 0 0 0 0 | 0 0 2 0 | 5 | 10 |
| 0 0 0 1 1 1 0 0 | 0 3 1 0 | 200 | 10 |
| 0 0 0 0 0 1 0 1 | 1 1 0 0 | 50 | 10 |
| 1 1 1 1 1 1 1 0 | 2 3 3 3 | 88 | 11 |
| 1 1 0 0 1 0 1 0 | 2 2 0 3 | 73 | 11 |
| 1 1 0 0 0 1 1 1 | 3 1 0 3 | 118 | 11 |
| 1 0 1 0 1 0 1 1 | 3 2 2 2 | 178 | 11 |
| 1 0 0 0 1 0 0 0 | 0 2 0 2 | 103 | 11 |
| 1 0 0 0 0 1 1 1 | 3 1 0 2 | 13 | 11 |
| 0 1 1 1 0 1 1 1 | 3 1 3 1 | 43 | 11 |
| 0 1 1 0 1 0 0 1 | 1 2 2 1 | 58 | 11 |
| 0 1 1 0 1 1 0 1 | 1 3 2 1 | 133 | 11 |
| 0 1 1 0 0 0 1 1 | 3 0 2 1 | 163 | 11 |
| 0 1 0 1 0 0 1 0 | 2 0 1 1 | 148 | 11 |
| 0 1 0 1 0 0 0 1 | 1 0 1 1 | 208 | 11 |
| 0 1 0 0 0 1 1 1 | 3 1 0 1 | 253 | 11 |
| 0 0 0 1 1 0 0 0 | 0 2 1 0 | 28 | 11 |
| 0 0 0 1 1 0 0 1 | 1 2 1 0 | 193 | 11 |
| 0 0 0 0 1 0 0 1 | 1 2 0 0 | 223 | 11 |
| 0 0 0 0 1 0 1 1 | 3 2 0 0 | 238 | 11 |

FIG. 16C

| pn(x) | pre_dec index | | |
|---|---|---|---|
| m= 7 6 5 4 3 2 1 0 | A B C D | n | 17n(15) |
| 1 1 1 1 0 1 0 1 | 1 1 3 3 | 231 | 12 |
| 1 1 1 0 0 1 1 1 | 3 1 2 3 | 81 | 12 |
| 1 1 1 0 0 1 0 0 | 0 1 2 3 | 156 | 12 |
| 1 1 0 1 1 0 0 1 | 1 2 1 3 | 96 | 12 |
| 1 1 0 0 1 1 1 0 | 2 3 0 3 | 111 | 12 |
| 1 1 0 0 1 1 1 1 | 3 3 0 3 | 246 | 12 |
| 1 1 0 0 0 0 1 1 | 3 0 0 3 | 216 | 12 |
| 1 0 1 1 0 0 1 1 | 3 0 3 2 | 171 | 12 |
| 0 1 1 1 0 1 0 1 | 1 1 3 1 | 21 | 12 |
| 0 1 1 0 1 1 1 0 | 2 3 2 1 | 186 | 12 |
| 0 1 1 0 0 0 0 1 | 1 0 2 1 | 66 | 12 |
| 0 1 1 0 0 1 1 0 | 2 1 2 1 | 126 | 12 |
| 0 1 0 0 0 0 0 0 | 0 0 0 1 | 6 | 12 |
| 0 0 1 1 1 0 0 0 | 0 2 3 0 | 201 | 12 |
| 0 0 1 0 0 1 0 1 | 1 1 2 0 | 36 | 12 |
| 0 0 0 1 0 1 0 1 | 1 1 1 0 | 141 | 12 |
| 0 0 0 0 1 0 1 0 | 2 2 0 0 | 51 | 12 |
| 1 1 1 0 1 1 1 0 | 2 3 2 3 | 44 | 13 |
| 1 1 1 0 0 0 0 1 | 1 0 2 3 | 89 | 13 |
| 1 1 0 1 1 0 1 0 | 2 2 1 3 | 134 | 13 |
| 1 1 0 1 0 0 1 0 | 2 0 1 3 | 59 | 13 |
| 1 1 0 0 0 1 1 0 | 2 1 0 3 | 164 | 13 |
| 1 0 1 0 0 1 0 0 | 0 1 2 2 | 149 | 13 |
| 1 0 1 0 0 0 1 0 | 2 0 2 2 | 209 | 13 |
| 1 0 0 1 0 0 1 1 | 3 0 1 2 | 119 | 13 |
| 1 0 0 0 1 0 0 1 | 1 2 0 2 | 74 | 13 |
| 1 0 0 0 1 1 1 0 | 2 3 0 2 | 254 | 13 |
| 0 1 0 0 1 0 1 1 | 3 2 0 1 | 179 | 13 |
| 0 0 1 1 0 0 0 0 | 0 0 3 0 | 29 | 13 |
| 0 0 1 1 0 0 1 0 | 2 0 3 0 | 194 | 13 |
| 0 0 0 1 0 0 1 1 | 3 0 1 0 | 14 | 13 |
| 0 0 0 1 0 0 1 0 | 2 0 1 0 | 224 | 13 |
| 0 0 0 1 0 1 1 0 | 2 1 1 0 | 239 | 13 |
| 0 0 0 0 1 1 0 1 | 1 3 0 0 | 104 | 13 |
| 1 1 1 1 0 1 1 1 | 3 1 3 3 | 232 | 14 |
| 1 1 1 0 1 0 1 0 | 2 2 2 3 | 22 | 14 |
| 1 1 0 1 1 1 0 0 | 0 3 1 3 | 187 | 14 |
| 1 1 0 1 0 0 1 1 | 3 0 1 3 | 82 | 14 |
| 1 1 0 1 0 1 0 1 | 1 1 1 3 | 157 | 14 |
| 1 1 0 0 1 1 0 0 | 0 3 0 3 | 127 | 14 |
| 1 1 0 0 0 0 1 0 | 2 0 0 3 | 67 | 14 |
| 1 0 1 0 1 1 1 1 | 3 3 2 2 | 97 | 14 |
| 1 0 0 1 1 0 1 1 | 3 2 1 2 | 217 | 14 |
| 1 0 0 0 0 0 0 0 | 0 0 0 2 | 7 | 14 |
| 1 0 0 0 0 0 0 1 | 1 0 0 2 | 112 | 14 |
| 1 0 0 0 0 0 1 1 | 3 0 0 2 | 247 | 14 |
| 0 1 1 1 1 0 1 1 | 3 2 3 1 | 172 | 14 |
| 0 1 1 1 0 0 0 0 | 0 0 3 1 | 202 | 14 |
| 0 1 0 0 1 0 1 0 | 2 2 0 1 | 37 | 14 |
| 0 0 1 0 1 0 1 0 | 2 2 2 0 | 142 | 14 |
| 0 0 0 1 0 1 0 0 | 0 1 1 0 | 52 | 14 |

FIG. 17A

| pn(x) | pre_dec index | | |
|---|---|---|---|
| m= 7 6 5 4 3 2 1 0 | A B C D | n | 15n(17) |
| 1 1 0 1 1 1 0 1 | 1 3 1 3 | 204 | 0 |
| 1 1 0 1 1 1 0 0 | 0 3 1 3 | 187 | 0 |
| 1 1 0 1 0 1 1 1 | 3 1 1 3 | 170 | 0 |
| 1 1 0 1 0 1 1 0 | 2 1 1 3 | 85 | 0 |
| 1 0 0 1 1 0 0 1 | 1 2 1 2 | 68 | 0 |
| 1 0 0 1 1 0 0 0 | 0 2 1 2 | 17 | 0 |
| 1 0 0 1 0 0 1 1 | 3 0 1 2 | 119 | 0 |
| 1 0 0 1 0 0 1 0 | 2 0 1 2 | 153 | 0 |
| 0 1 0 0 1 1 1 1 | 3 3 0 1 | 136 | 0 |
| 0 1 0 0 1 1 1 0 | 2 3 0 1 | 34 | 0 |
| 0 1 0 0 0 1 0 1 | 1 1 0 1 | 221 | 0 |
| 0 1 0 0 0 1 0 0 | 0 1 0 1 | 102 | 0 |
| 0 0 0 0 1 0 1 1 | 3 2 0 0 | 238 | 0 |
| 0 0 0 0 1 0 1 0 | 2 2 0 0 | 51 | 0 |
| 0 0 0 0 0 0 0 1 | 1 0 0 0 | 0 | 0 |
| 1 1 0 1 0 0 0 1 | 1 0 1 3 | 161 | 1 |
| 1 1 0 1 0 0 1 0 | 2 0 1 3 | 59 | 1 |
| 1 1 0 0 1 1 1 1 | 3 3 0 3 | 246 | 1 |
| 1 1 0 0 1 1 0 0 | 0 3 0 3 | 127 | 1 |
| 1 0 1 1 0 1 0 1 | 1 1 3 2 | 42 | 1 |
| 1 0 1 1 0 1 1 0 | 2 1 3 2 | 93 | 1 |
| 1 0 1 0 1 0 1 1 | 3 2 2 2 | 178 | 1 |
| 1 0 1 0 1 0 0 0 | 0 2 2 2 | 144 | 1 |
| 0 1 1 1 1 0 0 1 | 1 2 3 1 | 212 | 1 |
| 0 1 1 1 1 0 1 0 | 2 2 3 1 | 229 | 1 |
| 0 1 1 0 0 1 1 1 | 3 1 2 1 | 110 | 1 |
| 0 1 1 0 0 1 0 0 | 0 1 2 1 | 195 | 1 |
| 0 0 0 1 1 1 0 1 | 1 3 1 0 | 8 | 1 |
| 0 0 0 1 1 1 1 0 | 2 3 1 0 | 76 | 1 |
| 0 0 0 0 0 0 1 1 | 3 0 0 0 | 25 | 1 |
| 1 1 1 0 0 1 0 1 | 1 1 2 3 | 169 | 2 |
| 1 1 1 0 0 0 0 0 | 0 0 2 3 | 203 | 2 |
| 1 1 0 0 0 1 1 1 | 3 1 0 3 | 118 | 2 |
| 1 1 0 0 0 0 1 0 | 2 0 0 3 | 67 | 2 |
| 1 0 1 0 1 1 0 0 | 0 3 2 2 | 220 | 2 |
| 1 0 1 0 1 0 0 1 | 1 2 2 2 | 135 | 2 |
| 1 0 0 0 1 1 1 0 | 2 3 0 2 | 254 | 2 |
| 1 0 0 0 1 0 1 1 | 3 2 0 2 | 237 | 2 |
| 0 1 1 0 1 1 1 0 | 2 3 2 1 | 186 | 2 |
| 0 1 1 0 1 0 1 1 | 3 2 2 1 | 84 | 2 |
| 0 1 0 0 1 1 0 0 | 0 3 0 1 | 16 | 2 |
| 0 1 0 0 1 0 0 1 | 1 2 0 1 | 152 | 2 |
| 0 0 1 0 0 1 1 1 | 3 1 2 0 | 33 | 2 |
| 0 0 1 0 0 0 1 0 | 2 0 2 0 | 101 | 2 |
| 0 0 0 0 0 1 0 1 | 1 1 0 0 | 50 | 2 |
| 1 1 1 0 0 1 1 0 | 2 1 2 3 | 160 | 3 |
| 1 1 1 0 1 0 0 1 | 1 2 2 3 | 245 | 3 |
| 1 1 0 1 0 1 0 0 | 0 1 1 3 | 41 | 3 |
| 1 1 0 1 1 0 1 1 | 3 2 1 3 | 177 | 3 |
| 1 0 1 1 1 1 0 1 | 1 3 3 2 | 109 | 3 |
| 1 0 1 1 0 0 1 0 | 2 0 3 2 | 211 | 3 |
| 1 0 0 0 0 0 0 0 | 0 0 0 2 | 7 | 3 |
| 1 0 0 0 1 1 1 1 | 3 3 0 2 | 24 | 3 |
| 0 1 1 0 1 0 0 1 | 1 2 2 1 | 58 | 3 |
| 0 1 1 0 0 1 1 0 | 2 1 2 1 | 126 | 3 |
| 0 1 0 1 1 0 1 1 | 3 2 1 1 | 92 | 3 |
| 0 1 0 1 0 1 0 0 | 0 1 1 1 | 143 | 3 |
| 0 0 1 1 0 0 1 0 | 2 0 3 0 | 194 | 3 |
| 0 0 1 1 1 1 0 1 | 1 3 3 0 | 228 | 3 |
| 0 0 0 0 1 1 1 1 | 3 3 0 0 | 75 | 3 |

| pn(x) | pre_dec index | | |
|---|---|---|---|
| m= 7 6 5 4 3 2 1 0 | A B C D | n | 15n(17) |
| 1 1 1 1 1 1 0 0 | 0 3 3 3 | 168 | 4 |
| 1 1 1 0 1 1 0 1 | 1 3 2 3 | 117 | 4 |
| 1 1 0 1 1 0 1 0 | 2 2 1 3 | 134 | 4 |
| 1 1 0 0 1 0 1 1 | 3 2 0 3 | 236 | 4 |
| 1 0 1 1 1 0 1 1 | 3 2 3 2 | 83 | 4 |
| 1 0 1 0 1 0 1 0 | 2 2 2 2 | 151 | 4 |
| 1 0 0 1 1 1 0 1 | 1 3 1 2 | 32 | 4 |
| 1 0 0 0 1 1 0 0 | 0 3 0 2 | 49 | 4 |
| 0 1 1 1 0 0 0 0 | 0 0 3 1 | 202 | 4 |
| 0 1 1 0 0 0 0 1 | 1 0 2 1 | 66 | 4 |
| 0 1 0 1 0 1 1 0 | 2 1 1 1 | 219 | 4 |
| 0 1 0 0 0 1 1 1 | 3 1 0 1 | 253 | 4 |
| 0 0 1 1 0 1 1 1 | 3 1 3 0 | 185 | 4 |
| 0 0 1 0 0 1 1 0 | 2 1 2 0 | 15 | 4 |
| 0 0 0 1 0 0 0 1 | 1 0 1 0 | 100 | 4 |
| 1 1 1 1 1 0 1 0 | 2 2 3 3 | 244 | 5 |
| 1 1 1 0 0 0 1 1 | 3 0 2 3 | 176 | 5 |
| 1 1 0 1 0 0 0 0 | 0 0 1 3 | 108 | 5 |
| 1 1 0 0 1 0 0 1 | 1 2 0 3 | 23 | 5 |
| 1 0 1 1 1 0 1 0 | 2 2 3 2 | 57 | 5 |
| 1 0 1 0 0 0 1 1 | 3 0 2 2 | 91 | 5 |
| 1 0 0 1 0 0 0 0 | 0 0 1 2 | 227 | 5 |
| 1 0 0 0 1 0 0 1 | 1 2 0 2 | 74 | 5 |
| 0 1 1 1 0 0 1 1 | 3 0 3 1 | 159 | 5 |
| 0 1 1 0 1 0 1 0 | 2 2 2 1 | 40 | 5 |
| 0 1 0 1 1 0 0 1 | 1 2 1 1 | 210 | 5 |
| 0 1 0 0 0 0 0 0 | 0 0 0 1 | 6 | 5 |
| 0 0 1 1 0 0 1 1 | 3 0 3 0 | 125 | 5 |
| 0 0 1 0 1 0 1 0 | 2 2 2 0 | 142 | 5 |
| 0 0 0 1 1 0 0 1 | 1 2 1 0 | 193 | 5 |
| 1 1 1 1 1 0 0 0 | 0 2 3 3 | 116 | 6 |
| 1 1 1 0 1 0 1 1 | 3 2 2 3 | 235 | 6 |
| 1 1 0 1 0 0 1 1 | 3 0 1 3 | 82 | 6 |
| 1 1 0 0 0 0 0 0 | 0 0 0 3 | 31 | 6 |
| 1 0 1 1 1 1 1 0 | 2 3 3 2 | 65 | 6 |
| 1 0 1 0 1 1 0 1 | 1 3 2 2 | 252 | 6 |
| 1 0 0 1 0 1 0 1 | 1 1 1 2 | 184 | 6 |
| 1 0 0 0 0 1 1 0 | 2 1 0 2 | 99 | 6 |
| 0 1 1 1 1 1 1 0 | 2 3 3 1 | 167 | 6 |
| 0 1 1 0 1 1 0 1 | 1 3 2 1 | 133 | 6 |
| 0 1 0 1 0 1 0 1 | 1 1 1 1 | 150 | 6 |
| 0 1 0 0 0 1 1 0 | 2 1 0 1 | 48 | 6 |
| 0 0 1 1 1 0 0 0 | 0 2 3 0 | 201 | 6 |
| 0 0 1 0 1 0 1 1 | 3 2 2 0 | 218 | 6 |
| 0 0 0 1 0 0 1 1 | 3 0 1 0 | 14 | 6 |
| 1 1 1 1 1 1 1 1 | 3 3 3 3 | 175 | 7 |
| 1 1 1 0 1 0 1 0 | 2 2 2 3 | 22 | 7 |
| 1 1 0 1 1 1 1 1 | 3 3 1 3 | 90 | 7 |
| 1 1 0 0 1 0 1 0 | 2 2 0 3 | 73 | 7 |
| 1 0 1 1 0 1 1 1 | 3 1 3 2 | 158 | 7 |
| 1 0 1 0 0 0 1 0 | 2 0 2 2 | 209 | 7 |
| 1 0 0 1 0 1 1 1 | 3 1 1 2 | 124 | 7 |
| 1 0 0 0 0 0 1 0 | 2 0 0 2 | 192 | 7 |
| 0 1 1 1 1 1 0 1 | 1 3 3 1 | 243 | 7 |
| 0 1 1 0 1 0 0 0 | 0 2 2 1 | 107 | 7 |
| 0 1 0 1 1 1 0 1 | 1 3 1 1 | 56 | 7 |
| 0 1 0 0 1 0 0 0 | 0 2 0 1 | 226 | 7 |
| 0 0 1 1 0 1 0 1 | 1 1 3 0 | 39 | 7 |
| 0 0 1 0 0 0 0 0 | 0 0 2 0 | 5 | 7 |
| 0 0 0 1 0 1 0 1 | 1 1 1 0 | 141 | 7 |

FIG. 17B

| pn(x) | pre_dec index | | |
|---|---|---|---|
| m= 7 6 5 4 3 2 1 0 | A B C D | n | 15n(17) |
| 1 1 1 1 1 0 1 1 | 3 2 3 3 | 234 | 8 |
| 1 1 1 0 0 1 1 1 | 3 1 2 3 | 81 | 8 |
| 1 1 0 1 1 0 0 0 | 0 2 1 3 | 251 | 8 |
| 1 1 0 0 0 1 0 0 | 0 1 0 3 | 183 | 8 |
| 1 0 1 1 1 0 0 0 | 0 2 3 2 | 132 | 8 |
| 1 0 1 0 0 1 0 0 | 0 1 2 2 | 149 | 8 |
| 1 0 0 1 1 0 1 1 | 3 2 1 2 | 217 | 8 |
| 1 0 0 0 0 1 1 1 | 3 1 0 2 | 13 | 8 |
| 0 1 1 1 1 1 0 0 | 0 3 3 1 | 115 | 8 |
| 0 1 1 0 0 0 0 0 | 0 0 2 1 | 30 | 8 |
| 0 1 0 1 1 1 1 1 | 3 3 1 1 | 64 | 8 |
| 0 1 0 0 0 0 1 1 | 3 0 0 1 | 98 | 8 |
| 0 0 1 1 1 1 1 1 | 3 3 3 0 | 166 | 8 |
| 0 0 1 0 0 0 1 1 | 3 0 2 0 | 47 | 8 |
| 0 0 0 1 1 1 0 0 | 0 3 1 0 | 200 | 8 |
| 1 1 1 1 0 0 0 1 | 1 0 3 3 | 174 | 9 |
| 1 1 1 0 0 0 0 1 | 1 0 2 3 | 89 | 9 |
| 1 1 0 1 0 1 0 1 | 1 1 1 3 | 157 | 9 |
| 1 1 0 0 0 1 0 1 | 1 1 0 3 | 123 | 9 |
| 1 0 1 1 0 0 0 0 | 0 0 3 2 | 242 | 9 |
| 1 0 1 0 0 0 0 0 | 0 0 2 2 | 55 | 9 |
| 1 0 0 1 0 1 0 0 | 0 1 1 2 | 38 | 9 |
| 1 0 0 0 0 1 0 0 | 0 1 0 2 | 140 | 9 |
| 0 1 1 1 0 1 0 1 | 1 1 3 1 | 21 | 9 |
| 0 1 1 0 0 1 0 1 | 1 1 2 1 | 72 | 9 |
| 0 1 0 1 0 0 0 1 | 1 0 1 1 | 208 | 9 |
| 0 1 0 0 0 0 0 1 | 1 0 0 1 | 191 | 9 |
| 0 0 1 1 0 1 0 0 | 0 1 3 0 | 106 | 9 |
| 0 0 1 0 0 1 0 0 | 0 1 2 0 | 225 | 9 |
| 0 0 0 1 0 0 0 0 | 0 0 1 0 | 4 | 9 |
| 1 1 1 1 1 1 0 1 | 1 3 3 3 | 80 | 10 |
| 1 1 1 1 0 0 1 1 | 3 0 3 3 | 233 | 10 |
| 1 1 0 0 1 1 0 1 | 1 3 0 3 | 12 | 10 |
| 1 1 0 0 0 0 1 1 | 3 0 0 3 | 216 | 10 |
| 1 0 1 0 0 0 0 1 | 1 0 2 2 | 63 | 10 |
| 1 0 1 0 1 1 1 1 | 3 3 2 2 | 97 | 10 |
| 1 0 0 1 1 1 1 1 | 3 3 1 2 | 46 | 10 |
| 1 0 0 1 0 0 0 1 | 1 0 1 2 | 165 | 10 |
| 0 1 1 0 0 0 1 0 | 2 0 2 1 | 182 | 10 |
| 0 1 1 0 1 1 0 0 | 0 3 2 1 | 250 | 10 |
| 0 1 0 1 1 1 0 0 | 0 3 1 1 | 131 | 10 |
| 0 1 0 1 0 0 1 0 | 2 0 1 1 | 148 | 10 |
| 0 0 1 1 0 0 0 0 | 0 0 3 0 | 29 | 10 |
| 0 0 1 1 1 1 1 0 | 2 3 3 0 | 114 | 10 |
| 0 0 0 0 1 1 1 0 | 2 3 0 0 | 199 | 10 |
| 1 1 1 1 1 1 1 0 | 2 3 3 3 | 88 | 11 |
| 1 1 1 1 0 1 1 0 | 2 1 3 3 | 173 | 11 |
| 1 1 1 0 1 1 0 0 | 0 3 2 3 | 122 | 11 |
| 1 1 1 0 0 1 0 0 | 0 1 2 3 | 156 | 11 |
| 1 0 1 1 0 1 0 0 | 0 1 3 2 | 20 | 11 |
| 1 0 1 1 1 1 0 0 | 0 3 3 2 | 71 | 11 |
| 1 0 1 0 1 1 1 0 | 2 3 2 2 | 190 | 11 |
| 1 0 1 0 0 1 1 0 | 2 1 2 2 | 207 | 11 |
| 0 1 0 1 0 0 0 0 | 0 0 1 1 | 54 | 11 |
| 0 1 0 1 1 0 0 0 | 0 2 1 1 | 241 | 11 |
| 0 1 0 0 1 0 1 0 | 2 2 0 1 | 37 | 11 |
| 0 1 0 0 0 0 1 0 | 2 0 0 1 | 139 | 11 |
| 0 0 0 1 1 0 1 0 | 2 2 1 0 | 105 | 11 |
| 0 0 0 1 0 0 1 0 | 2 0 1 0 | 224 | 11 |
| 0 0 0 0 1 0 0 0 | 0 2 0 0 | 3 | 11 |

| pn(x) | pre_dec index | | |
|---|---|---|---|
| m= 7 6 5 4 3 2 1 0 | A B C D | n | 15n(17) |
| 1 1 1 1 0 0 0 0 | 0 0 3 3 | 79 | 12 |
| 1 1 1 1 0 1 1 1 | 3 1 3 3 | 232 | 12 |
| 1 1 1 0 1 0 0 0 | 0 2 2 3 | 11 | 12 |
| 1 1 1 0 1 1 1 1 | 3 3 2 3 | 215 | 12 |
| 1 1 0 1 1 1 1 0 | 2 3 1 3 | 62 | 12 |
| 1 1 0 1 1 0 0 1 | 1 2 1 3 | 96 | 12 |
| 1 1 0 0 0 0 0 1 | 1 0 0 3 | 45 | 12 |
| 1 1 0 0 0 1 1 0 | 2 1 0 3 | 164 | 12 |
| 0 0 1 1 0 0 0 1 | 1 0 3 0 | 181 | 12 |
| 0 0 1 1 0 1 1 0 | 2 1 3 0 | 249 | 12 |
| 0 0 1 0 1 1 1 0 | 2 3 2 0 | 130 | 12 |
| 0 0 1 0 1 0 0 1 | 1 2 2 0 | 147 | 12 |
| 0 0 0 1 1 0 0 0 | 0 2 1 0 | 28 | 12 |
| 0 0 0 1 1 1 1 1 | 3 3 1 0 | 113 | 12 |
| 0 0 0 0 0 1 1 1 | 3 1 0 0 | 198 | 12 |
| 0 1 1 1 1 1 1 1 | 3 3 3 1 | 87 | 13 |
| 0 1 1 1 1 0 1 1 | 3 2 3 1 | 172 | 13 |
| 0 1 1 1 0 1 1 0 | 2 1 3 1 | 121 | 13 |
| 0 1 1 1 0 0 1 0 | 2 0 3 1 | 155 | 13 |
| 0 1 0 1 1 0 1 0 | 2 2 1 1 | 19 | 13 |
| 0 1 0 1 1 1 1 0 | 2 3 1 1 | 70 | 13 |
| 0 1 0 1 0 1 1 1 | 3 1 1 1 | 189 | 13 |
| 0 1 0 1 0 0 1 1 | 3 0 1 1 | 206 | 13 |
| 0 0 1 0 1 0 0 0 | 0 2 2 0 | 53 | 13 |
| 0 0 1 0 1 1 0 0 | 0 3 2 0 | 240 | 13 |
| 0 0 1 0 0 1 0 1 | 1 1 2 0 | 36 | 13 |
| 0 0 1 0 0 0 0 1 | 1 0 2 0 | 138 | 13 |
| 0 0 0 0 1 1 0 1 | 1 3 0 0 | 104 | 13 |
| 0 0 0 0 1 0 0 1 | 1 2 0 0 | 223 | 13 |
| 0 0 0 0 0 1 0 0 | 0 1 0 0 | 2 | 13 |
| 1 1 1 1 1 0 0 1 | 1 2 3 3 | 214 | 14 |
| 1 1 1 1 0 1 0 1 | 1 1 3 3 | 231 | 14 |
| 1 1 1 0 1 1 1 0 | 2 3 2 3 | 44 | 14 |
| 1 1 1 0 0 0 1 0 | 2 0 2 3 | 95 | 14 |
| 1 0 0 1 1 0 1 0 | 2 2 1 2 | 146 | 14 |
| 1 0 0 1 0 1 1 0 | 2 1 1 2 | 180 | 14 |
| 1 0 0 0 0 0 0 1 | 1 0 0 2 | 112 | 14 |
| 1 0 0 0 1 1 0 1 | 1 3 0 2 | 197 | 14 |
| 0 1 1 1 0 1 0 0 | 0 1 3 1 | 10 | 14 |
| 0 1 1 1 1 0 0 0 | 0 2 3 1 | 78 | 14 |
| 0 1 1 0 1 1 1 1 | 3 3 2 1 | 61 | 14 |
| 0 1 1 0 0 0 1 1 | 3 0 2 1 | 163 | 14 |
| 0 0 0 1 0 1 1 1 | 3 1 1 0 | 129 | 14 |
| 0 0 0 1 1 0 1 1 | 3 2 1 0 | 248 | 14 |
| 0 0 0 0 1 1 0 0 | 0 3 0 0 | 27 | 14 |
| 1 0 1 1 0 0 0 1 | 1 0 3 2 | 86 | 15 |
| 1 0 1 1 0 0 1 1 | 3 0 3 2 | 171 | 15 |
| 1 0 1 0 0 1 0 1 | 1 1 2 2 | 188 | 15 |
| 1 0 1 0 0 1 1 1 | 3 1 2 2 | 205 | 15 |
| 1 0 0 1 1 1 0 0 | 0 3 1 2 | 35 | 15 |
| 1 0 0 1 1 1 1 0 | 2 3 1 2 | 137 | 15 |
| 1 0 0 0 1 0 0 0 | 0 2 0 2 | 103 | 15 |
| 1 0 0 0 1 0 1 0 | 2 2 0 2 | 222 | 15 |
| 0 0 1 1 1 0 1 1 | 3 2 3 0 | 120 | 15 |
| 0 0 1 1 1 0 0 1 | 1 2 3 0 | 154 | 15 |
| 0 0 1 0 1 1 0 1 | 1 3 2 0 | 18 | 15 |
| 0 0 1 0 1 1 1 1 | 3 3 2 0 | 69 | 15 |
| 0 0 0 1 0 1 0 0 | 0 1 1 0 | 52 | 15 |
| 0 0 0 1 0 1 1 0 | 2 1 1 0 | 239 | 15 |
| 0 0 0 0 0 0 1 0 | 2 0 0 0 | 1 | 15 |

FIG. 17C

| pn(x) | pre_dec index | | |
|---|---|---|---|
| m= 7 6 5 4 3 2 1 0 | A B C D | n | 15n(17) |
| 1 1 1 1 0 0 1 0 | 2 0 3 3 | 213 | 16 |
| 1 1 1 1 0 1 0 0 | 0 1 3 3 | 230 | 16 |
| 1 1 0 0 1 1 1 0 | 2 3 0 3 | 111 | 16 |
| 1 1 0 0 1 0 0 0 | 0 2 0 3 | 196 | 16 |
| 1 0 1 1 1 0 0 1 | 1 2 3 2 | 60 | 16 |
| 1 0 1 1 1 1 1 1 | 3 3 3 2 | 162 | 16 |
| 1 0 0 0 0 1 0 1 | 1 1 0 2 | 128 | 16 |
| 1 0 0 0 0 0 1 1 | 3 0 0 2 | 247 | 16 |
| 0 1 1 1 0 1 1 1 | 3 1 3 1 | 43 | 16 |
| 0 1 1 1 0 0 0 1 | 1 0 3 1 | 94 | 16 |
| 0 1 0 0 1 1 0 1 | 1 3 0 1 | 145 | 16 |
| 0 1 0 0 1 0 1 1 | 3 2 0 1 | 179 | 16 |
| 0 0 1 1 1 0 1 0 | 2 2 3 0 | 9 | 16 |
| 0 0 1 1 1 1 0 0 | 0 3 3 0 | 77 | 16 |
| 0 0 0 0 0 1 1 0 | 2 1 0 0 | 26 | 16 |

FIG. 18

| | | x(-1) | | x2 | | x(-2) | | x3 | | x(-3) | | x1/2 | |
|---|---|---|---|---|---|---|---|---|---|---|---|---|---|
| 15n(17) | 17n(15) | -15n(17) | -17n(15) | 30n(17) | 34n(15) | -30n(17) | -34n(15) | 45n(17) | 51n(15) | -45n(17) | -51n(15) | 15n/2(17) | 17n/2(15) |
| 0 | 0 | 0 | 0 | 0 | 0 | 0 | 0 | 0 | 0 | 0 | 0 | 0 | 0 |
| 1 | 1 | 16 | 14 | 2 | 2 | 15 | 13 | 3 | 3 | 14 | 12 | 9 | 8 |
| 2 | 2 | 15 | 13 | 4 | 4 | 13 | 11 | 6 | 6 | 11 | 9 | 1 | 1 |
| 3 | 3 | 14 | 12 | 6 | 6 | 11 | 9 | 9 | 9 | 8 | 6 | 10 | 9 |
| 4 | 4 | 13 | 11 | 8 | 8 | 9 | 7 | 12 | 12 | 5 | 3 | 2 | 2 |
| 5 | 5 | 12 | 10 | 10 | 10 | 7 | 5 | 15 | 0 | 2 | 0 | 11 | 10 |
| 6 | 6 | 11 | 9 | 12 | 12 | 5 | 3 | 1 | 3 | 16 | 12 | 3 | 3 |
| 7 | 7 | 10 | 8 | 14 | 14 | 3 | 1 | 4 | 6 | 13 | 9 | 12 | 11 |
| 8 | 8 | 9 | 7 | 16 | 1 | 1 | 14 | 7 | 9 | 10 | 6 | 4 | 4 |
| 9 | 9 | 8 | 6 | 1 | 3 | 16 | 12 | 10 | 12 | 7 | 3 | 13 | 12 |
| 10 | 10 | 7 | 5 | 3 | 5 | 14 | 10 | 13 | 0 | 4 | 0 | 5 | 5 |
| 11 | 11 | 6 | 4 | 5 | 7 | 12 | 8 | 16 | 3 | 1 | 12 | 14 | 13 |
| 12 | 12 | 5 | 3 | 7 | 9 | 10 | 6 | 2 | 6 | 15 | 9 | 6 | 6 |
| 13 | 13 | 4 | 2 | 9 | 11 | 8 | 4 | 5 | 9 | 12 | 6 | 15 | 14 |
| 14 | 14 | 3 | 1 | 11 | 13 | 6 | 2 | 8 | 12 | 9 | 3 | 7 | 7 |
| 15 | | 2 | | 13 | | 4 | | 11 | | 6 | | 16 | |
| 16 | | 1 | | 15 | | 2 | | 14 | | 3 | | 8 | |

FIG. 34A

| pn(x) | | | | | | | | | index | | | | input 15n(17) | | | | | | | | |
|---|---|---|---|---|---|---|---|---|---|---|---|---|---|---|---|---|---|---|---|---|
| m= | 7 | 6 | 5 | 4 | 3 | 2 | 1 | 0 | n | 15n(17) | 17n(15) | m= | 7 | 6 | 5 | 4 | 3 | 2 | 1 | 0 |
| | 0 | 0 | 0 | 0 | 0 | 0 | 0 | 1 | 0 | 0 | 0 | | | | | | | | | 0 |
| | 0 | 1 | 1 | 0 | 0 | 1 | 0 | 0 | 195 | 1 | 0 | | | 1 | 1 | | | 1 | | |
| | 1 | 0 | 1 | 0 | 1 | 0 | 0 | 1 | 135 | 2 | 0 | | 2 | | 2 | | 2 | | | 2 |
| | 0 | 0 | 0 | 0 | 1 | 1 | 1 | 1 | 75 | 3 | 0 | | | | | | 3 | 3 | 3 | 3 |
| | 0 | 0 | 1 | 0 | 0 | 1 | 1 | 0 | 15 | 4 | 0 | | | | 4 | | | 4 | 4 | |
| | 0 | 1 | 0 | 1 | 1 | 0 | 0 | 1 | 210 | 5 | 0 | | | 5 | | 5 | 5 | | | 5 |
| | 0 | 1 | 0 | 1 | 0 | 1 | 0 | 1 | 150 | 6 | 0 | | | 6 | | 6 | | 6 | | 6 |
| | 1 | 1 | 0 | 1 | 1 | 1 | 1 | 1 | 90 | 7 | 0 | | 7 | 7 | | 7 | 7 | 7 | 7 | 7 |
| | 0 | 1 | 1 | 0 | 0 | 0 | 0 | 0 | 30 | 8 | 0 | | | 8 | 8 | | | | | |
| | 0 | 0 | 1 | 0 | 0 | 1 | 0 | 0 | 225 | 9 | 0 | | | | 9 | | | 9 | | |
| | 1 | 0 | 0 | 1 | 0 | 0 | 0 | 1 | 165 | 10 | 0 | | 10 | | | 10 | | | | 10 |
| | 0 | 0 | 0 | 1 | 1 | 0 | 1 | 0 | 105 | 11 | 0 | | | | | 11 | 11 | | 11 | |
| | 1 | 1 | 0 | 0 | 0 | 0 | 0 | 1 | 45 | 12 | 0 | | 12 | 12 | | | | | | 12 |
| | 0 | 0 | 1 | 0 | 1 | 1 | 0 | 0 | 240 | 13 | 0 | | | | 13 | | 13 | 13 | | |
| | 1 | 0 | 0 | 1 | 0 | 1 | 1 | 0 | 180 | 14 | 0 | | 14 | | | 14 | | 14 | 14 | |
| | 0 | 0 | 1 | 1 | 1 | 0 | 1 | 1 | 120 | 15 | 0 | | | | 15 | 15 | 15 | | 15 | 15 |
| | 1 | 0 | 1 | 1 | 1 | 0 | 0 | 1 | 60 | 16 | 0 | | 16 | | 16 | 16 | 16 | | | 16 |
| | 1 | 0 | 0 | 1 | 1 | 0 | 0 | 1 | 68 | 0 | 1 | | 0 | | | 0 | 0 | | | 0 |
| | 0 | 0 | 0 | 1 | 1 | 1 | 0 | 1 | 8 | 1 | 1 | | | | | 1 | 1 | 1 | | 1 |
| | 1 | 1 | 1 | 0 | 0 | 0 | 0 | 0 | 203 | 2 | 1 | | 2 | 2 | 2 | | | | | |
| | 0 | 1 | 0 | 1 | 0 | 1 | 0 | 0 | 143 | 3 | 1 | | | 3 | | 3 | | 3 | | |
| | 1 | 0 | 1 | 1 | 1 | 0 | 1 | 1 | 83 | 4 | 1 | | 4 | | 4 | 4 | 4 | | 4 | 4 |
| | 1 | 1 | 0 | 0 | 1 | 0 | 0 | 1 | 23 | 5 | 1 | | 5 | 5 | | | 5 | | | 5 |
| | 0 | 0 | 1 | 0 | 1 | 0 | 1 | 1 | 218 | 6 | 1 | | | | 6 | | 6 | | 6 | 6 |
| | 1 | 0 | 1 | 1 | 0 | 1 | 1 | 1 | 158 | 7 | 1 | | 7 | | 7 | 7 | | 7 | 7 | 7 |
| | 0 | 1 | 0 | 0 | 0 | 0 | 1 | 1 | 98 | 8 | 1 | | | 8 | | | | | 8 | 8 |
| | 1 | 0 | 0 | 1 | 0 | 1 | 0 | 0 | 38 | 9 | 1 | | 9 | | | 9 | | 9 | | |
| | 1 | 1 | 1 | 1 | 0 | 0 | 1 | 1 | 233 | 10 | 1 | | 10 | 10 | 10 | 10 | | | 10 | 10 |
| | 1 | 1 | 1 | 1 | 0 | 1 | 1 | 0 | 173 | 11 | 1 | | 11 | 11 | 11 | 11 | | 11 | 11 | |
| | 0 | 0 | 0 | 1 | 1 | 1 | 1 | 1 | 113 | 12 | 1 | | | | | 12 | 12 | 12 | 12 | 12 |
| | 0 | 0 | 1 | 0 | 1 | 0 | 0 | 0 | 53 | 13 | 1 | | | | 13 | | 13 | | | |
| | 0 | 0 | 0 | 1 | 1 | 0 | 1 | 1 | 248 | 14 | 1 | | | | | 14 | 14 | | 14 | 14 |
| | 1 | 0 | 1 | 0 | 0 | 1 | 0 | 1 | 188 | 15 | 1 | | 15 | | 15 | | | 15 | | 15 |
| | 1 | 0 | 0 | 0 | 0 | 1 | 0 | 1 | 128 | 16 | 1 | | 16 | | | | | 16 | | 16 |
| | 0 | 1 | 0 | 0 | 1 | 1 | 1 | 1 | 136 | 0 | 2 | | | 0 | | | 0 | 0 | 0 | 0 |
| | 0 | 0 | 0 | 1 | 1 | 1 | 1 | 0 | 76 | 1 | 2 | | | | | 1 | 1 | 1 | 1 | |
| | 0 | 1 | 0 | 0 | 1 | 1 | 0 | 0 | 16 | 2 | 2 | | | 2 | | | 2 | 2 | | |
| | 1 | 0 | 1 | 1 | 0 | 0 | 1 | 0 | 211 | 3 | 2 | | 3 | | 3 | 3 | | | 3 | |
| | 1 | 0 | 1 | 0 | 1 | 0 | 1 | 0 | 151 | 4 | 2 | | 4 | | 4 | | 4 | | 4 | |
| | 1 | 0 | 1 | 0 | 0 | 0 | 1 | 1 | 91 | 5 | 2 | | 5 | | 5 | | | | 5 | 5 |
| | 1 | 1 | 0 | 0 | 0 | 0 | 0 | 0 | 31 | 6 | 2 | | 6 | 6 | | | | | | |
| | 0 | 1 | 0 | 0 | 1 | 0 | 0 | 0 | 226 | 7 | 2 | | | 7 | | | 7 | | | |
| | 0 | 0 | 1 | 1 | 1 | 1 | 1 | 1 | 166 | 8 | 2 | | | | 8 | 8 | 8 | 8 | 8 | 8 |
| | 0 | 0 | 1 | 1 | 0 | 1 | 0 | 0 | 106 | 9 | 2 | | | | 9 | 9 | | 9 | | |
| | 1 | 0 | 0 | 1 | 1 | 1 | 1 | 1 | 46 | 10 | 2 | | 10 | | | 10 | 10 | 10 | 10 | 10 |
| | 0 | 1 | 0 | 1 | 1 | 0 | 0 | 0 | 241 | 11 | 2 | | | 11 | | 11 | 11 | | | |
| | 0 | 0 | 1 | 1 | 0 | 0 | 0 | 1 | 181 | 12 | 2 | | | | 12 | 12 | | | | 12 |
| | 0 | 1 | 1 | 1 | 0 | 1 | 1 | 0 | 121 | 13 | 2 | | | 13 | 13 | 13 | | 13 | 13 | |
| | 0 | 1 | 1 | 0 | 1 | 1 | 1 | 1 | 61 | 14 | 2 | | | 14 | 14 | | 14 | 14 | 14 | 14 |
| | 0 | 0 | 0 | 0 | 0 | 0 | 1 | 0 | 1 | 15 | 2 | | | | | | | | 15 | |
| | 1 | 1 | 0 | 0 | 1 | 0 | 0 | 0 | 196 | 16 | 2 | | 16 | 16 | | | 16 | | | |

FIG. 34B

| pn(x) | | | | | | | | | index | | | input 15n(17) | | | | | | | | |
|---|---|---|---|---|---|---|---|---|---|---|---|---|---|---|---|---|---|---|---|---|
| m= | 7 | 6 | 5 | 4 | 3 | 2 | 1 | 0 | n | 15n(17) | 17n(15) | m= | 7 | 6 | 5 | 4 | 3 | 2 | 1 | 0 |
| | 1 | 1 | 0 | 1 | 1 | 1 | 0 | 1 | 204 | 0 | 3 | | 0 | 0 | | 0 | 0 | 0 | | 0 |
| | 1 | 0 | 1 | 0 | 1 | 0 | 0 | 0 | 144 | 1 | 3 | | 1 | | 1 | | 1 | | | |
| | 0 | 1 | 1 | 0 | 1 | 0 | 1 | 1 | 84 | 2 | 3 | | | 2 | 2 | | 2 | | 2 | 2 |
| | 1 | 0 | 0 | 0 | 1 | 1 | 1 | 1 | 24 | 3 | 3 | | 3 | | | | 3 | 3 | 3 | 3 |
| | 0 | 1 | 0 | 1 | 0 | 1 | 1 | 0 | 219 | 4 | 3 | | | 4 | | 4 | | 4 | 4 | |
| | 0 | 1 | 1 | 1 | 0 | 0 | 1 | 1 | 159 | 5 | 3 | | | 5 | 5 | 5 | | | 5 | 5 |
| | 1 | 0 | 0 | 0 | 0 | 1 | 1 | 0 | 99 | 6 | 3 | | 6 | | | | | 6 | 6 | |
| | 0 | 0 | 1 | 1 | 0 | 1 | 0 | 1 | 39 | 7 | 3 | | | | 7 | 7 | | 7 | | 7 |
| | 1 | 1 | 1 | 1 | 1 | 0 | 1 | 1 | 234 | 8 | 3 | | 8 | 8 | 8 | 8 | 8 | | 8 | 8 |
| | 1 | 1 | 1 | 1 | 0 | 0 | 0 | 1 | 174 | 9 | 3 | | 9 | 9 | 9 | 9 | | | | 9 |
| | 0 | 0 | 1 | 1 | 1 | 1 | 1 | 0 | 114 | 10 | 3 | | | | 10 | 10 | 10 | 10 | 10 | |
| | 0 | 1 | 0 | 1 | 0 | 0 | 0 | 0 | 54 | 11 | 3 | | | 11 | | 11 | | | | |
| | 0 | 0 | 1 | 1 | 0 | 1 | 1 | 0 | 249 | 12 | 3 | | | | 12 | 12 | | 12 | 12 | |
| | 0 | 1 | 0 | 1 | 0 | 1 | 1 | 1 | 189 | 13 | 3 | | | 13 | | 13 | | 13 | 13 | 13 |
| | 0 | 0 | 0 | 1 | 0 | 1 | 1 | 1 | 129 | 14 | 3 | | | | | 14 | | 14 | 14 | 14 |
| | 0 | 0 | 1 | 0 | 1 | 1 | 1 | 1 | 69 | 15 | 3 | | | | 15 | | 15 | 15 | 15 | 15 |
| | 0 | 0 | 1 | 1 | 1 | 0 | 1 | 0 | 9 | 16 | 3 | | | | 16 | 16 | 16 | | 16 | |
| | 1 | 0 | 0 | 1 | 1 | 0 | 0 | 0 | 17 | 0 | 4 | | 0 | | | 0 | 0 | | | |
| | 0 | 1 | 1 | 1 | 1 | 0 | 0 | 1 | 212 | 1 | 4 | | | 1 | 1 | 1 | 1 | | | 1 |
| | 0 | 1 | 0 | 0 | 1 | 0 | 0 | 1 | 152 | 2 | 4 | | | 2 | | | 2 | | | 2 |
| | 0 | 1 | 0 | 1 | 1 | 0 | 1 | 1 | 92 | 3 | 4 | | | 3 | | 3 | 3 | | 3 | 3 |
| | 1 | 0 | 0 | 1 | 1 | 1 | 0 | 1 | 32 | 4 | 4 | | 4 | | | 4 | 4 | 4 | | 4 |
| | 1 | 0 | 0 | 1 | 0 | 0 | 0 | 0 | 227 | 5 | 4 | | 5 | | | 5 | | | | |
| | 0 | 1 | 1 | 1 | 1 | 1 | 1 | 0 | 167 | 6 | 4 | | | 6 | 6 | 6 | 6 | 6 | 6 | |
| | 0 | 1 | 1 | 0 | 1 | 0 | 0 | 0 | 107 | 7 | 4 | | | 7 | 7 | | 7 | | | |
| | 0 | 0 | 1 | 0 | 0 | 0 | 1 | 1 | 47 | 8 | 4 | | | | 8 | | | | 8 | 8 |
| | 1 | 0 | 1 | 1 | 0 | 0 | 0 | 0 | 242 | 9 | 4 | | 9 | | 9 | 9 | | | | |
| | 0 | 1 | 1 | 0 | 0 | 0 | 1 | 0 | 182 | 10 | 4 | | | 10 | 10 | | | | 10 | |
| | 1 | 1 | 1 | 0 | 1 | 1 | 0 | 0 | 122 | 11 | 4 | | 11 | 11 | 11 | | 11 | 11 | | |
| | 1 | 1 | 0 | 1 | 1 | 1 | 1 | 0 | 62 | 12 | 4 | | 12 | 12 | | 12 | 12 | 12 | 12 | |
| | 0 | 0 | 0 | 0 | 0 | 1 | 0 | 0 | 2 | 13 | 4 | | | | | | | 13 | | |
| | 1 | 0 | 0 | 0 | 1 | 1 | 0 | 1 | 197 | 14 | 4 | | 14 | | | | 14 | 14 | | 14 |
| | 1 | 0 | 0 | 1 | 1 | 1 | 1 | 0 | 137 | 15 | 4 | | 15 | | | 15 | 15 | 15 | 15 | |
| | 0 | 0 | 1 | 1 | 1 | 1 | 0 | 0 | 77 | 16 | 4 | | | | 16 | 16 | 16 | 16 | | |
| | 1 | 1 | 0 | 1 | 0 | 1 | 1 | 0 | 85 | 0 | 5 | | 0 | 0 | | 0 | | 0 | 0 | |
| | 0 | 0 | 0 | 0 | 0 | 0 | 1 | 1 | 25 | 1 | 5 | | | | | | | | 1 | 1 |
| | 1 | 0 | 1 | 0 | 1 | 1 | 0 | 0 | 220 | 2 | 5 | | 2 | | 2 | | 2 | 2 | | |
| | 1 | 1 | 1 | 0 | 0 | 1 | 1 | 0 | 160 | 3 | 5 | | 3 | 3 | 3 | | | 3 | 3 | |
| | 0 | 0 | 0 | 1 | 0 | 0 | 0 | 1 | 100 | 4 | 5 | | | | | 4 | | | | 4 |
| | 0 | 1 | 1 | 0 | 1 | 0 | 1 | 0 | 40 | 5 | 5 | | | 5 | 5 | | 5 | | 5 | |
| | 1 | 1 | 1 | 0 | 1 | 0 | 1 | 1 | 235 | 6 | 5 | | 6 | 6 | 6 | | 6 | | 6 | 6 |
| | 1 | 1 | 1 | 1 | 1 | 1 | 1 | 1 | 175 | 7 | 5 | | 7 | 7 | 7 | 7 | 7 | 7 | 7 | 7 |
| | 0 | 1 | 1 | 1 | 1 | 1 | 0 | 0 | 115 | 8 | 5 | | | 8 | 8 | 8 | 8 | 8 | | |
| | 1 | 0 | 1 | 0 | 0 | 0 | 0 | 0 | 55 | 9 | 5 | | 9 | | 9 | | | | | |
| | 0 | 1 | 1 | 0 | 1 | 1 | 0 | 0 | 250 | 10 | 5 | | | 10 | 10 | | 10 | 10 | | |
| | 1 | 0 | 1 | 0 | 1 | 1 | 1 | 0 | 190 | 11 | 5 | | 11 | | 11 | | 11 | 11 | 11 | |
| | 0 | 0 | 1 | 0 | 1 | 1 | 1 | 0 | 130 | 12 | 5 | | | | 12 | | 12 | 12 | 12 | |
| | 0 | 1 | 0 | 1 | 1 | 1 | 1 | 0 | 70 | 13 | 5 | | | 13 | | 13 | 13 | 13 | 13 | |
| | 0 | 1 | 1 | 1 | 0 | 1 | 0 | 0 | 10 | 14 | 5 | | | 14 | 14 | 14 | | 14 | | |
| | 1 | 0 | 1 | 0 | 0 | 1 | 1 | 1 | 205 | 15 | 5 | | 15 | | 15 | | | 15 | 15 | 15 |
| | 0 | 1 | 0 | 0 | 1 | 1 | 0 | 1 | 145 | 16 | 5 | | | 16 | | | 16 | 16 | | 16 |

FIG. 34C

| pn(x) | | | | | | | | | index | | | input 15n(17) | | | | | | | | |
|---|---|---|---|---|---|---|---|---|---|---|---|---|---|---|---|---|---|---|---|---|
| m= | 7 | 6 | 5 | 4 | 3 | 2 | 1 | 0 | n | 15n(17) | 17n(15) | m= | 7 | 6 | 5 | 4 | 3 | 2 | 1 | 0 |
| | 1 | 0 | 0 | 1 | 0 | 0 | 1 | 0 | 153 | 0 | 6 | | 0 | | | 0 | | | 0 | |
| | 1 | 0 | 1 | 1 | 0 | 1 | 1 | 0 | 93 | 1 | 6 | | 1 | | 1 | 1 | | 1 | 1 | |
| | 0 | 0 | 1 | 0 | 0 | 1 | 1 | 1 | 33 | 2 | 6 | | | | 2 | | | 2 | 2 | 2 |
| | 0 | 0 | 1 | 1 | 1 | 1 | 0 | 1 | 228 | 3 | 6 | | | | 3 | 3 | 3 | 3 | | 3 |
| | 1 | 1 | 1 | 1 | 1 | 1 | 0 | 0 | 168 | 4 | 6 | | 4 | 4 | 4 | 4 | 4 | 4 | | |
| | 1 | 1 | 0 | 1 | 0 | 0 | 0 | 0 | 108 | 5 | 6 | | 5 | 5 | | 5 | | | | |
| | 0 | 1 | 0 | 0 | 0 | 1 | 1 | 0 | 48 | 6 | 6 | | | 6 | | | | 6 | 6 | |
| | 0 | 1 | 1 | 1 | 1 | 1 | 0 | 1 | 243 | 7 | 6 | | | 7 | 7 | 7 | 7 | 7 | | 7 |
| | 1 | 1 | 0 | 0 | 0 | 1 | 0 | 0 | 183 | 8 | 6 | | 8 | 8 | | | | 8 | | |
| | 1 | 1 | 0 | 0 | 0 | 1 | 0 | 1 | 123 | 9 | 6 | | 9 | 9 | | | | 9 | | 9 |
| | 1 | 0 | 1 | 0 | 0 | 0 | 0 | 1 | 63 | 10 | 6 | | 10 | | 10 | | | | | 10 |
| | 0 | 0 | 0 | 0 | 1 | 0 | 0 | 0 | 3 | 11 | 6 | | | | | | 11 | | | |
| | 0 | 0 | 0 | 0 | 0 | 1 | 1 | 1 | 198 | 12 | 6 | | | | | | | 12 | 12 | 12 |
| | 0 | 0 | 1 | 0 | 0 | 0 | 0 | 1 | 138 | 13 | 6 | | | | 13 | | | | | 13 |
| | 0 | 1 | 1 | 1 | 1 | 0 | 0 | 0 | 78 | 14 | 6 | | | 14 | 14 | 14 | 14 | | | |
| | 0 | 0 | 1 | 0 | 1 | 1 | 0 | 1 | 18 | 15 | 6 | | | | 15 | | 15 | 15 | | 15 |
| | 1 | 1 | 1 | 1 | 0 | 0 | 1 | 0 | 213 | 16 | 6 | | 16 | 16 | 16 | 16 | | | 16 | |
| | 0 | 1 | 0 | 0 | 0 | 1 | 0 | 1 | 221 | 0 | 7 | | | 0 | | | | 0 | | 0 |
| | 1 | 1 | 0 | 1 | 0 | 0 | 0 | 1 | 161 | 1 | 7 | | 1 | 1 | | 1 | | | | 1 |
| | 0 | 0 | 1 | 0 | 0 | 0 | 1 | 0 | 101 | 2 | 7 | | | | 2 | | | | 2 | |
| | 1 | 1 | 0 | 1 | 0 | 1 | 0 | 0 | 41 | 3 | 7 | | 3 | 3 | | 3 | | 3 | | |
| | 1 | 1 | 0 | 0 | 1 | 0 | 1 | 1 | 236 | 4 | 7 | | 4 | 4 | | | 4 | | 4 | 4 |
| | 1 | 1 | 1 | 0 | 0 | 0 | 1 | 1 | 176 | 5 | 7 | | 5 | 5 | 5 | | | | 5 | 5 |
| | 1 | 1 | 1 | 1 | 1 | 0 | 0 | 0 | 116 | 6 | 7 | | 6 | 6 | 6 | 6 | 6 | | | |
| | 0 | 1 | 0 | 1 | 1 | 1 | 0 | 1 | 56 | 7 | 7 | | | 7 | | 7 | 7 | 7 | | 7 |
| | 1 | 1 | 0 | 1 | 1 | 0 | 0 | 0 | 251 | 8 | 7 | | 8 | 8 | | 8 | 8 | | | |
| | 0 | 1 | 0 | 0 | 0 | 0 | 0 | 1 | 191 | 9 | 7 | | | 9 | | | | | | 9 |
| | 0 | 1 | 0 | 1 | 1 | 1 | 0 | 0 | 131 | 10 | 7 | | | 10 | | 10 | 10 | 10 | | |
| | 1 | 0 | 1 | 1 | 1 | 1 | 0 | 0 | 71 | 11 | 7 | | 11 | | 11 | 11 | 11 | 11 | | |
| | 1 | 1 | 1 | 0 | 1 | 0 | 0 | 0 | 11 | 12 | 7 | | 12 | 12 | 12 | | 12 | | | |
| | 0 | 1 | 0 | 1 | 0 | 0 | 1 | 1 | 206 | 13 | 7 | | | 13 | | 13 | | | 13 | 13 |
| | 1 | 0 | 0 | 1 | 1 | 0 | 1 | 0 | 146 | 14 | 7 | | 14 | | | 14 | 14 | | 14 | |
| | 1 | 0 | 1 | 1 | 0 | 0 | 0 | 1 | 86 | 15 | 7 | | 15 | | 15 | 15 | | | | 15 |
| | 0 | 0 | 0 | 0 | 0 | 1 | 1 | 0 | 26 | 16 | 7 | | | | | | | 16 | 16 | |
| | 0 | 1 | 0 | 0 | 1 | 1 | 1 | 0 | 34 | 0 | 8 | | | 0 | | | 0 | 0 | 0 | |
| | 0 | 1 | 1 | 1 | 1 | 0 | 1 | 0 | 229 | 1 | 8 | | | 1 | 1 | 1 | 1 | | 1 | |
| | 1 | 1 | 1 | 0 | 0 | 1 | 0 | 1 | 169 | 2 | 8 | | 2 | 2 | 2 | | | 2 | | 2 |
| | 1 | 0 | 1 | 1 | 1 | 1 | 0 | 1 | 109 | 3 | 8 | | 3 | | 3 | 3 | 3 | 3 | | 3 |
| | 1 | 0 | 0 | 0 | 1 | 1 | 0 | 0 | 49 | 4 | 8 | | 4 | | | | 4 | 4 | | |
| | 1 | 1 | 1 | 1 | 1 | 0 | 1 | 0 | 244 | 5 | 8 | | 5 | 5 | 5 | 5 | 5 | | 5 | |
| | 1 | 0 | 0 | 1 | 0 | 1 | 0 | 1 | 184 | 6 | 8 | | 6 | | | 6 | | 6 | | 6 |
| | 1 | 0 | 0 | 1 | 0 | 1 | 1 | 1 | 124 | 7 | 8 | | 7 | | | 7 | | 7 | 7 | 7 |
| | 0 | 1 | 0 | 1 | 1 | 1 | 1 | 1 | 64 | 8 | 8 | | | 8 | | 8 | 8 | 8 | 8 | 8 |
| | 0 | 0 | 0 | 1 | 0 | 0 | 0 | 0 | 4 | 9 | 8 | | | | | 9 | | | | |
| | 0 | 0 | 0 | 0 | 1 | 1 | 1 | 0 | 199 | 10 | 8 | | | | | | 10 | 10 | 10 | |
| | 0 | 1 | 0 | 0 | 0 | 0 | 1 | 0 | 139 | 11 | 8 | | | 11 | | | | | 11 | |
| | 1 | 1 | 1 | 1 | 0 | 0 | 0 | 0 | 79 | 12 | 8 | | 12 | 12 | 12 | 12 | | | | |
| | 0 | 1 | 0 | 1 | 1 | 0 | 1 | 0 | 19 | 13 | 8 | | | 13 | | 13 | 13 | | 13 | |
| | 1 | 1 | 1 | 1 | 1 | 0 | 0 | 1 | 214 | 14 | 8 | | 14 | 14 | 14 | 14 | 14 | | | 14 |
| | 0 | 0 | 1 | 1 | 1 | 0 | 0 | 1 | 154 | 15 | 8 | | | | 15 | 15 | 15 | | | 15 |
| | 0 | 1 | 1 | 1 | 0 | 0 | 0 | 1 | 94 | 16 | 8 | | | 16 | 16 | 16 | | | | 16 |

FIG. 34D

| pn(x) | | | | | | | | | index | | | input 15n(17) | | | | | | | | |
|---|---|---|---|---|---|---|---|---|---|---|---|---|---|---|---|---|---|---|---|---|
| m= | 7 | 6 | 5 | 4 | 3 | 2 | 1 | 0 | n | 15n(17) | 17n(15) | m= | 7 | 6 | 5 | 4 | 3 | 2 | 1 | 0 |
| | 0 | 1 | 0 | 0 | 0 | 1 | 0 | 0 | 102 | 0 | 9 | | | 0 | | | | 0 | | |
| | 1 | 0 | 1 | 1 | 0 | 1 | 0 | 1 | 42 | 1 | 9 | | 1 | | 1 | 1 | | 1 | | 1 |
| | 1 | 0 | 0 | 0 | 1 | 0 | 1 | 1 | 237 | 2 | 9 | | 2 | | | | 2 | | 2 | 2 |
| | 1 | 1 | 0 | 1 | 1 | 0 | 1 | 1 | 177 | 3 | 9 | | 3 | 3 | | 3 | 3 | | 3 | 3 |
| | 1 | 1 | 1 | 0 | 1 | 1 | 0 | 1 | 117 | 4 | 9 | | 4 | 4 | 4 | | 4 | 4 | | 4 |
| | 1 | 0 | 1 | 1 | 1 | 0 | 1 | 0 | 57 | 5 | 9 | | 5 | | 5 | 5 | 5 | | 5 | |
| | 1 | 0 | 1 | 0 | 1 | 1 | 0 | 1 | 252 | 6 | 9 | | 6 | | 6 | | 6 | 6 | | 6 |
| | 1 | 0 | 0 | 0 | 0 | 0 | 1 | 0 | 192 | 7 | 9 | | 7 | | | | | | 7 | |
| | 1 | 0 | 1 | 1 | 1 | 0 | 0 | 0 | 132 | 8 | 9 | | 8 | | 8 | 8 | 8 | | | |
| | 0 | 1 | 1 | 0 | 0 | 1 | 0 | 1 | 72 | 9 | 9 | | | 9 | 9 | | | 9 | | 9 |
| | 1 | 1 | 0 | 0 | 1 | 1 | 0 | 1 | 12 | 10 | 9 | | 10 | 10 | | | 10 | 10 | | 10 |
| | 1 | 0 | 1 | 0 | 0 | 1 | 1 | 0 | 207 | 11 | 9 | | 11 | | 11 | | | 11 | 11 | |
| | 0 | 0 | 1 | 0 | 1 | 0 | 0 | 1 | 147 | 12 | 9 | | | | 12 | | 12 | | | 12 |
| | 0 | 1 | 1 | 1 | 1 | 1 | 1 | 1 | 87 | 13 | 9 | | | 13 | 13 | 13 | 13 | 13 | 13 | 13 |
| | 0 | 0 | 0 | 0 | 1 | 1 | 0 | 0 | 27 | 14 | 9 | | | | | | 14 | 14 | | |
| | 1 | 0 | 0 | 0 | 1 | 0 | 1 | 0 | 222 | 15 | 9 | | 15 | | | | 15 | | 15 | |
| | 1 | 0 | 1 | 1 | 1 | 1 | 1 | 1 | 162 | 16 | 9 | | 16 | | 16 | 16 | 16 | 16 | 16 | 16 |
| | 1 | 1 | 0 | 1 | 0 | 1 | 1 | 1 | 170 | 0 | 10 | | 0 | 0 | | 0 | | 0 | 0 | 0 |
| | 0 | 1 | 1 | 0 | 0 | 1 | 1 | 1 | 110 | 1 | 10 | | | 1 | 1 | | | 1 | 1 | 1 |
| | 0 | 0 | 0 | 0 | 0 | 1 | 0 | 1 | 50 | 2 | 10 | | | | | | | 2 | | 2 |
| | 1 | 1 | 1 | 0 | 1 | 0 | 0 | 1 | 245 | 3 | 10 | | 3 | 3 | 3 | | 3 | | | 3 |
| | 0 | 0 | 1 | 1 | 0 | 1 | 1 | 1 | 185 | 4 | 10 | | | | 4 | 4 | | 4 | 4 | 4 |
| | 0 | 0 | 1 | 1 | 0 | 0 | 1 | 1 | 125 | 5 | 10 | | | | 5 | 5 | | | 5 | 5 |
| | 1 | 0 | 1 | 1 | 1 | 1 | 1 | 0 | 65 | 6 | 10 | | 6 | | 6 | 6 | 6 | 6 | 6 | |
| | 0 | 0 | 1 | 0 | 0 | 0 | 0 | 0 | 5 | 7 | 10 | | | | 7 | | | | | |
| | 0 | 0 | 0 | 1 | 1 | 1 | 0 | 0 | 200 | 8 | 10 | | | | | 8 | 8 | 8 | | |
| | 1 | 0 | 0 | 0 | 0 | 1 | 0 | 0 | 140 | 9 | 10 | | 9 | | | | | 9 | | |
| | 1 | 1 | 1 | 1 | 1 | 1 | 0 | 1 | 80 | 10 | 10 | | 10 | 10 | 10 | 10 | 10 | 10 | | 10 |
| | 1 | 0 | 1 | 1 | 0 | 1 | 0 | 0 | 20 | 11 | 10 | | 11 | | 11 | 11 | | 11 | | |
| | 1 | 1 | 1 | 0 | 1 | 1 | 1 | 1 | 215 | 12 | 10 | | 12 | 12 | 12 | | 12 | 12 | 12 | 12 |
| | 0 | 1 | 1 | 1 | 0 | 0 | 1 | 0 | 155 | 13 | 10 | | | 13 | 13 | 13 | | | 13 | |
| | 1 | 1 | 1 | 0 | 0 | 0 | 1 | 0 | 95 | 14 | 10 | | 14 | 14 | 14 | | | | 14 | |
| | 1 | 0 | 0 | 1 | 1 | 1 | 0 | 0 | 35 | 15 | 10 | | 15 | | | 15 | 15 | 15 | | |
| | 1 | 1 | 1 | 1 | 0 | 1 | 0 | 0 | 230 | 16 | 10 | | 16 | 16 | 16 | 16 | | 16 | | |
| | 0 | 0 | 0 | 0 | 1 | 0 | 1 | 1 | 238 | 0 | 11 | | | | | | 0 | | 0 | 0 |
| | 1 | 0 | 1 | 0 | 1 | 0 | 1 | 1 | 178 | 1 | 11 | | 1 | | 1 | | 1 | | 1 | 1 |
| | 1 | 1 | 0 | 0 | 0 | 1 | 1 | 1 | 118 | 2 | 11 | | 2 | 2 | | | | 2 | 2 | 2 |
| | 0 | 1 | 1 | 0 | 1 | 0 | 0 | 1 | 58 | 3 | 11 | | | 3 | 3 | | 3 | | | 3 |
| | 0 | 1 | 0 | 0 | 0 | 1 | 1 | 1 | 253 | 4 | 11 | | | 4 | | | | 4 | 4 | 4 |
| | 0 | 0 | 0 | 1 | 1 | 0 | 0 | 1 | 193 | 5 | 11 | | | | | 5 | 5 | | | 5 |
| | 0 | 1 | 1 | 0 | 1 | 1 | 0 | 1 | 133 | 6 | 11 | | | 6 | 6 | | 6 | 6 | | 6 |
| | 1 | 1 | 0 | 0 | 1 | 0 | 1 | 0 | 73 | 7 | 11 | | 7 | 7 | | | 7 | | 7 | |
| | 1 | 0 | 0 | 0 | 0 | 1 | 1 | 1 | 13 | 8 | 11 | | 8 | | | | | 8 | 8 | 8 |
| | 0 | 1 | 0 | 1 | 0 | 0 | 0 | 1 | 208 | 9 | 11 | | | 9 | | 9 | | | | 9 |
| | 0 | 1 | 0 | 1 | 0 | 0 | 1 | 0 | 148 | 10 | 11 | | | 10 | | 10 | | | 10 | |
| | 1 | 1 | 1 | 1 | 1 | 1 | 1 | 0 | 88 | 11 | 11 | | 11 | 11 | 11 | 11 | 11 | 11 | 11 | |
| | 0 | 0 | 0 | 1 | 1 | 0 | 0 | 0 | 28 | 12 | 11 | | | | | 12 | 12 | | | |
| | 0 | 0 | 0 | 0 | 1 | 0 | 0 | 1 | 223 | 13 | 11 | | | | | | 13 | | | 13 |
| | 0 | 1 | 1 | 0 | 0 | 0 | 1 | 1 | 163 | 14 | 11 | | | 14 | 14 | | | | 14 | 14 |
| | 1 | 0 | 0 | 0 | 1 | 0 | 0 | 0 | 103 | 15 | 11 | | 15 | | | | 15 | | | |
| | 0 | 1 | 1 | 1 | 0 | 1 | 1 | 1 | 43 | 16 | 11 | | | 16 | 16 | 16 | | 16 | 16 | 16 |

FIG. 34E

| | pn(x) | | | | | | | | index | | | | input 15n(17) | | | | | | | |
|---|---|---|---|---|---|---|---|---|---|---|---|---|---|---|---|---|---|---|---|---|
| m= | 7 | 6 | 5 | 4 | 3 | 2 | 1 | 0 | n | 15n(17) | 17n(15) | m= | 7 | 6 | 5 | 4 | 3 | 2 | 1 | 0 |
| | 0 | 0 | 0 | 0 | 1 | 0 | 1 | 0 | 51 | 0 | 12 | | | | | | 0 | | 0 | |
| | 1 | 1 | 0 | 0 | 1 | 1 | 1 | 1 | 246 | 1 | 12 | | 1 | 1 | | | 1 | 1 | 1 | 1 |
| | 0 | 1 | 1 | 0 | 1 | 1 | 1 | 0 | 186 | 2 | 12 | | | 2 | 2 | | 2 | 2 | 2 | |
| | 0 | 1 | 1 | 0 | 0 | 1 | 1 | 0 | 126 | 3 | 12 | | | 3 | 3 | | | 3 | 3 | |
| | 0 | 1 | 1 | 0 | 0 | 0 | 0 | 1 | 66 | 4 | 12 | | | 4 | 4 | | | | | 4 |
| | 0 | 1 | 0 | 0 | 0 | 0 | 0 | 0 | 6 | 5 | 12 | | | 5 | | | | | | |
| | 0 | 0 | 1 | 1 | 1 | 0 | 0 | 0 | 201 | 6 | 12 | | | | 6 | 6 | 6 | | | |
| | 0 | 0 | 0 | 1 | 0 | 1 | 0 | 1 | 141 | 7 | 12 | | | | | 7 | | 7 | | 7 |
| | 1 | 1 | 1 | 0 | 0 | 1 | 1 | 1 | 81 | 8 | 12 | | 8 | 8 | 8 | | | 8 | 8 | 8 |
| | 0 | 1 | 1 | 1 | 0 | 1 | 0 | 1 | 21 | 9 | 12 | | | 9 | 9 | 9 | | 9 | | 9 |
| | 1 | 1 | 0 | 0 | 0 | 0 | 1 | 1 | 216 | 10 | 12 | | 10 | 10 | | | | | 10 | 10 |
| | 1 | 1 | 1 | 0 | 0 | 1 | 0 | 0 | 156 | 11 | 12 | | 11 | 11 | 11 | | | 11 | | |
| | 1 | 1 | 0 | 1 | 1 | 0 | 0 | 1 | 96 | 12 | 12 | | 12 | 12 | | 12 | 12 | | | 12 |
| | 0 | 0 | 1 | 0 | 0 | 1 | 0 | 1 | 36 | 13 | 12 | | | | 13 | | | 13 | | 13 |
| | 1 | 1 | 1 | 1 | 0 | 1 | 0 | 1 | 231 | 14 | 12 | | 14 | 14 | 14 | 14 | | 14 | | 14 |
| | 1 | 0 | 1 | 1 | 0 | 0 | 1 | 1 | 171 | 15 | 12 | | 15 | | 15 | 15 | | | 15 | 15 |
| | 1 | 1 | 0 | 0 | 1 | 1 | 1 | 0 | 111 | 16 | 12 | | 16 | 16 | | | 16 | 16 | 16 | |
| | 1 | 0 | 0 | 1 | 0 | 0 | 1 | 1 | 119 | 0 | 13 | | 0 | | | 0 | | | 0 | 0 |
| | 1 | 1 | 0 | 1 | 0 | 0 | 1 | 0 | 59 | 1 | 13 | | 1 | 1 | | 1 | | | 1 | |
| | 1 | 0 | 0 | 0 | 1 | 1 | 1 | 0 | 254 | 2 | 13 | | 2 | | | | 2 | 2 | 2 | |
| | 0 | 0 | 1 | 1 | 0 | 0 | 1 | 0 | 194 | 3 | 13 | | | | 3 | 3 | | | 3 | |
| | 1 | 1 | 0 | 1 | 1 | 0 | 1 | 0 | 134 | 4 | 13 | | 4 | 4 | | 4 | 4 | | 4 | |
| | 1 | 0 | 0 | 0 | 1 | 0 | 0 | 1 | 74 | 5 | 13 | | 5 | | | | 5 | | | 5 |
| | 0 | 0 | 0 | 1 | 0 | 0 | 1 | 1 | 14 | 6 | 13 | | | | | 6 | | | 6 | 6 |
| | 1 | 0 | 1 | 0 | 0 | 0 | 1 | 0 | 209 | 7 | 13 | | 7 | | 7 | | | | 7 | |
| | 1 | 0 | 1 | 0 | 0 | 1 | 0 | 0 | 149 | 8 | 13 | | 8 | | 8 | | | 8 | | |
| | 1 | 1 | 1 | 0 | 0 | 0 | 0 | 1 | 89 | 9 | 13 | | 9 | 9 | 9 | | | | | 9 |
| | 0 | 0 | 1 | 1 | 0 | 0 | 0 | 0 | 29 | 10 | 13 | | | | 10 | 10 | | | | |
| | 0 | 0 | 0 | 1 | 0 | 0 | 1 | 0 | 224 | 11 | 13 | | | | | 11 | | | 11 | |
| | 1 | 1 | 0 | 0 | 0 | 1 | 1 | 0 | 164 | 12 | 13 | | 12 | 12 | | | | 12 | 12 | |
| | 0 | 0 | 0 | 0 | 1 | 1 | 0 | 1 | 104 | 13 | 13 | | | | | | 13 | 13 | | 13 |
| | 1 | 1 | 1 | 0 | 1 | 1 | 1 | 0 | 44 | 14 | 13 | | 14 | 14 | 14 | | 14 | 14 | 14 | |
| | 0 | 0 | 0 | 1 | 0 | 1 | 1 | 0 | 239 | 15 | 13 | | | | | 15 | | 15 | 15 | |
| | 0 | 1 | 0 | 0 | 1 | 0 | 1 | 1 | 179 | 16 | 13 | | | 16 | | | 16 | | 16 | 16 |
| | 1 | 1 | 0 | 1 | 1 | 1 | 0 | 0 | 187 | 0 | 14 | | 0 | 0 | | 0 | 0 | 0 | | |
| | 1 | 1 | 0 | 0 | 1 | 1 | 0 | 0 | 127 | 1 | 14 | | 1 | 1 | | | 1 | 1 | | |
| | 1 | 1 | 0 | 0 | 0 | 0 | 1 | 0 | 67 | 2 | 14 | | 2 | 2 | | | | | 2 | |
| | 1 | 0 | 0 | 0 | 0 | 0 | 0 | 0 | 7 | 3 | 14 | | 3 | | | | | | | |
| | 0 | 1 | 1 | 1 | 0 | 0 | 0 | 0 | 202 | 4 | 14 | | | 4 | 4 | 4 | | | | |
| | 0 | 0 | 1 | 0 | 1 | 0 | 1 | 0 | 142 | 5 | 14 | | | | 5 | | 5 | | 5 | |
| | 1 | 1 | 0 | 1 | 0 | 0 | 1 | 1 | 82 | 6 | 14 | | 6 | 6 | | 6 | | | 6 | 6 |
| | 1 | 1 | 1 | 0 | 1 | 0 | 1 | 0 | 22 | 7 | 14 | | 7 | 7 | 7 | | 7 | | 7 | |
| | 1 | 0 | 0 | 1 | 1 | 0 | 1 | 1 | 217 | 8 | 14 | | 8 | | | 8 | 8 | | 8 | 8 |
| | 1 | 1 | 0 | 1 | 0 | 1 | 0 | 1 | 157 | 9 | 14 | | 9 | 9 | | 9 | | 9 | | 9 |
| | 1 | 0 | 1 | 0 | 1 | 1 | 1 | 1 | 97 | 10 | 14 | | 10 | | 10 | | 10 | 10 | 10 | 10 |
| | 0 | 1 | 0 | 0 | 1 | 0 | 1 | 0 | 37 | 11 | 14 | | | 11 | | | 11 | | 11 | |
| | 1 | 1 | 1 | 1 | 0 | 1 | 1 | 1 | 232 | 12 | 14 | | 12 | 12 | 12 | 12 | | 12 | 12 | 12 |
| | 0 | 1 | 1 | 1 | 1 | 0 | 1 | 1 | 172 | 13 | 14 | | | 13 | 13 | 13 | 13 | | 13 | 13 |
| | 1 | 0 | 0 | 0 | 0 | 0 | 0 | 1 | 112 | 14 | 14 | | 14 | | | | | | | 14 |
| | 0 | 0 | 0 | 1 | 0 | 1 | 0 | 0 | 52 | 15 | 14 | | | | | 15 | | 15 | | |
| | 1 | 0 | 0 | 0 | 0 | 0 | 1 | 1 | 247 | 16 | 14 | | 16 | | | | | | 16 | 16 |

15σt DEC
17σt DEC
15σ ($S_1^2$+B) DEC
17σ ($S_1^2$+B) DEC
15σ (A+1) DEC
17σ (A+1) DEC

T−Adder (mod17)

FIG. 45A

| j | zj | zj | j | j | zj | zj | j |
|---|---|---|---|---|---|---|---|
| 0 | − | 3 | 125 | 53 | 92 | 70 | 146 |
| 1 | 51 | 5 | 184 | 54 | 215 | 73 | 168 |
| 2 | 102 | 6 | 250 | 55 | 181 | 74 | 69 |
| 3 | 194 | 10 | 113 | 56 | 63 | 77 | 174 |
| 4 | 204 | 11 | 12 | 57 | 223 | 79 | 52 |
| 5 | 26 | 12 | 245 | 58 | 17 | 80 | 139 |
| 6 | 133 | 13 | 130 | 59 | 223 | 81 | 15 |
| 7 | 231 | 15 | 149 | 60 | 69 | 82 | 42 |
| 8 | 153 | 17 | 51 | 61 | 178 | 83 | 171 |
| 9 | 249 | | 58 | 62 | 242 | 84 | 195 |
| 10 | 52 | | 163 | 63 | 173 | 85 | 170 |
| 11 | 246 | 20 | 226 | 64 | 204 | | 187 |
| 12 | 11 | 21 | 240 | 65 | 134 | | 238 |
| 13 | 211 | 22 | 24 | 66 | 126 | 86 | 167 |
| 14 | 207 | 23 | 77 | 67 | 244 | 87 | 219 |
| 15 | 81 | 24 | 235 | 68 | 102 | 88 | 96 |
| 16 | 51 | 25 | 74 | 69 | 74 | 89 | 158 |
| 17 | 153 | 26 | 5 | 70 | 198 | 91 | 105 |
| 18 | 243 | 27 | 25 | 71 | 34 | | 115 |
| 19 | 203 | 30 | 43 | 72 | 207 | | 126 |
| 20 | 104 | 34 | 71 | 73 | 35 | 92 | 53 |
| 21 | 41 | | 102 | 74 | 25 | 93 | 111 |
| 22 | 237 | | 116 | 75 | 218 | 94 | 152 |
| 23 | 160 | 35 | 73 | 76 | 47 | | 199 |
| 24 | 22 | 37 | 162 | 77 | 23 | | 253 |
| 25 | 27 | 40 | 197 | 78 | 247 | 95 | 216 |
| 26 | 167 | 41 | 21 | 79 | 172 | 96 | 175 |
| 27 | 235 | 42 | 225 | 80 | 161 | 97 | 129 |
| 28 | 159 | 43 | 211 | 81 | 146 | 99 | 35 |
| 29 | 136 | 44 | 48 | 82 | 200 | 100 | 41 |
| 30 | 162 | 46 | 154 | 83 | 197 | 101 | 122 |
| 31 | 121 | 47 | 76 | 84 | 164 | 102 | 2 |
| 32 | 102 | | 227 | 85 | 170 | | 32 |
| 33 | 63 | | 254 | 86 | 60 | | 68 |
| 34 | 51 | 48 | 215 | 87 | 166 | 104 | 20 |
| 35 | 99 | 50 | 148 | 88 | 183 | 106 | 117 |
| 36 | 231 | 51 | 1 | 89 | 240 | 107 | 45 |
| 37 | 140 | | 16 | 90 | 214 | | 110 |
| 38 | 151 | | 34 | 91 | 254 | | 207 |
| 39 | 251 | 52 | 10 | 92 | 130 | 108 | 100 |
| 40 | 208 | 53 | 186 | 93 | 154 | 109 | 165 |
| 41 | 100 | 54 | 50 | 94 | 243 | | 205 |
| 42 | 82 | 60 | 86 | 95 | 192 | | 249 |
| 43 | 30 | 61 | 208 | 96 | 88 | 111 | 176 |
| 44 | 219 | 63 | 33 | 97 | 222 | 113 | 212 |
| 45 | 107 | | 56 | 98 | 121 | 117 | 189 |
| 46 | 65 | | 229 | 99 | 125 | 120 | 172 |
| 47 | 249 | 65 | 46 | 100 | 108 | 121 | 31 |
| 48 | 44 | 67 | 160 | 101 | 195 | | 98 |
| 49 | 188 | 68 | 142 | 102 | 34 | | 247 |
| 50 | 54 | | 204 | 103 | 251 | 122 | 161 |
| 51 | 17 | | 232 | 104 | 158 | 123 | 133 |
| 52 | 79 | 69 | 60 | 105 | 91 | 125 | 99 |

FIG. 45B

| j | zj | zj | j |
|---|---|---|---|
| 106 | 184 | 126 | 66 |
| 107 | 223 | | 112 |
| 108 | 175 | | 203 |
| 109 | 251 | 127 | 173 |
| 110 | 107 | | 228 |
| 111 | 93 | | 236 |
| 112 | 126 | 129 | 190 |
| 113 | 10 | 130 | 92 |
| 114 | 191 | 133 | 6 |
| 115 | 91 | 134 | 65 |
| 116 | 34 | 135 | 202 |
| 117 | 106 | 136 | 29 |
| 118 | 191 | | 153 |
| 119 | 170 | | 209 |
| 120 | 138 | 138 | 120 |
| 121 | 207 | 139 | 166 |
| 122 | 101 | 140 | 37 |
| 123 | 234 | 141 | 140 |
| 124 | 229 | 145 | 164 |
| 125 | 3 | 146 | 81 |
| 126 | 91 | 148 | 138 |
| 127 | 151 | 149 | 233 |
| 128 | 153 | 151 | 38 |
| 129 | 97 | | 127 |
| 130 | 13 | | 241 |
| 131 | 243 | 153 | 8 |
| 132 | 252 | | 17 |
| 133 | 123 | | 128 |
| 134 | 233 | 154 | 93 |
| 135 | 168 | 158 | 104 |
| 136 | 204 | 159 | 28 |
| 137 | 229 | | 144 |
| 138 | 148 | | 242 |
| 139 | 80 | 160 | 23 |
| 140 | 141 | 161 | 80 |
| 141 | 245 | 162 | 30 |
| 142 | 68 | 164 | 84 |
| 143 | 188 | 166 | 87 |
| 144 | 159 | 167 | 26 |
| 145 | 177 | 168 | 135 |
| 146 | 70 | 169 | 213 |
| 147 | 253 | 170 | 85 |
| 148 | 50 | | 119 |
| 149 | 15 | | 221 |
| 150 | 181 | 171 | 237 |
| 151 | 252 | 172 | 79 |
| 152 | 94 | 173 | 63 |
| 153 | 136 | | 180 |
| 154 | 46 | | 185 |
| 155 | 218 | 174 | 183 |
| 156 | 239 | 175 | 108 |
| 157 | 239 | 176 | 192 |
| 158 | 89 | 177 | 145 |

| j | zj | zj | j |
|---|---|---|---|
| 159 | 214 | 178 | 61 |
| 160 | 67 | 181 | 55 |
| 161 | 122 | | 150 |
| 162 | 37 | | 231 |
| 163 | 17 | 182 | 210 |
| 164 | 145 | | 230 |
| 165 | 109 | | 252 |
| 166 | 139 | 183 | 88 |
| 167 | 86 | 184 | 106 |
| 168 | 73 | 186 | 222 |
| 169 | 226 | 188 | 49 |
| 170 | 85 | | 143 |
| 171 | 83 | | 251 |
| 172 | 120 | 189 | 194 |
| 173 | 127 | 190 | 177 |
| 174 | 77 | 191 | 114 |
| 175 | 96 | | 118 |
| 176 | 111 | | 214 |
| 177 | 190 | 192 | 95 |
| 178 | 225 | 194 | 3 |
| 179 | 253 | 195 | 101 |
| 180 | 173 | 197 | 83 |
| 181 | 239 | 198 | 70 |
| 182 | 253 | 200 | 82 |
| 183 | 174 | 202 | 244 |
| 184 | 5 | 203 | 19 |
| 185 | 173 | | 191 |
| 186 | 53 | | 248 |
| 187 | 85 | 204 | 4 |
| 188 | 231 | | 64 |
| 189 | 117 | | 136 |
| 190 | 129 | 207 | 14 |
| 191 | 203 | | 72 |
| 192 | 176 | | 121 |
| 193 | 249 | 208 | 40 |
| 194 | 189 | 211 | 13 |
| 195 | 84 | 212 | 234 |
| 196 | 242 | 213 | 246 |
| 197 | 40 | 214 | 90 |
| 198 | 250 | | 159 |
| 199 | 94 | | 220 |
| 200 | 216 | 215 | 54 |
| 201 | 254 | 216 | 200 |
| 202 | 135 | 218 | 75 |
| 203 | 126 | | 155 |
| 204 | 68 | | 243 |
| 205 | 109 | 219 | 44 |
| 206 | 247 | 222 | 97 |
| 207 | 107 | 223 | 57 |
| 208 | 61 | | 59 |
| 209 | 136 | | 107 |
| 210 | 182 | 225 | 178 |
| 211 | 43 | 226 | 169 |

FIG. 45C

| j | zj | zj | j |
|---|---|---|---|
| 212 | 113 | 229 | 124 |
| 213 | 169 | | 137 |
| 214 | 191 | | 223 |
| 215 | 48 | 231 | 7 |
| 216 | 95 | | 36 |
| 217 | 254 | | 188 |
| 218 | 247 | 233 | 134 |
| 219 | 87 | 234 | 123 |
| 220 | 214 | 235 | 27 |
| 221 | 170 | 237 | 22 |
| 222 | 186 | 239 | 156 |
| 223 | 229 | | 157 |
| 224 | 252 | | 181 |
| 225 | 42 | 240 | 89 |
| 226 | 20 | 242 | 62 |
| 227 | 47 | | 196 |
| 228 | 127 | | 239 |
| 229 | 63 | 243 | 18 |
| 230 | 182 | | 94 |
| 231 | 181 | | 131 |
| 232 | 68 | 244 | 67 |
| 233 | 149 | 245 | 141 |
| 234 | 212 | 246 | 11 |
| 235 | 24 | 247 | 78 |
| 236 | 127 | | 206 |
| 237 | 171 | | 218 |
| 238 | 85 | 249 | 9 |
| 239 | 242 | | 47 |
| 240 | 21 | | 193 |
| 241 | 151 | 250 | 198 |
| 242 | 159 | 251 | 39 |
| 243 | 218 | | 103 |
| 244 | 202 | | 109 |
| 245 | 12 | 252 | 132 |
| 246 | 213 | | 151 |
| 247 | 121 | | 224 |
| 248 | 203 | 253 | 147 |
| 249 | 109 | | 179 |
| 250 | 6 | | 182 |
| 251 | 188 | 254 | 91 |
| 252 | 182 | | 201 |
| 253 | 94 | | 217 |
| 254 | 47 | | |

FIG. 46A

| index | | 15j(17) | | | | | |
|---|---|---|---|---|---|---|---|
| 15j(17) | j | bs1 | bs2 | b23 | zj | 15zj(17) | 17zj(15) |
| 0 | 51 | 0 | | | 17 | 0 | 4 |
| 0 | 170 | 0 | | | 85 | 0 | 5 |
| 0 | 85 | 0 | | | 170 | 0 | 10 |
| 0 | 204 | | 0 | | 68 | 0 | 1 |
| 0 | 153 | | 0 | | 136 | 0 | 2 |
| 0 | 187 | | 0 | | 85 | 0 | 5 |
| 0 | 17 | | 0 | | 153 | 0 | 6 |
| 0 | 102 | | 0 | | 34 | 0 | 8 |
| 0 | 119 | | 0 | | 170 | 0 | 10 |
| 0 | 136 | | | 0 | 204 | 0 | 3 |
| 0 | 238 | | | 0 | 85 | 0 | 5 |
| 0 | 68 | | | 0 | 102 | 0 | 9 |
| 0 | 221 | | | 0 | 170 | 0 | 10 |
| 0 | 34 | | | 0 | 51 | 0 | 12 |
| 1 | 8 | 1 | | | 153 | 0 | 6 |
| 1 | 76 | 1 | | | 47 | 8 | 4 |
| 1 | 127 | | 1 | | 151 | 4 | 2 |
| 1 | 144 | | 1 | | 159 | 5 | 3 |
| 1 | 110 | | 1 | | 107 | 7 | 4 |
| 1 | 59 | | 1 | | 223 | 13 | 11 |
| 1 | 229 | | | 1 | 63 | 10 | 6 |
| 2 | 33 | 2 | | | 63 | 10 | 6 |
| 2 | 152 | 2 | | | 94 | 16 | 8 |
| 2 | 16 | | 2 | | 51 | 0 | 12 |
| 2 | 118 | | 2 | | 191 | 9 | 7 |
| 2 | 203 | | | 2 | 126 | 3 | 12 |
| 2 | 254 | | | 2 | 47 | 8 | 4 |
| 2 | 220 | | | 2 | 214 | 14 | 8 |
| 3 | 75 | 3 | | | 218 | 6 | 1 |
| 3 | 7 | 3 | | | 231 | 14 | 12 |
| 3 | 58 | | 3 | | 17 | 0 | 4 |
| 3 | 228 | | 3 | | 127 | 1 | 14 |
| 3 | 143 | | 3 | | 188 | 15 | 1 |
| 3 | 126 | | | 3 | 91 | 5 | 2 |
| 3 | 109 | | | 3 | 251 | 8 | 7 |
| 4 | 66 | 4 | | | 126 | 3 | 12 |
| 4 | 49 | 4 | | | 188 | 15 | 1 |
| 4 | 32 | | 4 | | 102 | 0 | 9 |
| 4 | 151 | | 4 | | 252 | 6 | 9 |
| 4 | 236 | | | 4 | 127 | 1 | 14 |
| 4 | 185 | | | 4 | 173 | 11 | 1 |
| 4 | 253 | | | 4 | 94 | 16 | 8 |

FIG. 46B

| index | | 15j(17) | | | | | |
|---|---|---|---|---|---|---|---|
| 15j(17) | j | bs1 | bs2 | b23 | zj | 15zj(17) | 17zj(15) |
| 5 | 142 | 5 | | | 68 | 0 | 1 |
| 5 | 91 | 5 | | | 254 | 2 | 13 |
| 5 | 210 | 5 | | | 182 | 10 | 4 |
| 5 | 57 | 5 | | | 223 | 13 | 11 |
| 5 | 227 | | 5 | | 47 | 8 | 4 |
| 5 | 159 | | 5 | | 214 | 14 | 8 |
| 5 | 193 | | | 5 | 249 | 12 | 3 |
| 6 | 14 | 6 | | | 207 | 11 | 9 |
| 6 | 31 | 6 | | | 121 | 13 | 2 |
| 6 | 201 | | 6 | | 254 | 2 | 13 |
| 6 | 150 | | 6 | | 181 | 12 | 2 |
| 6 | 116 | | | 6 | 34 | 0 | 8 |
| 6 | 252 | | | 6 | 182 | 10 | 4 |
| 6 | 218 | | | 6 | 247 | 16 | 14 |
| 7 | 124 | 7 | | | 229 | 1 | 8 |
| 7 | 39 | 7 | | | 251 | 8 | 7 |
| 7 | 90 | 7 | | | 214 | 14 | 8 |
| 7 | 56 | | 7 | | 63 | 10 | 6 |
| 7 | 209 | | | 7 | 136 | 0 | 2 |
| 7 | 243 | | | 7 | 218 | 6 | 1 |
| 7 | 107 | | | 7 | 223 | 13 | 11 |
| 8 | 132 | 8 | | | 252 | 6 | 9 |
| 8 | 64 | | 8 | | 204 | 0 | 3 |
| 8 | 115 | | 8 | | 91 | 5 | 2 |
| 8 | 47 | | 8 | | 249 | 12 | 3 |
| 8 | 98 | | 8 | | 121 | 13 | 2 |
| 8 | 217 | | | 8 | 254 | 2 | 13 |
| 8 | 251 | | | 8 | 188 | 15 | 1 |
| 9 | 4 | 9 | | | 204 | 0 | 3 |
| 9 | 38 | 9 | | | 151 | 4 | 2 |
| 9 | 55 | 9 | | | 181 | 12 | 2 |
| 9 | 191 | | 9 | | 203 | 2 | 1 |
| 9 | 72 | | 9 | | 207 | 11 | 9 |
| 9 | 157 | | 9 | | 239 | 15 | 13 |
| 9 | 242 | | | 9 | 159 | 5 | 3 |
| 10 | 29 | 10 | | | 136 | 0 | 2 |
| 10 | 165 | 10 | | | 109 | 3 | 8 |
| 10 | 114 | 10 | | | 191 | 9 | 7 |
| 10 | 63 | 10 | | | 173 | 11 | 1 |
| 10 | 199 | | 10 | | 94 | 16 | 8 |
| 10 | 131 | | | 10 | 243 | 7 | 6 |
| 10 | 182 | | | 10 | 253 | 4 | 11 |

FIG. 46C

| index | | 15j(17) | | | | | |
|---|---|---|---|---|---|---|---|
| 15j(17) | j | bs1 | bs2 | b23 | zj | 15zj(17) | 17zj(15) |
| 11 | 71 | 11 | | | 34 | 0 | 8 |
| 11 | 173 | 11 | | | 127 | 1 | 14 |
| 11 | 105 | 11 | | | 91 | 5 | 2 |
| 11 | 156 | 11 | | | 239 | 15 | 13 |
| 11 | 241 | | | 11 | 151 | 4 | 2 |
| 11 | 224 | | | 11 | 252 | 6 | 9 |
| 11 | 207 | | | 11 | 107 | 7 | 4 |
| 12 | 28 | 12 | | | 159 | 5 | 3 |
| 12 | 45 | 12 | | | 107 | 7 | 4 |
| 12 | 62 | 12 | | | 242 | 9 | 4 |
| 12 | 147 | 12 | | | 253 | 4 | 11 |
| 12 | 232 | | | 12 | 68 | 0 | 1 |
| 12 | 249 | | | 12 | 109 | 3 | 8 |
| 12 | 181 | | | 12 | 239 | 15 | 13 |
| 13 | 2 | 13 | | | 102 | 0 | 9 |
| 13 | 19 | 13 | | | 203 | 2 | 1 |
| 13 | 155 | | 13 | | 218 | 6 | 1 |
| 13 | 36 | | 13 | | 231 | 14 | 12 |
| 13 | 206 | | 13 | | 247 | 16 | 14 |
| 13 | 223 | | | 13 | 229 | 1 | 8 |
| 13 | 121 | | | 13 | 207 | 11 | 9 |
| 14 | 78 | 14 | | | 247 | 16 | 14 |
| 14 | 112 | | 14 | | 126 | 3 | 12 |
| 14 | 180 | | 14 | | 173 | 11 | 1 |
| 14 | 163 | | | 14 | 17 | 0 | 4 |
| 14 | 248 | | | 14 | 203 | 2 | 1 |
| 14 | 214 | | | 14 | 191 | 9 | 7 |
| 14 | 231 | | | 14 | 181 | 12 | 2 |
| 15 | 1 | 15 | | | 51 | 0 | 12 |
| 15 | 18 | 15 | | | 243 | 7 | 6 |
| 15 | 137 | | 15 | | 229 | 1 | 8 |
| 15 | 205 | | 15 | | 109 | 3 | 8 |
| 15 | 103 | | 15 | | 251 | 8 | 7 |
| 15 | 239 | | | 15 | 242 | 9 | 4 |
| 15 | 188 | | | 15 | 231 | 14 | 12 |
| 16 | 9 | 16 | | | 249 | 12 | 3 |
| 16 | 179 | | 16 | | 253 | 4 | 11 |
| 16 | 94 | | 16 | | 243 | 7 | 6 |
| 16 | 196 | | 16 | | 242 | 9 | 4 |
| 16 | 230 | | 16 | | 182 | 10 | 4 |
| 16 | 128 | | | 16 | 153 | 0 | 6 |
| 16 | 247 | | | 16 | 121 | 13 | 2 |

FIG. 47A

| index | | 17j(15) | | | | | |
|---|---|---|---|---|---|---|---|
| 17j(15) | j | bs1 | bs2 | bs3 | zj | 15zj(17) | 17zj(15) |
| 0 | 165 | 0 | | | 109 | 3 | 8 |
| 0 | 105 | 0 | | | 91 | 5 | 2 |
| 0 | 75 | 0 | | | 218 | 6 | 1 |
| 0 | 45 | 0 | | | 107 | 7 | 4 |
| 0 | 210 | 0 | | | 182 | 10 | 4 |
| 0 | 90 | 0 | | | 214 | 14 | 8 |
| 0 | 180 | | 0 | | 173 | 11 | 1 |
| 0 | 150 | | 0 | | 181 | 12 | 2 |
| 1 | 8 | 1 | | | 153 | 0 | 6 |
| 1 | 173 | 1 | | | 127 | 1 | 14 |
| 1 | 38 | 1 | | | 151 | 4 | 2 |
| 1 | 98 | | 1 | | 121 | 13 | 2 |
| 1 | 143 | | 1 | | 188 | 15 | 1 |
| 1 | 128 | | | 1 | 153 | 0 | 6 |
| 1 | 68 | | | 1 | 102 | 0 | 9 |
| 1 | 248 | | | 1 | 203 | 2 | 1 |
| 1 | 203 | | | 1 | 126 | 3 | 12 |
| 1 | 188 | | | 1 | 231 | 14 | 12 |
| 1 | 218 | | | 1 | 247 | 16 | 14 |
| 2 | 1 | 2 | | | 51 | 0 | 12 |
| 2 | 91 | 2 | | | 254 | 2 | 13 |
| 2 | 76 | 2 | | | 47 | 8 | 4 |
| 2 | 31 | 2 | | | 121 | 13 | 2 |
| 2 | 16 | | 2 | | 51 | 0 | 12 |
| 2 | 196 | | 2 | | 242 | 9 | 4 |
| 2 | 151 | | 2 | | 252 | 6 | 9 |
| 2 | 136 | | | 2 | 204 | 0 | 3 |
| 2 | 241 | | | 2 | 151 | 4 | 2 |
| 2 | 121 | | | 2 | 207 | 11 | 9 |
| 2 | 181 | | | 2 | 239 | 15 | 13 |
| 3 | 39 | 3 | | | 251 | 8 | 7 |
| 3 | 114 | 3 | | | 191 | 9 | 7 |
| 3 | 9 | 3 | | | 249 | 12 | 3 |
| 3 | 204 | | 3 | | 68 | 0 | 1 |
| 3 | 144 | | 3 | | 159 | 5 | 3 |
| 3 | 159 | | 3 | | 214 | 14 | 8 |
| 3 | 249 | | | 3 | 109 | 3 | 8 |
| 4 | 2 | 4 | | | 102 | 0 | 9 |
| 4 | 62 | 4 | | | 242 | 9 | 4 |
| 4 | 152 | 4 | | | 94 | 16 | 8 |
| 4 | 17 | | 4 | | 153 | 0 | 6 |
| 4 | 32 | | 4 | | 102 | 0 | 9 |
| 4 | 137 | | 4 | | 229 | 1 | 8 |
| 4 | 227 | | 4 | | 47 | 8 | 4 |
| 4 | 47 | | 4 | | 249 | 12 | 3 |
| 4 | 182 | | | 4 | 253 | 4 | 11 |
| 4 | 242 | | | 4 | 159 | 5 | 3 |
| 4 | 107 | | | 4 | 223 | 13 | 11 |

FIG. 47B

| index | | 17j(15) | | | | | |
|---|---|---|---|---|---|---|---|
| 17j(15) | j | bs1 | bs2 | bs3 | zj | 15zj(17) | 17zj(15) |
| 5 | 85 | 5 | | | 170 | 0 | 10 |
| 5 | 55 | 5 | | | 181 | 12 | 2 |
| 5 | 205 | | 5 | | 109 | 3 | 8 |
| 5 | 115 | | 5 | | 91 | 5 | 2 |
| 5 | 220 | | | 5 | 214 | 14 | 8 |
| 6 | 18 | 6 | | | 243 | 7 | 6 |
| 6 | 33 | 6 | | | 63 | 10 | 6 |
| 6 | 63 | 6 | | | 173 | 11 | 1 |
| 6 | 78 | 6 | | | 247 | 16 | 14 |
| 6 | 153 | | 6 | | 136 | 0 | 2 |
| 6 | 228 | | 6 | | 127 | 1 | 14 |
| 6 | 243 | | | 6 | 218 | 6 | 1 |
| 7 | 71 | 7 | | | 34 | 0 | 8 |
| 7 | 191 | | 7 | | 203 | 2 | 1 |
| 7 | 56 | | 7 | | 63 | 10 | 6 |
| 7 | 206 | | 7 | | 247 | 16 | 14 |
| 7 | 116 | | | 7 | 34 | 0 | 8 |
| 7 | 221 | | | 7 | 170 | 0 | 10 |
| 7 | 236 | | | 7 | 127 | 1 | 14 |
| 7 | 131 | | | 7 | 243 | 7 | 6 |
| 7 | 251 | | | 7 | 188 | 15 | 1 |
| 8 | 4 | 8 | | | 204 | 0 | 3 |
| 8 | 124 | 8 | | | 229 | 1 | 8 |
| 8 | 19 | 8 | | | 203 | 2 | 1 |
| 8 | 49 | 8 | | | 188 | 15 | 1 |
| 8 | 64 | | 8 | | 204 | 0 | 3 |
| 8 | 94 | | 8 | | 243 | 7 | 6 |
| 8 | 199 | | 8 | | 94 | 16 | 8 |
| 8 | 34 | | | 8 | 51 | 0 | 12 |
| 8 | 109 | | | 8 | 251 | 8 | 7 |
| 8 | 214 | | | 8 | 191 | 9 | 7 |
| 8 | 229 | | | 8 | 63 | 10 | 6 |
| 9 | 147 | 9 | | | 253 | 4 | 11 |
| 9 | 132 | 9 | | | 252 | 6 | 9 |
| 9 | 57 | 9 | | | 223 | 13 | 11 |
| 9 | 102 | | 9 | | 34 | 0 | 8 |
| 9 | 72 | | 9 | | 207 | 11 | 9 |
| 9 | 207 | | | 9 | 107 | 7 | 4 |
| 9 | 252 | | | 9 | 182 | 10 | 4 |
| 10 | 170 | 10 | | | 85 | 0 | 5 |
| 10 | 155 | | 10 | | 218 | 6 | 1 |
| 10 | 110 | | 10 | | 107 | 7 | 4 |
| 10 | 230 | | 10 | | 182 | 10 | 4 |
| 10 | 185 | | | 10 | 173 | 11 | 1 |

FIG. 47C

| index | | 17j(15) | | | | | |
|---|---|---|---|---|---|---|---|
| 17j(15) | j | bs1 | bs2 | bs3 | zj | 15zj(17) | 17zj(15) |
| 11 | 28 | 11 | | | 159 | 5 | 3 |
| 11 | 58 | | 11 | | 17 | 0 | 4 |
| 11 | 118 | | 11 | | 191 | 9 | 7 |
| 11 | 103 | | 11 | | 251 | 8 | 7 |
| 11 | 163 | | | 11 | 17 | 0 | 4 |
| 11 | 238 | | | 11 | 85 | 0 | 5 |
| 11 | 253 | | | 11 | 94 | 16 | 8 |
| 11 | 223 | | | 11 | 229 | 1 | 8 |
| 11 | 193 | | | 11 | 249 | 12 | 3 |
| 12 | 51 | 12 | | | 17 | 0 | 4 |
| 12 | 66 | 12 | | | 126 | 3 | 12 |
| 12 | 156 | 12 | | | 239 | 15 | 13 |
| 12 | 36 | | 12 | | 231 | 14 | 12 |
| 12 | 201 | | 12 | | 254 | 2 | 13 |
| 12 | 126 | | | 12 | 91 | 5 | 2 |
| 12 | 231 | | | 12 | 181 | 12 | 2 |
| 13 | 29 | 13 | | | 136 | 0 | 2 |
| 13 | 14 | 13 | | | 207 | 11 | 9 |
| 13 | 119 | | 13 | | 170 | 0 | 10 |
| 13 | 59 | | 13 | | 223 | 13 | 11 |
| 13 | 179 | | 13 | | 253 | 4 | 11 |
| 13 | 209 | | | 13 | 136 | 0 | 2 |
| 13 | 224 | | | 13 | 252 | 6 | 9 |
| 13 | 254 | | | 13 | 47 | 8 | 4 |
| 13 | 239 | | | 13 | 242 | 9 | 4 |
| 14 | 142 | 14 | | | 68 | 0 | 1 |
| 14 | 7 | 14 | | | 231 | 14 | 12 |
| 14 | 187 | | 14 | | 85 | 0 | 5 |
| 14 | 112 | | 14 | | 126 | 3 | 12 |
| 14 | 127 | | 14 | | 151 | 4 | 2 |
| 14 | 157 | | 14 | | 239 | 15 | 13 |
| 14 | 232 | | | 14 | 68 | 0 | 1 |
| 14 | 217 | | | 14 | 254 | 2 | 13 |
| 14 | 247 | | | 14 | 121 | 13 | 2 |

az−Adder (mod15)

Decoder Circuit 1507, 1607
(Zj(17) DEC, Zj(15) DEC)

Index/Binary Converting Circuit 1503, 1504, 1603, 1604 no index 3EC(17)

no index 3EC(15)

Error Location DEC

FIG. 56A

| i | yi |
|---|---|
| 0 | 0 |
| 1 | 198 |
| 2 | 141 |
| 3 | 152 |
| 4 | 27 |
| 5 | 150 |
| 6 | 49 |
| 7 | 153 |
| 8 | 54 |
| 9 | 239 |
| 10 | 45 |
| 11 | 25 |
| 12 | 98 |
| 13 | 7 |
| 14 | 51 |
| 15 | 253 |
| 16 | 108 |
| 17 | 170 |
| 18 | 223 |
| 19 | 246 |
| 20 | 90 |
| 21 | 45 |
| 22 | 50 |
| 23 | 189 |
| 24 | 196 |
| 25 | 198 |
| 26 | 14 |
| 27 | 56 |
| 28 | 102 |
| 29 | 241 |
| 30 | 251 |
| 31 | 113 |
| 32 | 216 |
| 33 | 253 |
| 34 | 85 |
| 35 | 216 |
| 36 | 191 |
| 37 | 67 |
| 38 | 237 |
| 39 | 16 |
| 40 | 180 |
| 41 | 26 |
| 42 | 90 |
| 43 | 118 |
| 44 | 100 |
| 45 | 113 |
| 46 | 123 |
| 47 | 206 |
| 48 | 137 |
| 49 | 111 |
| 50 | 141 |
| 51 | 136 |
| 52 | 28 |

| yi | i |
|---|---|
| 0 | 0 |
| 1 | 114 |
| | 166 |
| 2 | 77 |
| | 228 |
| 3 | 234 |
| | 244 |
| 4 | 154 |
| | 201 |
| 6 | 213 |
| | 233 |
| 7 | 13 |
| | 99 |
| 8 | 53 |
| | 147 |
| 12 | 171 |
| | 211 |
| 13 | 148 |
| | 206 |
| 14 | 26 |
| | 198 |
| 16 | 39 |
| | 106 |
| 17 | 102 |
| | 221 |
| 19 | 96 |
| | 251 |
| 23 | 210 |
| | 241 |
| 24 | 87 |
| | 167 |
| 25 | 11 |
| | 245 |
| 26 | 41 |
| | 157 |
| 27 | 4 |
| | 100 |
| 28 | 52 |
| | 141 |
| 31 | 91 |
| | 209 |
| 32 | 78 |
| | 212 |
| 34 | 187 |
| | 204 |
| 35 | 97 |
| | 190 |
| 37 | 185 |
| | 249 |
| 38 | 192 |
| | 247 |
| 41 | 205 |
| | 207 |

| i | yi |
|---|---|
| 53 | 8 |
| 54 | 112 |
| 55 | 164 |
| 56 | 204 |
| 57 | 128 |
| 58 | 227 |
| 59 | 52 |
| 60 | 247 |
| 61 | 192 |
| 62 | 226 |
| 63 | 164 |
| 64 | 177 |
| 65 | 165 |
| 66 | 251 |
| 67 | 193 |
| 68 | 170 |
| 69 | 75 |
| 70 | 177 |
| 71 | 124 |
| 72 | 127 |
| 73 | 208 |
| 74 | 134 |
| 75 | 92 |
| 76 | 219 |
| 77 | 2 |
| 78 | 32 |
| 79 | 48 |
| 80 | 105 |
| 81 | 210 |
| 82 | 52 |
| 83 | 128 |
| 84 | 180 |
| 85 | |
| 86 | 236 |
| 87 | 24 |
| 88 | 200 |
| 89 | 179 |
| 90 | 226 |
| 91 | 31 |
| 92 | 246 |
| 93 | 96 |
| 94 | 157 |
| 95 | 145 |
| 96 | 19 |
| 97 | 35 |
| 98 | 222 |
| 99 | 7 |
| 100 | 27 |
| 101 | 206 |
| 102 | 17 |
| 103 | 134 |
| 104 | 56 |
| 105 | 139 |

| yi | i |
|---|---|
| 45 | 10 |
| | 21 |
| 46 | 165 |
| | 227 |
| 48 | 79 |
| | 174 |
| 49 | 6 |
| | 191 |
| 50 | 22 |
| | 235 |
| 51 | 14 |
| | 224 |
| 52 | 59 |
| | 82 |
| 54 | 8 |
| | 200 |
| 56 | 27 |
| | 104 |
| 59 | 149 |
| | 188 |
| 62 | 163 |
| | 182 |
| 64 | 156 |
| | 169 |
| 67 | 37 |
| | 179 |
| 68 | 119 |
| | 153 |
| 70 | 125 |
| | 194 |
| 73 | 110 |
| | 126 |
| 74 | 115 |
| | 243 |
| 75 | 69 |
| | 130 |
| 76 | 129 |
| | 239 |
| 82 | 155 |
| | 159 |
| 85 | 34 |
| | 136 |
| 90 | 20 |
| | 42 |
| 92 | 75 |
| | 199 |
| 96 | 93 |
| | 158 |
| 98 | 12 |
| | 127 |
| 99 | 128 |
| | 140 |
| 100 | 44 |

FIG. 56B

| i | yi | yi | i |
|---|---|---|---|
| 106 | 16 | | 215 |
| 107 | 227 | 102 | 28 |
| 108 | 224 | | 193 |
| 109 | 124 | 103 | 151 |
| 110 | 73 | | 178 |
| 111 | 221 | 104 | 118 |
| 112 | 153 | | 164 |
| 113 | 219 | 105 | 80 |
| 114 | 1 | | 168 |
| 115 | 74 | 108 | 16 |
| 116 | 199 | | 145 |
| 117 | 129 | 111 | 49 |
| 118 | 104 | | 197 |
| 119 | 68 | 112 | 54 |
| 120 | 239 | | 208 |
| 121 | 118 | 113 | 31 |
| 122 | 129 | | 45 |
| 123 | 238 | 118 | 43 |
| 124 | 197 | | 121 |
| 125 | 70 | 119 | 189 |
| 126 | 73 | | 219 |
| 127 | 98 | 123 | 46 |
| 128 | 99 | | 137 |
| 129 | 76 | 124 | 71 |
| 130 | 75 | | 109 |
| 131 | 204 | 127 | 72 |
| 132 | 247 | | 195 |
| 133 | 140 | 128 | 57 |
| 134 | 131 | | 83 |
| 135 | 254 | 129 | 117 |
| 136 | 85 | | 122 |
| 137 | 123 | 131 | 134 |
| 138 | 150 | | 177 |
| 139 | 222 | 134 | 74 |
| 140 | 99 | | 103 |
| 141 | 28 | 136 | 51 |
| 142 | 248 | | 238 |
| 143 | 184 | 137 | 48 |
| 144 | 254 | | 253 |
| 145 | 108 | 139 | 105 |
| 146 | 161 | | 248 |
| 147 | 8 | 140 | 133 |
| 148 | 13 | | 250 |
| 149 | 59 | 141 | 2 |
| 150 | 184 | | 50 |
| 151 | 103 | 143 | 173 |
| 152 | 183 | | 232 |
| 153 | 68 | 145 | 95 |
| 154 | 4 | | 176 |
| 155 | 82 | 146 | 220 |
| 156 | 64 | | 252 |
| 157 | 26 | 148 | 230 |
| 158 | 96 | | 231 |

| i | yi | yi | i |
|---|---|---|---|
| 159 | 82 | 150 | 5 |
| 160 | 210 | | 138 |
| 161 | 224 | 152 | 3 |
| 162 | 165 | | 223 |
| 163 | 62 | 153 | 7 |
| 164 | 104 | | 112 |
| 165 | 46 | 157 | 94 |
| 166 | 1 | | 202 |
| 167 | 24 | 161 | 146 |
| 168 | 105 | | 217 |
| 169 | 64 | 164 | 55 |
| 170 | | | 63 |
| 171 | 12 | 165 | 65 |
| 172 | 217 | | 162 |
| 173 | 143 | 170 | 17 |
| 174 | 48 | | 68 |
| 175 | 200 | 177 | 64 |
| 176 | 145 | | 70 |
| 177 | 131 | 179 | 89 |
| 178 | 103 | | 203 |
| 179 | 67 | 180 | 40 |
| 180 | 197 | | 84 |
| 181 | 241 | 183 | 152 |
| 182 | 62 | | 226 |
| 183 | 238 | 184 | 143 |
| 184 | 237 | | 150 |
| 185 | 37 | 187 | 222 |
| 186 | 192 | | 237 |
| 187 | 34 | 189 | 23 |
| 188 | 59 | | 196 |
| 189 | 119 | 191 | 36 |
| 190 | 35 | | 225 |
| 191 | 49 | 192 | 61 |
| 192 | 38 | | 186 |
| 193 | 102 | 193 | 67 |
| 194 | 70 | | 216 |
| 195 | 127 | 196 | 24 |
| 196 | 189 | | 254 |
| 197 | 111 | 197 | 124 |
| 198 | 14 | | 180 |
| 199 | 92 | 198 | 1 |
| 200 | 54 | | 25 |
| 201 | 4 | 199 | 116 |
| 202 | 157 | | 214 |
| 203 | 179 | 200 | 88 |
| 204 | 34 | | 175 |
| 205 | 41 | 204 | 56 |
| 206 | 13 | | 131 |
| 207 | 41 | 206 | 47 |
| 208 | 112 | | 101 |
| 209 | 31 | 208 | 73 |
| 210 | 23 | | 236 |
| 211 | 12 | 210 | 81 |

FIG. 56C

| i | yi | yi | i |
|---|---|---|---|
| 212 | 32 | | 160 |
| 213 | 6 | 216 | 32 |
| 214 | 199 | | 35 |
| 215 | 100 | 217 | 172 |
| 216 | 193 | | 229 |
| 217 | 161 | 219 | 76 |
| 218 | 248 | | 113 |
| 219 | 119 | 221 | 111 |
| 220 | 146 | | 246 |
| 221 | 17 | 222 | 98 |
| 222 | 187 | | 139 |
| 223 | 152 | 223 | 18 |
| 224 | 51 | | 240 |
| 225 | 191 | 224 | 108 |
| 226 | 183 | | 161 |
| 227 | 46 | 226 | 62 |
| 228 | 2 | | 90 |
| 229 | 217 | 227 | 58 |
| 230 | 148 | | 107 |
| 231 | 148 | 236 | 86 |
| 232 | 143 | | 242 |
| 233 | 6 | 237 | 38 |
| 234 | 3 | | 184 |
| 235 | 50 | 238 | 123 |
| 236 | 208 | | 183 |
| 237 | 187 | 239 | 9 |
| 238 | 136 | | 120 |
| 239 | 76 | 241 | 29 |
| 240 | 223 | | 181 |
| 241 | 23 | 246 | 19 |
| 242 | 236 | | 92 |
| 243 | 74 | 247 | 60 |
| 244 | 3 | | 132 |
| 245 | 25 | 248 | 142 |
| 246 | 221 | | 218 |
| 247 | 38 | 251 | 30 |
| 248 | 139 | | 66 |
| 249 | 37 | 253 | 15 |
| 250 | 140 | | 33 |
| 251 | 19 | 254 | 135 |
| 252 | 146 | | 144 |
| 253 | 137 | – | 85 |
| 254 | 196 | – | 170 |

FIG. 57A

| index | | 15i(17) | | | | |
|---|---|---|---|---|---|---|
| 15i(17) | i | bs1 | bs2 | yi | 15yi(17) | 17yi(15) |
| 0 | 0 | 0 | 0 | 0 | 0 | 0 |
| 0 | 102 | 0 | | 17 | 0 | 4 |
| 0 | 187 | 0 | | 34 | 0 | 8 |
| 0 | 119 | 0 | | 68 | 0 | 1 |
| 0 | 34 | 0 | | 85 | 0 | 5 |
| 0 | 51 | 0 | | 136 | 0 | 2 |
| 0 | 17 | 0 | | 170 | 0 | 10 |
| 0 | 221 | | 0 | 17 | 0 | 4 |
| 0 | 204 | | 0 | 34 | 0 | 8 |
| 0 | 153 | | 0 | 68 | 0 | 1 |
| 0 | 136 | | 0 | 85 | 0 | 5 |
| 0 | 238 | | 0 | 136 | 0 | 2 |
| 0 | 68 | | 0 | 170 | 0 | 10 |
| 1 | 59 | 1 | | 52 | 15 | 14 |
| 1 | 8 | 1 | | 54 | 11 | 3 |
| 1 | 110 | 1 | | 73 | 7 | 11 |
| 1 | 93 | 1 | | 96 | 12 | 12 |
| 1 | 76 | 1 | | 219 | 4 | 3 |
| 1 | 212 | | 1 | 32 | 4 | 4 |
| 1 | 42 | | 1 | 90 | 7 | 0 |
| 1 | 127 | | 1 | 98 | 8 | 1 |
| 1 | 178 | | 1 | 103 | 15 | 11 |
| 1 | 195 | | 1 | 127 | 1 | 14 |
| 1 | 25 | | 1 | 198 | 12 | 6 |
| 1 | 229 | | 1 | 217 | 8 | 14 |
| 1 | 246 | | 1 | 221 | 0 | 7 |
| 1 | 161 | | 1 | 224 | 11 | 13 |
| 1 | 144 | | 1 | 254 | 2 | 13 |
| 2 | 118 | 2 | | 104 | 13 | 13 |
| 2 | 16 | 2 | | 108 | 5 | 6 |
| 2 | 220 | 2 | | 146 | 14 | 7 |
| 2 | 152 | 2 | | 183 | 8 | 6 |
| 2 | 67 | 2 | | 193 | 5 | 11 |
| 2 | 135 | 2 | | 254 | 2 | 13 |
| 2 | 169 | | 2 | 64 | 8 | 8 |
| 2 | 50 | | 2 | 141 | 7 | 12 |
| 2 | 203 | | 2 | 179 | 16 | 13 |
| 2 | 84 | | 2 | 180 | 14 | 0 |
| 2 | 237 | | 2 | 187 | 0 | 14 |
| 2 | 186 | | 2 | 192 | 7 | 9 |
| 2 | 254 | | 2 | 196 | 16 | 2 |
| 2 | 101 | | 2 | 206 | 13 | 7 |
| 2 | 33 | | 2 | 253 | 4 | 11 |
| 3 | 41 | 3 | | 26 | 16 | 7 |
| 3 | 75 | 3 | | 92 | 3 | 4 |
| 3 | 7 | 3 | | 153 | 0 | 6 |
| 3 | 143 | 3 | | 184 | 6 | 8 |
| 3 | 24 | 3 | | 196 | 16 | 2 |
| 3 | 58 | 3 | | 227 | 5 | 4 |
| 3 | 228 | | 3 | 2 | 13 | 4 |
| 3 | 211 | | 3 | 12 | 10 | 9 |
| 3 | 245 | | 3 | 25 | 1 | 5 |
| 3 | 194 | | 3 | 70 | 13 | 5 |
| 3 | 126 | | 3 | 73 | 7 | 11 |
| 3 | 109 | | 3 | 124 | 7 | 8 |
| 3 | 177 | | 3 | 131 | 10 | 7 |
| 3 | 160 | | 3 | 210 | 5 | 0 |
| 3 | 92 | | 3 | 246 | 1 | 12 |

| index | | 15i(17) | | | | |
|---|---|---|---|---|---|---|
| 15i(17) | i | bs1 | bs2 | yi | 15yi(17) | 17yi(15) |
| 4 | 185 | 4 | | 37 | 11 | 14 |
| 4 | 151 | 4 | | 103 | 15 | 11 |
| 4 | 49 | 4 | | 111 | 16 | 12 |
| 4 | 117 | 4 | | 129 | 14 | 3 |
| 4 | 134 | 4 | | 131 | 10 | 7 |
| 4 | 32 | 4 | | 216 | 10 | 12 |
| 4 | 15 | 4 | | 253 | 4 | 11 |
| 4 | 100 | | 4 | 27 | 14 | 9 |
| 4 | 168 | | 4 | 105 | 11 | 0 |
| 4 | 219 | | 4 | 119 | 0 | 13 |
| 4 | 83 | | 4 | 128 | 16 | 1 |
| 4 | 253 | | 4 | 137 | 15 | 4 |
| 4 | 202 | | 4 | 157 | 9 | 14 |
| 4 | 236 | | 4 | 208 | 9 | 11 |
| 4 | 66 | | 4 | 251 | 8 | 7 |
| 5 | 210 | 5 | | 23 | 5 | 1 |
| 5 | 91 | 5 | | 31 | 6 | 2 |
| 5 | 6 | 5 | | 49 | 4 | 8 |
| 5 | 125 | 5 | | 70 | 13 | 5 |
| 5 | 57 | 5 | | 128 | 16 | 1 |
| 5 | 74 | 5 | | 134 | 4 | 13 |
| 5 | 40 | 5 | | 180 | 14 | 0 |
| 5 | 23 | 5 | | 189 | 13 | 3 |
| 5 | 108 | 5 | | 224 | 11 | 13 |
| 5 | 142 | 5 | | 248 | 14 | 1 |
| 5 | 244 | | 5 | 3 | 11 | 6 |
| 5 | 227 | | 5 | 46 | 10 | 2 |
| 5 | 159 | | 5 | 82 | 6 | 14 |
| 5 | 193 | | 5 | 102 | 0 | 9 |
| 5 | 176 | | 5 | 145 | 16 | 5 |
| 6 | 14 | 6 | | 51 | 0 | 12 |
| 6 | 31 | 6 | | 113 | 12 | 1 |
| 6 | 48 | 6 | | 137 | 15 | 4 |
| 6 | 133 | 6 | | 140 | 9 | 10 |
| 6 | 65 | 6 | | 165 | 10 | 0 |
| 6 | 116 | 6 | | 199 | 10 | 8 |
| 6 | 201 | | 6 | 4 | 9 | 8 |
| 6 | 99 | | 6 | 7 | 3 | 14 |
| 6 | 167 | | 6 | 24 | 3 | 3 |
| 6 | 235 | | 6 | 50 | 2 | 10 |
| 6 | 82 | | 6 | 52 | 15 | 14 |
| 6 | 252 | | 6 | 146 | 14 | 7 |
| 6 | 150 | | 6 | 184 | 6 | 8 |
| 6 | 184 | | 6 | 237 | 2 | 9 |
| 6 | 218 | | 6 | 248 | 14 | 1 |
| 7 | 39 | 7 | | 16 | 2 | 2 |
| 7 | 192 | 7 | | 38 | 9 | 1 |
| 7 | 22 | 7 | | 50 | 2 | 10 |
| 7 | 5 | 7 | | 150 | 6 | 0 |
| 7 | 124 | 7 | | 197 | 14 | 4 |
| 7 | 56 | 7 | | 204 | 0 | 3 |
| 7 | 73 | 7 | | 208 | 9 | 11 |
| 7 | 141 | | 7 | 28 | 12 | 11 |
| 7 | 209 | | 7 | 31 | 6 | 2 |
| 7 | 243 | | 7 | 74 | 5 | 13 |
| 7 | 158 | | 7 | 96 | 12 | 12 |
| 7 | 226 | | 7 | 183 | 8 | 6 |
| 7 | 175 | | 7 | 200 | 8 | 10 |
| 7 | 90 | | 7 | 226 | 7 | 2 |
| 7 | 107 | | 7 | 227 | 5 | 4 |

FIG. 57B

| index | | 15i(17) | | | | |
|---|---|---|---|---|---|---|
| 15i(17) | i | bs1 | bs2 | yi | 15yi(17) | 17yi(15) |
| 8 | 234 | 8 | | 3 | 11 | 6 |
| 8 | 13 | 8 | | 7 | 3 | 14 |
| 8 | 149 | 8 | | 59 | 1 | 13 |
| 8 | 115 | 8 | | 74 | 5 | 13 |
| 8 | 64 | 8 | | 177 | 3 | 9 |
| 8 | 47 | 8 | | 206 | 13 | 7 |
| 8 | 81 | 8 | | 210 | 5 | 0 |
| 8 | 98 | 8 | | 222 | 15 | 9 |
| 8 | 30 | 8 | | 251 | 8 | 7 |
| 8 | 166 | | 8 | 1 | 15 | 2 |
| 8 | 251 | | 8 | 19 | 13 | 8 |
| 8 | 200 | | 8 | 54 | 11 | 3 |
| 8 | 217 | | 8 | 161 | 1 | 7 |
| 8 | 183 | | 8 | 238 | 0 | 11 |
| 8 | 132 | | 8 | 247 | 16 | 14 |
| 9 | 4 | 9 | | 27 | 14 | 9 |
| 9 | 72 | 9 | | 127 | 1 | 14 |
| 9 | 55 | 9 | | 164 | 12 | 13 |
| 9 | 89 | 9 | | 179 | 16 | 13 |
| 9 | 38 | 9 | | 237 | 2 | 9 |
| 9 | 123 | 9 | | 238 | 0 | 11 |
| 9 | 106 | | 9 | 16 | 2 | 2 |
| 9 | 157 | | 9 | 26 | 16 | 7 |
| 9 | 21 | | 9 | 45 | 12 | 0 |
| 9 | 174 | | 9 | 48 | 6 | 6 |
| 9 | 191 | | 9 | 49 | 4 | 8 |
| 9 | 140 | | 9 | 99 | 6 | 3 |
| 9 | 208 | | 9 | 112 | 14 | 14 |
| 9 | 225 | | 9 | 191 | 9 | 7 |
| 9 | 242 | | 9 | 236 | 4 | 7 |
| 10 | 114 | 10 | | 1 | 15 | 2 |
| 10 | 148 | 10 | | 13 | 8 | 11 |
| 10 | 97 | 10 | | 35 | 15 | 10 |
| 10 | 165 | 10 | | 46 | 10 | 2 |
| 10 | 12 | 10 | | 98 | 8 | 1 |
| 10 | 80 | 10 | | 105 | 11 | 0 |
| 10 | 46 | 10 | | 123 | 9 | 6 |
| 10 | 29 | 10 | | 241 | 11 | 2 |
| 10 | 233 | | 10 | 6 | 5 | 12 |
| 10 | 182 | | 10 | 62 | 12 | 4 |
| 10 | 199 | | 10 | 92 | 3 | 4 |
| 10 | 250 | | 10 | 140 | 9 | 10 |
| 10 | 63 | | 10 | 164 | 12 | 13 |
| 10 | 216 | | 10 | 193 | 5 | 11 |
| 10 | 131 | | 10 | 204 | 0 | 3 |
| 11 | 156 | 11 | | 64 | 8 | 8 |
| 11 | 37 | 11 | | 67 | 2 | 14 |
| 11 | 20 | 11 | | 90 | 7 | 0 |
| 11 | 54 | 11 | | 112 | 14 | 14 |
| 11 | 71 | 11 | | 124 | 7 | 8 |
| 11 | 105 | 11 | | 139 | 11 | 8 |
| 11 | 173 | 11 | | 143 | 3 | 1 |
| 11 | 3 | 11 | | 152 | 2 | 4 |
| 11 | 88 | 11 | | 200 | 8 | 10 |
| 11 | 241 | | 11 | 23 | 5 | 1 |
| 11 | 190 | | 11 | 35 | 15 | 10 |
| 11 | 207 | | 11 | 41 | 3 | 7 |
| 11 | 224 | | 11 | 51 | 0 | 12 |
| 11 | 122 | | 11 | 129 | 14 | 3 |
| 11 | 139 | | 11 | 222 | 15 | 9 |

| index | | 15i(17) | | | | |
|---|---|---|---|---|---|---|
| 15i(17) | i | bs1 | bs2 | yi | 15yi(17) | 17yi(15) |
| 12 | 96 | 12 | | 19 | 13 | 8 |
| 12 | 11 | 12 | | 25 | 1 | 5 |
| 12 | 79 | 12 | | 48 | 6 | 6 |
| 12 | 28 | 12 | | 102 | 0 | 9 |
| 12 | 62 | 12 | | 226 | 7 | 2 |
| 12 | 147 | | 12 | 8 | 1 | 1 |
| 12 | 198 | | 12 | 14 | 6 | 13 |
| 12 | 249 | | 12 | 37 | 11 | 14 |
| 12 | 130 | | 12 | 75 | 3 | 0 |
| 12 | 215 | | 12 | 100 | 4 | 5 |
| 12 | 164 | | 12 | 104 | 13 | 13 |
| 12 | 45 | | 12 | 113 | 12 | 1 |
| 12 | 232 | | 12 | 143 | 3 | 1 |
| 12 | 113 | | 12 | 219 | 4 | 3 |
| 12 | 181 | | 12 | 241 | 11 | 2 |
| 13 | 53 | 13 | | 8 | 1 | 1 |
| 13 | 87 | 13 | | 24 | 3 | 3 |
| 13 | 155 | 13 | | 82 | 6 | 14 |
| 13 | 189 | 13 | | 119 | 0 | 13 |
| 13 | 2 | 13 | | 141 | 7 | 12 |
| 13 | 36 | 13 | | 191 | 9 | 7 |
| 13 | 172 | 13 | | 217 | 8 | 14 |
| 13 | 19 | 13 | | 246 | 1 | 12 |
| 13 | 206 | | 13 | 13 | 8 | 11 |
| 13 | 104 | | 13 | 56 | 7 | 7 |
| 13 | 121 | | 13 | 118 | 2 | 11 |
| 13 | 138 | | 13 | 150 | 6 | 0 |
| 13 | 223 | | 13 | 152 | 2 | 4 |
| 13 | 70 | | 13 | 177 | 3 | 9 |
| 13 | 240 | | 13 | 223 | 13 | 11 |
| 14 | 78 | 14 | | 32 | 4 | 4 |
| 14 | 10 | 14 | | 45 | 12 | 0 |
| 14 | 27 | 14 | | 56 | 7 | 7 |
| 14 | 163 | 14 | | 62 | 12 | 4 |
| 14 | 129 | 14 | | 76 | 1 | 2 |
| 14 | 44 | 14 | | 100 | 4 | 5 |
| 14 | 95 | 14 | | 145 | 16 | 5 |
| 14 | 146 | 14 | | 161 | 1 | 7 |
| 14 | 61 | 14 | | 192 | 7 | 9 |
| 14 | 197 | | 14 | 111 | 16 | 12 |
| 14 | 248 | | 14 | 139 | 11 | 8 |
| 14 | 231 | | 14 | 148 | 10 | 11 |
| 14 | 112 | | 14 | 153 | 0 | 6 |
| 14 | 180 | | 14 | 197 | 14 | 4 |
| 14 | 214 | | 14 | 199 | 10 | 8 |
| 15 | 154 | 15 | | 4 | 9 | 8 |
| 15 | 171 | 15 | | 12 | 10 | 9 |
| 15 | 52 | 15 | | 28 | 12 | 11 |
| 15 | 205 | 15 | | 41 | 3 | 7 |
| 15 | 69 | 15 | | 75 | 3 | 0 |
| 15 | 222 | 15 | | 187 | 0 | 14 |
| 15 | 1 | 15 | | 198 | 12 | 6 |
| 15 | 18 | 15 | | 223 | 13 | 11 |
| 15 | 86 | 15 | | 236 | 4 | 7 |
| 15 | 188 | | 15 | 59 | 1 | 13 |
| 15 | 239 | | 15 | 76 | 1 | 2 |
| 15 | 137 | | 15 | 123 | 9 | 6 |
| 15 | 103 | | 15 | 134 | 4 | 13 |
| 15 | 35 | | 15 | 216 | 10 | 12 |
| 15 | 120 | | 15 | 239 | 15 | 13 |

FIG. 57C

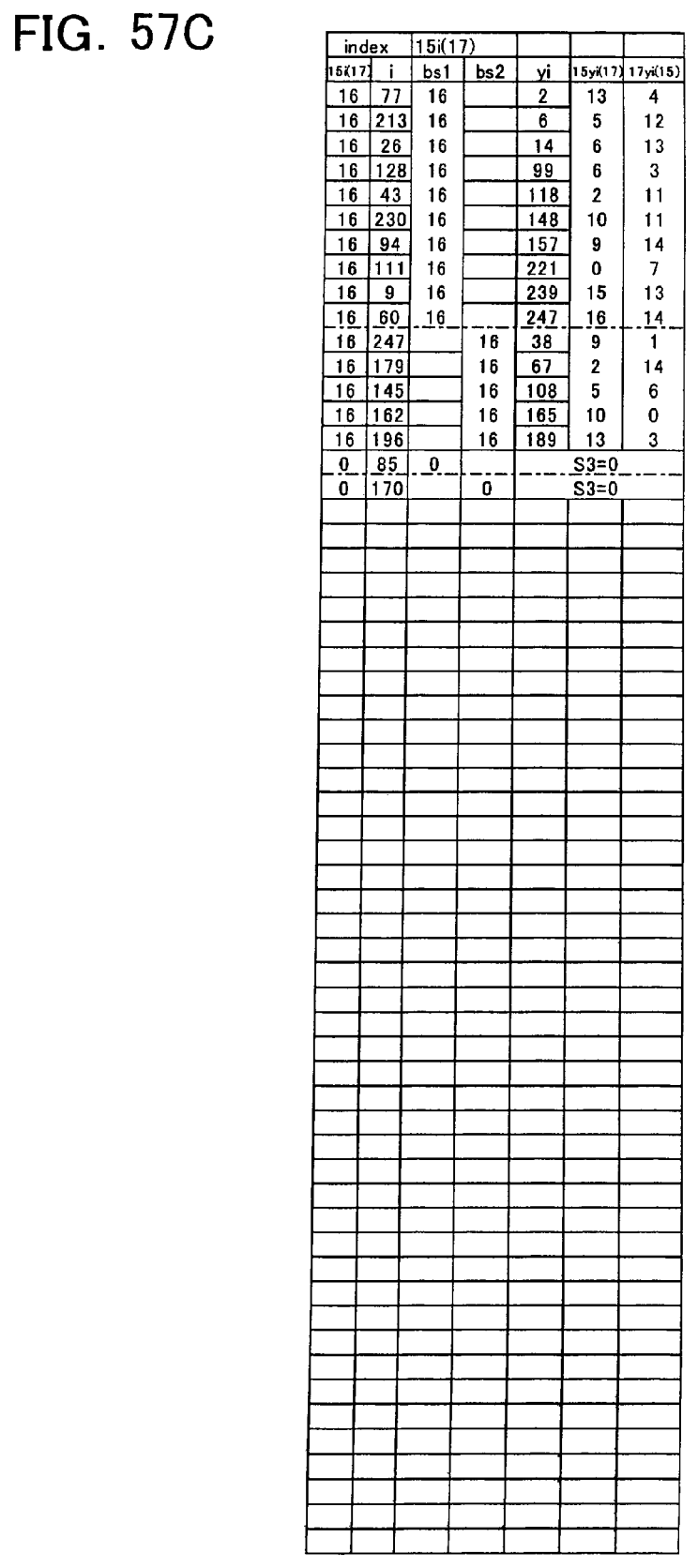

| index | | 15i(17) | | | | |
|---|---|---|---|---|---|---|
| 15i(17) | i | bs1 | bs2 | yi | 15yi(17) | 17yi(15) |
| 16 | 77 | 16 | | 2 | 13 | 4 |
| 16 | 213 | 16 | | 6 | 5 | 12 |
| 16 | 26 | 16 | | 14 | 6 | 13 |
| 16 | 128 | 16 | | 99 | 6 | 3 |
| 16 | 43 | 16 | | 118 | 2 | 11 |
| 16 | 230 | 16 | | 148 | 10 | 11 |
| 16 | 94 | 16 | | 157 | 9 | 14 |
| 16 | 111 | 16 | | 221 | 0 | 7 |
| 16 | 9 | 16 | | 239 | 15 | 13 |
| 16 | 60 | 16 | | 247 | 16 | 14 |
| 16 | 247 | | 16 | 38 | 9 | 1 |
| 16 | 179 | | 16 | 67 | 2 | 14 |
| 16 | 145 | | 16 | 108 | 5 | 6 |
| 16 | 162 | | 16 | 165 | 10 | 0 |
| 16 | 196 | | 16 | 189 | 13 | 3 |
| 0 | 85 | 0 | | S3=0 | | |
| 0 | 170 | | 0 | S3=0 | | |

FIG. 58A

| index | | 17i(15) | | | | |
|---|---|---|---|---|---|---|
| 17i(15) | i | bs1 | bs2 | yi | 15yi(17) | 17yi(15) |
| 0 | 0 | 0 | 0 | 0 | 0 | 0 |
| 0 | 210 | 0 | | 23 | 5 | 1 |
| 0 | 165 | 0 | | 46 | 10 | 2 |
| 0 | 75 | 0 | | 92 | 3 | 4 |
| 0 | 105 | 0 | | 139 | 11 | 8 |
| 0 | 60 | 0 | | 247 | 16 | 14 |
| 0 | 30 | 0 | | 251 | 8 | 7 |
| 0 | 15 | 0 | | 253 | 4 | 11 |
| 0 | 135 | 0 | | 254 | 2 | 13 |
| 0 | 45 | | 0 | 113 | 12 | 1 |
| 0 | 195 | | 0 | 127 | 1 | 14 |
| 0 | 150 | | 0 | 184 | 6 | 8 |
| 0 | 225 | | 0 | 191 | 9 | 7 |
| 0 | 180 | | 0 | 197 | 14 | 4 |
| 0 | 240 | | 0 | 223 | 13 | 11 |
| 0 | 90 | | 0 | 226 | 7 | 2 |
| 0 | 120 | | 0 | 239 | 15 | 13 |
| 1 | 53 | 1 | | 8 | 1 | 1 |
| 1 | 8 | 1 | | 54 | 11 | 3 |
| 1 | 128 | 1 | | 99 | 6 | 3 |
| 1 | 173 | 1 | | 143 | 3 | 1 |
| 1 | 143 | 1 | | 184 | 6 | 8 |
| 1 | 23 | 1 | | 189 | 13 | 3 |
| 1 | 98 | 1 | | 222 | 15 | 9 |
| 1 | 38 | 1 | | 237 | 2 | 9 |
| 1 | 233 | | 1 | 6 | 5 | 12 |
| 1 | 188 | | 1 | 59 | 1 | 13 |
| 1 | 158 | | 1 | 96 | 12 | 12 |
| 1 | 83 | | 1 | 128 | 16 | 1 |
| 1 | 248 | | 1 | 139 | 11 | 8 |
| 1 | 68 | | 1 | 170 | 0 | 10 |
| 1 | 203 | | 1 | 179 | 16 | 13 |
| 1 | 113 | | 1 | 219 | 4 | 3 |
| 1 | 218 | | 1 | 248 | 14 | 1 |
| 2 | 91 | 2 | | 31 | 6 | 2 |
| 2 | 151 | 2 | | 103 | 15 | 11 |
| 2 | 16 | 2 | | 108 | 5 | 6 |
| 2 | 31 | 2 | | 113 | 12 | 1 |
| 2 | 46 | 2 | | 123 | 9 | 6 |
| 2 | 61 | 2 | | 192 | 7 | 9 |
| 2 | 1 | 2 | | 198 | 12 | 6 |
| 2 | 76 | 2 | | 219 | 4 | 3 |
| 2 | 166 | | 2 | 1 | 15 | 2 |
| 2 | 211 | | 2 | 12 | 10 | 9 |
| 2 | 106 | | 2 | 16 | 2 | 2 |
| 2 | 241 | | 2 | 23 | 5 | 1 |
| 2 | 136 | | 2 | 85 | 0 | 5 |
| 2 | 121 | | 2 | 118 | 2 | 11 |
| 2 | 226 | | 2 | 183 | 8 | 6 |
| 2 | 196 | | 2 | 189 | 13 | 3 |
| 2 | 181 | | 2 | 241 | 11 | 2 |

| index | | 17i(15) | | | | |
|---|---|---|---|---|---|---|
| 17i(15) | i | bs1 | bs2 | yi | 15yi(17) | 17yi(15) |
| 3 | 114 | 3 | | 1 | 15 | 2 |
| 3 | 234 | 3 | | 3 | 11 | 6 |
| 3 | 39 | 3 | | 16 | 2 | 2 |
| 3 | 69 | 3 | | 75 | 3 | 0 |
| 3 | 129 | 3 | | 76 | 1 | 2 |
| 3 | 54 | 3 | | 112 | 14 | 14 |
| 3 | 189 | 3 | | 119 | 0 | 13 |
| 3 | 24 | 3 | | 196 | 16 | 2 |
| 3 | 9 | 3 | | 239 | 15 | 13 |
| 3 | 99 | | 3 | 7 | 3 | 14 |
| 3 | 204 | | 3 | 34 | 0 | 8 |
| 3 | 249 | | 3 | 37 | 11 | 14 |
| 3 | 174 | | 3 | 48 | 6 | 6 |
| 3 | 159 | | 3 | 82 | 6 | 14 |
| 3 | 219 | | 3 | 119 | 0 | 13 |
| 3 | 84 | | 3 | 180 | 14 | 0 |
| 3 | 144 | | 3 | 254 | 2 | 13 |
| 4 | 77 | 4 | | 2 | 13 | 4 |
| 4 | 2 | 4 | | 141 | 7 | 12 |
| 4 | 17 | 4 | | 170 | 0 | 10 |
| 4 | 152 | 4 | | 183 | 8 | 6 |
| 4 | 47 | 4 | | 206 | 13 | 7 |
| 4 | 32 | 4 | | 216 | 10 | 12 |
| 4 | 62 | 4 | | 226 | 7 | 2 |
| 4 | 167 | | 4 | 24 | 3 | 3 |
| 4 | 212 | | 4 | 32 | 4 | 4 |
| 4 | 227 | | 4 | 46 | 10 | 2 |
| 4 | 182 | | 4 | 62 | 12 | 4 |
| 4 | 197 | | 4 | 111 | 16 | 12 |
| 4 | 137 | | 4 | 123 | 9 | 6 |
| 4 | 122 | | 4 | 129 | 14 | 3 |
| 4 | 107 | | 4 | 227 | 5 | 4 |
| 4 | 242 | | 4 | 236 | 4 | 7 |
| 4 | 92 | | 4 | 246 | 1 | 12 |
| 5 | 205 | 5 | | 41 | 3 | 7 |
| 5 | 10 | 5 | | 45 | 12 | 0 |
| 5 | 115 | 5 | | 74 | 5 | 13 |
| 5 | 220 | 5 | | 146 | 14 | 7 |
| 5 | 55 | 5 | | 164 | 12 | 13 |
| 5 | 40 | 5 | | 180 | 14 | 0 |
| 5 | 100 | | 5 | 27 | 14 | 9 |
| 5 | 190 | | 5 | 35 | 15 | 10 |
| 5 | 235 | | 5 | 50 | 2 | 10 |
| 5 | 130 | | 5 | 75 | 3 | 0 |
| 5 | 145 | | 5 | 108 | 5 | 6 |
| 5 | 250 | | 5 | 140 | 9 | 10 |
| 5 | 70 | | 5 | 177 | 3 | 9 |
| 5 | 25 | | 5 | 198 | 12 | 6 |
| 5 | 175 | | 5 | 200 | 8 | 10 |
| 5 | 160 | | 5 | 210 | 5 | 0 |

FIG. 58B

| index | | 17i(15) | | | | |
|---|---|---|---|---|---|---|
| 17i(15) | i | bs1 | bs2 | yi | 15yi(17) | 17yi(15) |
| 6 | 213 | 6 | | 6 | 5 | 12 |
| 6 | 78 | 6 | | 32 | 4 | 4 |
| 6 | 93 | 6 | | 96 | 12 | 12 |
| 6 | 48 | 6 | | 137 | 15 | 4 |
| 6 | 3 | 6 | | 152 | 2 | 4 |
| 6 | 18 | 6 | | 223 | 13 | 11 |
| 6 | 108 | 6 | | 224 | 11 | 13 |
| 6 | 123 | 6 | | 238 | 0 | 11 |
| 6 | 228 | | 6 | 2 | 13 | 4 |
| 6 | 198 | | 6 | 14 | 6 | 13 |
| 6 | 153 | | 6 | 68 | 0 | 1 |
| 6 | 243 | | 6 | 74 | 5 | 13 |
| 6 | 168 | | 6 | 105 | 11 | 0 |
| 6 | 138 | | 6 | 150 | 6 | 0 |
| 6 | 63 | | 6 | 164 | 12 | 13 |
| 6 | 183 | | 6 | 238 | 0 | 11 |
| 6 | 33 | | 6 | 253 | 4 | 11 |
| 7 | 26 | 7 | | 14 | 6 | 13 |
| 7 | 11 | 7 | | 25 | 1 | 5 |
| 7 | 41 | 7 | | 26 | 16 | 7 |
| 7 | 71 | 7 | | 124 | 7 | 8 |
| 7 | 146 | 7 | | 161 | 1 | 7 |
| 7 | 116 | 7 | | 199 | 10 | 8 |
| 7 | 56 | 7 | | 204 | 0 | 3 |
| 7 | 86 | 7 | | 236 | 4 | 7 |
| 7 | 206 | | 7 | 13 | 8 | 11 |
| 7 | 221 | | 7 | 17 | 0 | 4 |
| 7 | 251 | | 7 | 19 | 13 | 8 |
| 7 | 191 | | 7 | 49 | 4 | 8 |
| 7 | 176 | | 7 | 145 | 16 | 5 |
| 7 | 131 | | 7 | 204 | 0 | 3 |
| 7 | 101 | | 7 | 206 | 13 | 7 |
| 7 | 236 | | 7 | 208 | 9 | 11 |
| 7 | 161 | | 7 | 224 | 11 | 13 |
| 8 | 154 | 8 | | 4 | 9 | 8 |
| 8 | 4 | 8 | | 27 | 14 | 9 |
| 8 | 79 | 8 | | 48 | 6 | 6 |
| 8 | 34 | 8 | | 85 | 0 | 5 |
| 8 | 49 | 8 | | 111 | 16 | 12 |
| 8 | 94 | 8 | | 157 | 9 | 14 |
| 8 | 64 | 8 | | 177 | 3 | 9 |
| 8 | 124 | 8 | | 197 | 14 | 4 |
| 8 | 19 | 8 | | 246 | 1 | 12 |
| 8 | 244 | | 8 | 3 | 11 | 6 |
| 8 | 169 | | 8 | 64 | 8 | 8 |
| 8 | 199 | | 8 | 92 | 3 | 4 |
| 8 | 109 | | 8 | 124 | 7 | 8 |
| 8 | 214 | | 8 | 199 | 10 | 8 |
| 8 | 229 | | 8 | 217 | 8 | 14 |
| 8 | 139 | | 8 | 222 | 15 | 9 |
| 8 | 184 | | 8 | 237 | 2 | 9 |

| index | | 17i(15) | | | | |
|---|---|---|---|---|---|---|
| 17i(15) | i | bs1 | bs2 | yi | 15yi(17) | 17yi(15) |
| 9 | 102 | 9 | | 17 | 0 | 4 |
| 9 | 87 | 9 | | 24 | 3 | 3 |
| 9 | 192 | 9 | | 38 | 9 | 1 |
| 9 | 27 | 9 | | 56 | 7 | 7 |
| 9 | 12 | 9 | | 98 | 8 | 1 |
| 9 | 72 | 9 | | 127 | 1 | 14 |
| 9 | 57 | 9 | | 128 | 16 | 1 |
| 9 | 117 | 9 | | 129 | 14 | 3 |
| 9 | 222 | 9 | | 187 | 0 | 14 |
| 9 | 147 | | 9 | 8 | 1 | 1 |
| 9 | 207 | | 9 | 41 | 3 | 7 |
| 9 | 42 | | 9 | 90 | 7 | 0 |
| 9 | 177 | | 9 | 131 | 10 | 7 |
| 9 | 252 | | 9 | 146 | 14 | 7 |
| 9 | 162 | | 9 | 165 | 10 | 0 |
| 9 | 237 | | 9 | 187 | 0 | 14 |
| 9 | 132 | | 9 | 247 | 16 | 14 |
| 10 | 185 | 10 | | 37 | 11 | 14 |
| 10 | 125 | 10 | | 70 | 13 | 5 |
| 10 | 110 | 10 | | 73 | 7 | 11 |
| 10 | 155 | 10 | | 82 | 6 | 14 |
| 10 | 20 | 10 | | 90 | 7 | 0 |
| 10 | 80 | 10 | | 105 | 11 | 0 |
| 10 | 95 | 10 | | 145 | 16 | 5 |
| 10 | 230 | 10 | | 148 | 10 | 11 |
| 10 | 5 | 10 | | 150 | 6 | 0 |
| 10 | 65 | 10 | | 165 | 10 | 0 |
| 10 | 245 | | 10 | 25 | 1 | 5 |
| 10 | 200 | | 10 | 54 | 11 | 3 |
| 10 | 140 | | 10 | 99 | 6 | 3 |
| 10 | 215 | | 10 | 100 | 4 | 5 |
| 10 | 50 | | 10 | 141 | 7 | 12 |
| 10 | 35 | | 10 | 216 | 10 | 12 |
| 11 | 13 | 11 | | 7 | 3 | 14 |
| 11 | 148 | 11 | | 13 | 8 | 11 |
| 11 | 163 | 11 | | 62 | 12 | 4 |
| 11 | 28 | 11 | | 102 | 0 | 9 |
| 11 | 118 | 11 | | 104 | 13 | 13 |
| 11 | 43 | 11 | | 118 | 2 | 11 |
| 11 | 133 | 11 | | 140 | 9 | 10 |
| 11 | 88 | 11 | | 200 | 8 | 10 |
| 11 | 73 | 11 | | 208 | 9 | 11 |
| 11 | 58 | 11 | | 227 | 5 | 4 |
| 11 | 193 | | 11 | 102 | 0 | 9 |
| 11 | 178 | | 11 | 103 | 15 | 11 |
| 11 | 208 | | 11 | 112 | 14 | 14 |
| 11 | 103 | | 11 | 134 | 4 | 13 |
| 11 | 238 | | 11 | 136 | 0 | 2 |
| 11 | 253 | | 11 | 137 | 15 | 4 |
| 11 | 223 | | 11 | 152 | 2 | 4 |

FIG. 58C

| index | | 17i(15) | | | | |
|---|---|---|---|---|---|---|
| 17i(15) | i | bs1 | bs2 | yi | 15yi(17) | 17yi(15) |
| 12 | 171 | 12 | | 12 | 10 | 9 |
| 12 | 96 | 12 | | 19 | 13 | 8 |
| 12 | 6 | 12 | | 49 | 4 | 8 |
| 12 | 156 | 12 | | 64 | 8 | 8 |
| 12 | 51 | 12 | | 136 | 0 | 2 |
| 12 | 36 | 12 | | 191 | 9 | 7 |
| 12 | 81 | 12 | | 210 | 5 | 0 |
| 12 | 111 | 12 | | 221 | 0 | 7 |
| 12 | 201 | | 12 | 4 | 9 | 8 |
| 12 | 141 | | 12 | 28 | 12 | 11 |
| 12 | 21 | | 12 | 45 | 12 | 0 |
| 12 | 126 | | 12 | 73 | 7 | 11 |
| 12 | 231 | | 12 | 148 | 10 | 11 |
| 12 | 186 | | 12 | 192 | 7 | 9 |
| 12 | 216 | | 12 | 193 | 5 | 11 |
| 12 | 246 | | 12 | 221 | 0 | 7 |
| 12 | 66 | | 12 | 251 | 8 | 7 |
| 13 | 14 | 13 | | 51 | 0 | 12 |
| 13 | 59 | 13 | | 52 | 15 | 14 |
| 13 | 149 | 13 | | 59 | 1 | 13 |
| 13 | 119 | 13 | | 68 | 0 | 1 |
| 13 | 44 | 13 | | 100 | 4 | 5 |
| 13 | 134 | 13 | | 131 | 10 | 7 |
| 13 | 74 | 13 | | 134 | 4 | 13 |
| 13 | 89 | 13 | | 179 | 16 | 13 |
| 13 | 29 | 13 | | 241 | 11 | 2 |
| 13 | 209 | | 13 | 31 | 6 | 2 |
| 13 | 224 | | 13 | 51 | 0 | 12 |
| 13 | 104 | | 13 | 56 | 7 | 7 |
| 13 | 179 | | 13 | 67 | 2 | 14 |
| 13 | 194 | | 13 | 70 | 13 | 5 |
| 13 | 239 | | 13 | 76 | 1 | 2 |
| 13 | 164 | | 13 | 104 | 13 | 13 |
| 13 | 254 | | 13 | 196 | 16 | 2 |
| 14 | 52 | 14 | | 28 | 12 | 11 |
| 14 | 187 | 14 | | 34 | 0 | 8 |
| 14 | 97 | 14 | | 35 | 15 | 10 |
| 14 | 22 | 14 | | 50 | 2 | 10 |
| 14 | 37 | 14 | | 67 | 2 | 14 |
| 14 | 7 | 14 | | 153 | 0 | 6 |
| 14 | 67 | 14 | | 193 | 5 | 11 |
| 14 | 172 | 14 | | 217 | 8 | 14 |
| 14 | 142 | 14 | | 248 | 14 | 1 |
| 14 | 157 | | 14 | 26 | 16 | 7 |
| 14 | 247 | | 14 | 38 | 9 | 1 |
| 14 | 82 | | 14 | 52 | 15 | 14 |
| 14 | 127 | | 14 | 98 | 8 | 1 |
| 14 | 232 | | 14 | 143 | 3 | 1 |
| 14 | 112 | | 14 | 153 | 0 | 6 |
| 14 | 202 | | 14 | 157 | 9 | 14 |
| 14 | 217 | | 14 | 161 | 1 | 7 |
| 5 | 85 | 5 | | S3=0 | | |
| 10 | 170 | | 10 | S3=0 | | |

Decoder Circuit 1707, 1807
(yi(17) DEC, yi(15) DEC)

Index/Binary Converting Circuit 1703, 1704, 1803, 1804 no index 2EC(17)

no index 2EC(15)

SEMICONDUCTOR MEMORY DEVICE

CROSS-REFERENCE TO RELATED APPLICATION

This application is based on and claims the benefit of priority from the prior Japanese Patent Application No. 2006-230375, filed on Aug. 28, 2006, the entire contents of which are incorporated herein by reference.

BACKGROUND OF THE INVENTION

1. Field of the Invention

This invention relates to a semiconductor memory device, more specifically, to an error detection and correction system adaptable for use therein.

2. Description of the Related Art

Electrically rewritable and non-volatile semiconductor memory devises, i.e., flash memories, increase in error rate with increasing of the number of data rewrite operations. In particular, as a memory capacity increases and the miniaturization is enhanced, the error rate increases more. In this view point, it becomes a material technique to mount an ECC circuit on a flash memory chip.

There has been provided such a technique that an ECC circuit is formed on a flash memory chip or in a memory controller (for example, JP-A2000-173289).

To constitute a BCH-ECC system using Galois finite field $GF(2^n)$, in which 2-bit or more errors are correctable, if error location search is performed in such a way as to sequentially substitute finite field elements in the error searching equation to obtain elements satisfying the equation, it takes a very long operation time, and read/write performance of the memory will be largely reduced even if the system is formed as on-chip one.

Therefore, it is desired to constitute a high speed ECC system without the above-described sequential searching, which does not sacrifice the memory performance.

SUMMARY OF THE INVENTION

According to an aspect of the present invention, there is provided a semiconductor memory device including an error detecting and correcting system, wherein the error detecting and correcting system includes a 3EC system configured to be able to detect and correct 3-bit errors, and wherein the 3EC system is configured to search errors in such a manner that 3-degree error searching equation is divided into a first part containing only unknown numbers and a second part calculative with syndromes via variable transformation by use of two or more parameters, and previously nominated solution indexes collected in a table and syndrome indexes are compared to each other.

According to an another aspect of the present invention, there is provided a semiconductor memory device including an error detecting and correcting system for detecting and correcting an error bit of read out data with a BCH code, wherein the error detecting and correcting system includes:

a 3EC system and a 2EC system configured to be able to detect and correct 3-bit errors and up to 2-bit errors, respectively, either solution results of the 3EC system or 2EC system being selected in accordance with an error situation; and a warning signal generating circuit configured to generate a warning signal designating that there are 4-bit or more errors in case syndromes are not in an all "0" state, and in case no error location is searched with whichever of the 3EC system and 2EC system.

BRIEF DESCRIPTION OF THE DRAWINGS

FIGS. 3A, 3B, 3C, and 3D show tables for selecting polynomial degrees used for calculating check bits of the 3EC-EW system.

FIGS. 8A, 8B and 8C show a selection table for the degrees of data bits used in syndrome $S_1$ calculation.

FIGS. 11A, 11B and 11C show a selection table for the degrees of data bits used in syndrome $S_3$ calculation.

FIGS. 13A, 13B and 13C show a selection table for the degrees of data bits used in syndrome $S_5$ calculation.

FIGS. 16A, 16B and 16C and 17A, 17B, and 17C are tables for showing the relationship between the expression index components and element polynomial of GF(256).

FIG. 18 is a table showing the relationship between the expression indexes and multiple element polynomial of GF(256).

FIGS. 34A, 34B, 34C, 34D and 34E are selection tables showing the relationship between the coefficients of element polynomial and the expression indexes.

FIGS. 45A, 45 and 45C are tables showing the relationship between index $z_j$ of $z^3+z$ and index j of z.

FIGS. 46A, 46B, and 46C, and 47A, 47B and 47C are tables showing the relationship between the expression index of zj, expression index component of "j" and data buses.

FIGS. 56A, 56B and 56C are tables showing the relationship between index "i" of "y" and index "$y_i$" of $y^2+y+1$.

FIGS. 57A, 57B and 57C and 58A, 58B and 58C are tables showing the relationship between the expression index of $y_i$, expression index component of "i" and data buses.

DETAILED DESCRIPTION OF THE EMBODIMENTS

Figure 1:
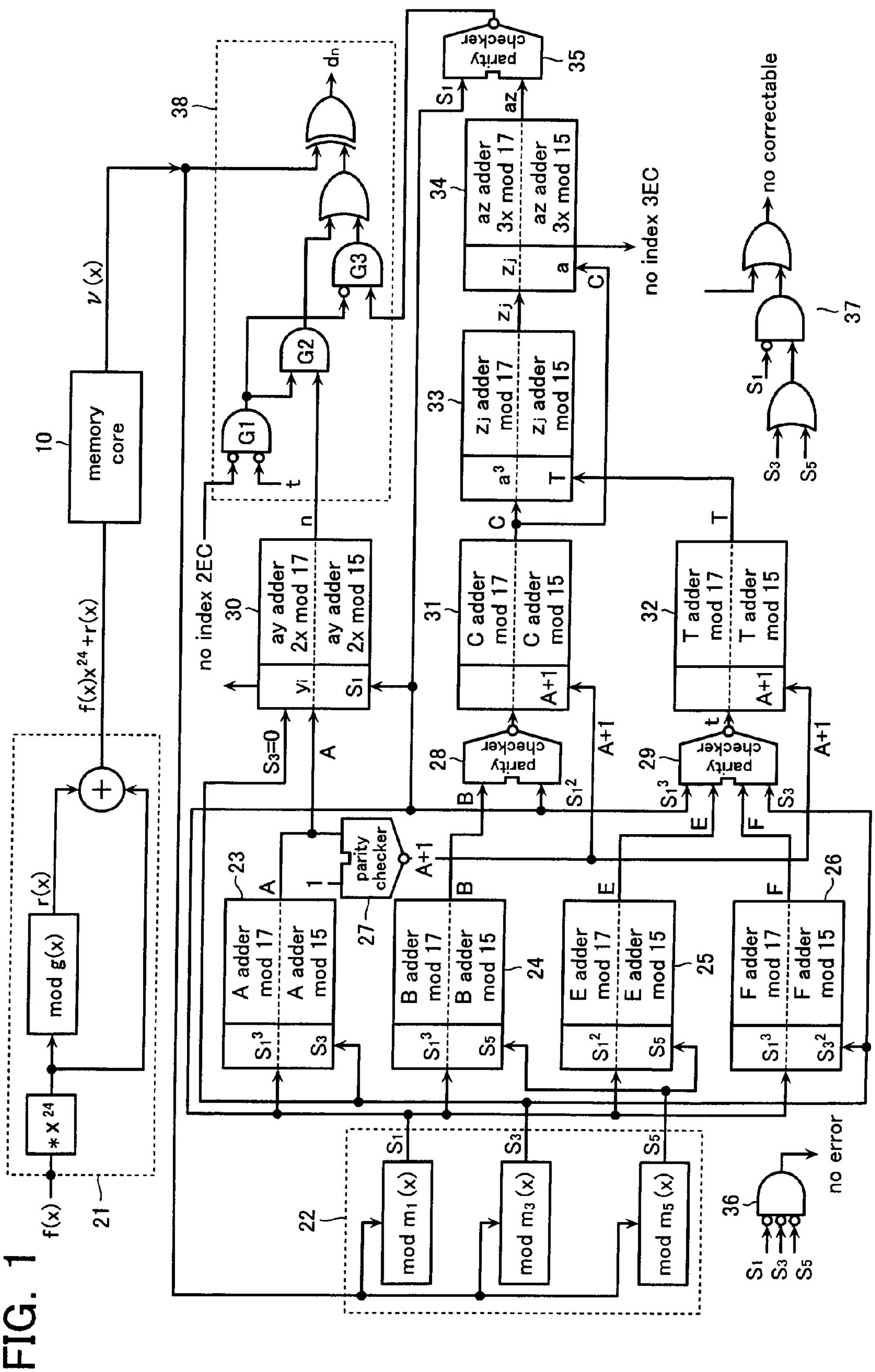
FIG. 1 shows a block configuration of a 3EC-EW system in accordance with an embodiment of the present invention.

Illustrative embodiments of this invention will be explained with reference to the accompanying drawings below.

There has already been provided by this inventor such a method that 2-bit error correction may be performed with a high-speed operation in place of the conventional method, in which finite elements are sequential substituted in the error searching equation to solve it.

That is, to perform error location search at a high rate with BCH code on GF(256), form a table for designating solution candidacy, and compare syndrome indexes calculated from read out data of a memory with the table to obtain a solution. In detail, an error searching equation including syndromes calculated from the read data is solved. In this case, the error searching equation is divided into a part including only unknown numbers (refer to as a variable part, hereinafter) and another part to be calculated by syndromes (refer to as a syndrome part) by use of variable transformation, so that an error location becomes possible to be solved by use of relationships between them. In other word, comparing the indexes of the syndrome part and variable part, the identical variable designates the index corresponding to the error location, whereby the error location may be searched.

Calculation necessary for error location searching is to decide an index satisfying congruence. In this case, a congruence with mod 255 is divided into two congruences with mod 17 and 15, and it is used such a characteristic that a number satisfying the two congruences satisfies the original congruence. With this method, it becomes possible to search an error location with a small circuit scale and a small operation time.

The present invention enlarges the 2-bit error detection and correction system (2EC system) described above to provide a high-speed and on-chip use 3-bit error detection and correction system (3EC system).

In the 3EC-BCH system, 3-degree polynomial including unknown numbers and syndromes is used as an error searching equation. By use of linear transformation with two parameters introduced, the polynomial is divided into a variable part and a syndrome part, and in consideration of a so-called "expression index" when solutions and table thereof are compared with each other, the calculation may be performed in a short time as parallel operations. These facts have been made clear through this inventor's examinations.

Mounting such a "3EC-EW" system on a flash memory chip that is capable of 3-bit error correction and error warning for 4-bit or more errors with BCH code, it becomes possible to obtain a flash memory without reducing the memory performance and with a high reliability of data retention.

[Summary of the 3EC-EW System]

To execute 3-bit error correction with a BCH code over $GF(2^n)$, the error location searching equation, which contains unknown numbers designating an error location and syndromes, is subjected to variable transformation with two or more parameters introduced, and divided into variable parts and syndrome parts.

The 3EC-EW system includes, in detail, a 2EC system and a 3EC system, in which up to 2-bit errors and 3-bit errors are correctable, respectively. The error location searching equations for the 2EC system and the 3EC system are divided into variable parts and syndrome parts through variable transformations with one parameter and two parameters, respectively, and solved results will be exchanged in accordance with a situation of the error number.

When designating the respective elements in the ECC system using elements of finite GF($2^n$) by indexes of roots of the basic irreducible polynomial, $2^n-1$ is factorized into two prime factors, and indexes are multiplied by the prime factors, respectively. The obtained remainders with the prime factors as modulo are referred to as "expression indexes", and operations between elements are performed by use of the expression indexes. That is, the operations between elements are performed as follows: product of the elements is performed as addition of the elements in the respective expression indexes; and addition of the elements is performed as parity check between coefficients obtained from the remainder polynomial of the basic irreducible polynomial.

(Data Encoding)

First, data encoding of the 3EC-EW system formed over Galois field GF($2^8$) will be explained. Assume that a basic irreducible polynomial on GF(2) is $m_1(x)$ and root thereof is $\alpha$. In case GF($2^8$) is used as a finite field, $m_1(x)$ is expressed as a 8-degree polynomial as shown in the following Expression 1. For 3-bit error correction, as shown in the Expression 1, two irreducible polynomials $m_3(x)$ and $m_5(x)$ with roots $\alpha^3$ and $\alpha^5$, respectively, are used in addition to $m_1(x)$.

$$\alpha: m_1(x)=x^8+x^4+x^3+x^2+1$$

$$\alpha^3: m_3(x)=x^8+x^6+x^5+x^4+x^2+x+1$$

$$\alpha^5: m_5(x)=x^8+x^7+x^6+x^5+x^4+x+1 \quad \text{[Exp. 1]}$$

Based on the three irreducible polynomials, a 3-bit error correctable ECC system will be configured. To perform encoding to generate check bits added to-be-written data, prepare a polynomial g(x) that is a product of $m_1(x)$, $m_3(x)$ and $m_5(x)$ as a code generation polynomial, as shown in Expression 2.

$$g(x)=m_1(x)m_3(x)m_5(x)=x^{24}+x^{23}+x^{21}+x^{20}+x^{19}+x^{17}+x^{16}+x^{15}+x^{13}+x^8+x^5+x^4+x^2+1 \quad \text{[Exp. 2]}$$

A maximum number usable as three-bit error correctable information bits is 231, which is obtained by subtracting check bit numbers 24 from $2^8-1=255$. Based on these bits, letting the coefficients of bit positions 24 to 254 be $a_{24}$ to $a_{254}$, an information polynomial f(x) is formed as shown in the following Expression 3.

$$f(x)=a_{254}x^{230}+a_{253}x^{229}+\ldots+a_{26}x^2+a_{25}x+a_{24} \quad \text{[Exp. 3]}$$

From the information polynomial f(x), a data polynomial $f(x)x^{24}$ containing 24 check bits is obtained. To make such check bits, the data polynomial $f(x)x^{24}$ will be divided by the code generation polynomial g(x) to obtain a remainder polynomial r(x) as shown in the following Expression 4.

$$f(x)x^{24}=q(x)g(x)+r(x)$$

$$r(x)=b_{23}x^{23}+b_{22}x^{22}+\ldots+b_1x+b_0 \quad \text{[Exp. 4]}$$

24 bits, i.e., coefficients $b_{23}$ to $b_0$ in the remainder polynomial r(x), are used as "check bits", and these are stored in the memory together with the "information bits" defined by the coefficients $a_{254}$ to $a_{24}$ of the information polynomial f(x). Therefore, data bits stored in the memory are represented by the Expression 5.

$$a_{254}a_{253}\ldots a_{26}a_{25}a_{24}b_{23}b_{22}\ldots b_1b_0 \quad \text{[Exp. 5]}$$

(Data Decoding)

If an error takes place when the coefficients of 254-degree polynomial are stored as information bits, the error should also be expressed by 254-degree polynomial. Supposing that an error polynomial is e(x), read out data from the memory will be expressed by such a polynomial $\nu(x)$ shown in the following Expression 6.

$$\nu(x)=f(x)x^{24}+r(x)+e(x) \quad \text{[Exp. 6]}$$

A term with the coefficient of this error polynomial e(x) being "1" corresponds to an error position.

At the first stage for decoding the read out data, $\nu(x)$ is divided by $m_1(x)$, $m_3(x)$ and $m_5(x)$ to obtain remainders $S_1(x)$, $S_3(x)$ and $S_5(x)$, respectively. As shown in the following Expression 7, these also are remainders obtained by dividing e(x) by $m_1(x)$, $m_3(x)$ and $m_5(x)$.

$$\nu(x)\equiv S_1(x) \bmod m_1(x) \rightarrow e(x)\equiv S_1(x) \bmod m_1(x)$$

$$\nu(x)\equiv S_3(x) \bmod m_3(x) \rightarrow e(x)\equiv S_3(x) \bmod m_3(x)$$

$$\nu(x)\equiv S_5(x) \bmod m_5(x) \rightarrow e(x)\equiv S_5(x) \bmod m_5(x) \quad \text{[Exp. 7]}$$

These division remainders $S_1(x)$, $S_3(x)$ and $S_5(x)$ are referred to as syndrome polynomials.

If 3-bit errors are present at i-th, j-th and k-th, e(x) will be expressed as follows: $e(x)=x^i+x^j+x^k$. Therefore, to search these indexes i, j and k, is to decide the error locations. In detail, these indexes will be obtained by calculation for the index of a root $\alpha$ of $m_1(x)=0$ in GF(256).

Introducing a remainder polynomial pn(x) defined by: $x^n\equiv pn(x) \bmod m1(x)$, $\alpha^n=pn(\alpha)$ is obtained in GF(256). As shown in the following Expression 8, roots $\alpha^i$, $\alpha^j$ and $\alpha^k$ corresponding to error orders are defined as $X_1$, $X_2$ and $X_3$; with respect to syndromes $S_1(x)$, $S_3(x)$ and $S_5(x)$, indexes corresponding to $S_1(\alpha)$, $S_3(\alpha)$ and $S_5(\alpha)$ are referred to as $\sigma_1$, $\sigma_3$ and $\sigma_5$; and $S_1(\alpha)$, $S_3(\alpha^3)$ and $S_5(\alpha^5)$ are referred to as $S_1$, $S_3$ and $S_5$. Note here that $S_1$, $S_3$ and $S_5$ are equivalent to $S_1(x)$, $S_3(x)$ and $S_5(x)$, respectively, in the expression by use of a remainder polynomial.

$$X_1=pi(\alpha)=\alpha^i$$

$$X_2=pj(\alpha)=\alpha^j$$

$$X_3=pk(\alpha)=\alpha^k$$

$$S_1(\alpha)=S_1=\alpha^{\sigma1}$$

$$S_3(\alpha^3)=S_3=\alpha^{\sigma3}$$

$$S_5(\alpha^5)=S_5=\alpha^{\sigma5} \quad \text{[Exp. 8]}$$

Since $m_3(\alpha^3)=m_5(\alpha^5)=0$, the following Expression 9 is obtained from the Expression 8.

$$e(\alpha)\equiv X_1+X_2+X_3=S_1$$

$$e(\alpha^3)\equiv X_1^3+X_2^3+X_3^3=S_3$$

$$e(\alpha^5)\equiv X_1^5+X_2^5+X_3^5=S_5 \quad \text{[Exp. 9]}$$

At the second stage, considering an error searching polynomial $\Lambda^R(x)=0$ having unknown numbers $X_1$, $X_3$ and $X_5$ as roots thereof, $\Lambda^R(x)$ will be expressed by basic symmetric equations $S_1$, D and T of $X_1$, $X_3$ and $X_5$ as shown in Expression 10.

$$\Lambda^R(x)=(x-X_1)(x-X_3)(x-X_5)=x^3+S_1x^2+Dx+T \quad \text{[Exp. 10]}$$

where, $D=X_1X_2+X_2X_3+X_3X_1$, $T=X_1X_2X_3$

Error location search is to search index "n" of the root $\alpha^n$ satisfying $\Lambda^R(x)=0$. Therefore, firstly, express the coefficients of $\Lambda^R(x)=0$ with syndromes $S_1$, $S_3$ and $S_5$. Since $S_1$, D and T are basic symmetric equations, and $S_3$ and $S_5$ are symmetric equations as being expressed by the basic symmetric equations; and D and T may be expressed by $S_1$, $S_3$ and $S_5$. That is, from the relationships of: $S_1^2D+S_1T=S_1^3+S_3$, $S_3D+S_1^2T=S_1^5+S_5$, assuming that $A=S_3/S_1^3$, $B=S_5/S_1^3$, the following Expression 11 is obtained.

$$D=d/(A+1)$$

$$d=B+S_3/S_1$$

$$T=t/(A+1)$$

$$t=S_1^3+S_3+E+F$$

$$E=S_5/S_1^2$$

$$F=S_3^2/S_1^3 \quad \text{[Exp. 11]}$$

At the third stage, finding the root $\alpha^n$ of $\Lambda^R(x)=0$ in GF(256), "i", "j" and "k" will be obtained as "n" of $\alpha^n$ from $X_1, X_2, X_3=\alpha^n$. That is, searching $\Lambda^R(x)=0$ in the range of n=0 to 254, hit "n" becomes an error bit.

Note here that the root of $\Lambda^R(x)=0$ is not always obtained, and there is such a case that the polynomial is not three-degree one. Therefore, in accordance with these cases, error numbers are different from each other. The error numbers and condition thereof may be summarized as follows.

[Exp. 12]

(1) 0-bit error: $S_1=S_3=S_5=0$.

(2) 1-bit error: $S_1=X_1$, $X_1^3=S_3=S_1^3$, $X_1^5=S_5=S_1^5$, then A=1, d=0 and t=0.

(3) 2-bit errors: $S_1=X_1+X_2$, $S_3=X_1^3+X_2^3$, $S_5=X_1^5+X_2^5$, then t=0.

(4) 3-bit errors: t=0 or no solution is obtained in 2EC system.

(5) more than 4-bit errors: $S_1=0$ and $S_3\neq0$ or $S_5\neq0$, or "n" is not obtained by searching $\Lambda^R(x)=0$. This is a case where errors are not correctable.

In case of 1-bit error or 2-bit errors, go to 2EC system to search a solution.

In case there are three errors, sequentially substituting finite elements for x, the solution may be obtained in principle. However, it is necessary to take a large amount of calculation. Therefore, in this embodiment, nominated solutions are collected in a table, and $\Lambda^R(x)$ is modified and divided into variable parts and syndrome parts, so that it is made possible to obtain the index "n" only based on the relationships between the nominated solution's indexes and the syndrome indexes.

Explaining in detail, in case of 3EC system, calculate index "n" of the root $\alpha^n$ of the three degree error location searching equation $\Lambda^R(x)=x^3+S_1x^2+Dx+T=0$. In this case, variable transformation of: x=az+b is used, and the error location searching equation is divided into the variable part and syndrome part as follows:

$$z^3+z=T/a^3 \quad \text{[Exp. 13]}$$

where, $a=C^{1/2}$, $C=(S_1^2+B)/(A+1)$, $b=S_1$

As the variable transformation method, it is possible to use other methods, for example, such a method that $z^2$ is remained. Here, the simplest method is selected. Basic indexes required to solve the variable transformed equation are $\sigma_1$ of $S_1$, $\sigma_3$ of $S_3$, $\sigma_5$ of $S_5$, $\sigma_A$ of A, $\sigma_B$ of B, $\sigma_T$ of T and $\sigma_a$ of "a".

Substituting $\alpha^j$ for the variable part "z" to obtain the index $z_j$ shown in the following Expression 14, and it is tabled.

$$z^3+z=\alpha^{3j}+\alpha^j=\alpha^{zj} \quad \text{[Exp. 14]}$$

Since the index of the syndrome part $T/a^3$ is $\sigma_T-3\sigma_a$, "j" satisfying the following Expression 15 is the index of the variable "z" corresponding to the error location.

$$\sigma_T-3\sigma_a\equiv z_j \bmod 255 \quad \text{[Exp. 15]}$$

The practical error location will be obtained as the bit position "n" as shown in the following Expression 16.

$$az=\alpha^{\sigma a+j}=\alpha^{\sigma X}$$

$$X=az+S_1=\alpha^{\sigma X}+\alpha^{\sigma 1}=\alpha^n \quad \text{[Exp. 16]}$$

In case of 2EC or 1EC, the error searching equation (i.e., solution searching polynomial) is expressed as: $\Lambda^R(x)=(x-X_1)(x-X_2)=x^2+S_1x+X_1X_2=0$, and index "n" of root $\alpha^n$ thereof will be searched. Here, $X_1X_2=S_1^2+S_3/S_1$.

In this case, $\Lambda^R(x)$ is modified to have a variable part and a syndrome part separated from each other, and it becomes possible to obtain "n" based on only the index relationships. That is, the following Expression 17 is obtained through variable transformation, $x=S_1y$.

$$y^2+y+1=S_3/S_1^3=A \quad \text{[Exp. 17]}$$

Assuming that the index of the result, $\alpha^{2i}+\alpha^i+1$, that is obtained by substituting $\alpha^i$ for the variable "y" in the Expression 17, is "$y_i$", "i" shown in the following Expression 18 is the index of "y" corresponding to an error position.

$$\alpha_A\equiv y_i \bmod 255 \quad \text{[Exp. 18]}$$

If there is no "i" satisfying yi as determined from the syndrome, no solution is obtained, i.e., there are 3-bit or more errors. Error location will be obtained as bit position "n" as shown in the following Expression 19.

$$x=S_1y=\alpha^{\sigma1+i}=\alpha^n \quad \text{[Exp. 19]}$$

Calculation necessary for error location searching through 3EC and 2EC cases is to decide indexes based on congruences between indexes. The calculation method required of this memory system will be explained below.

Every congruence is that with mod 255 on GF(256). If directly calculating the congruence, it becomes equivalent to performing comparison of 255×255, and resulting in that the circuit scale becomes great. In consideration of this, in this embodiment, the congruence calculation is parallelized. That is, 255 is factorized into two prime factors, and a congruence is divided into two congruences with different modulo defined by the prime factors. Then it will be used such a rule that in case a number satisfies simultaneously the divided congruences, it also satisfies the original congruence.

As explained below, by use of 255=17×15, every congruence is divided into two congruences of mod 17 and mod 15, which are simultaneously solved.

1: calculation for index $\alpha_A$ of $A=S_3/S_1^3$ is to obtain $\sigma_A\equiv\sigma_3-3\sigma_1 \pmod{255}$. Therefore, it is divided into two congruences shown in the following Expression 20.

$$15\sigma_A\equiv15\sigma_3-45\sigma_1 \pmod{17}$$

$$17\sigma_A\equiv17\sigma_3-51\sigma_1 \pmod{15} \quad \text{[Exp. 20]}$$

2: calculation for index $\alpha_B$ of $B=S_5/S_1^3$ is to obtain $\alpha_B\equiv\sigma_5-3\sigma_1 \pmod{255}$. Therefore, it is divided into two congruences shown in the following Expression 21.

$$15\sigma_B\equiv15\sigma_5-45\sigma_1 \pmod{17}$$

$$17\sigma_B\equiv17\sigma_5-51\sigma_1 \pmod{15} \quad \text{[Exp. 21]}$$

3: calculation for index $\alpha_E$ of $E=S_5/S_1^2$ is to obtain $\sigma_E\equiv\sigma_5-3\sigma_1 \pmod{255}$. Therefore, it is divided into two congruences shown in the following Expression 22.

$$15\sigma_E\equiv15\sigma_5-30\sigma_1 \pmod{17}$$

$$17\sigma_E\equiv17\sigma_5-34\sigma_1 \pmod{15} \quad \text{[Exp. 22]}$$

4: calculation for index $\alpha_F$ of $F=S_3^2/S_1^3$ is to obtain $\sigma_F \equiv 2\sigma_3 - 3\sigma_1$ (mod 255). Therefore, it is divided into two congruences shown in the following Expression 23.

$$15\sigma_F \equiv 30\sigma_3 - 45\sigma_1 (\text{mod } 17)$$

$$17\sigma_F \equiv 34\sigma_3 - 51\sigma_1 (\text{mod } 15) \quad \text{[Exp. 23]}$$

5: to select index "i" of "y" from "$y_i$", and obtain index "n" of $\alpha^{\sigma 1}y=\alpha^n$, decode "i" from $y_i=\sigma_A$ based on a table, and obtain $n \equiv \sigma_1 + i$ (mod 255). This congruence is divided into two congruences shown in the following Expression 24.

$$15n \equiv 15\sigma_1 + 15i (\text{mod } 17)$$

$$17n \equiv 17\sigma_1 + 17i (\text{mod } 15) \quad \text{[Exp. 24]}$$

6. calculation for index $\sigma_C$ of $C=(S_1^2+B)/(A+1)$ is to obtain $\sigma_C \equiv \sigma(S_1^2+B) - \sigma(A+1)$ (mod 255). Therefore, it is divided into two congruences shown in the following Expression 25.

$$15\sigma_C \equiv 15\sigma(S_1^2+B) - 15\sigma(A+1)(\text{mod } 17)$$

$$17\sigma_C \equiv 17\sigma(S_1^2+B) - 17\sigma(A+1)(\text{mod } 15) \quad \text{[Exp. 25]}$$

7. calculation for index $\sigma^T$ of $T=t/(A+1)$ is to obtain $\sigma_T \equiv \sigma_t - \sigma_{(A+1)}$ (mod 255). Therefore, it is divided into two congruences shown in the following Expression 26.

$$15\sigma_T \equiv 15\sigma_t - 15\sigma_{(A+1)}(\text{mod } 17)$$

$$17\sigma_T \equiv 17\sigma_t - 17\sigma_{(A+1)}(\text{mod } 15) \quad \text{[Exp. 26]}$$

8. calculation for index zj of $\alpha^{zj}=\alpha^{\sigma T-3\sigma a}$ is to obtain $z_j \equiv \sigma_T - 3\sigma_a$ (mod 255). Therefore, it is divided into two congruences shown in the following Expression 27.

$$15z_j \equiv 15\sigma_T - 45\sigma_a (\text{mod } 17)$$

$$17z_j \equiv 17\sigma_T - 51\sigma_a (\text{mod } 15) \quad \text{[Exp. 27]}$$

9. to select index "j" from $z_j$, and obtain index $\sigma_X$ of $\alpha^{\sigma a}z=\alpha^{\sigma X}$, decode "j" from $z_j$ based on a table, and obtain $\sigma_x \equiv \sigma_a + j$ (mod 255). This congruence is divided into two congruences shown in the following Expression 28.

$$15\sigma_X \equiv 15\sigma_a + 15j (\text{mod } 17)$$

$$17\sigma_X \equiv 17\sigma_a + 17j (\text{mod } 15) \quad \text{[Exp. 28]}$$

The congruences to be calculated shown in the above-described Expressions 20 to 23 is to obtain different indexes between index multiples of $S_1$, $S_3$ and $S_5$. Corresponding relationships between 15 times index or 17 times index and other index multiples with mod 17 or mod 15 may be previously obtained as described later, additions between index multiples may be obtained by adding circuits (i.e., adders).

In the congruences shown in Expressions 20 to 23, with respect to each index of a of A, B, E and F, "expression index" defined by a pair of remainder indexes with mod 17 and mod 15 is searched.

In Expression 24, "i" satisfying $y_i=\sigma_A$ is searched from index $\sigma_A$ obtained from syndromes based on the relationship between index "i" and "$y_i$". In this case, calculation is performed based on the remainder indexes with mod 17 and mod 15, and index "n" is obtained as binary expression indexes. At this time, there may be such a situation that $\sigma_A$ corresponds to $y_i$ without "i".

Expression 25 obtains index $\sigma_C$ based on index of $(S_1^2+B)$ obtained from the syndrome calculation and index of (A+1) as expression indexes.

Expression 26 obtains index $\sigma_T$ of T based on index of "It" obtained from the syndrome calculation and index of (A+1) as expression indexes.

Expression 27 obtains index $z_j$ based on operations for indexes obtained from syndromes. The addition of $\sigma_T$ and $-3\sigma_a$ may be obtained as expression indexes with mod 17 and mod 15.

Expression 28 selects "j" based on the relationship between index "j" and $z_j$, and obtains index $\sigma_X$ obtained by adding "j" to index $\sigma_a$ as expression indexes.

[3EC System Configuration]

FIG. 1 shows a 3EC-EW system mounted on a flash memory in correspondence to the memory core 10.

Figure 2:
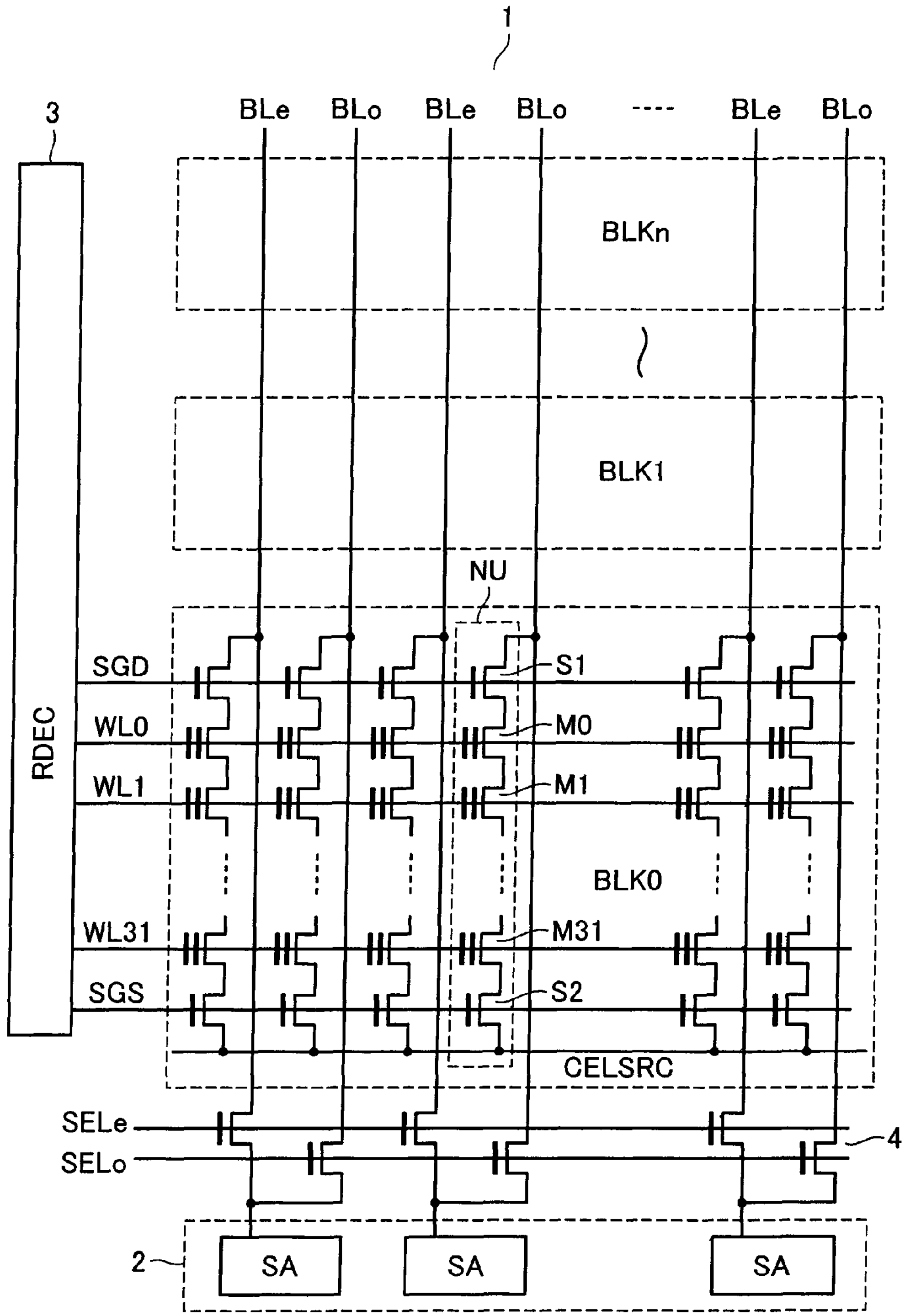
FIG. 2 shows a memory core configuration in the embodiment.

In a NAND-type flash memory, the memory core 10 includes, as shown in FIG. 2, cell array 1, sense amplifier circuit 2 and row decoder 3. The cell array 1 has NAND cell units (i.e., NAND strings) NU arranged therein, in each of which multiple memory cells M0-M31 are connected in series. One end of the NAND cell unit NU is coupled to a bit line BLe (or BLo) via select gate transistor S1 while the other end is coupled to a common source line CELSRC via select gate transistor S2.

Control gates of memory cells M0-M31 are coupled to word lines WL0-WL31; and gates of select gate transistors S1 and S2 to select gate lines SGD and SGS. Disposed to selectively drive the word lines WL0-WL31 and select gate lines SGD and SGS is the row decoder 3.

Sense amplifier circuit 2 contains multiple sense units SA, which perform write/read one page data simultaneously. Each sense unit SA is coupled to either one of adjacent two bit lines BLe and BLo via bit line select circuit 4. Therefore, a set of memory cells selected by a word line and multiple even bit lines BLe (or multiple odd bit lines BLo) constitute a page (a sector), in which memory cells are simultaneously written or read. Using non-selected bit liens as shield lines with a certain voltage applied, it becomes possible to prevent the interference between bit lines.

A set of NAND cell units sharing word lines WL0-WL31 constitutes a block, which serves as a data erase unit. AS shown in FIG. 2, multiple blocks are arranged in the direction of the bit line.

In FIG. 1, encode portion 21 receives input data defined as 230-degree polynomial f(x), the coefficients a24 to a254 of which serve as 231 information bits. The coefficients are selected from suitable degrees to constitutes data bits while and nonselected coefficients serve as fixed "0" data or "1" data, which are not stored in the memory. With this selection, an ECC system may be constituted suitably corresponding to the memory capacity.

The remainder obtained by dividing $f(x)x^{24}$ by g(x) being referred to as r(x), the coefficients of $f(x)x^{24}+r(x)$ are stored in the memory core 10 as data bits. 255 bits read out from the memory core 10 serve as coefficients of 254-degree polynomial ν(x).

Syndrome calculation portion 22 is for obtaining syndromes $S_1$, $S_3$ and $S_5$ from the read out data polynomial ν(x). As described above, dividing ν(x) by the irreducible polynomials $m_1(x)$, $m_3(x)$ and $m_5(x)$, syndromes $S_1$, $S_3$ and $S_5$ are obtained as the remainders, respectively.

If all syndromes $S_1$, $S_3$ and $S_5$ are zero, there is no error. In this case, gate circuit 36 outputs a signal "no error".

The indexes of syndromes $S_1$, $S_3$ and $S_5$ each is divided into those expressed as a pair of remainders with mod 17 and mod 15, which are referred to as "expression indexes", hereinafter. In the calculation circuits described hereinafter, adding of binary data expressed by the expression indexes will be performed. That is, adder circuits 23 to 26 each calculates the indexes A, B, E, F expressed as products or quotients of syndromes $S_1$, $S_3$ and $S_5$ based on congruences with mod 17 and mod 15, and the expression indexes obtained as the remainder pair will be used in the following operations.

Parity checkers 27, 28 and 29 are for adding the same degrees of polynomials transformed from input indexes by mod 2. In detail, these parity checkers perform addition of A and 1 (one), addition of B and $S_1^2$, and addition of $S_1^3$, $S_3$, E and F, respectively. Based on these parity checkers, as a result of parity check between coefficients of the respective orders of 7-degree polynomials, added coefficients of polynomials of finite field elements will be obtained.

Adder circuit 30 is for obtaining "y" based on $y^2+y+1=A$ corresponding to 2EC system, and calculating the expression index at the error location "n" based on the transformation equation of $x=S_1y$. Inputs of this adder circuit 30 are A, $S_1$ and a signal corresponding to $S_3=0$. At this input portion, index of "y" satisfying $y^2+y+1=0$ will be decoded.

When $S_3=0$, then A=0, and in spite of that there are two "y"s satisfying $y^2+y+1$, index $\sigma_A$ of A in not output from the previous stage adder circuit. Therefore, in case of $S_3=0$, the corresponding signal is directly received from the syndrome calculation portion 22, whereby the index of "y" satisfying $y^2+y+1=0$ is decoded.

Based on "i" and index $\sigma_1$ of $S_1$ obtained as a decode result, expression indexes of "n"s corresponding two errors are output as a calculation result. If index "i" of "y" is not obtained as a result of decoding at the input portion, signal "no index 2EC" will be output for designating that 2EC system is not adaptable.

Adder circuit 31 outputs the expression index of index $\sigma_C$ of $C=(B+S_1^2)/(A+1)$ based on the expression index of $B+S_1^2$ and that of A+1 as inputs.

Adder circuit 32 receives the expression index of $S_1^2+S_3+E+F=t$ and that of A+1 as inputs and outputs the expression index of index $\sigma_T$ of $T=t/(A+1)$.

At the following stage of these adder circuits 30-32, there is disposed adder circuit 33 for receiving indexes of C and T to calculate the index $z_i$. Since $a^3=C^{3/2}$, the expression index of $a^3$ is obtained by only input exchanging based on the transformation table designating the transformation from the expression index to index for index $\sigma_C$ of C, and based on it and index $\sigma_T$ of T, the expression index of $T/a^3$ will be calculated and output.

Adder circuit 34 is such a portion that calculates "z" based on $z^3+z=T/a^3$ corresponding to 3EC system, and the expression index of index $\sigma_X$ based on the transformation of az. At the input portion, the result $z_i$ of the previous stage and the expression index of index $\sigma_C$ of C are input, and index "j" of "z" satisfying $z^3+z=T/a^3$ will be decoded.

Based on the relationship between the decoded result "j" and $a=C^{1/2}$, the expression index of "a" is obtained by only input exchanging based on the transformation table between index $\sigma_C$ and expression index thereof, and the expression index of index of az corresponding to three errors will be output as a calculation result.

In case index "j" of the decoded result "z" at the input portion is not obtained, 3EC system is not adaptable. In this case, signal "no index 3EC" will be generated.

Parity checker 35 calculates the expression index of index of X based on $X=az+S_1$, which corresponds to the error location "n". If there are four or more error bits and it is not correctable, warning signal generating circuit 37 generates signal "non correctable" designating that it is not correctable.

The warning signal generating circuit 37 is formed to output the warning signal in such a case that syndromes are not in an all "0" state, and no solution is obtained with whichever of 2EC system and 3EC system. Explaining in detail, the circuit logic is constructed to output "non-correctable" in such a case that $S_1=0$ and $S_3\neq0$ or $S_5\neq0$, or in such a case there is no solution of 3EC system, i.e., "no index 3EC" is output.

To finally correct and output the read out data from the memory core 10, there is prepared error correction circuit 38. Error location information from the 2EC system is used in such a case that t=0 and "no index 2EC" is not output (i.e., output of gate G1 is "1"). In this case, gate G2 becomes active while gate G3 becomes inactive, so that the error location information from the 3EC system will not be used.

In case 2EC condition is not satisfied, gate G3 becomes active, so that error location information from 3EC system is used. The coefficient of data polynomial ν(x) at the error location is inverted via XOR logic, to which the position information is input, to be output as data $d_n$.

FIGS. 3A, 3B, 3C and 3D show tables for selecting data bit positions used in the encoding portion 21 for calculating check bits. The meaning of these tables is as follows.

Single term $x^n$ is previously divided by the code generation polynomial g(x), and the remainder rn(x) is obtained as a 23-degree polynomial. Since 255 data are expressed as coefficients of the respective degree numbers of 254-degree polynomial, in case data is "1", there is a term $x^n$ corresponding to the degree number "n" corresponding to the data position, and this is reflected in the remainder of the code generation polynomial g(x), i.e., rn(x).

Therefore, selecting rn(x) at "n" with data "1", and adding the respective coefficients of rn(x) with mod 2, it becomes the remainder obtained by dividing data polynomial by g(x).

Here, since coefficients "0" of the respective degree numbers of rn(x) do not serve for the above-described calculation in whichever data polynomial, these may be previously removed. Therefore, the tables shown in FIGS. 3A, 3B, 3C and 3D are a result of collecting "n"s with the coefficient being "1" for the respective degree numbers "m" of rn(x). When forming check bits, degree numbers up to n=23 are not used as data, so that the table shows a range of n=24 or more.

The method of using these tables is as follows. For example, the degree number "n" of rn(x) with the coefficient of $x^{15}$ being "1" is 24, 25, 27, . . . , 250, 253 and 254 written in fields defined by the "number of coefficient 1" being from 1 to 130 in the column m=15. Therefore, check bit $b_{15}$ corresponding to the coefficient of $x^{15}$ is obtained as a result of parity check of the selected n-degree terms' coefficients in the information data polynomial $f(x)x^{24}$, i.e., as a remainder of mod 2 in the numbers of "n" corresponding to data "1" in the table.

Figure 4:
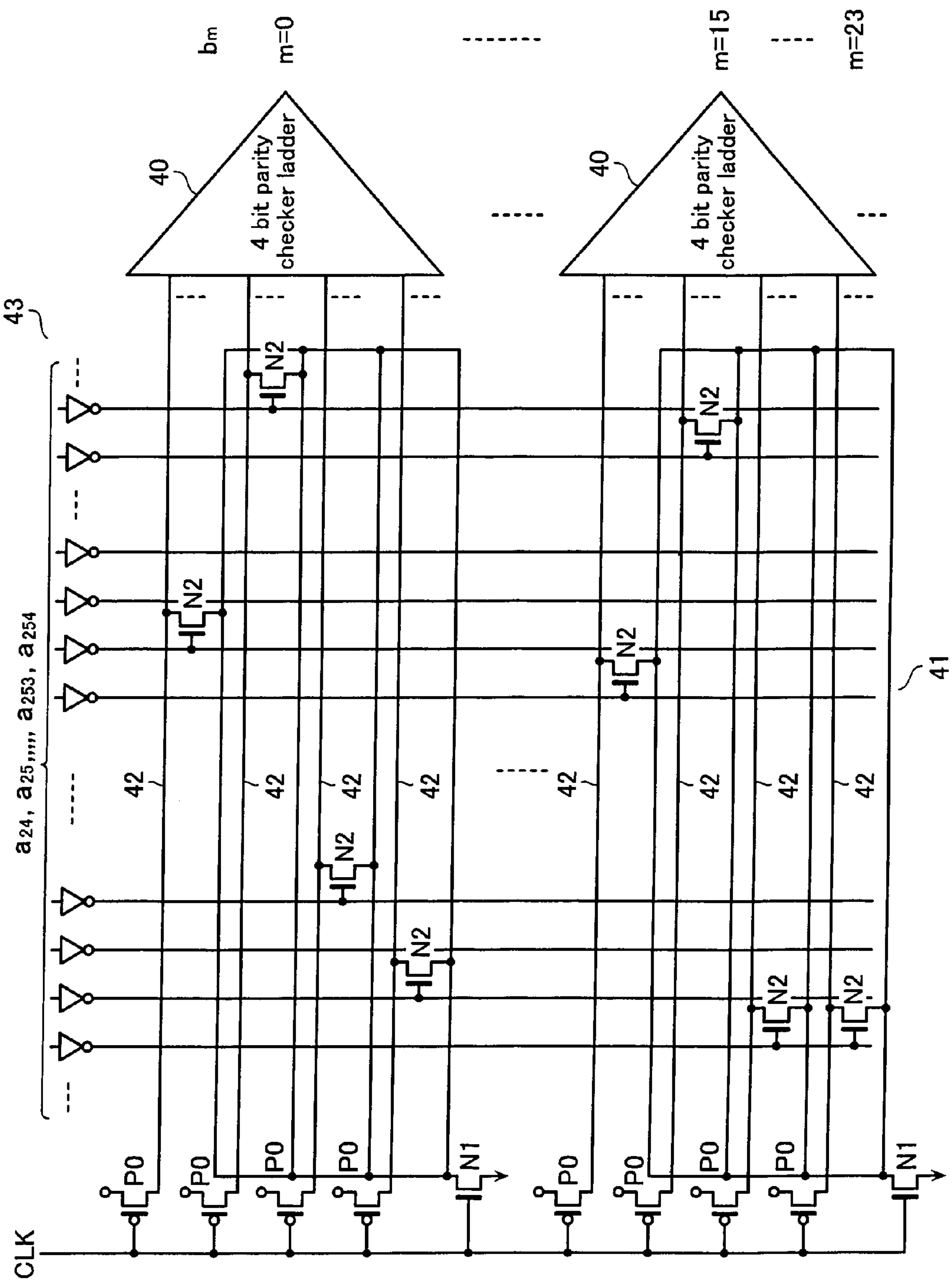
FIG. 4 shows the input decoder circuit of the check bit-use parity checker ladder.

FIG. 4 shows a circuit for achieving the check bit calculation based on the table. This circuit has m, 4-bit parity checker ladders 40 for calculating check bits from the information data polynomial $f(x)x^{24}$ as the remainders of g(x), and input circuit 41 for selecting inputs of the respective degree numbers in accordance with the table of the remainder of $x^n$ divided by the code generation polynomial shown in FIGS. 3A, 3B, 36C and 3D. That is, this circuit is for selecting "n" from the table for the respective "m"s, and performing parity check with $a_n$.

Parity checker ladder 40 is a set of XOR circuits used for calculating the coefficients of the respective degree numbers of the polynomial expressing the check bits, and selects inputs at the respective degree numbers in accordance with the remainder on the table obtained by the code generation polynomial to calculate the parity.

The input circuit 41 has nodes 42, which are precharged by PMOS transistors P0 driven by clock CLK="L"; inverters 43 for inverting the 231 coefficients of the information data polynomial, i.e., input data signals; NMOS transistors N2 having drains coupled to the nodes 42, the gates of which are driven by the inverted input signals; and discharging NMOS transistors N1 driven by CLK="H" to be turned on, to which sources of NMOS transistors N2 are coupled in common.

The arrangement of NMOS transistors N2 is defined by the tables shown in FIGS. 3A, 3B, 3C and 3D. That is, it is determined by the arrangement of NMOS transistors N2 and the input signals whether the precharged nodes 42 are discharged or not, and the result become inputs of the parity checker ladders 40.

Outputs of the m-parity checker ladders 40 becomes check bits $b_m$. Here, in case all 231 coefficients are not always used as information, it should be noted that coefficients are suitably selected and used in accordance with the system configuration.

Figure 5:
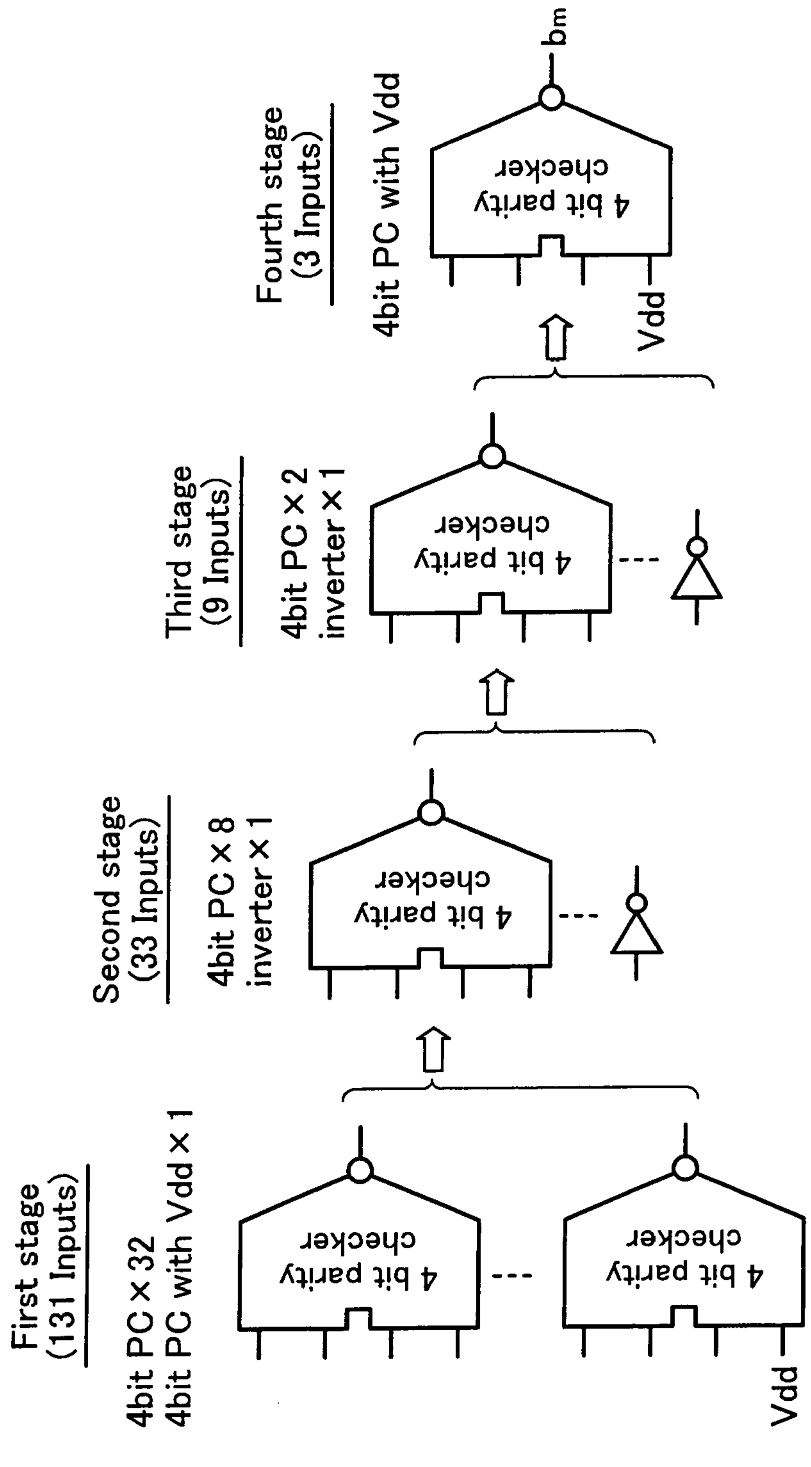
FIG. 5 shows the parity checker ladder.

FIG. 5 shows an example of the 4-bit parity checker ladder 40. Parity checkers (PC) are suitably combined in accordance with that the input number belongs to which system of the remainder of four. That is, in case of the input number is dividable by four, only 4-bit PCs are used; if one is remained, 2-bit PC with one input applied with Vdd, i.e., an inverter, is added; if two is remained, 2-bit PC is used; and if three is remained, 4-bit PC with one input applied with Vdd is added.

As shown in FIGS. 3A, 3B, 3C and 3D, the bit number of parity check becomes the maximum, 131, at m=6, 5 of $x^m$. FIG. 5 shows an example of this situation. Since the input number is 131, thirty three 4-bit PCs are used at the first stage (where, one input of one of them is applied with Vdd); eight 4-bit PCs and an inverter are used at the second stage because of thirty three inputs; two 4-bit PCs and an inverter are used at the third stage because of nine inputs; and one 4-bit PC, an input of which is applied with Vdd, is used at the fourth stage because of three inputs.

With respect to other "m"s, parity checker ladders may be formed with the same scheme as above-described example.

Figure 6B:
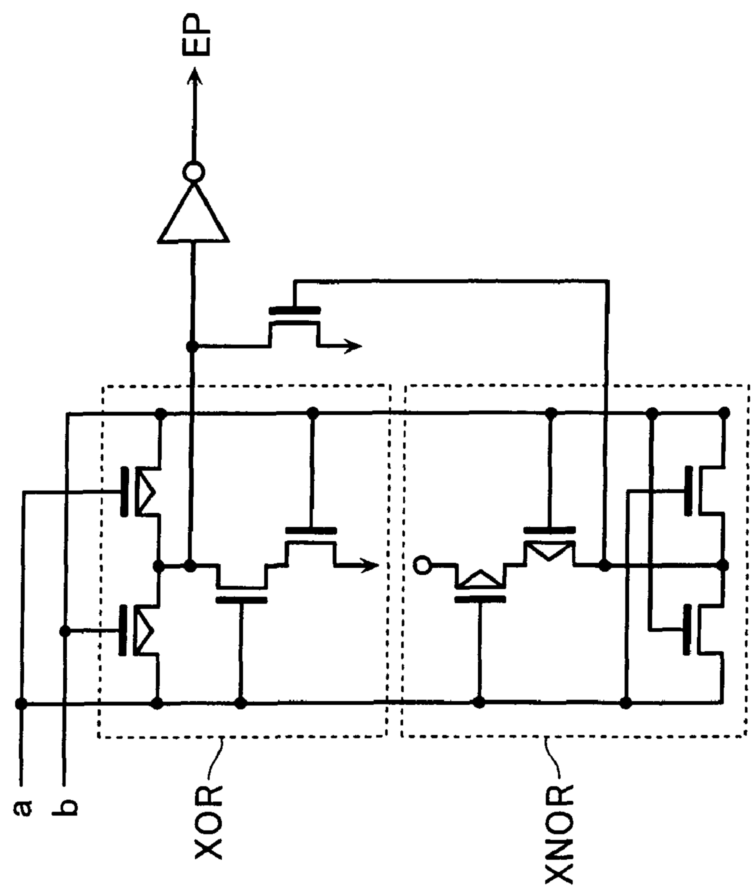
FIG. 6 shows the circuit symbol and the detailed circuit of 2-bit parity checker used in the parity checker ladder.
Figure 6A:
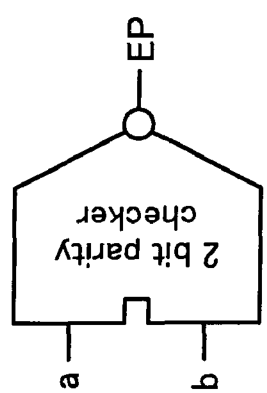

FIGS. 6 (*a*) and (*b*) show a circuit symbol and a detailed circuit of the 2-bit PC. 2-bit PC is formed of an XOR operation portion and an XNOR operation portion for two inputs "a" and "b", to perform even parity check, i.e., output EP="1" when number of "1"s in inputs is even.

Figure 7A:
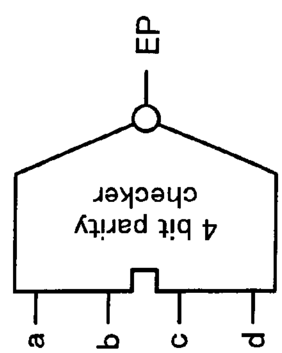
FIG. 7 shows the circuit symbol and the detailed circuit of 4-bit parity checker used in the parity checker ladder.
Figure 7B:
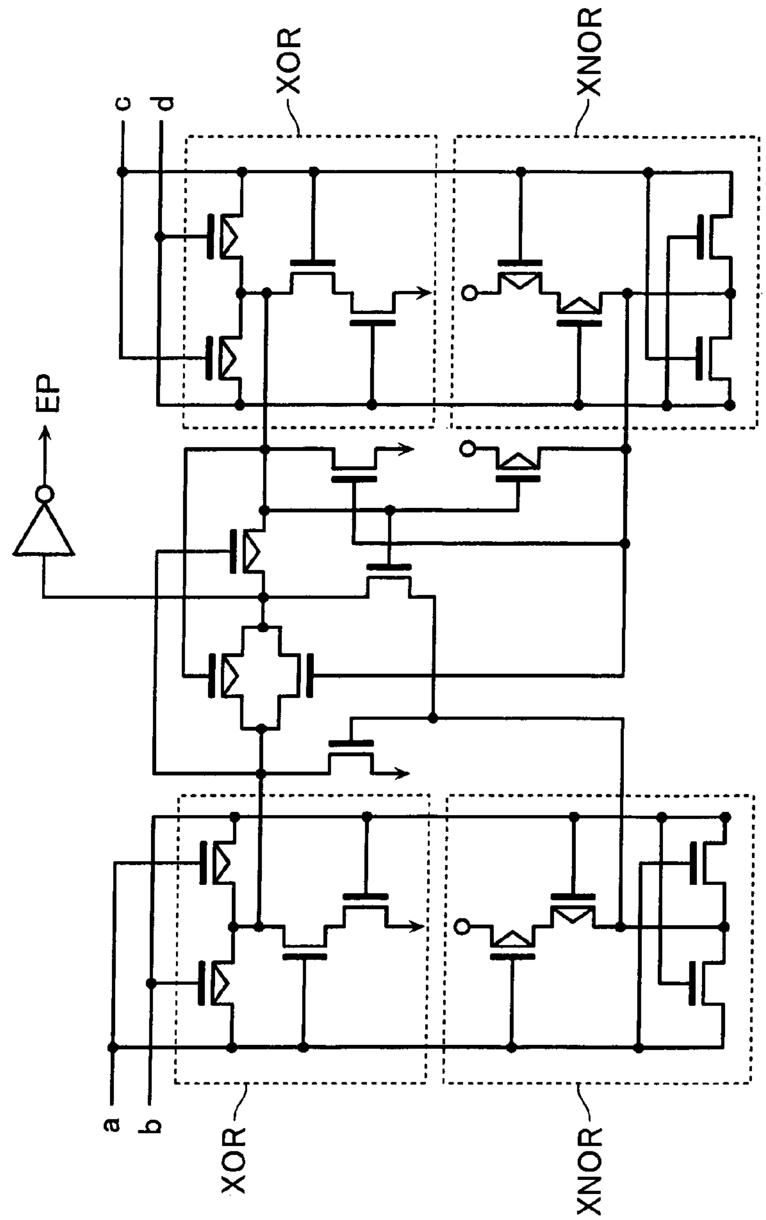

FIGS. 7 (*a*) and (*b*) show a circuit symbol and a detailed circuit of the 4-bit PC. 4-bit PC is formed to operate between outputs of two 2-bit PCs defined as inputs "a", "b", "c" and "d", and output EP="1" when number of "1"s in inputs is even.

FIG. 8 is a table showing the number of coefficient "1"s for the respective degree numbers in the remainder pn(x) obtained by dividing $x^n$ by $m_1(x)$, which is used in the syndrome calculation of $S_1=S_1(x)$. The meaning of this table is as follows.

Single term $x^n$ is previously divided by $m_1(x)$ to obtain the remainder pn(x) as a 7-degree polynomial. Since 255 data are expressed as coefficients of the respective degree numbers of 254-degree polynomial, in case data is "1", there is a term $x^n$ corresponding to the degree number "n" corresponding to the data position, and this is reflected in the remainder of $m_1(x)$, i.e., pn(x).

Therefore, selecting pn(x) at "n" with data "1", and adding the respective coefficients of pn(x) with mod 2, it becomes the remainder obtained by dividing data polynomial by $m_1(x)$.

Here, since coefficients "0" of the respective degree numbers of pn(x) do not serve for the above-described calculation in whichever data polynomial, these may be previously removed. Therefore, the tables shown in FIGS. 8A, 8B and 8C are a result of collecting "n"s with the coefficient being "1" for the respective degree numbers "m" of pn(x).

For example, the degree number "n" of pn(x) with the coefficient of $x^7$ being "1" is 7, 11, 12, . . . , 251, 252 and 254 written in fields defined by the "number of coefficient 1" being from 1 to 128 in the column m=7. The coefficient $(s1)_7$ of $x^7$ of the syndrome $S_1(x)$ will be obtained as a parity check with respect to the coefficients of n-degree terms in the data polynomial ν(x).

Figure 9:
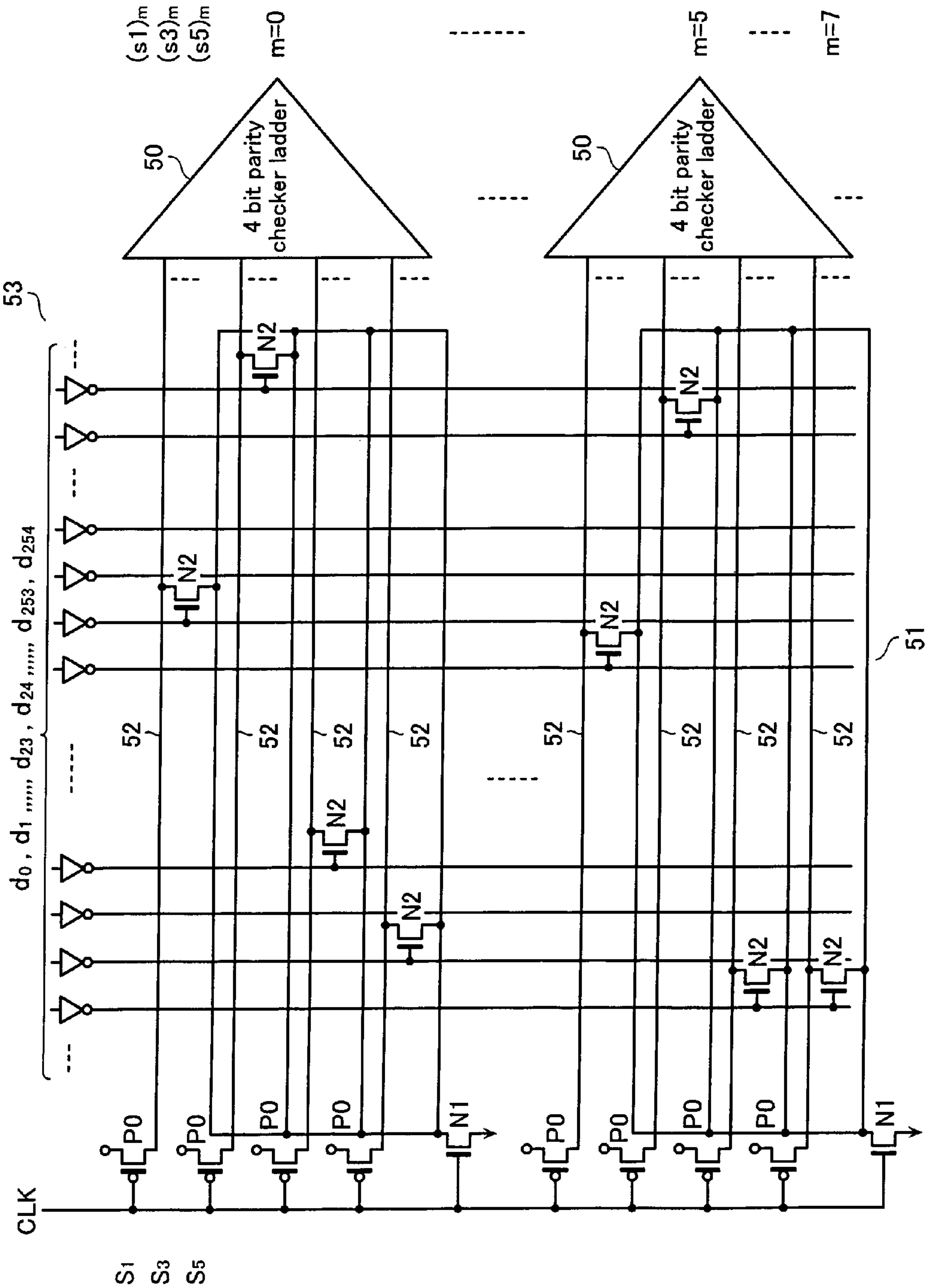
FIG. 9 shows the input decoder circuit of the parity checker ladder used for syndrome $S_1$ calculation.

FIG. 9 shows a circuit for achieving the syndrome $S_1$ as the remainder of data polynomial ν(x) by $m_1(x)$. This circuit has m, 4-bit parity checker ladders 50 for calculating the syndrome $S_1$ from the information data polynomial $f(x)x^{24}$ as the remainders of $m_1(x)$, and input circuit 51 for selecting inputs of the respective degree numbers in accordance with the tables of the remainder of $x^n$ divided by $m_1(x)$ shown in FIGS. 8A, 8B and 8C. That is, this circuit is for selecting "n" from the table for the respective "m"s, and performing parity check with $d_n$.

Parity checker ladder 50 is a set of XOR circuits used for calculating the coefficients of the respective degree numbers of the polynomial expressing the syndrome $S_1$, and selects inputs at the respective degree numbers in accordance with the remainder on the table to calculate the parity.

The input circuit 51 has nodes 52, which are precharged by PMOS transistors P0 driven by clock CLK="L"; inverters 53 for inverting the 255 coefficients $d_0$-$d_{254}$ of the information data polynomial, i.e., input data signals; NMOS transistors N2 having drains coupled to the nodes 52, the gates of which are driven by the inverted input signals; and discharging NMOS transistors N1 driven by CLK="H" to be turned on, to which sources of NMOS transistors N2 are coupled in common.

The arrangement of NMOS transistors N2 is defined by the tables shown in FIGS. 8A, 8B and 8C. That is, whether the precharged nodes 52 are discharged or not is determined by the arrangement of NMOS transistors N2 and the input signals, and the result become inputs of the parity checker ladders 50.

Outputs of the m-parity checker ladders 50 becomes syndrome coefficients $(s1)_m$. Here, in case all 255 coefficients are not always used as information, it should be noted that coefficients are suitably selected and used in accordance with the system configuration.

The calculation circuits for coefficients $(s3)_m$ and $(s5)_m$ of syndromes $S_3$ and $S_5$ may be formed with the same configuration described above except that the 4-bit PC ladder is different from the example described above.

Figure 10:
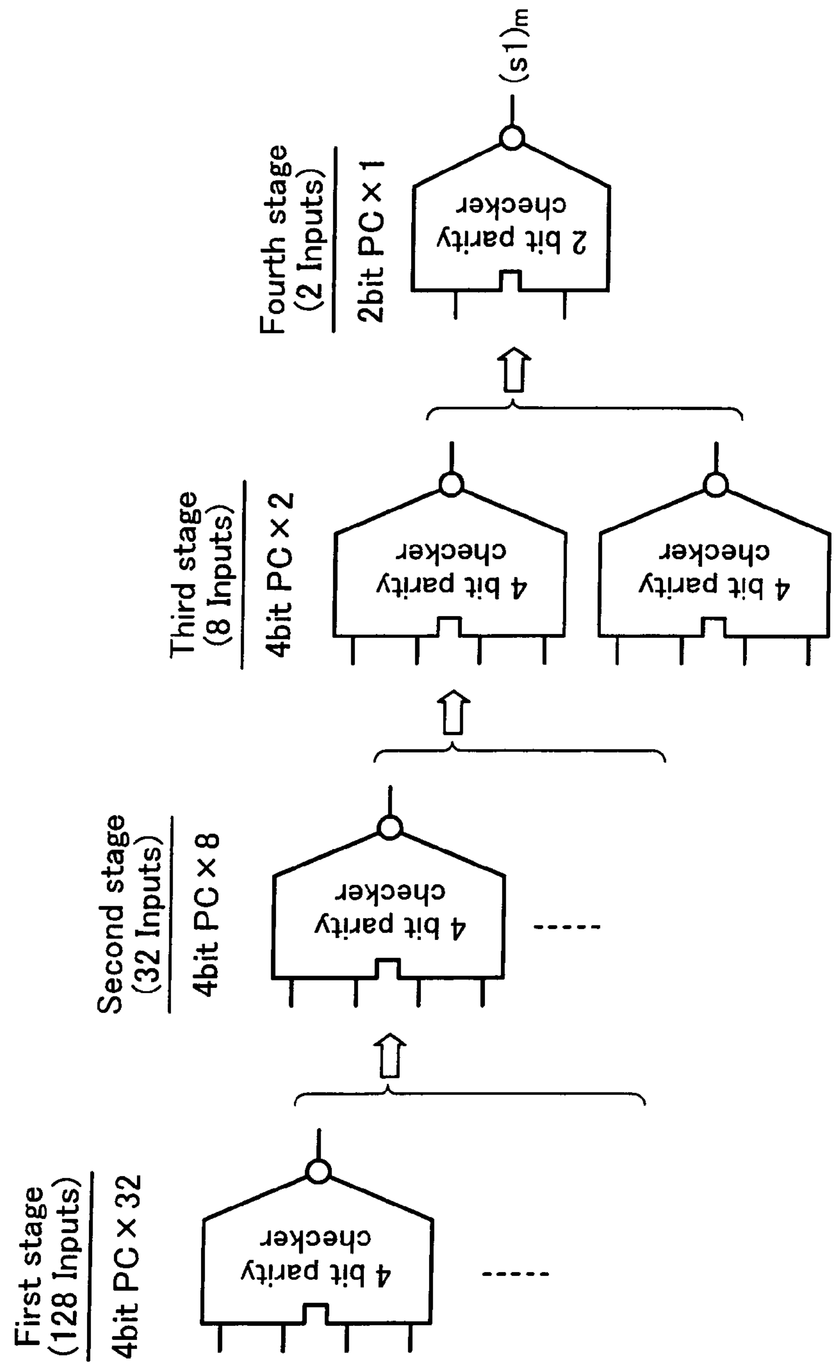
FIG. 10 shows the parity checker ladder.

FIG. 10 shows an example of the 4-bit parity checker ladder 50 in the calculation circuit of syndrome $S_1$. Parity checker(PC)s are suitably combined in accordance with that the input number belongs to which system of the remainders of four. That is, in case of the input number is dividable by four, only 4-bit PCs are used; if one remaining, 2-bit PC with one input applied with Vdd, i.e., an inverter, is added; if two remaining, 2-bit PC is used; and if three remaining, 4-bit PC having one input applied with Vdd is added.

As shown in FIGS. 8A, 8B and 8C, the bit number for parity checking is 128 for all "m" of $x^m$. Therefore, thirty two 4-bit PCs are used at the first stage because of 128 inputs; eight 4-bit PCs at the second stage because of thirty two inputs; two 4-bit PCs at the third stage because of eight inputs; and one 2-bit PC at the fourth stage because of two inputs.

FIGS. 11A to 11C are tables showing the number of coefficient "1"s for the respective degree numbers in the remainder p3n(x) obtained by dividing $x^{3n}$ by $m_3(x)$, which is used in the syndrome calculation of $S_3=S_3(x^3)$. The meaning of these tables is as follows.

Single term $x^n$ is previously divided by $m_3(x)$ to obtain the remainder tn(x) as a 7-degree polynomial. tn(x) contributes to syndrome $S_3(x)$. Since $S_3=S_3(x^3)$, $tn(x^3)$ contributes $S_3$.

From $x^n \equiv tn(x) \bmod m_3(x)$, $tn(x^3) = x^{3n} \bmod m_3(x^3)$ and $m_3(x^3) \equiv 0 \bmod m_1(x)$ are obtained. Therefore, $tn(x^3) \equiv x^{3n} \equiv p3n(x) \bmod m_1(x)$.

An element of GF(256) is an irreducible remainder of mod $m_1(x)$. Since the contribution of $x^n$ to $\nu(x)$ is the same as that of p3n(x) to $S_3$, p3n(x) is previously obtained. Since 255 data correspond to coefficients of the respective degree numbers of 254-degree polynomial, in case of data "1", there is a term $x^n$ of a degree number corresponding to the data position. The contribution of the remainder tn(x) by $m_3(x)$ to $S_3 = S_3(x^3)$ is p3n(x).

Therefore, selecting p3n(x) at "n" with data "1", and adding the respective coefficients of p3n(x) with mod 2, it becomes possible to directly obtain $S_3(x^3)$ without calculating the remainder $S_3(x)$ by dividing the data polynomial by $m_3(x)$. Here, since coefficients "0" of the respective degree numbers of p3n(x) do not serve for the above-described calculation in whichever data polynomial, these may be previously removed.

Therefore, the tables shown in FIGS. 11A to 11C are a result of collecting "n"s with the coefficient being "1" for the respective degree numbers "m" of p3n(x). For example, the degree number "n" of p3n(x) with the coefficient of $x^7$ being "1" is 4, 8, 14, . . . , 249, 252 and 254 written in fields defined by the "number of coefficient 1" being from 1 to 128 in the column m=7. The coefficient $(s\mathbf{3})_7$ of $x^7$ of the syndrome $S_3(x^3)$ will be obtained as a parity check with respect to the coefficients of n-degree terms in the data polynomial $\nu(x)$. With respect to other "m"s, it is possible to obtain as similar to the above-described example.

Figure 12:
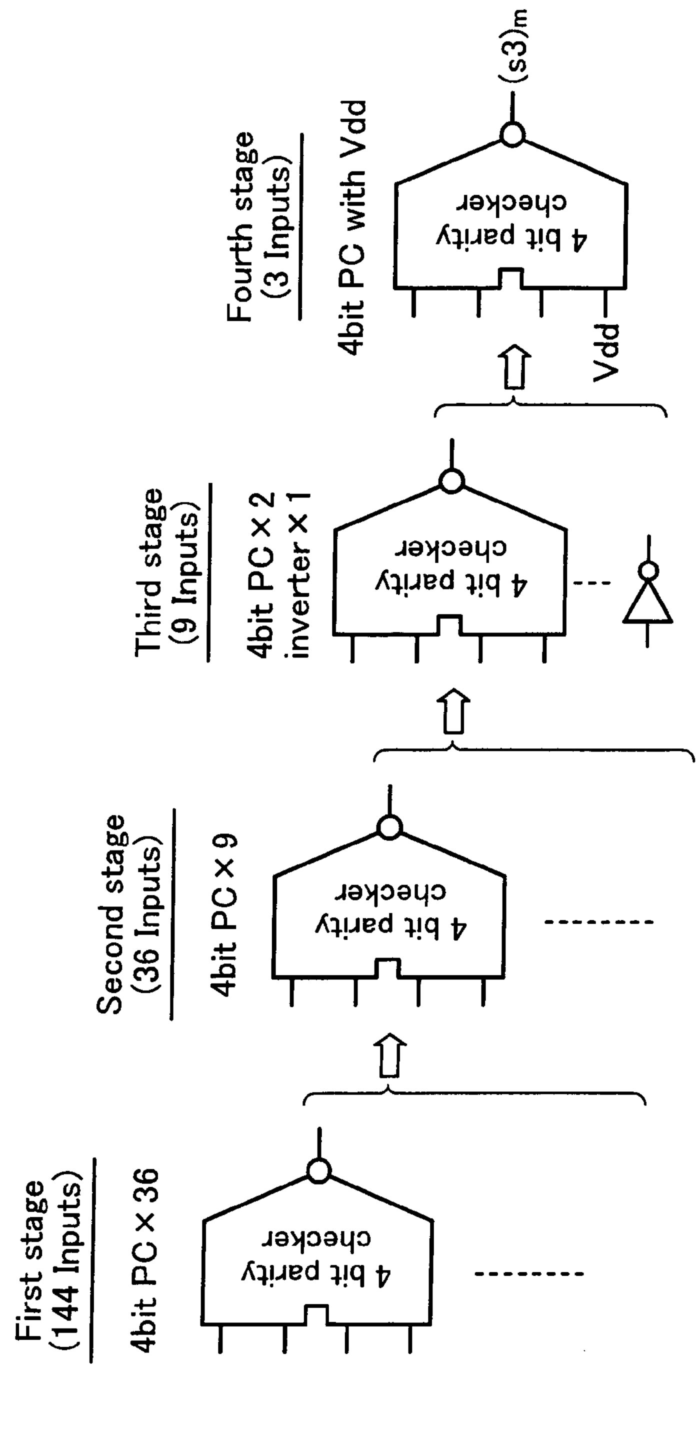
FIG. 12 shows the input decoder circuit of the parity checker ladder used for syndrome $S_3$ calculation.

FIG. 12 shows a 4-bit parity checker ladder in the calculation circuit of syndrome $S_3 = S_3(x^3)$. Parity checkers (PC) are suitably combined in accordance with that the input number belongs to which system of the remainders of four. That is, in case of the input number is dividable by four, only 4-bit PCs are used; if one remaining, 2-bit PC with one input applied with Vdd, i.e., an inverter, is added; if two remaining, 2-bit PC is used; and if three remaining, 4-bit PC having one input applied with Vdd is added.

As shown in FIGS. 11A to 11C, the maximum bit number for parity checking is 144 in case of m=5, 2 and 0 of $x^m$. Therefore, thirty six 4-bit PCs are used at the first stage because of 144 inputs; nine 4-bit PCs at the second stage because of thirty six inputs; two 4-bit PCs at the third stage because of nine inputs; and one 4-bit PC with one input applied with Vdd at the fourth stage because of three inputs.

With respect to other "m"s, it is possible to form parity checker ladder as similar to the above-described example.

FIGS. 13A to 13C are tables showing the number of coefficient "1"s for the respective degree numbers in the remainder p5n(x) obtained by dividing $x^{5n}$ by $m_5(x)$, which is used in the syndrome calculation of $S_5 = S_5(x^5)$. The meaning of these tables is as follows.

Single term $x^n$ is previously divided by $m_5(x)$ to obtain the remainder qn(x) as a 7-degree polynomial. qn(x) contributes to syndrome $S_5(x)$. Since $S_5 = S_5(x^5)$, $qn(x^5)$ contributes $S_5$.

From $x^n \equiv qn(x) \bmod m_5(x)$, $qn(x^5) = x^5 n \bmod m_5(x^5)$ and $m_5(x^5) \equiv 0 \bmod m_1(x)$ are obtained. Therefore, $qn(x^5) \equiv x^{5n} \equiv p5n(x) \bmod m_1(x)$.

An element of GF(256) is an irreducible remainder of mod $m_1(x)$. Since the contribution of $x^n$ to $\nu(x)$ is the same as that of p5n(x) to $S_5$, p5n(x) is previously obtained. Since 255 data correspond to coefficients of the respective degree numbers of 254-degree polynomial, in case of data "1", there is a term $x^n$ of a degree number corresponding to the data position. The contribution of the remainder qn(x) by $m_5(x)$ to $S_5 = S_5(x^5)$ is p5n(x).

Therefore, selecting p5n(x) at "n" with data "1", and adding the respective coefficients of p5n(x) with mod 2, it becomes possible to directly obtain $S_5(x^5)$ without calculating the remainder $S_5(x)$ by dividing the data polynomial by $m_5(x)$. Here, since coefficients "0" of the respective degree numbers of p5n(x) do not serve for the above-described calculation in whichever data polynomial, these may be previously removed.

Therefore, the tables shown in FIGS. 13A to 13C are a result of collecting "n"s with the coefficient being "1" for the respective degree numbers "m" of p5n(x). For example, the degree number "n" of p5n(x) with the coefficient of $x^7$ being "1" is 4, 7, 9, . . . , 250, 251 and 253 written in fields defined by the "number of coefficient 1" being from 1 to 120 in the column m=7. The coefficient $(s\mathbf{5})_7$ of $x^7$ of the syndrome $S_5(x^5)$ will be obtained as a parity check with respect to the coefficients of n-degree terms in the data polynomial $\nu(x)$. With respect to other "m"s, it is possible to obtain as similar to the above-described example.

Figure 14:
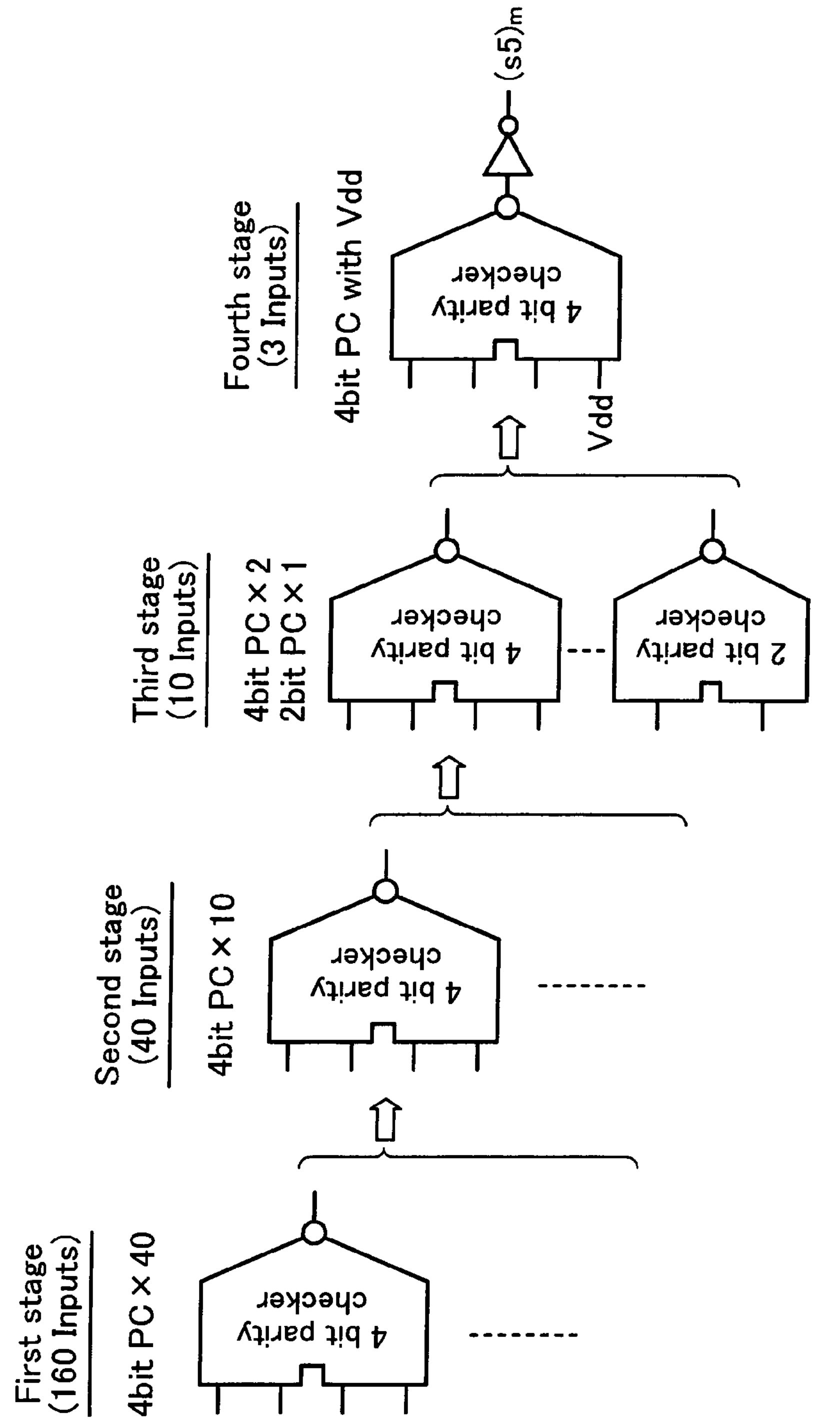
FIG. 14 shows the input decoder circuit of the parity checker ladder used for syndrome $S_5$ calculation.

FIG. 14 shows a 4-bit parity checker ladder in the calculation circuit of syndrome $S_3 = S_5(x^5)$, which selects "n" with respect to the respective "m"s from the table shown in FIG. 13 and executes parity checking.

Parity checkers (PCs) are suitably combined in accordance with that the input number belongs to which system of the remainders of four. That is, in case of the input number is dividable by four, only 4-bit PCs are used; if one remaining, 2-bit PC with one input applied with Vdd, i.e., an inverter, is added; if two remaining, 2-bit PC is used; and if three remaining, 4-bit PC having one input applied with Vdd is added.

As shown in FIGS. 13A to 13C, the maximum bit number for parity checking is 160 in case of m=5, 2 of $x^m$. Therefore, forty 4-bit PCs are used at the first stage because of 160 inputs; ten 4-bit PCs at the second stage because of forty inputs; two 4-bit PCs and a 2-bit PC at the third stage because of ten inputs; and one 4-bit PC with one input applied with Vdd at the fourth stage because of three inputs.

With respect to other "m"s, it is possible to form parity checker ladder as similar to the above-described example.

Syndromes $S_1$, $S_3$ and $S_5$ each is obtained as a 7-degree polynomial, and identical to either one of pn(x), which are elements of GF(256). Therefore, transforming these syndromes to indexes of the root $\alpha$ by $m_1(x)$ to be used hereinafter, which are represented as "expression indexes" with mod 17 and mod 15.

Figure 15A:
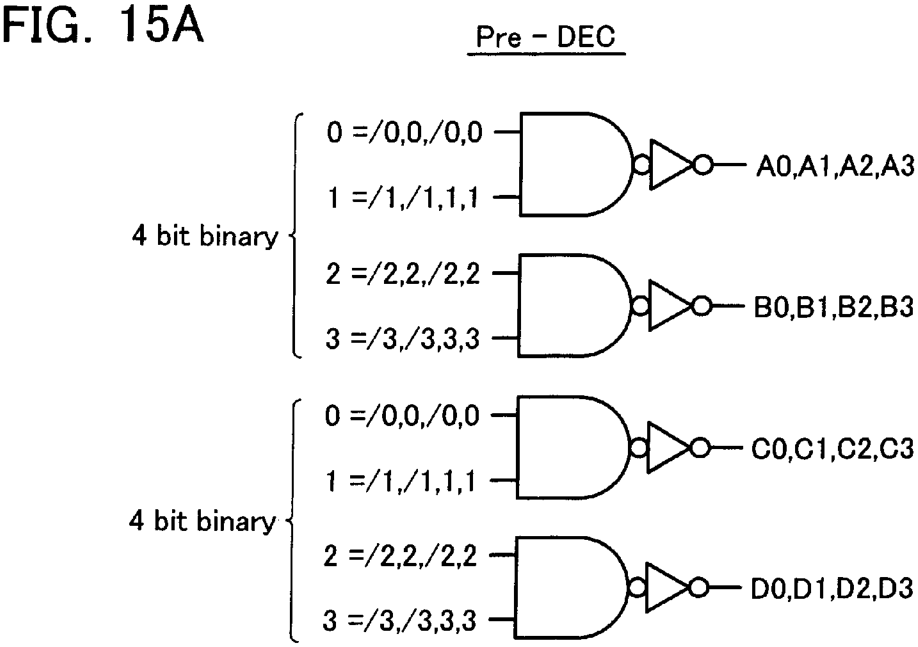
FIGS. 15A to 15C show decoders for transforming syndromes to expression indexes.
Figure 15B:
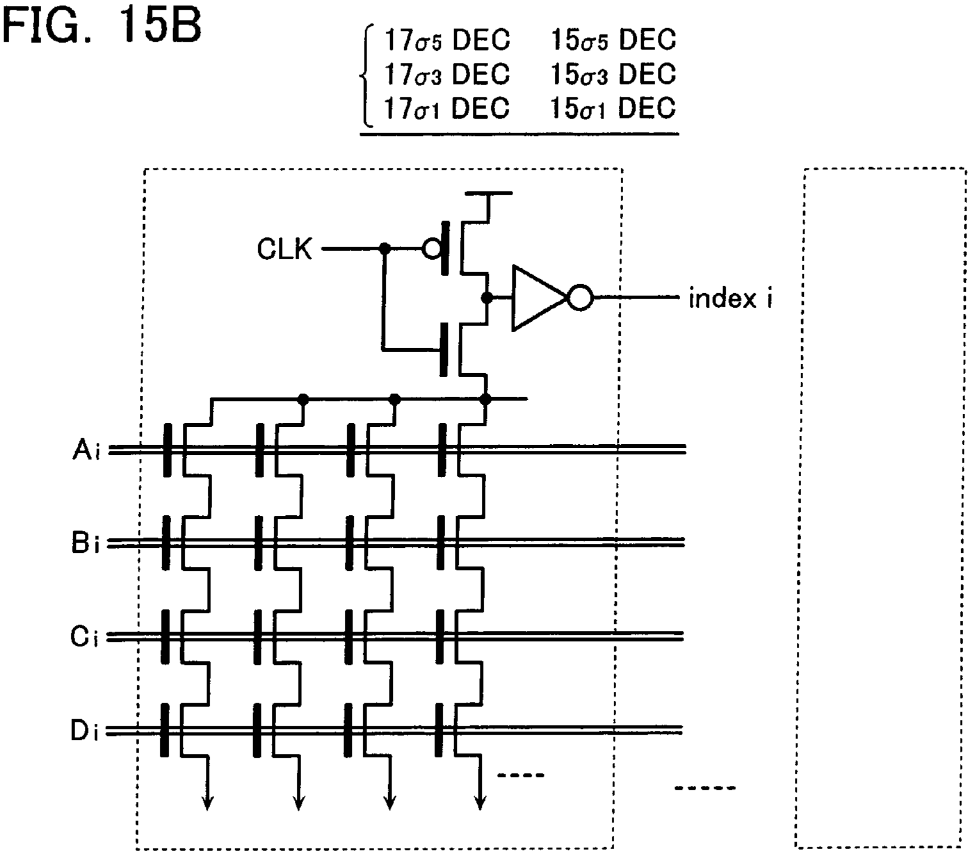
Figure 15C:
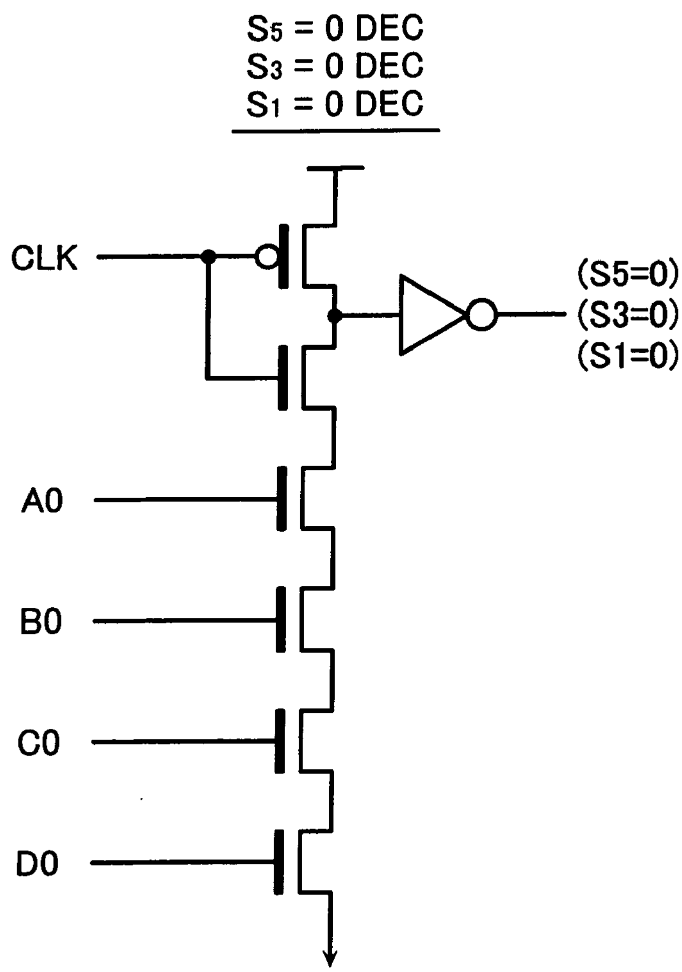

FIGS. 15A to 15C show the decode circuit for performing the index transformation.

FIG. 15A shows a pre-decoder portion, Pre-DEC, for transforming 256 binary states expressed by 8-bit coefficients of pn(x) to combinations of signals Ai, Bi, Ci and Di (i=0~3), which is formed of NAND circuits. 8-bit binary signals are divided 2-bit by 2-bit to be expressed as quaternary data Ai, Bi, Ci and Di.

As a result, degree numbers m=0 and 1 of syndromes $S_1$, $S_3$ and $S_5$ are transformed to Ai; m=2 and 3 to Bi; m=4 and 5 to Ci; and m=6 and 7 to Di. By use of this pre-decoder, it becomes possible to reduce the number of transistors used in the successive main decoder stage from 8 to 4.

FIG. 15B shows a configuration of the main index decoder portions (DEC), i.e., $17\sigma_5$DEC, $15\sigma_5$DEC, $17\sigma_3$DEC, $15\sigma_3$DEC, $17\sigma_1$DEC and $15\sigma_1$DEC, which are formed of the same circuit configuration except that inputs thereof are different from each other. Pre-decoded signals are classified into multiple remainder classes, indexes of which are output. That is, NAND circuits, in which transistors are connected in series to be selectively driven by the pre-decoded signals Ai, Bi, Ci and Di, are connected in parallel up to the number of the irreducible polynomial belonging to each remainder class.

The main decoder has common nodes to be precharged by precharge transistors driven by clock CLK, and in accordance with whether the common node is discharged or not, index signal "index i" is output. A signal wiring and the inverted signal wiring constitute a pair, which are selectively coupled to a gate of transistors in NAND circuit in accordance with the decoded code.

Indexes of mod 17 and mod 15 are generated to constitute a pair, which is defined as an expression index.

In case of pn(x)=0, the state is not expressed by a power of the primitive element α, so that no index will be searched. For the purpose of using this state later, a status signal is generated by an auxiliary decoder portion shown in FIG. 15C. That is, decoders, s1=0 DEC, s3=0 DEC and S5=0 DEC, are prepared to output (s1=0), (s3=0) and (s5=0), respectively, in the case of A0=B0=C0=D0=1.

FIGS. 16A to 16C and 17A to 17C are tables, which are referred to when searching an expression index with the pre-decoder and the like. FIGS. 16A to 16C are tables, in which index "n" of the irreducible remainder pn(x) is multiplied by 17 and classified by the remainder class of mod 15, i.e., 17n(15). As shown in FIGS. 16A to 16C, there are index classes from 0 to 14, each class including 17 "n"s, and each "i(=0~3)" of pre-decoded signals Ai, Bi, Ci and Di are shown, which are pre-decoded in accordance with coefficients of the respective degree numbers of pn(x).

Based on these signals Ai, Bi, Ci and Di, the transistor gate wiring connections of the index decoder shown in FIG. 15A will be determined. For example, in case of index "1", NAND nodes to be NOR-connected in parallel correspond to n=173, 233, 203, 23, 83, 158, 188, 68, 38, 128, 143, 98, 53, 218, 8, 113 and 248, and the corresponding Ai, Bi, Ci and Di are coupled to transistor gates of NAND circuits.

FIGS. 17A to 17C are tables, in which index "n" of the irreducible remainder pn(x) is multiplied by 15 and classified by the remainder class of mod 17, i.e., 15n(17). As shown in FIGS. 17A to 17C, there are index classes from 0 to 16, each class including 15 "n"s, and each "i(=0~3)" of pre-decoded signals Ai, Bi, Ci and Di are shown, which are pre-decoded in accordance with coefficients of the respective degree numbers of pn(x).

For example, in case of index "1", NAND nodes to be NOR-connected in parallel correspond to n=161, 59, 246, 127, 42, 93, 178, 144, 212, 229, 110, 195, 8, 76 and 25, and the corresponding Ai, Bi, Ci and Di are coupled to transistor gates of NAND circuits.

The expression index corresponding to index "n" of $\alpha^n$ is referred to as {15n(17), 17n(15)}, which is expressed by a pair of mod 17 and mod 15. It will be explained here how the expression index and the remainder class are converted with respect to a multiply of "n". There are three cases in this system as follows. In the following explanation, $15n(17)=\sigma_{17}$ (mod 17) and $17n(15)=\sigma_{15}$(mod 15) are used.

1) first case: to obtain expression indexes of multiply "mn" of number "m", which is prime to modulus 15, from the expression indexes $\sigma_{17}$ and $\sigma_{15}$. 17 is a prime, so it is prime to every number.

When multiplying "n" by "m", it is possible to divide the both side of a congruence by "m" without changing the modulus because "m" and the modulus are prime to each other. Therefore, the remainder class is not changed, and the containing elements are also not changed. The expression indexes are multiplied by "m" to become {$m\sigma_{17}$(mod 17), $m\sigma_{15}$(mod 15)} from {($\sigma_{17}$(mod 17), $\sigma_{15}$(mod 15)}.

2) second case: to obtain expression indexes of multiply "mn" of number "m", which is a factor of modulus "n". Modulus 17 is a prime and contains no factors, but modulus 15 has factors 3 and 5.

If "mn" and "mn" belong to the same remainder class, 17m(n−n')≡0(mod 15). "m" is a factor of 15, and when dividing the both side of the congruence by "m", modulus thereof also divided by the absolute, whereby separated remainder classes are combined to be a large remainder class. The reason is as follows. Since n≡n' (mod 15/|m|), elements of remainder classes with a difference of 15/|m| are regarded as those of the same remainder class.

The expression index is transformed to have the same expression index due to these combinations. For example, in case of m=−3, since n≡n' (mod 5), three remainder classes with mod 15 are combined, so that fifteen remainder classes are collected to five remainder classes. The transformation of the expression index itself is the same as the first case 1).

3) third case: to obtain expression indexes of n/m from the expression indexes $\sigma_{17}$, $\sigma_5$, where number "m" and modulus 15 are prime to each other. 17 is a prime, so it is prime to every number.

With respect to the remainder classes of 17n/m and 17n'/m, 17(n−n')/m (mod 15), and "m" and 15 are prime to each other, so that there is provided $17(n-n')/m\equiv(\sigma_{15}-\sigma_{15}')/m$ (mod 15). Therefore, the remainder class itself is not changed.

Assuming that $17n/m\equiv\sigma_m$ (mod 15), the expression index is $m\sigma_m\equiv\sigma_{15}$ (mod 15). Since "m" and 15 are prime to each other, there are always integers $a_{15}$ and $b_{15}$ satisfying $\sigma_{15}+15\sigma a_{15}=mb_{15}$, and there is provided $\sigma_m\equiv b_{15}$(mod 15). This is the same for mod 17, and a pair of expression indexes is as follows: {$b_{17}$ (mod 17), $b_{15}$(mod 15)}.

For example, in case of m=2, if $\sigma_{17}$ is even, then $b_{17}=\sigma_{17}/2$ while it is odd, then $b_{17}=(\sigma_{17}+17)/2$; and if $\sigma_{15}$ is even, then $b_{15}=\sigma_{15}/2$ while it is odd, then $b_{15}=(\sigma_{15}+15)/2$.

FIG. 18 shows a table, in which component indexes of expression index {15n(17), 17n(15)} for "n" are shown in columns×m as values after multiplying "n" by "m". Combining this transformation, there will be provided all expression indexes required in this system.

For example, explaining such a case that expression index {3,8} is transformed to (−3/2) multiple, since the first component index is 15n(17)=3, it is transformed to 8 as shown in column ×(−3), and then based on 15n(17)=8, further transformed to 4 as shown in column ×½. The first component index 17n(15)=8 is transformed to 6 as shown in column ×(−3), and then based on 17n(15)=6, further transformed to 3 as shown in column ×½.

That is, {3,8} is transformed to {4,3} by ×(−3/2). This transformation process may be reversed as follows: firstly, search ×½, and then search ×(−3). The result is the same as the example described above.

Figure 19:
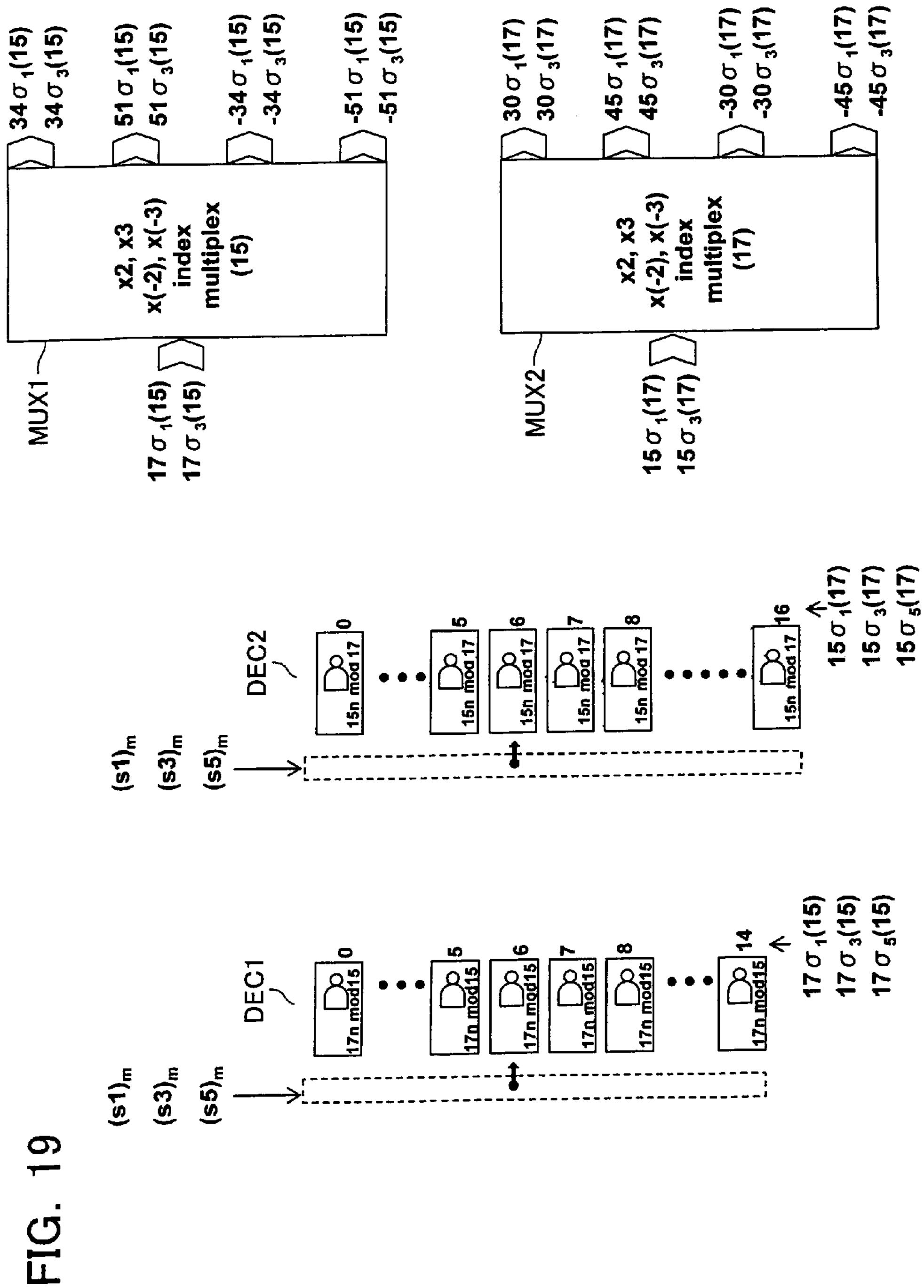
FIG. 19 shows the decode portion for decoding the syndrome to the expression index and multiplexer portion of the expression index.

FIG. 19 shows an expression index transformation circuit for transforming syndromes $S_1$, $S_3$ and $S_5$ based on the syndrome polynomial to the first expression indexes, and further obtain the second expression indexes of 2-power, 3-power, (−2)-power and (−3)-power thereof based on the transformation of ×2, ×3, ×(−2) and ×(−3), respectively.

Decode circuits DEC1 and DEC2 generate expression indexes {$15\sigma_1(17)$, $17\sigma_1(15)$}, {$15\sigma_3(17)$, $17\sigma_3(15)$} and {15σ5(17), 17σ5(15)} of syndromes $S_1$, $S_3$ and $S_5$, respectively. These are formed similar to the pre-decoder and main index decoder described above.

Component indexes of these expression indexes are transformed via multiplexers MUX1 and MUX2 based on the transformation table shown in FIG. 18, and used in the successive adder circuit. These multiplexers MUX1 and MUX2 each is a branching circuit for only transmitting signals in accordance with the relationship between indexes.

Figure 20:
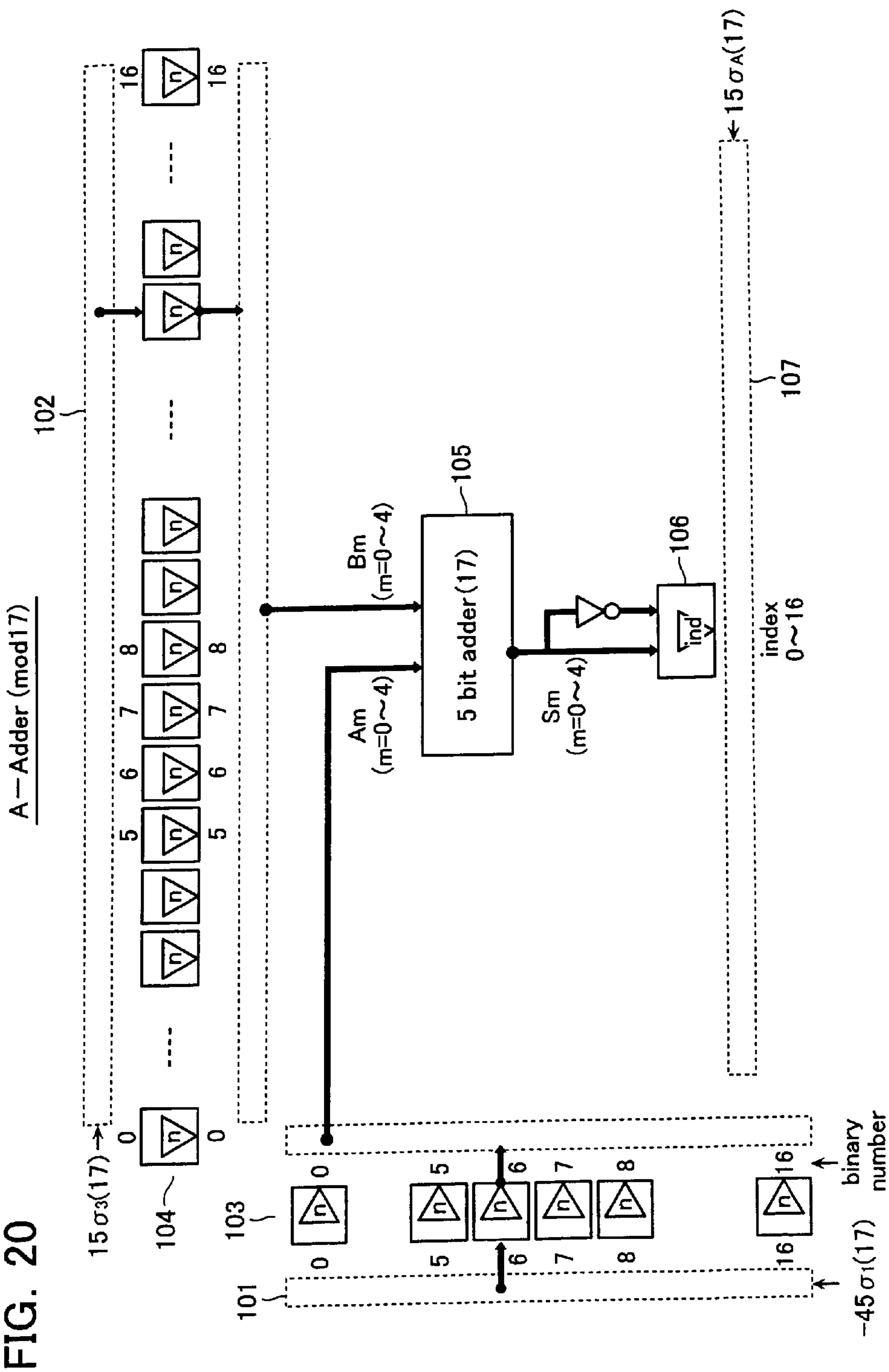
FIG. 20 shows an adder, A-Adder (mod 17), used for calculating a congruence.

FIG. 20 shows one adder in the adder circuit 23 shown in FIG. 1, i.e., A-Adder (mod 17), for calculating the expression index of mod 17 of the finite field element $A=S_3/S_1^3$. This adder is a circuit for calculating the right side of the congruence, $15\sigma_A \equiv 15\sigma_3 - 45\sigma_1$ (mod 17), shown in the Expression 20.

Inputs 101 and 102 are $-45\sigma_1(17)$ and $15\sigma_3(17)$, respectively, which are transformed from the expression index component $15\sigma_1(17)$. To add these components via 5-bit adder 105, there are prepared index/binary transforming circuits 103 and 104 for transforming these indexes to binary data.

The adding result is passed through binary/index transformation circuit 106 for transforming the binary data to indexes again, whereby the expression index component $15\sigma_A(17)$ will be obtained at the output node 107.

Figure 21:
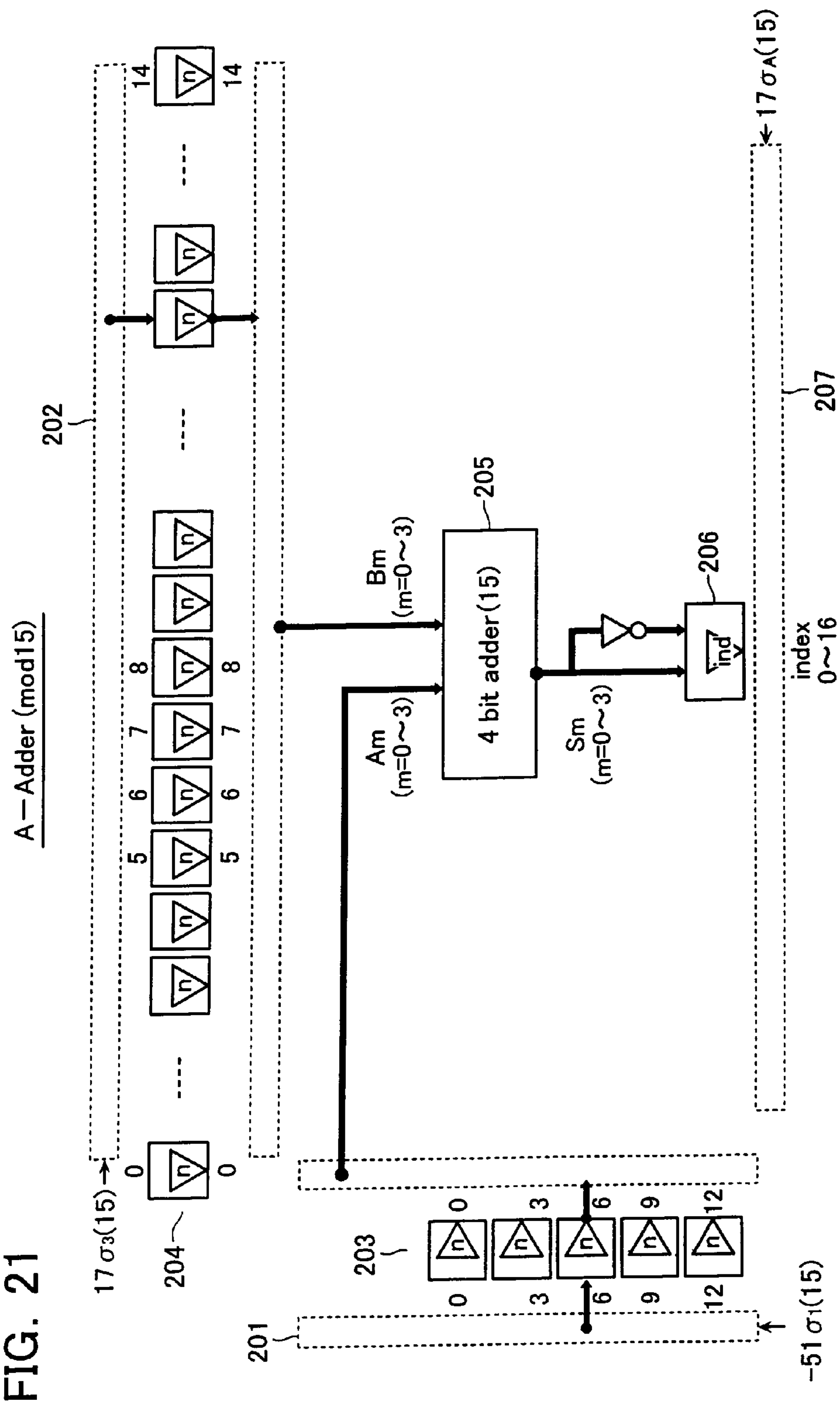
FIG. 21 shows another adder, A-Adder (mod 15).

FIG. 21 shows another adder in the adder circuit 23 shown in FIG. 1, i.e., A-Adder (mod 15), for calculating the expression index of mod 15 of the finite field element $A=S_3/S_1^3$. This adder is a circuit for calculating the right side of the congruence, $17\sigma_A \equiv 17\sigma_3 - 51\sigma_1$ (mod 15), shown in the Expression 20.

Inputs 201 and 202 are $-51\sigma 1(15)$ and $17\sigma_3(15)$, respectively, which are transformed from the expression index component $17\sigma_1(15)$. To add these components via 4-bit adder 205, there are prepared index/binary transforming circuits 203 and 204 for transforming these indexes to binary data.

The adding result is passed through binary/index transformation circuit 206 for transforming the binary data to indexes again, whereby the expression index component $17\sigma_A(15)$ will be obtained at the output node 207.

Figure 22:
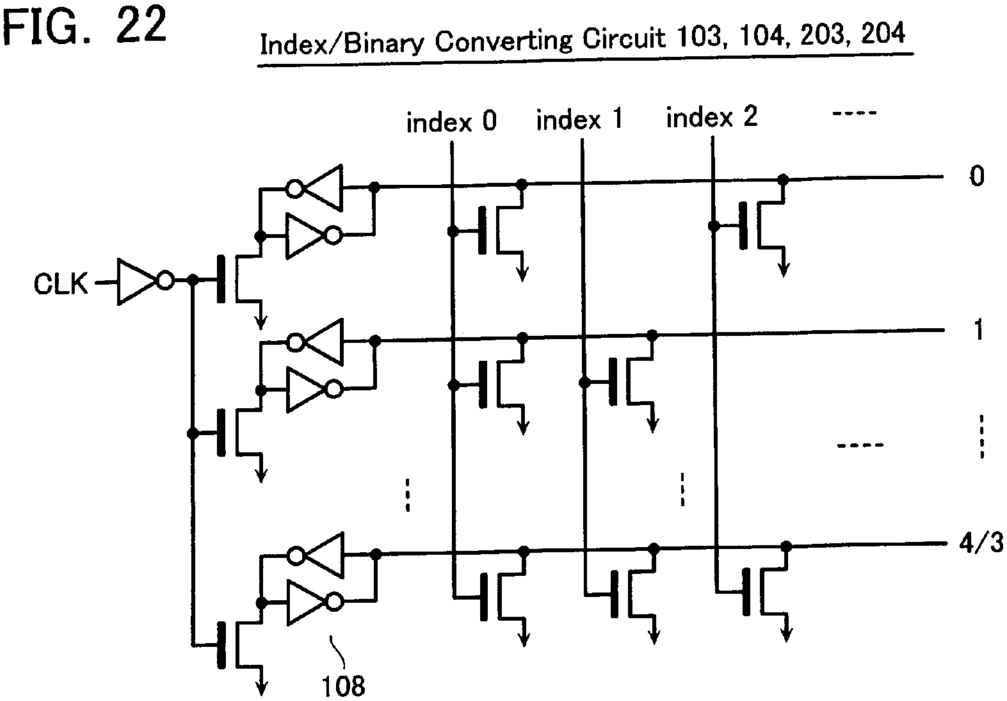
FIG. 22 shows the index/binary converting circuit for converting the index to binary data.

FIG. 22 shows an example of the index/binary transforming circuits 103, 104, 203 and 204, which is for transforming an index "i" designating the remainder class to binary data (index to 5 binary, index to 4 binary), and has a latch 108 driven by clock CLK to hold the transformed binary data. In case indexes are not input, an all "H" state is kept for designating 31 and 15 in case of 5 binary and 4 binary circuits, respectively.

Figure 23:
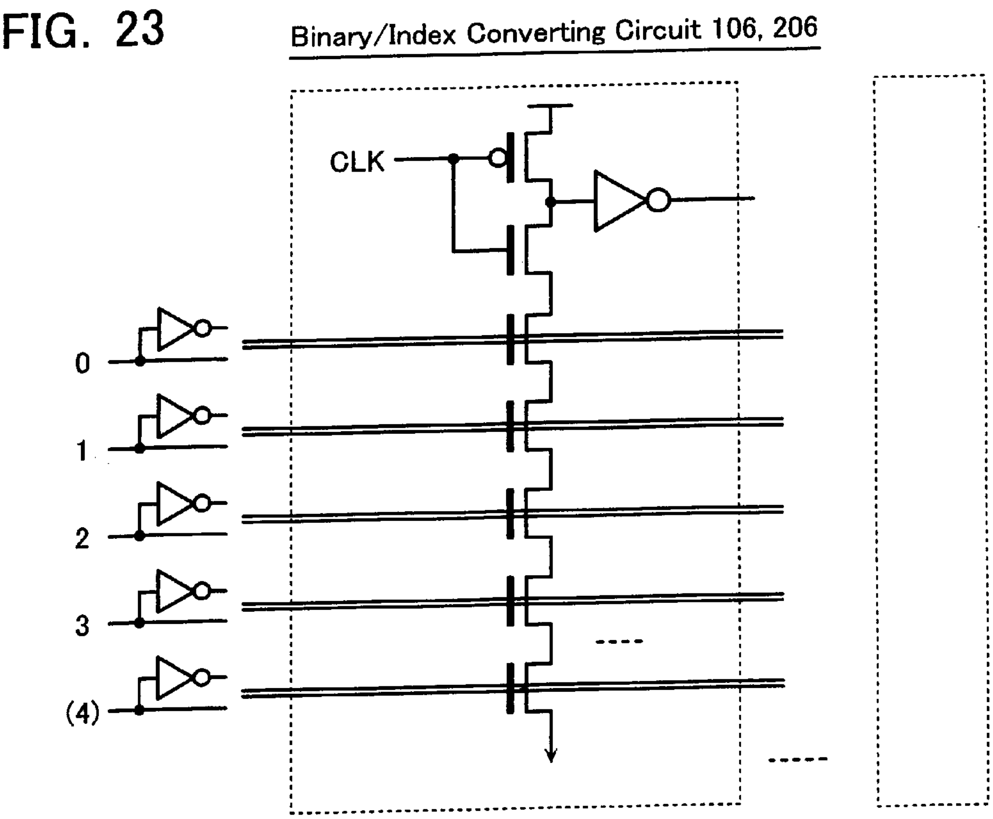
FIG. 23 shows the binary/index converting circuit for converting the binary data to the index.

FIG. 23 is an example of the binary/index transforming circuits 106 and 206, which is prepared to transforming the binary data to indexes again for the next stage calculating expression indexes. This may be formed with the same construction as the decode circuit shown in FIG. 15B.

Figure 24:
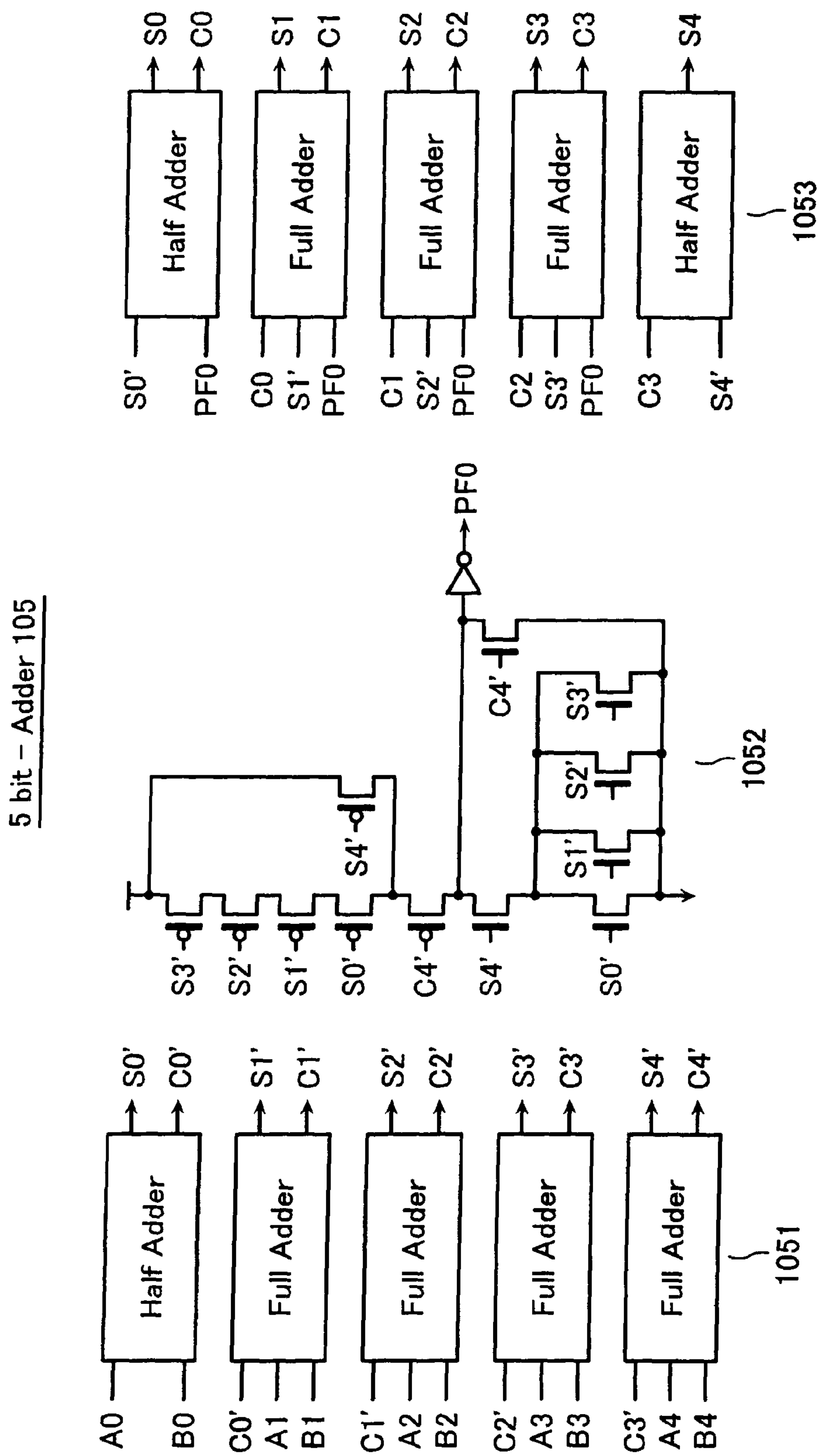
FIG. 24 shows 5-bit adder used in the A-Adder (mod 17).

FIG. 24 is an example of the 5-bit adder 105 for adding the respective digits of numbers Am and Bm expressed by binary data with half adders and full adders to obtain the sum as a remainder of mod 17. As shown in FIG. 24, this adder 105 is formed of: a first stage 5-bit adder 1051; carry correcting circuit 1052 for detecting that the sum is over 17 to carry; and a second stage adder 1053 for adding 17's complement 15 (=32−17) when the sum is over 17.

The carry correction circuit 1052 is for generating signal PF0 in accordance with the output state of the first stage adder 1051. Explaining in detail, detecting that the uppermost output bit S4' of the first stage adder is "1", and at least one of other output bits S0, S1'~S3' is "1", signal PF0="H" is output.

The second stage adder 1053 is formed to add complement (01111) to the output of the first stage adder when it is over 17.

Figure 25:
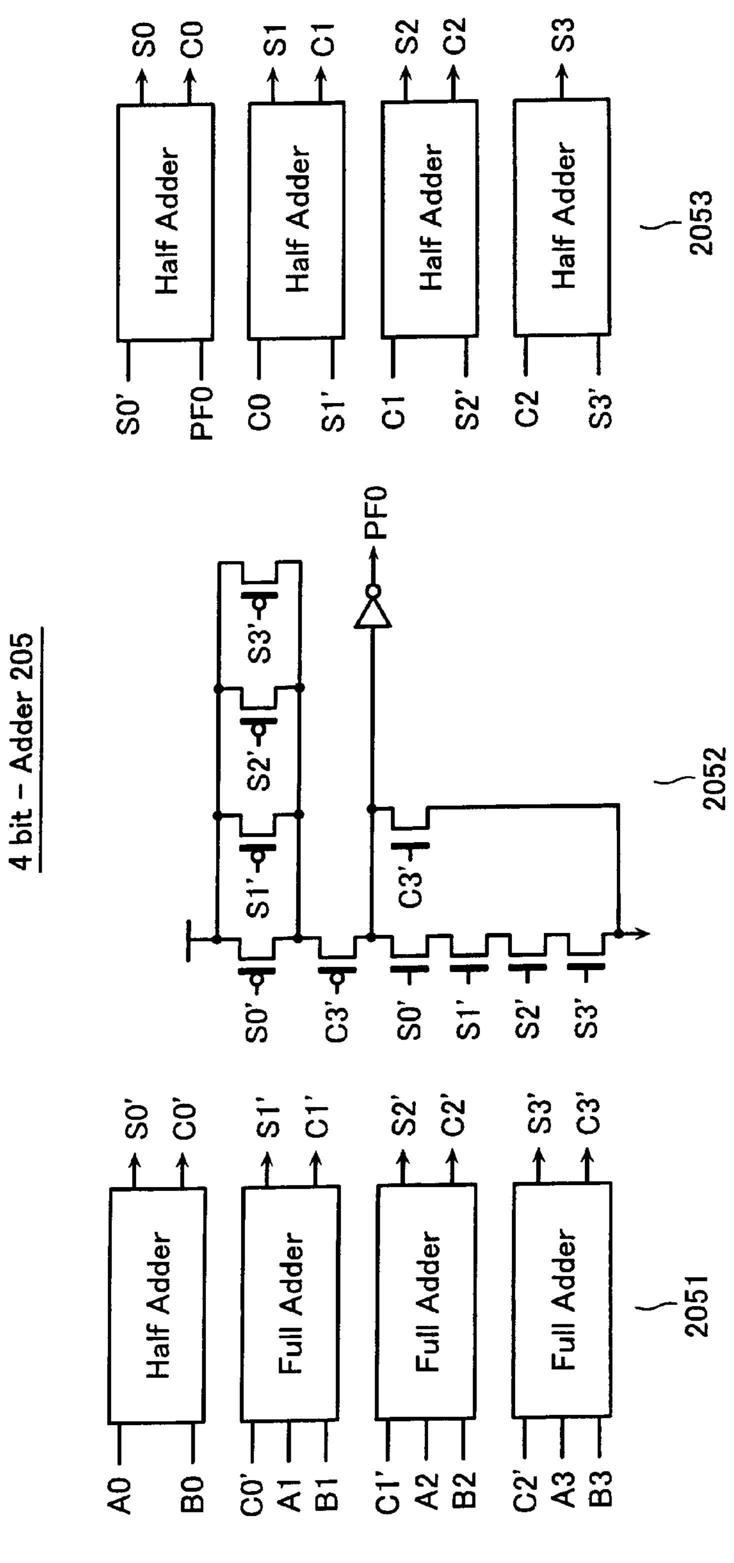
FIG. 25 shows 4-bit adder used in the A-Adder (mod 15).
Figure 26B:
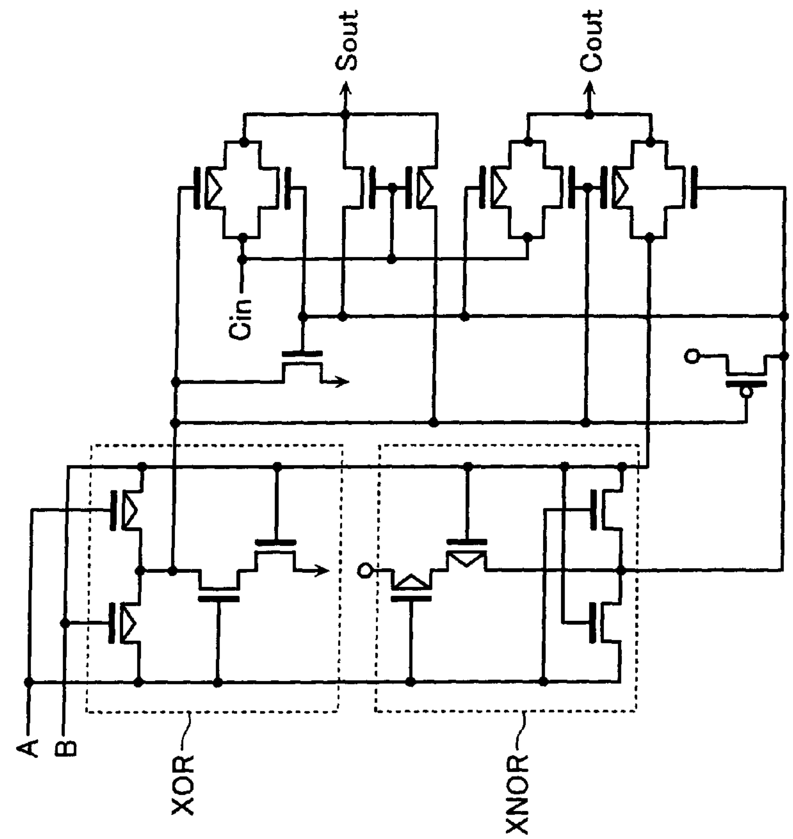
FIGS. 26A and 26B show the circuit symbol and the detailed circuit of a full adder.
Figure 26A:
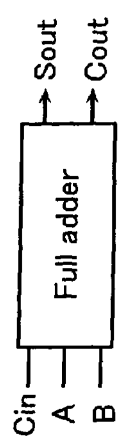
Figure 27B:
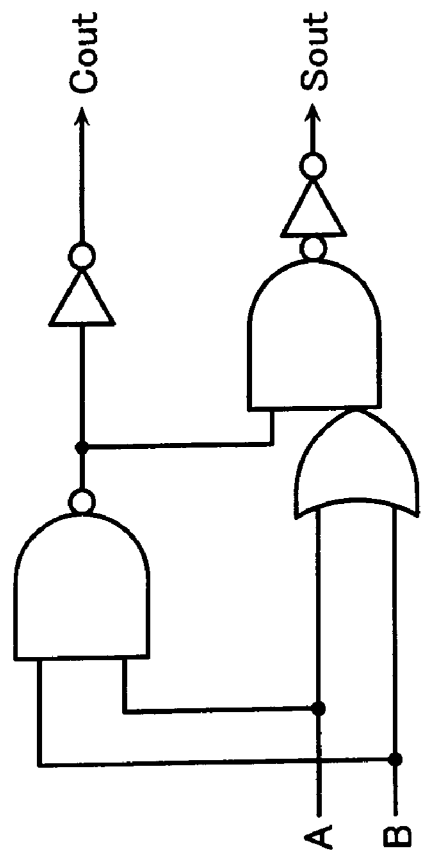
FIGS. 27A and 27B show the circuit symbol and the detailed circuit of a half adder.
Figure 27A:
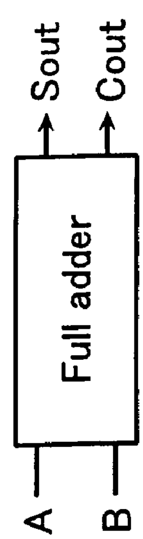

FIG. 25 is an example of the 4-bit adder 205 for obtaining the sum as a remainder of mod 15. As shown in FIG. 25, this adder 205 is formed of: a first stage 4-bit adder 2051; carry correcting circuit 2052 for detecting that the sum is over 15 to carry; and a second stage adder 2053 for adding 15's complement when the sum is over 15.

The carry correction circuit 2052 is for generating signal PF0 in accordance with the output state of the first stage adder 2051.

The second stage adder 2053 is formed to add complement 1(=0001) to the output of the first stage adder when it is over 15.

These adders 105 and 205 are formed to determine the output when the input is determined without using clock synchronization. Therefore, it becomes possible to reduce the load of timing controlling the system.

FIGS. 26A and 26B and FIGS. 27A and 27B show full adder's and half adder's symbols and detailed circuits, respectively, used in the adder 105 or 205 as basic units for adding binary data. Full adder executes a logic operation between to-be-added bits A and B with an XOR circuit and an XNOR circuit, and further executes another logic operation between the result and carry signal Cin, thereby outputting the sum Sout of A, B and Cin and carry signal Cout. The half adder will be formed with conventional logic gates.

Figure 28:
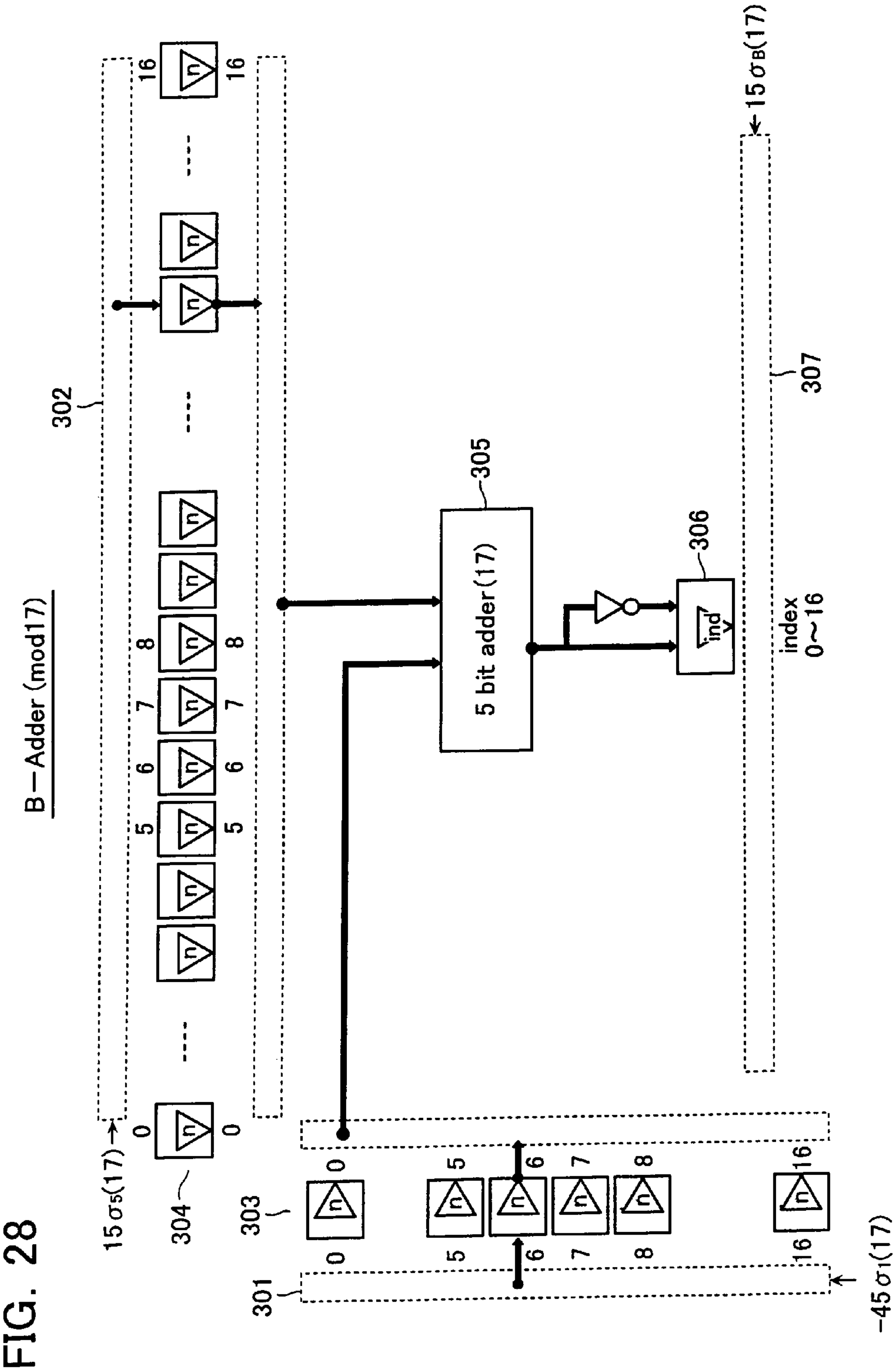
FIG. 28 shows an adder, B-Adder (mod 17), used for calculating another congruence.

FIG. 28 shows one adder in the adder circuit 24 shown in FIG. 1, i.e., B-Adder (mod 17), for calculating the expression index of mod 17 of the finite field element $B=S_5/S_1^3$. This adder is a circuit for calculating the right side of the congruence, $15\sigma_B \equiv 15\sigma_5 - 45\sigma_1$ (mod 17), shown in the Expression 21.

Inputs 301 and 302 are $-45\sigma_1(17)$ and $15\sigma_5(17)$, respectively, which are transformed from the expression index component $15\sigma_1(17)$. To add these components via 5-bit adder 305, there are prepared index/binary transforming circuits 303 and 304 for transforming these indexes to binary data.

The adding result is passed through binary/index transformation circuit 306 for transforming the binary data to indexes again, whereby the expression index component $15\sigma_B(17)$ will be obtained at the output node 307.

Figure 29:
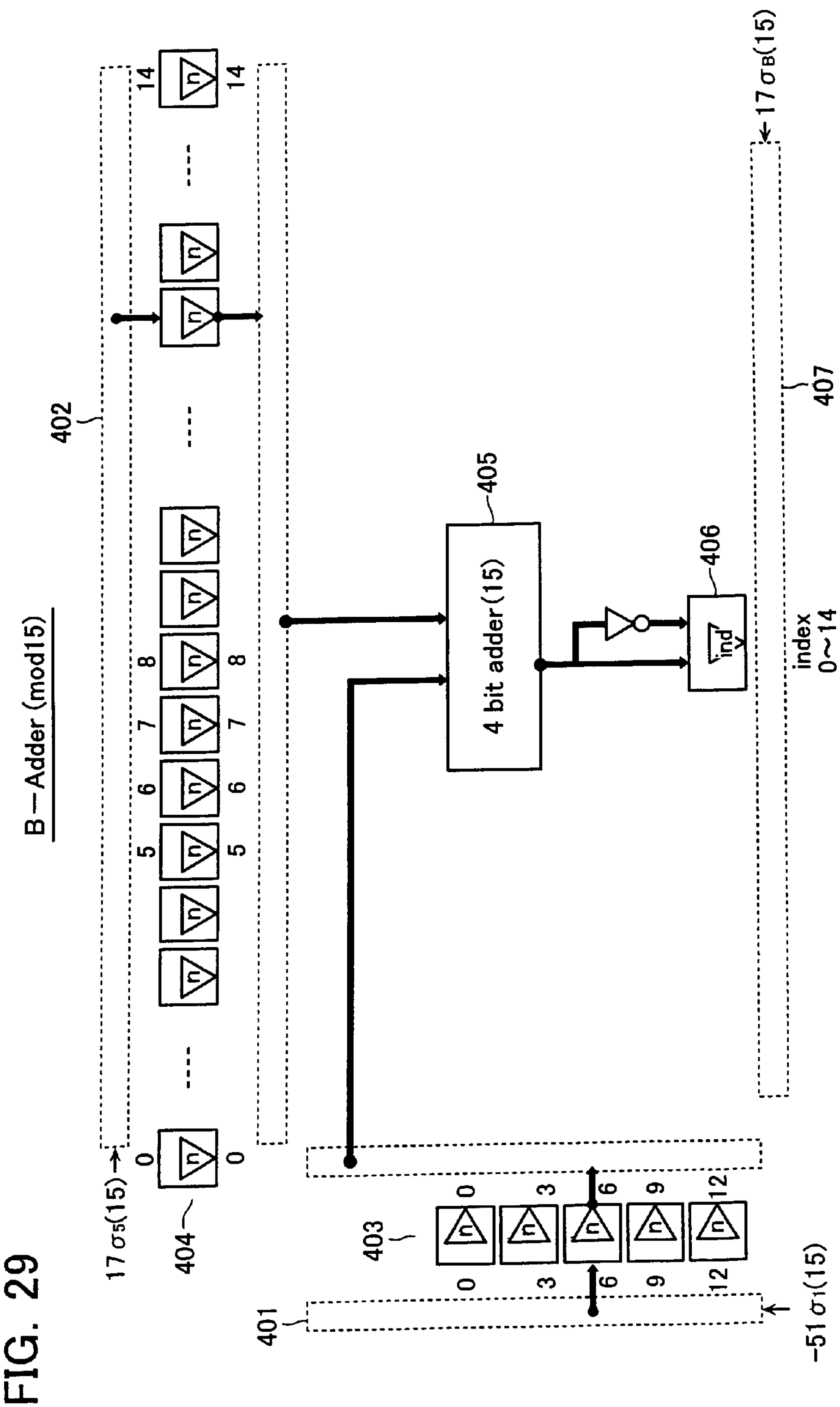
FIG. 29 shows another adder, B-Adder (mod 15).

FIG. 29 shows another adder in the adder circuit 24 shown in FIG. 1, i.e., B-Adder (mod 15), for calculating the expression index of mod 15 of the finite field element $B=S_5/S_1^3$. This adder is a circuit for calculating the right side of the congruence, $15\sigma_B \equiv 15\sigma_5 - 51\sigma_1$ (mod 15), shown in the Expression 21.

Inputs 401 and 402 are $-51\sigma_1(15)$ and $17\sigma_5(15)$, respectively, which are transformed from the expression index component $15\sigma_1(17)$. To add these components via 4-bit adder 405, there are prepared index/binary transforming circuits 403 and 404 for transforming these indexes to binary data.

The adding result is passed through binary/index transformation circuit 406 for transforming the binary data to indexes again, whereby the expression index component $17\sigma_B(15)$ will be obtained at the output node 407.

Figure 30:
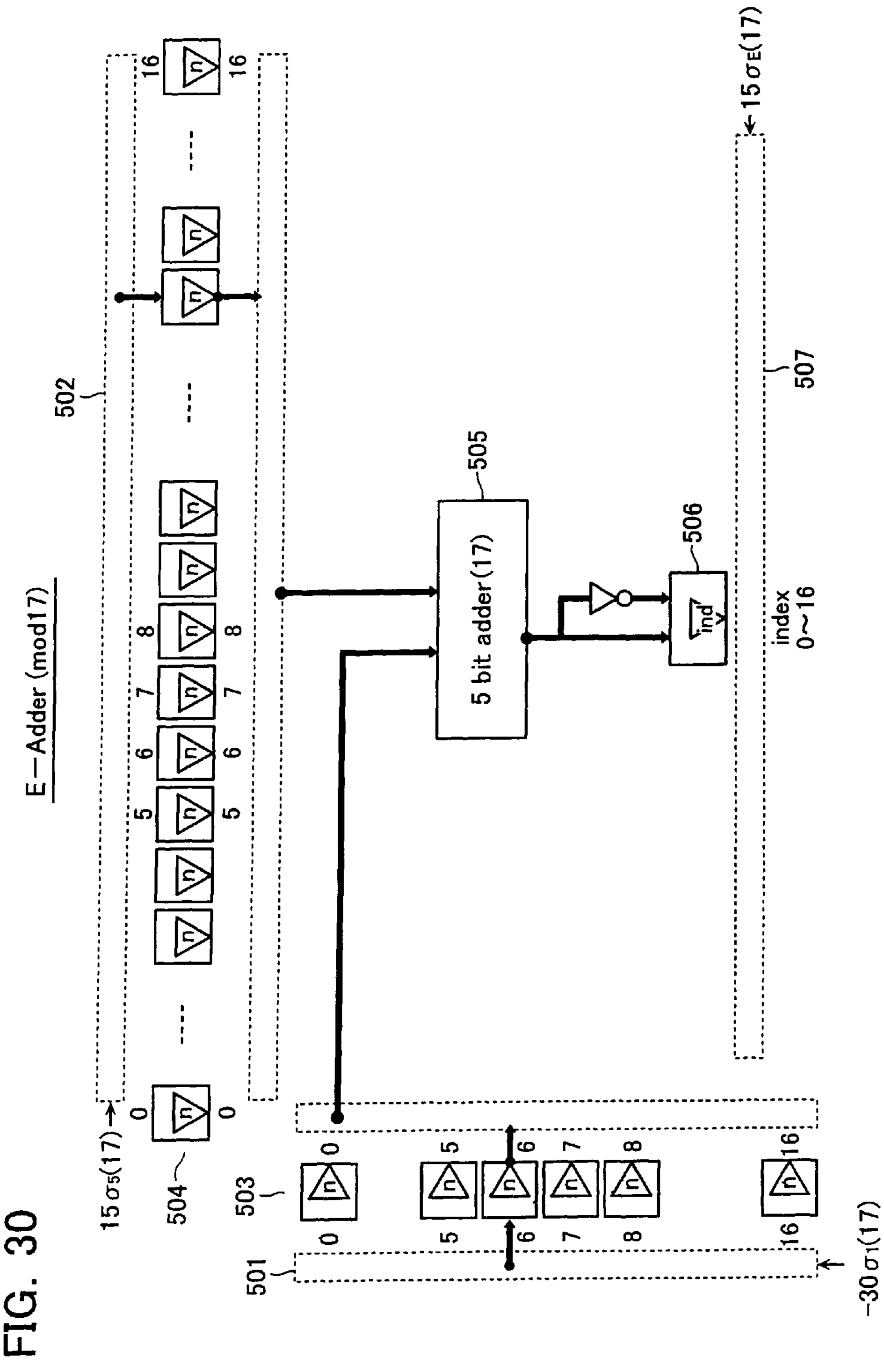
FIG. 30 shows an adder, E-Adder (mod 17), used for calculating another congruence.

FIG. 30 shows one adder in the adder circuit 25 shown in FIG. 1, i.e., E-Adder (mod 17), for calculating the expression index of mod 17 of the finite field element $E=S_5/S_1^2$. This adder is a circuit for calculating the right side of the congruence, $15\sigma_E \equiv 15\sigma_5 - 30\sigma_1$ (mod 17), shown in the Expression 22.

Inputs 501 and 502 are $-30\sigma_1(17)$ and $15\sigma_5(17)$, respectively, which are transformed from the expression index component $15\sigma_1(17)$. To add these components via 5-bit adder 505, there are prepared index/binary transforming circuits 503 and 504 for transforming these indexes to binary data.

The adding result is passed through binary/index transformation circuit 506 for transforming the binary data to indexes again, whereby the expression index component $15\sigma_E(17)$ will be obtained at the output node 507.

Figure 31:
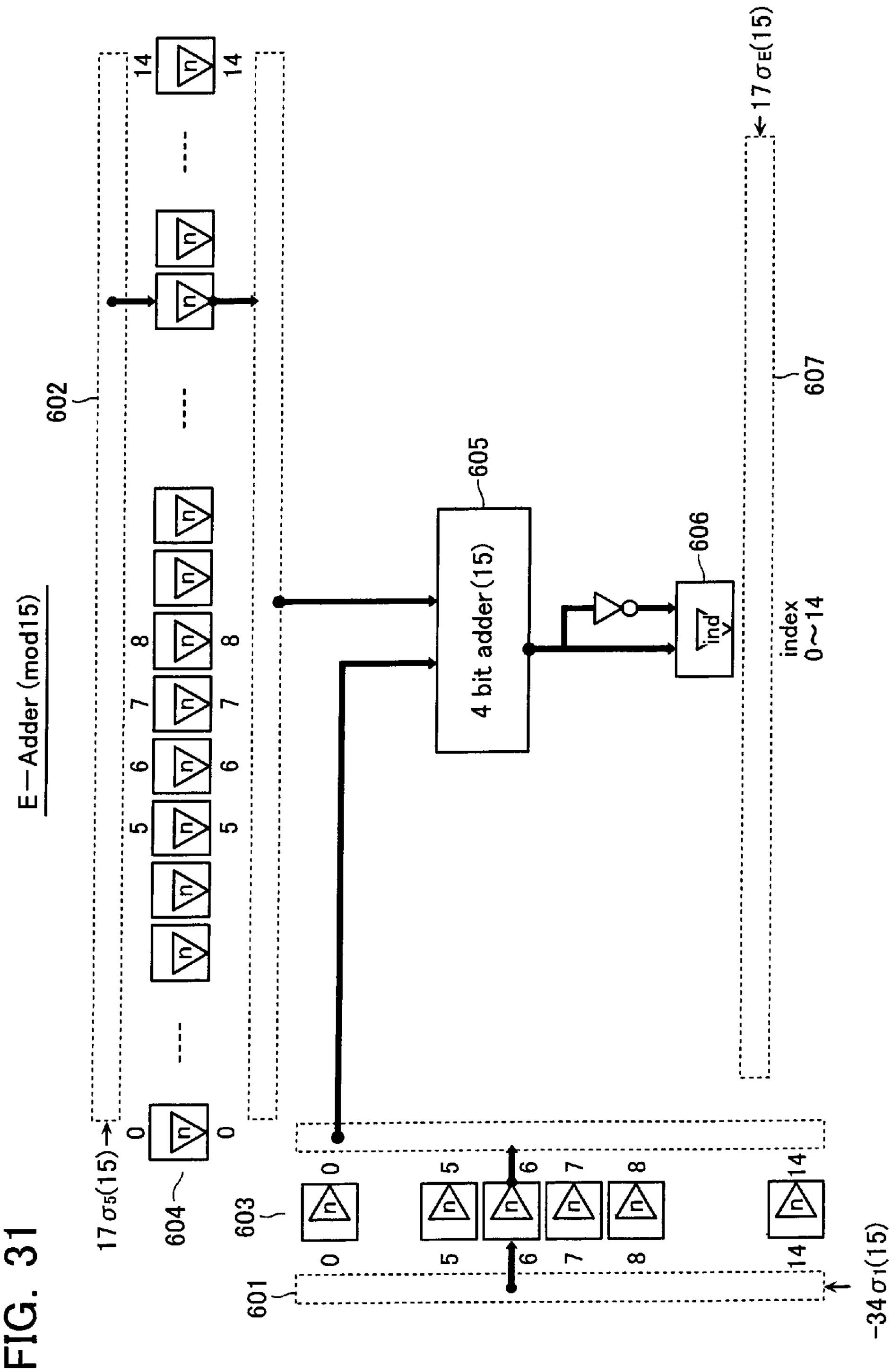
FIG. 31 shows another adder, E-Adder (mod 15).

FIG. 31 shows another adder in the adder circuit 25 shown in FIG. 1, i.e., E-Adder (mod 15), for calculating the expression index of mod 15 of the finite field element $E=S_5/S_1^2$. This adder is a circuit for calculating the right side of the congruence, $17\sigma_E \equiv 17\sigma_s - 34\sigma_1$ (mod 15), shown in the Expression 22.

Inputs 601 and 602 are $-34\sigma_1(15)$ and $17\sigma_5(15)$, respectively, which are transformed from the expression index component $15\sigma_1(17)$. To add these components via 4-bit adder 605, there are prepared index/binary transforming circuits 603 and 604 for transforming these indexes to binary data.

The adding result is passed through binary/index transformation circuit 606 for transforming the binary data to indexes again, whereby the expression index component $17\sigma_E(15)$ will be obtained at the output node 607.

Figure 32:
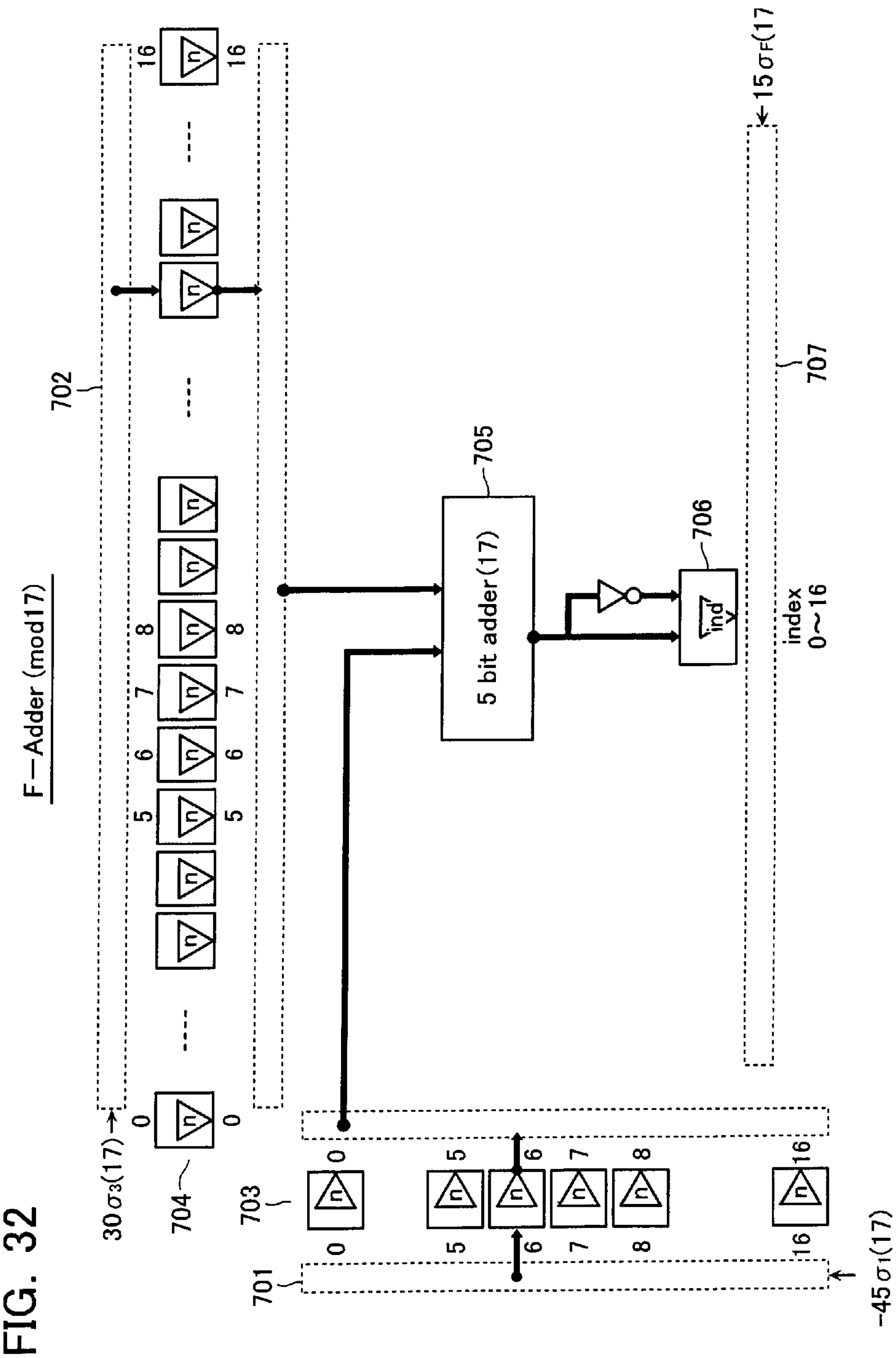
FIG. 32 shows an adder, F-Adder (mod 17), used for calculating another congruence.

FIG. 32 shows one adder in the adder circuit 26 shown in FIG. 1, i.e., F-Adder (mod 17), for calculating the expression index of mod 17 of the finite field element $F=S_3^2/S_1^3$. This adder is a circuit for calculating the right side of the congruence, $15\sigma_F \equiv 30\sigma_3 - 45\sigma_1$ (mod 17), shown in the Expression 23.

Inputs 701 and 702 are $-45\sigma_1(17)$ and $30\sigma_3(17)$, respectively, which are transformed from the expression index component $15\sigma_1(17)$. To add these components via 5-bit adder 705, there are prepared index/binary transforming circuits 703 and 704 for transforming these indexes to binary data.

The adding result is passed through binary/index transformation circuit 706 for transforming the binary data to indexes again, whereby the expression index component $15\sigma_F(17)$ will be obtained at the output node 707.

Figure 33:
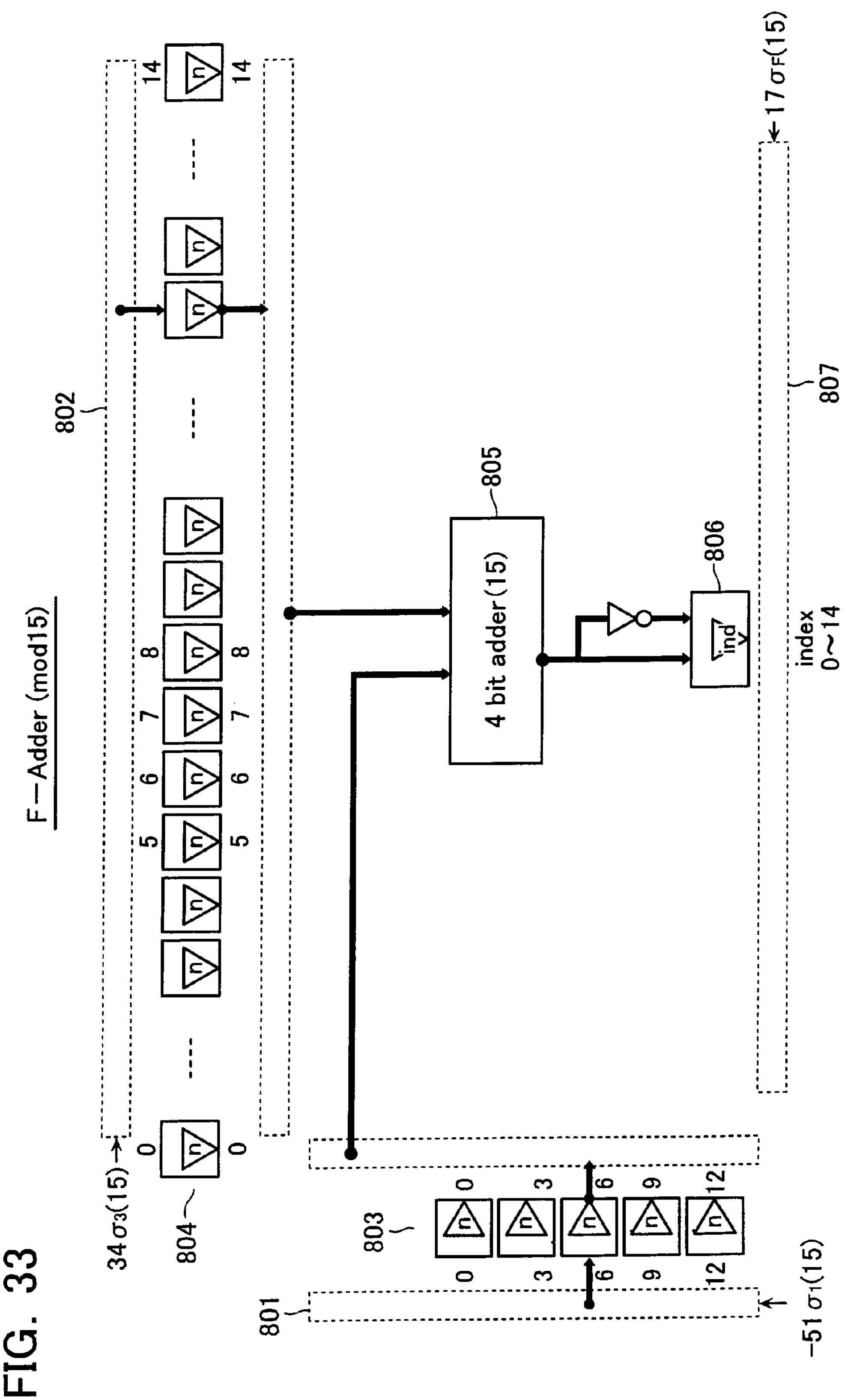
FIG. 33 shows another adder, F-Adder (mod 15).

FIG. 33 shows another adder in the adder circuit 26 shown in FIG. 1, i.e., F-Adder (mod 15), for calculating the expression index of mod 15 of the finite field element $F=S_3^2/S_1^3$. This adder is a circuit for calculating the right side of the congruence, $17\sigma_F \equiv 34\sigma_3 - 51\sigma_1$ (mod 15), shown in the Expression 23.

Inputs 801 and 802 are $-51\sigma_1(15)$ and $34\sigma_3(15)$, respectively, which are transformed from the expression index component $17\sigma_1(15)$. To add these components via 4-bit adder 805, there are prepared index/binary transforming circuits 803 and 804 for transforming these indexes to binary data.

The adding result is passed through binary/index transformation circuit 806 for transforming the binary data to indexes again, whereby the expression index component $17\sigma_F(15)$ will be obtained at the output node 807.

Outputs of these adders 23-26 serve for calculating in the parity checkers 27-29, i.e., for calculating $t=S_1^3+S^3+E+F$ and so on. Dealing with the elements as an irreducible polynomial, this calculation is for obtaining the sum of mod 2 of coefficients of the irreducible polynomial. A method of obtaining the coefficients by adding the element polynomials pn(x) expressed by expression indexes will be explained below.

FIGS. 34A and 34B are tables showing the relationship between the coefficients of the degree "m" of pn(x), index "n" of the root $\alpha^n$, and expression index {15n(17), 17n(15)} for the respective groups of values 0~14 of the expression index component 17n(15). The expression index component 15n (17), 0~16, is arranged in the order of magnitude thereof in each group.

In the column of "input 15n(17)", the place of coefficients "1" of pn(x) are shown as a value of 15n(17). Since pn(x) and the expression index {15n(17), 17n(15)} are correspond to each other one to one, when an expression index is applied, its contribution to the sum of coefficients of the degree "m" of pn(x) may be decoded based on these tables.

That is, with respect to the respective degrees "m", under a transistor, the gate of which is applied with a 17n(15), a NOR connection is formed with transistors connected in parallel, the gates of which are applied with such 15n(17) that coefficient of the degree "m" of pn(x) belonging to 17n(15) is "1". As a result, it is formed that there is provided a current path when an expression index is hit to this group.

Such connections are formed for the respective 17n(15) based on the tables shown in FIGS. 34A to 34E to be able to discharge a common node. This common node designates an inverted one of the coefficient of degree "m" of pn(x) for an expression index.

For example, in case of m=7, the following NOR connections (1)~(15) will be formed based on the tables.

(1) NOR connection of 15n(17)=2, 7, 10, 12, 14 and 16 under 17n(15)=0.

(2) NOR connection of 15n(17)=0, 2, 4, 5, 7, 9, 10, 11, 15 and 16 under 17n(15)=1.

(3) NOR connection of 15n(17)=3, 4, 5, 6, 10 and 16 under 17n(15)=2.

(4) NOR connection of 15n(17)=0, 1, 3, 6, 8 and 9 under 17n(15)=3.

(5) NOR connection of 15n(17)=0, 4, 5, 9, 11, 12, 14 and 15 under 17n(15)=4.

(6) NOR connection of 15n(17)=0, 2, 3, 6, 7, 9, 11 and 15 under 17n(15)=5.

(7) NOR connection of 15n(17)=0, 1, 4, 5, 8, 9, 10 and 16 under 17n(15)=6.

(8) NOR connection of 15n(17)=1, 3, 4, 5, 6, 8, 11, 12, 14 and 15 under 17n(15)=7.

(9) NOR connection of 15n(17)=2, 3, 4, 5, 6, 7, 12 and 14 under 17n(15)=8.

(10) NOR connection of 15n(17)=1, 2, 3, 4, 5, 6, 7, 8, 10, 11, 15 and 16 under 17n(15)=9.

(11) NOR connection of 15n(17)=0, 3, 6, 9, 10, 11, 12, 14, 15 and 16 under 17n(15)=10.

(12) NOR connection of 15n(17)=1, 2, 7, 8, 11 and 15 under 17n(15)=11.

(13) NOR connection of 15n(17)=1, 8, 10, 11, 12, 14, 15 and 16 under 17n(15)=12.

(14) NOR connection of 15n(17)=0, 1, 2, 4, 5, 7, 8, 9, 12 and 14 under 17n(15)=13.

(15) NOR connection of 15n(17)=0, 1, 2, 3, 6, 7, 8, 9, 10, 12, 14 and 16 under 17n(15)=14.

In accordance with whether the common code is discharged or not by these NOR connections, coefficient "1" is decoded. For example, in case of {15n(17), 17n(15)}={11, 4}, the common node is discharged via a NOR connection of 15n(17)=0, 4, 5, 9, 11, 14 and 15 under 17n(15)=4, so that the coefficient of m=7 is decoded as "1".

Figure 35:
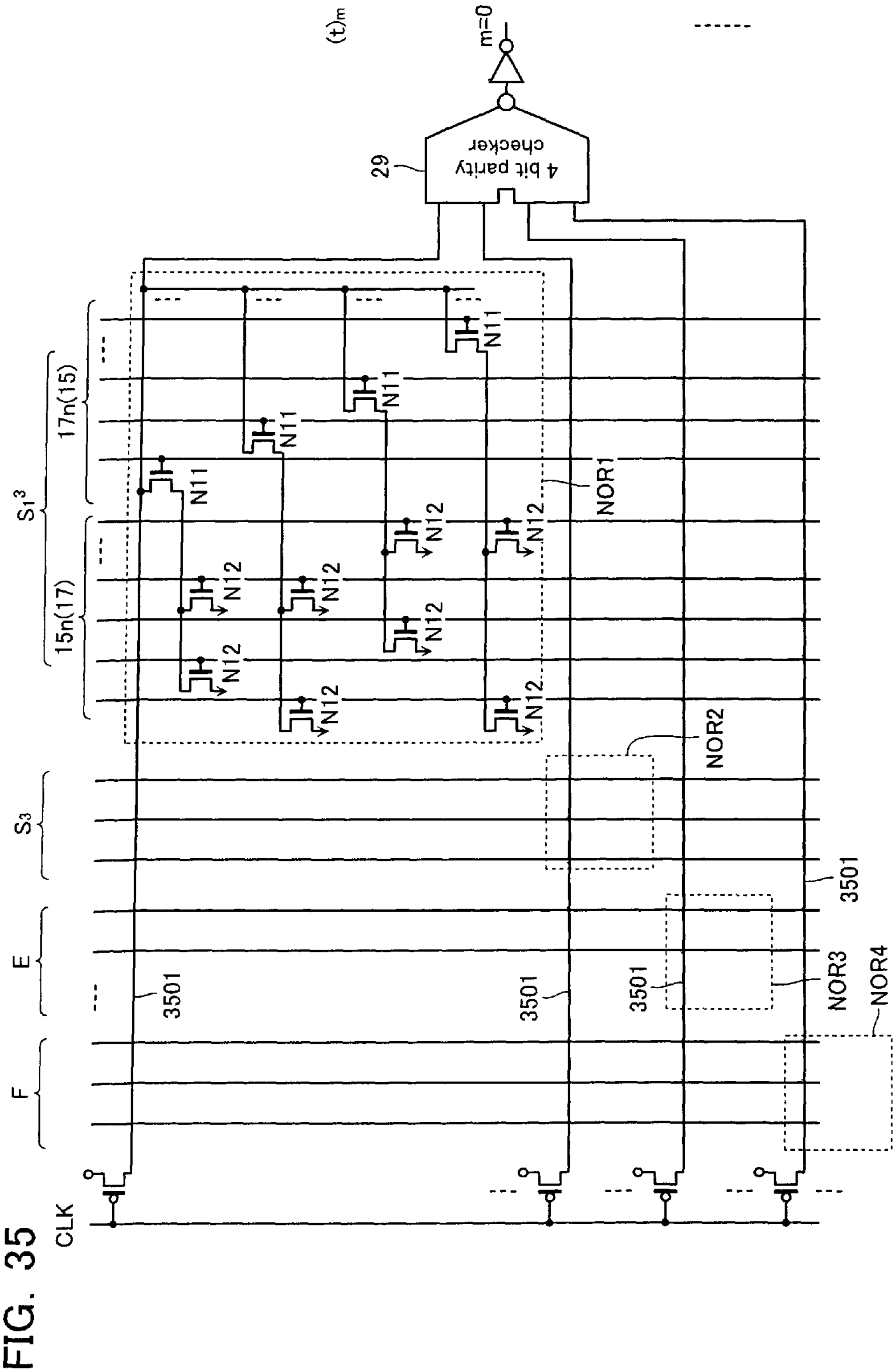
FIG. 35 shows a parity check circuit for searching the element "t" as the sum of coefficients.

FIG. 35 shows the input portion of one 4-bit parity checker 29, which calculates $t=S_1^3+S_3+E+F$ to output a judging signal of designating 2-bit error or not by use of the tables shown in FIGS. 34A to 34E.

Input signals are expression indexes of elements $S_1^3$, $S_3$, E and F, and there are prepared common nodes 3501 for the respective elements, each of which corresponds to a coefficient of m-degree. Common nodes 3501 are precharged by PMOS transistors driven by clock CLK to Vdd.

Corresponding to the respective common nodes 3501, NOR circuits NOR1-NOR4 are constituted by NMOS transistors N11, gates of which are driven by expression index components 17n(15), and NMOS transistors N12, gates of which are driven by expression index components 15n(17). Arrangement of NMOS transistors N11 and N12 is determined in accordance with the tables shown in FIGS. 34A to 34E.

Parity checkers 29 perform parity check for each four common nodes, thereby outputting coefficients, $(t)_m$, of m-degree of "t". All inputs being inverted, the output of the parity checker is not changed. Therefore, inverted inputs are used here, which serve for easily constructing a logic circuit with node discharging.

Figure 36:
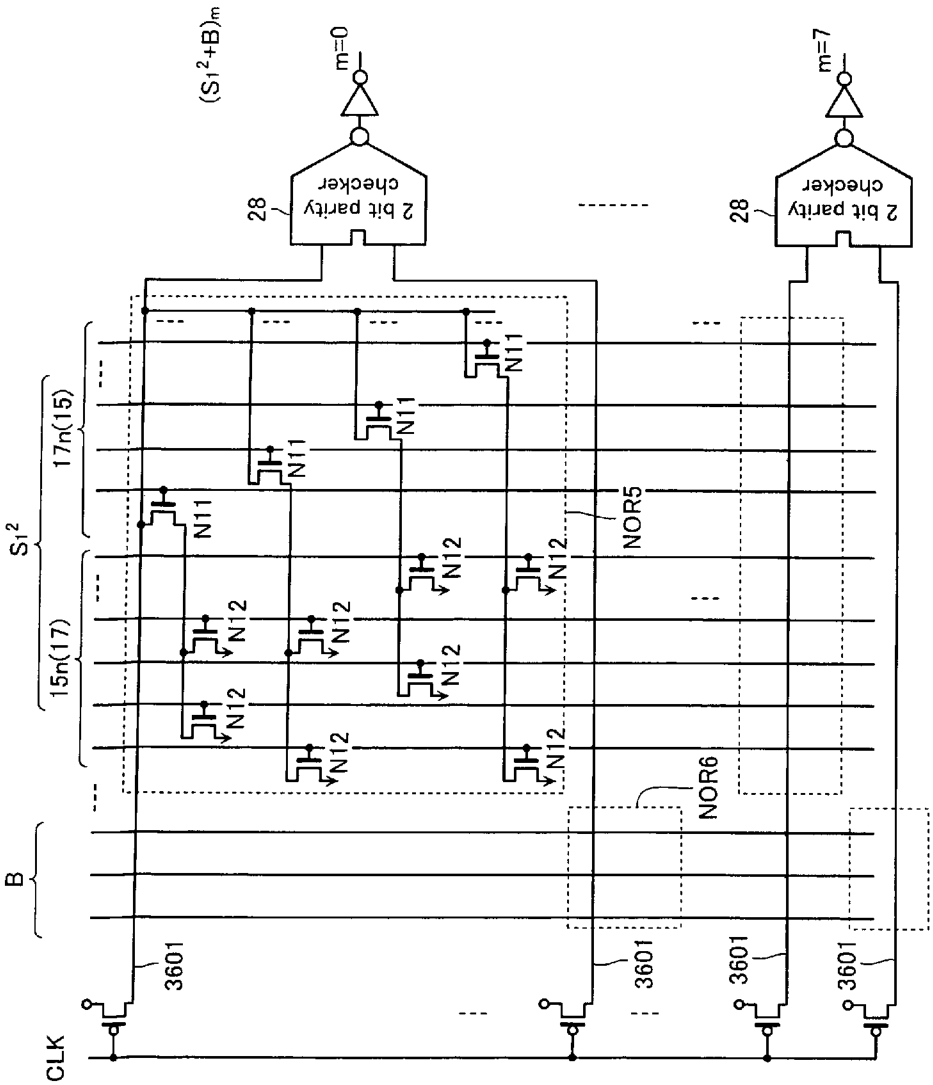
FIG. 36 shows a parity check circuit for searching the elements B and $S_1^2$ as the sum of coefficients.

FIG. 36 shows the input portion of one parity checker 28, which calculates element $S_1^2$+B of C=($S_1^2$+B)/(A+1) relating to Expression 13 by use of the tables shown in FIGS. 34A and 34B.

Input signals are expression indexes of elements $S_1^2$ and B, and there are prepared common nodes 3601 for the respective elements, each of which corresponds to a coefficient of m-degree. Common nodes 3601 are precharged by PMOS transistors driven by clock CLK to Vdd.

Corresponding to the respective common nodes 3601, NOR circuits NOR5 and NOR6 are constituted by NMOS transistors N11, gates of which are driven by expression index components 17n(15), and NMOS transistors N12, gates of which are driven by expression index components 15n(17).

2-bit parity checkers 28 perform parity check for each two common nodes, thereby outputting coefficients, $(S_1^2+B)_m$, of m-degree of $S_1^2$+B.

Figure 37:
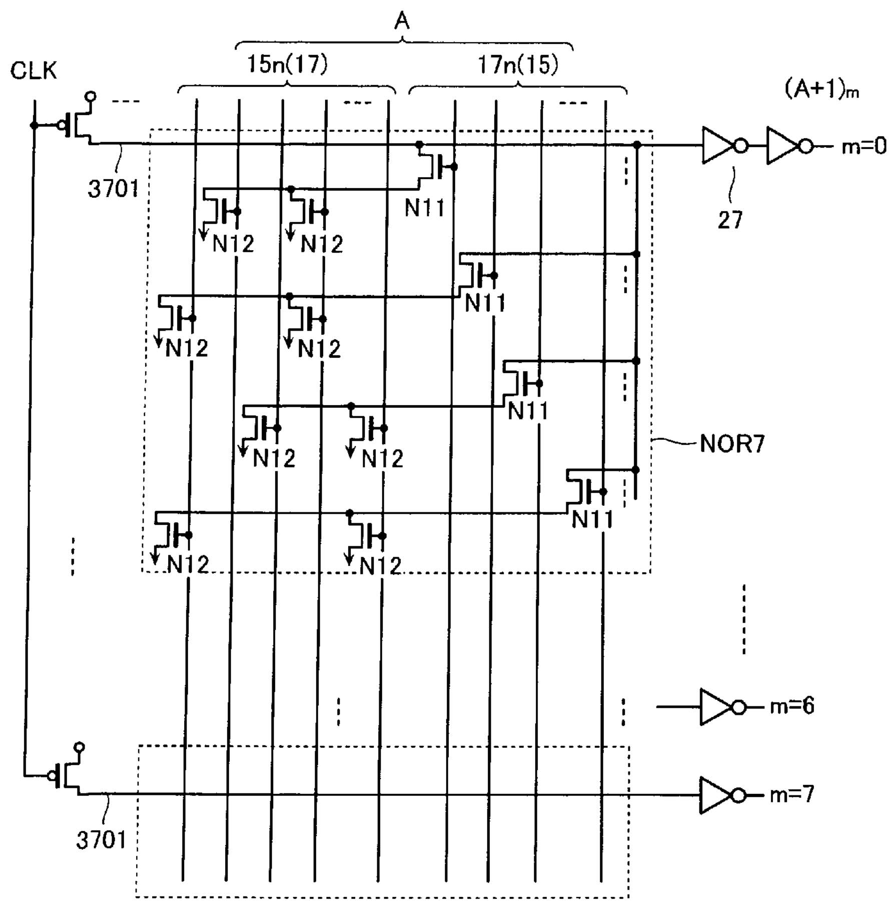
FIG. 37 shows a parity check circuit for searching the elements "A" and "1" as the sum of coefficients.

FIG. 37 shows the input portion of one parity checker 27, which calculates A+1 of C=($S_1^2$+B)/(A+1) relating to Expression 13 by use of the tables shown in FIGS. 34A and 34B.

Input signals are expression indexes of element A, and there are prepared common nodes 3701 for the respective coefficients of m-degree of the element. Common nodes 3701 are precharged by PMOS transistors driven by clock CLK to Vdd.

Corresponding to the respective common nodes 3701, NOR circuits NOR7 are constituted by NMOS transistors N11, gates of which are driven by expression index components 17n(15), and NMOS transistors N12, gates of which are driven by expression index components 15n(17).

Parity checker 27 is for only adding 1 to A. Therefore, m=0 stage is formed of two inverters connected in series; other "m" stages each is formed of one inverter. As a result, coefficient $(A+1)_m$ of m-degree of (A+1) is output.

After obtaining m-degree coefficients of polynomial based on addition of elements as described above, these are converted to expression indexes. That is, elements t, $S_1^2$+b, A+1 are obtained as 7-degree polynomials, and identical with either one of pn(x). Therefore, the polynomial is converted to an expression index, which expresses the index of root a by $m_1(x)$ with mod 17 and mod 15, and serves for calculating hereinafter.

Figure 38A:
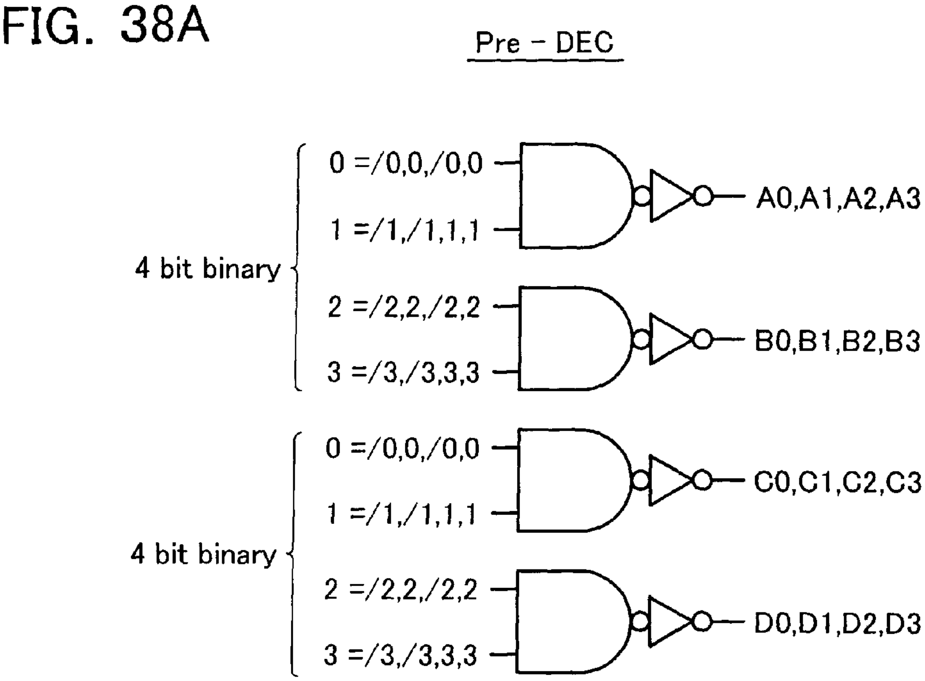
FIGS. 38A to 38C show decoder portions of a decoder circuit for generating the expression index from coefficients of the element polynomial.
Figure 38C:
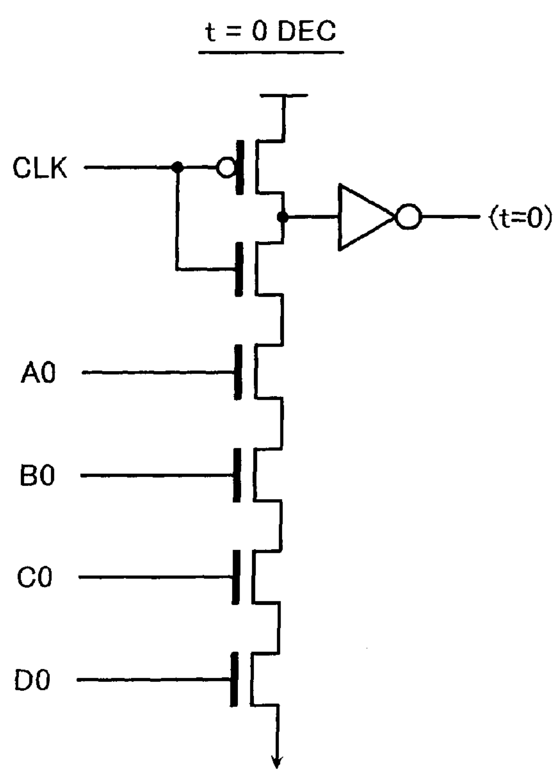
Figure 38B:
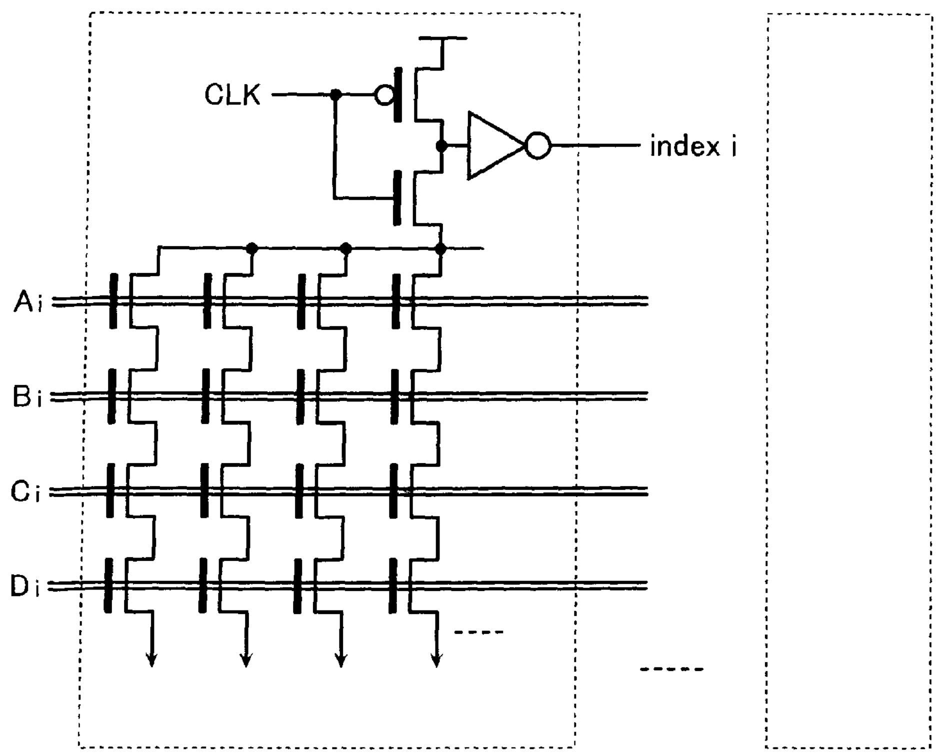

FIGS. 38A to 38C show the decode circuit for performing the index transformation, which has pre-decoder, Pre-DEC, shown in FIG. 38A; main decoders, $15\sigma_t$DEC, $17\sigma_t$DEC, $15\sigma_{(S12+B)}$DEC, $17\sigma_{(S12+B)}$DEC, $15\sigma_{(A+1)}$DEC and $17\sigma_{(A+1)}$ DEC shown in FIG. 38B; and auxiliary decoder, t=0DEC, shown in FIG. 38C.

The pre-decoder portion Pre-DEC shown in FIG. 38A is for transforming 256 binary states expressed by 8-bit coefficients of pn(x) to combinations of signals Ai, Bi, Ci and Di (i=0~3), which is formed of NAND circuits. 8-bit binary signals are divided 2-bit by 2-bit to be expressed as quaternary data Ai, Bi, Ci and Di.

As a result, degree numbers m=0 and 1 of t, $S_1^2$+B, A+1 are transformed to Ai; m=2 and 3 to Bi; m=4 and 5 to Ci; and m=6 and 7 to Di. By use of this pre-decoder, it becomes possible to reduce the number of transistors used in the successive main decoder stage from 8 to 4.

There are six kinds of main index decoder portions (DEC), which are formed of the same circuit configuration except that inputs thereof are different from each other. Therefore, FIG. 38B shows one example of them. Pre-decoded signals are classified into multiple remainder classes, indexes of which are output. That is, there are NAND circuits for decoding Ai, Bi, Ci and Di, and NOR connections for coupling the NAND circuits in parallel.

The main decoder has common nodes to be precharged by precharge transistors driven by clock CLK, and in accordance with whether the common node is discharged or not, index signal "index i" is output. A signal wiring and the inverted signal wiring constitute a pair, which are selectively coupled to the gates of transistors in each NAND circuit in accordance with the decoded code.

Indexes of mod 17 and mod 15 are generated to constitute a pair, which is defined as an expression index.

In case of pn(x)=0, the state is not expressed by a power of the primitive root α, so that no index will be searched. For the purpose of using this state later, a status signal is generated by an auxiliary decoder portion shown in FIG. 38C. This decoder outputs a signal designating t=0 when A0=B0=C0=D0=1.

Figure 39:
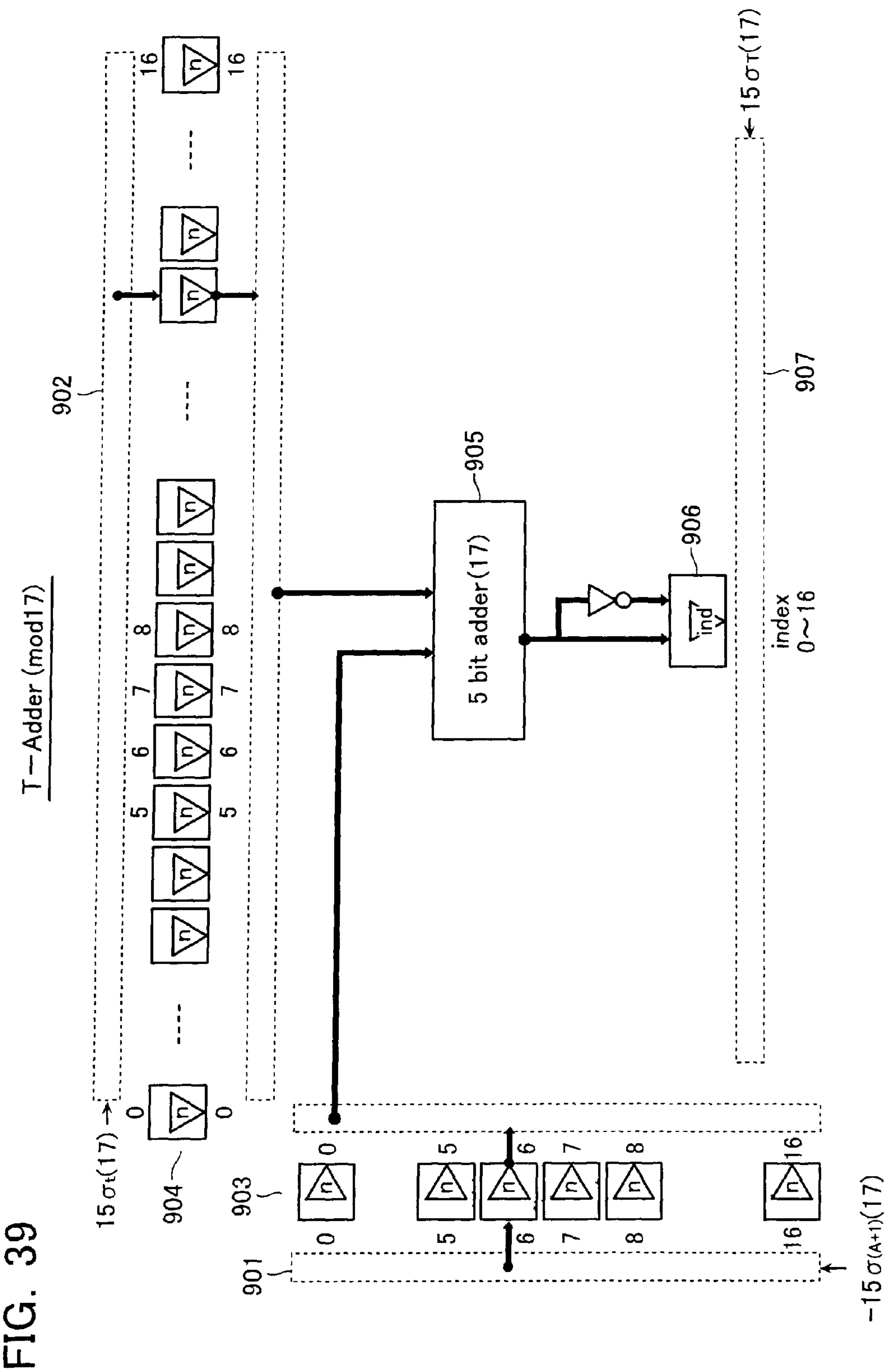
FIG. 39 shows an adder, T-Adder (mod 17), used for calculating another congruence.

FIG. 39 shows one adder in the adder circuit 32 shown in FIG. 1, i.e., T-Adder (mod 17), for calculating the expression index of mod 17 of the finite field element T=t/(A+1). This adder is a circuit for calculating the right side of the congruence, $15\sigma_T \equiv 15\sigma_t - 15\sigma_{(A+1)}$ (mod 17), shown in the Expression 26.

Inputs 901 and 902 are $-15\sigma_{(A+1)}(17)$ transformed from the expression index component $15\sigma_{(A+1)}(17)$ and the expression index component $15\sigma_t(17)$ of "t". To add these components via 5-bit adder 905, there are prepared index/binary transforming circuits 903 and 904 for transforming these indexes to binary data.

The adding result is passed through binary/index transformation circuit 906 for transforming the binary data to indexes again, whereby the expression index component $15\sigma_T(17)$ will be obtained at the output node 907.

Figure 40:
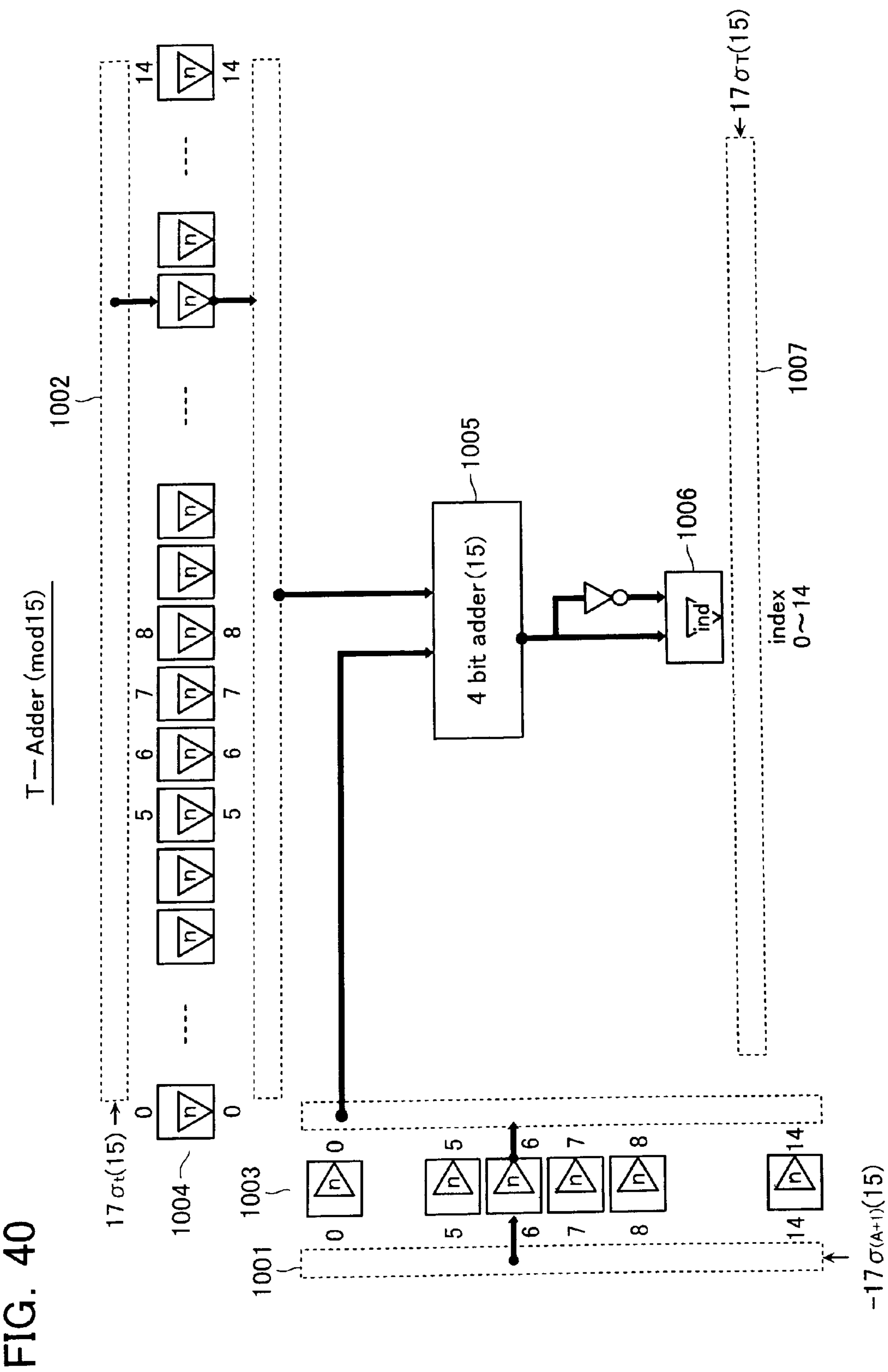
FIG. 40 shows another adder, T-Adder (mod 15).

FIG. 40 shows another adder in the adder circuit 32 shown in FIG. 1, i.e., T-Adder (mod 15), for calculating the expression index of mod 15 of the finite field element T=t/(A+1). This adder is a circuit for calculating the right side of the congruence, $17\sigma_T \equiv 17\sigma_t - 17\sigma_{(A+1)}$ (mod 15), shown in the Expression 26.

Inputs 1001 and 1002 are $-17\sigma_{(A+1)}$ (15) transformed from the expression index component $15\sigma_{(A+1)}(15)$, and the expression index component $17\sigma_t$ (15) of "t". To add these components via 4-bit adder 1005, there are prepared index/binary transforming circuits 1003 and 1004 for transforming these indexes to binary data.

The adding result is passed through binary/index transformation circuit 1006 for transforming the binary data to indexes again, whereby the expression index component $17\sigma_T(15)$ will be obtained at the output node 1007.

Figure 41:
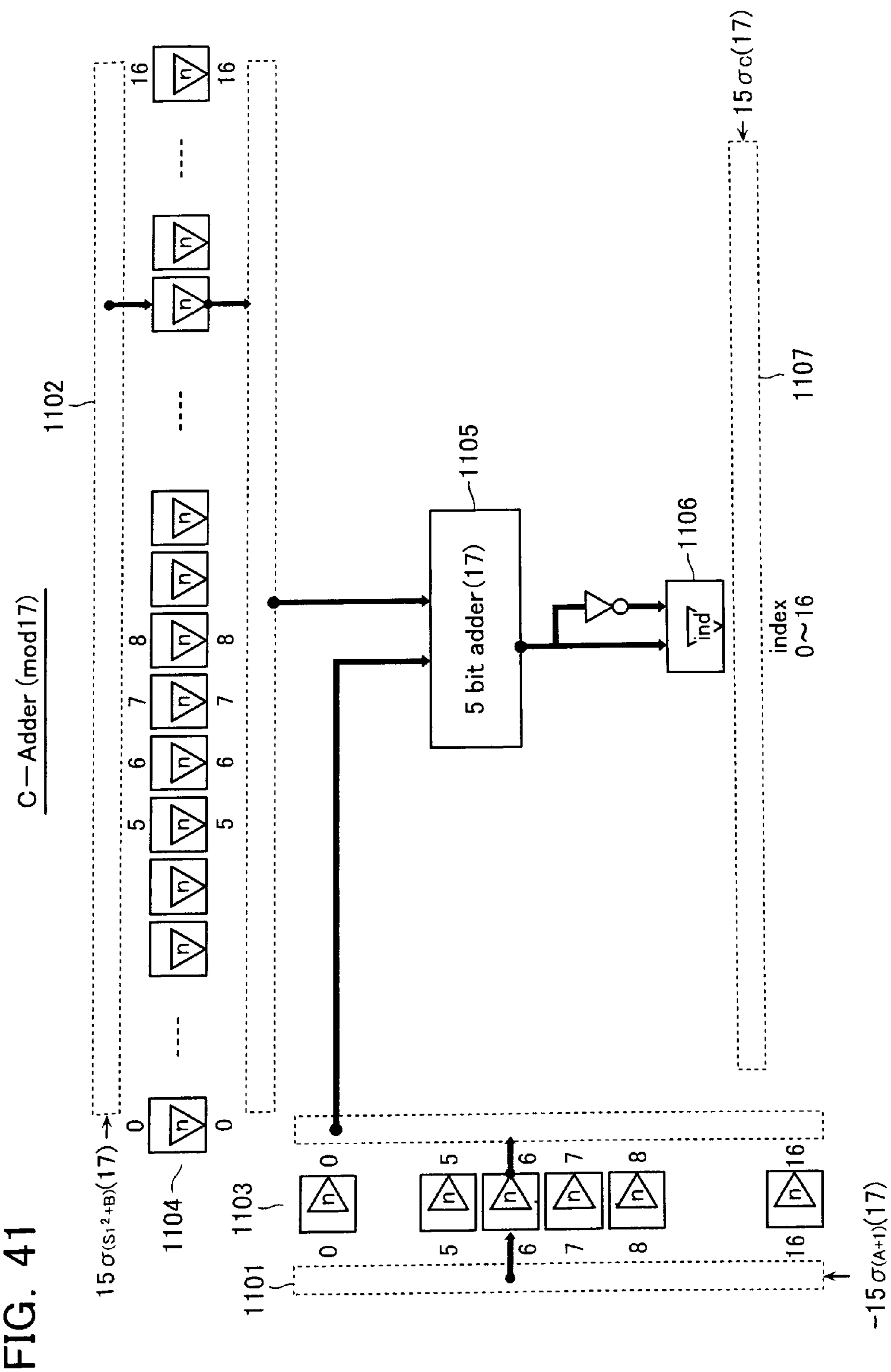
FIG. 41 shows an adder, C-Adder (mod 17), used for calculating another congruence.

FIG. 41 shows one adder in the adder circuit 31 shown in FIG. 1, i.e., C-Adder (mod 17), for calculating the expression index of mod 17 of the finite field element C=($S_1^2$+B)/(A+1). This adder is a circuit for calculating the right side of the congruence, $15\sigma_C \equiv 15\sigma_{(S12+B)} - 15\sigma_{(A+1)}$ (mod 17), shown in the Expression 25.

Inputs 1101 and 1102 are $-15\sigma_{(A+1)}(17)$ transformed from the expression index component $15\sigma_{(A+1)}(17)$ and the expression index component $15\sigma_{(S12+B)}(17)$ of $S_1^2$+B. To add these components via 5-bit adder 1105, there are prepared index/binary transforming circuits 1103 and 1104 for transforming these indexes to binary data.

The adding result is passed through binary/index transformation circuit 1106 for transforming the binary data to indexes again, whereby the expression index component $15\sigma_C(17)$ will be obtained at the output node 1107.

Figure 42:
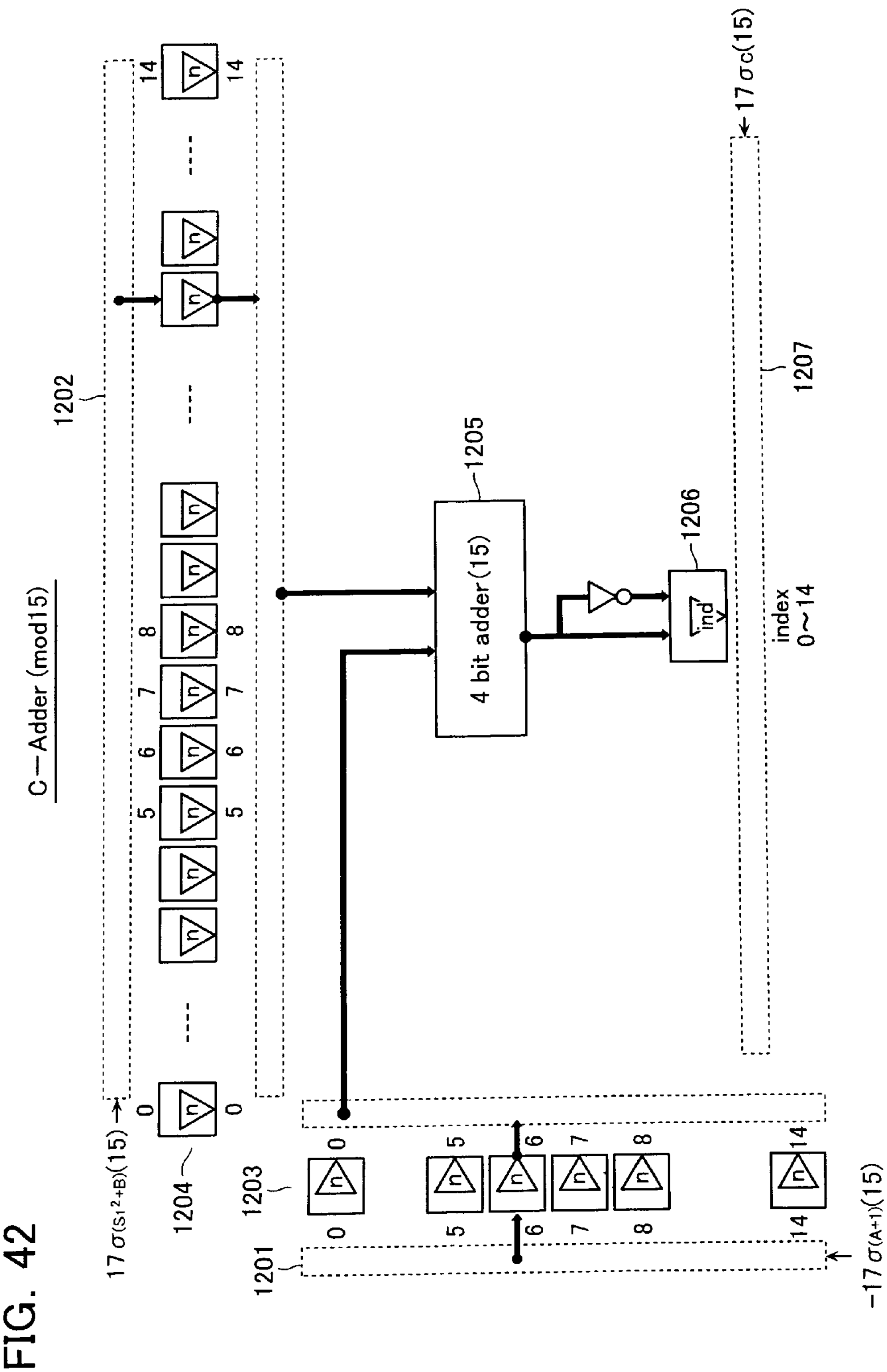
FIG. 42 shows another adder, C-Adder (mod 15).

FIG. 42 shows another adder in the adder circuit 31 shown in FIG. 1, i.e., C-Adder (mod 15), for calculating the expression index of mod 15 of the finite field element $C=(S_1^2+B)/(A+1)$. This adder is a circuit for calculating the right side of the congruence, $17\sigma_C \equiv 17\sigma_{(S12+B)} - 17\sigma_{(A+1)}$(mod 15), shown in the Expression 25.

Inputs 1201 and 1202 are $-17\sigma_{(A+1)}(15)$ transformed from the expression index component $15\sigma_{(A+1)}(15)$, and the expression index component $17\sigma_{(S12+B)}(15)$ of $S_1^2$+B. To add these components via 4-bit adder 1205, there are prepared index/binary transforming circuits 1203 and 1204 for transforming these indexes to binary data.

The adding result is passed through binary/index transformation circuit 1206 for transforming the binary data to indexes again, whereby the expression index component $17\sigma_C(15)$ will be obtained at the output node 1207.

Figure 43:
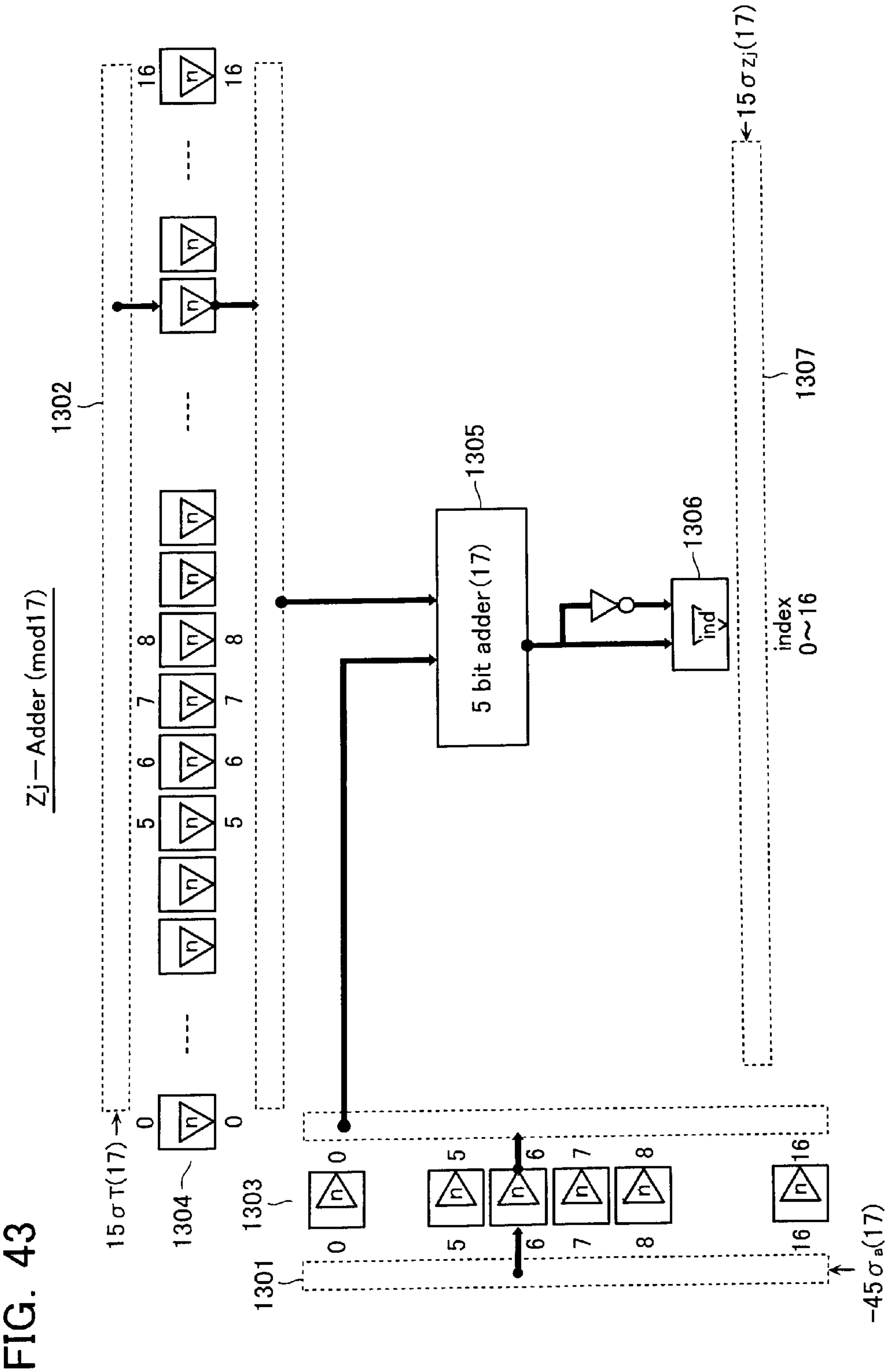
FIG. 43 shows an adder, zj-Adder (mod 17), used for calculating another congruence.

FIG. 43 shows one adder in the adder circuit 33 shown in FIG. 1, i.e., $z_j$-Adder (mod 17), for calculating the expression index of mod 17 of the finite field element $\alpha^{zj}=T/a^3$. This adder is a circuit for calculating the right side of the congruence, $15z_j \equiv 15\sigma_T - 45\sigma_a$(mod 17), shown in the Expression 27.

Input 1301 is $-45\sigma_a(17)$ transformed from the expression index component $15\sigma_a(17)$ of element $a=C^{1/2}$, which is transformed by signal exchanging in accordance with the relationship of $\sigma_a=\sigma_{(C(1/2))}$, and input 1302 is the expression index component $15\sigma_T(17)$ of T. To add these components via 5-bit adder 1305, there are prepared index/binary transforming circuits 1303 and 1304 for transforming these indexes to binary data.

The adding result is passed through binary/index transformation circuit 1306 for transforming the binary data to indexes again, whereby the expression index component $15z_j(17)$ will be obtained at the output node 1307.

Figure 44:
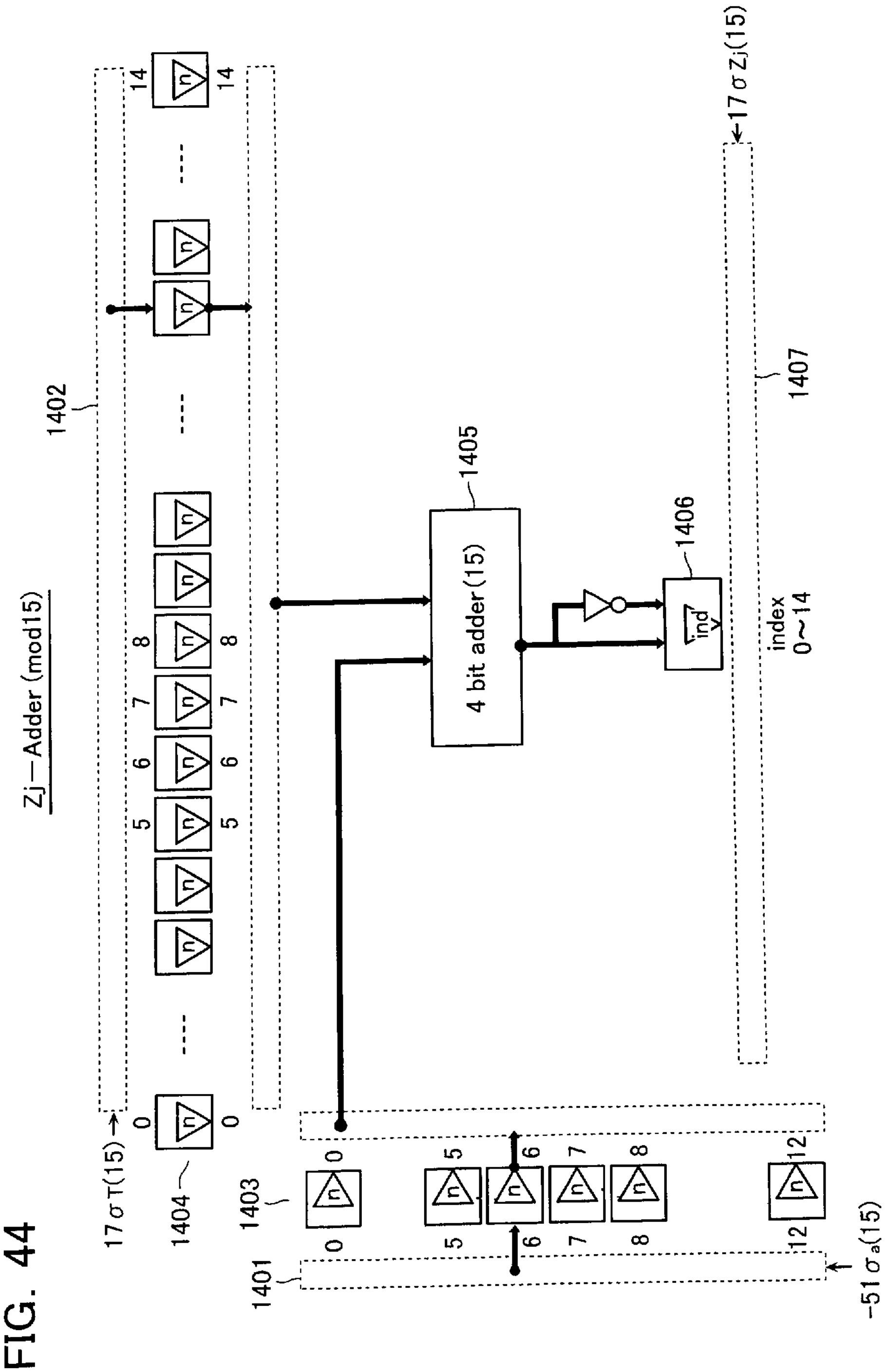
FIG. 44 shows another adder, zj-Adder (mod 15).

FIG. 44 shows another adder in the adder circuit 33 shown in FIG. 1, i.e., $z_j$-Adder (mod 15), for calculating the expression index of mod 15 of the finite field element $z_j=T/a^3$. This adder is a circuit for calculating the right side of the congruence, $17z_j \equiv 17\sigma_T - 51\sigma_a$ (mod 15), shown in the Expression 27.

Input 1401 is $-51\sigma_a(15)$ transformed from the expression index component $17\sigma_a(15)$ of element $a=C^{1/2}$, which is transformed by signal exchanging in accordance with the relationship of $\sigma_a=\sigma_{C(1/2)}$, and input 1402 is the expression index component $17\sigma_T(15)$ of T. To add these components via 4-bit adder 1405, there are prepared index/binary transforming circuits 1403 and 1404 for transforming these indexes to binary data.

The adding result is passed through binary/index transformation circuit 1406 for transforming the binary data to indexes again, whereby the expression index component $17z_j(15)$ will be obtained at the output node 1407.

FIGS. 45A to 45C are tables showing the relationship between indexes "j" and $z_j$ for searching three error positions as indexes "j" of $z=\alpha^j$ from $z^3+Z=\alpha^{zj}$. A column, in which "$z_j$"s are arranged in the order of "j", and another column, in which "j"s are arranged in the order of $z_j$, are shown in parallel in the tables.

The latter column designates that there are cases where three "j"s correspond to one "$z_j$". "$z_j$", to which three "j"s do not correspond, corresponds to a case where there are not just three errors, i.e., there is no solution, and it may be omitted from the solution searching process.

FIGS. 46A to 46C show the relationship between the expression index $\{15z_j(17), 17z_j(15)\}$ of "$z_j$" and the expression index component 15j(17) of "j" in the case where there are three errors. Relations to buses used in the decoder portion are also shown in the tables.

The tables are classified into groups defined by a value of 15j(17). With respect to a calculated expression index of "$z_j$", forming a decoder in accordance with the table, it is possible to obtain an expression index component of "j". Since one "$Z_j$" corresponds to three "j"s, decoder output is divided into three parts. That is, there are disposed three buses, bs1, bs2 and bs3, for outputting three data without conflict.

For example, j=51, 58 and 163 corresponding to $z_j$=17, the output bus is divided into three in such a manner that j=51 is output to bs1; j=58 to bs2; and j=163 to bs3.

Practically used in the decoder is the expression index, and values of the expression index component 15j(17) output to buses bs1, bs2 and bs3 should be corresponded to the respective expression indexes of $z_j$. If there is no relationship between the expression indexes, it is not a case of three errors.

FIGS. 47A to 47C show the relationship between the expression index $\{15z_j(17), 17z_j(15)\}$ of "$z_j$" and the expression index component 17j(15) of "j" in the case where there are three errors. Relations to buses used in the decoder portion are also shown in the tables.

The tables are classified into groups defined by a value of 17j(15). With respect to a calculated expression index of "$z_j$", forming a decoder in accordance with the tables, it is possible to obtain an expression index component of "j". Since one "$Z_j$" corresponds to three "j"s, decoder output is divided into three parts. That is, there are disposed three buses bs1, bs2 and bs3 for outputting three data without conflict.

For example, j=51, 58 and 163 corresponding to $z_j$=17, the output bus is divided into three in such a manner that j=51 is output to bs1; j=58 to bs2; and j=163 to bs3. This is the same as the table of 15j(17).

Practically used in the decoder is the expression index, and values of the expression index component 17j(15) output to buses bs1, bs2 and bs3 should be corresponded to the respective expression indexes of $z_j$. If there is no relationship between the expression indexes, it is not a case of three errors.

Figure 48:
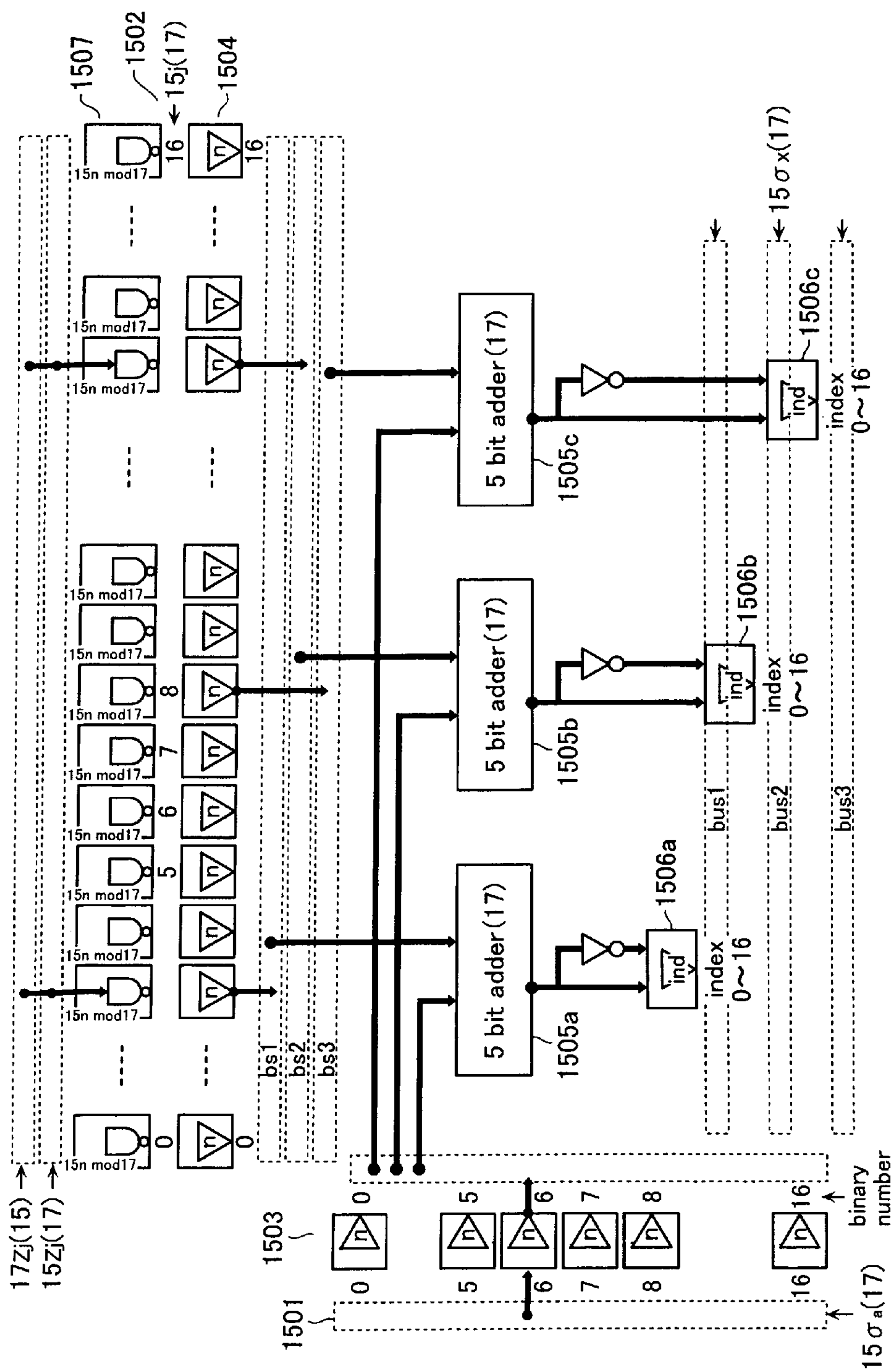
FIG. 48 shows an adder, az-Adder (mod 17), used for calculating another congruence.

FIG. 48 shows one adder in the adder circuit 34 shown in FIG. 1, i.e., az-Adder (mod 17), for calculating the expression index component $15\sigma_X(17)$ of the finite field element az. This adder is a circuit for calculating the right side of the congruence, $15\sigma_X \equiv 15\sigma_a + 15j$ (mod 17), shown in the Expression 28.

Input 1501 is the expression index component $15\sigma_a(17)$ of the element $a=C^{1/2}$, which is transformed by signal exchanging in accordance with the relationship of $\sigma_a=\sigma_{C(1/2)}$. Input 1502 is the expression index component 15j(17), which is obtained by decoder 1507 formed in accordance with tables shown in FIGS. 46 and 47 showing the expression index components $17z_j(15)$ and $15z_j(17)$ of $z_j$.

$15z_j(17)$ of $z_j$.

Input 1501, i.e., $15\sigma_a(17)$, is passed through index/binary converting circuit 1503 to be converted to binary data. Input 1502, i.e., 15j(17), is also passed through index/binary converting circuit 1506*a*, 1506*b* and 1506*c* to be output to buses bs1, bs2 and bs3 as binary data, which are input to three 5-bit adders 1505*a*, 1505*b* and 1505*c* corresponding to three errors.

Outputs of these buses bs1, bs2 and bs3 are added to binary data output from the input 1501 side at the respective adders 1505*a*, 1505*b* and 1505*c*. The addition results are passed through binary/index converting circuits 1506*a*, 1506*b* and 1506*c* to be restored to the expression index component $15\sigma_X(17)$, and output to buses bus1, bus2 and bus3, respectively.

Figure 49:
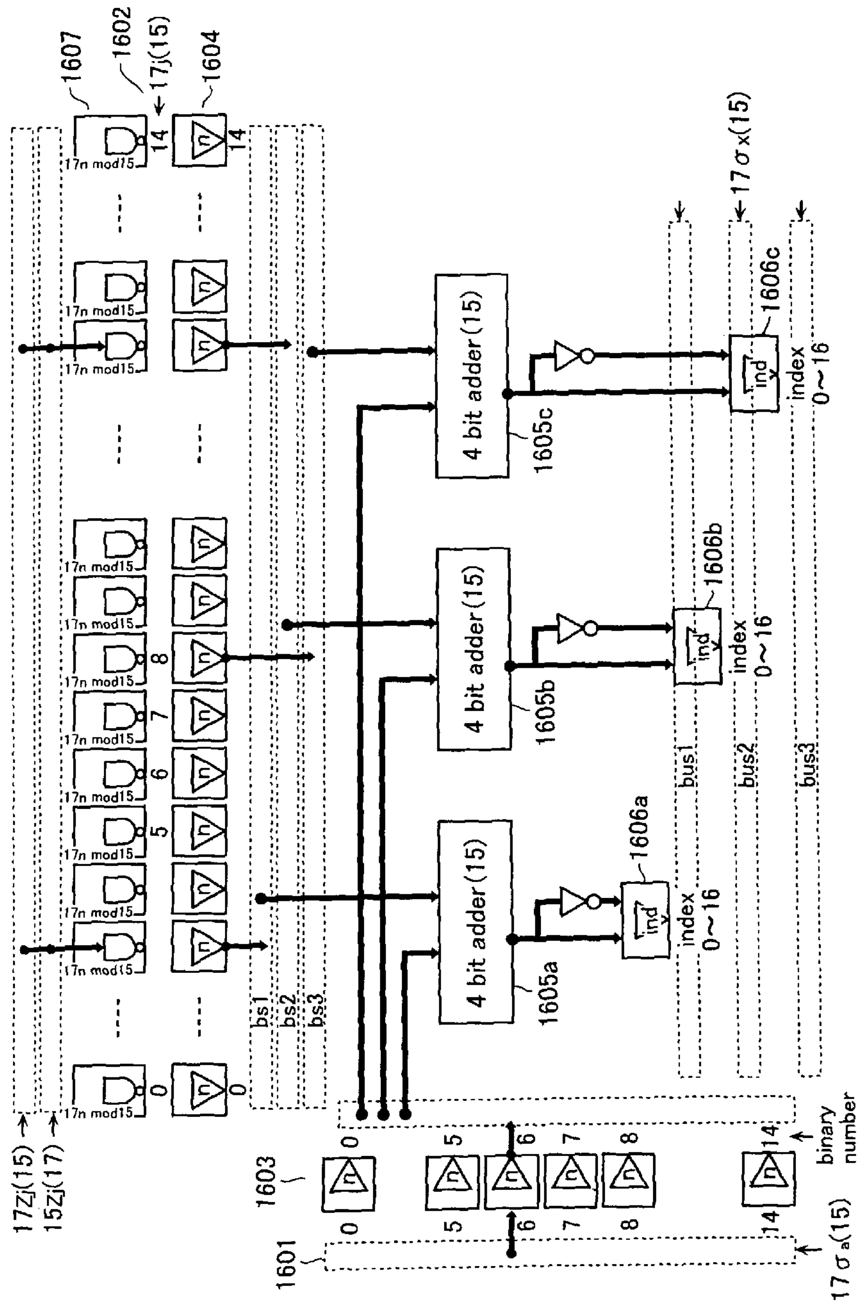
FIG. 49 shows another adder, az-Adder (mod 15).

FIG. 49 shows another adder in the adder circuit 34 shown in FIG. 1, i.e., az-Adder (mod 15), for calculating the expression index component $17\sigma_X(15)$ of the finite field element az.

This adder is a circuit for calculating the right side of the congruence, $17\sigma_X \equiv 17\sigma_a + 17j \pmod{15}$, shown in the Expression 28.

Input 1601 is the expression index component $17\sigma_a(15)$ of the element $a=C^{1/2}$, which is transformed by signal exchanging in accordance with the relationship of $\sigma_a=\sigma_{C(1/2)}$. Input 1602 is the expression index component 17j(15), which is obtained by decoder 1607 formed in accordance with tables shown in FIGS. 46 and 47 showing the expression index components $17z_j(15)$ and $15z_j(17)$ of $z_j$.

Input 1601, i.e., $17\sigma_a(15)$, is passed through index/binary converting circuit 1603 to be converted to binary data. Input 1602, i.e., 17j(15), is also passed through index/binary converting circuit 1606*a*, 1606*b* and 1606*c* to be output to buses bs1, bs2 and bs3 as binary data, which are input to three 4-bit adders 1605*a*, 1605*b* and 1605*c* corresponding to three errors.

Outputs of these buses bs1, bs2 and bs3 are added to binary data output from the input 1601 side at the respective adders 1605*a*, 1605*b* and 1605*c*. The addition results are passed through binary/index converting circuits 1606*a*, 1606*b* and 1606*c* to be restored to the expression index component $17\sigma_X(15)$, and output to buses bus1, bus2 and bus3, respectively.

Figure 50:
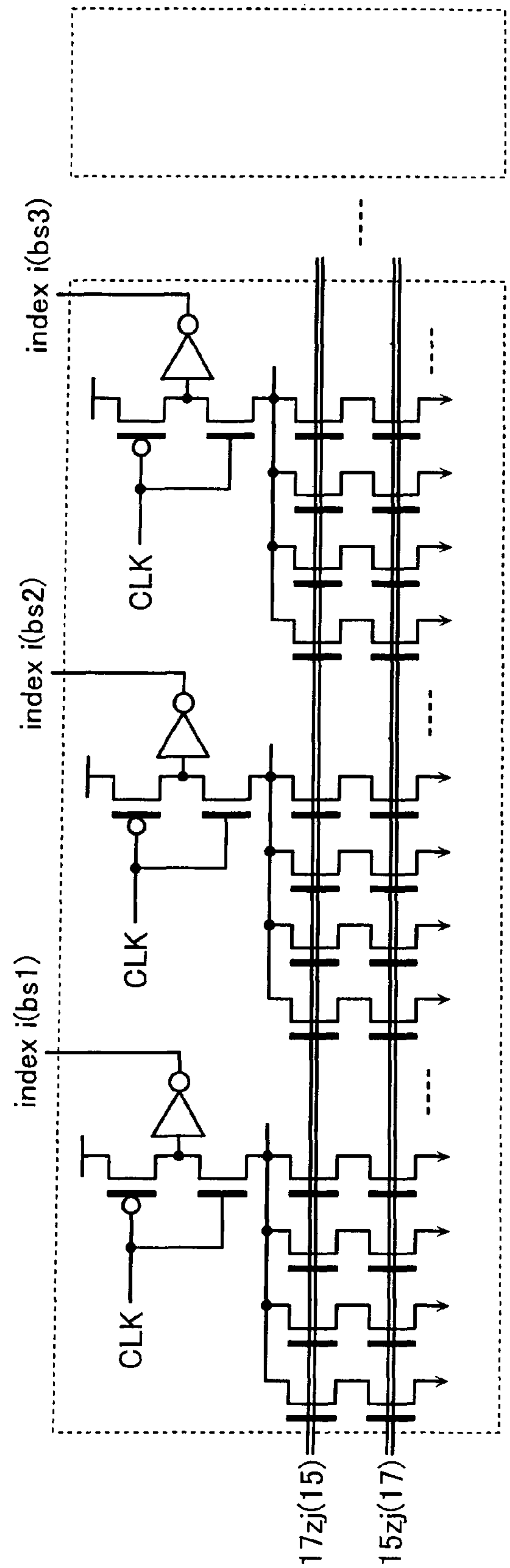
FIG. 50 shows a decoder used in the adders.

FIG. 50 shows an example of the decode circuits 1507, 1607 (i.e., zj(17)DEC, zj(15)DEC). Decoder zj(17)DEC or zj(15)DEC transforms the expression index $z_j$ to that of "j". Since three "j"s correspond to one $z_j$, there are prepared three buses bs1, bs2 and bs3, to which the expression of "j" is output.

These expression indexes are distinguished from each other in accordance with NAND connections, gates of which are applied with the expression index components $15z_j(17)$ and $17z_j(15)$ of $z_j$. These NAND connections are NOR-connected for each group defined by the identical index component of "j" in accordance with the above-described table, and their common nodes are precharged by clock CLK, and discharged and inverted, whereby the expression index components $15_j(17)$ and 17j(15) are output to each of buses bs1, bs2 and bs3.

Figure 51:
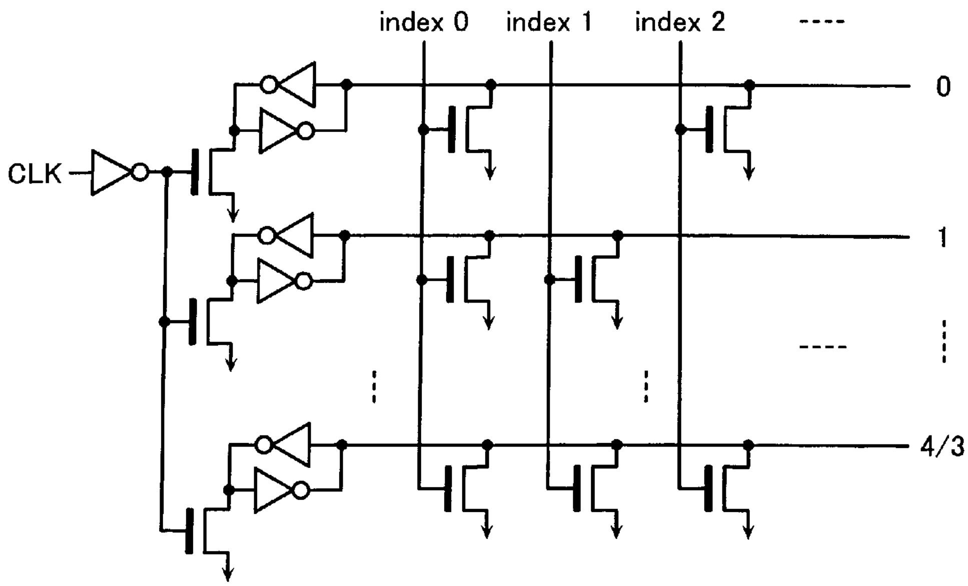
FIG. 51 shows index/binary converting circuit thereof.

FIG. 51 shows an example of index/binary converter circuits 1503, 1504, 1603 and 1604 for converting the index to binary data as being additive in an adder. This is the same as the circuit explained with reference to FIG. 22.

Figure 52:
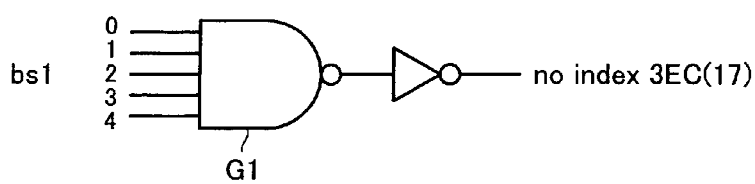
FIG. 52 shows a "no index" signal generating circuit.
Figure 52:
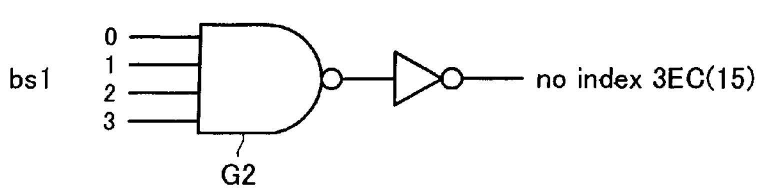

FIG. 52 shows circuits for generating signals "no index 3EC(17)" and "no index 3EC(15), which designate that there is no "j" corresponding to $z_j$, i.e., there is not obtained just three errors. If index is not output, the index/binary converting circuit outputs an all "1" state. The signal generating circuits may be formed to detect the all "1" state with NAND circuits G1 and G2. Since the same signals are output to the buses bs1, bs2 and bs3, it is sufficient to monitor only one bus bs1.

Figure 53:
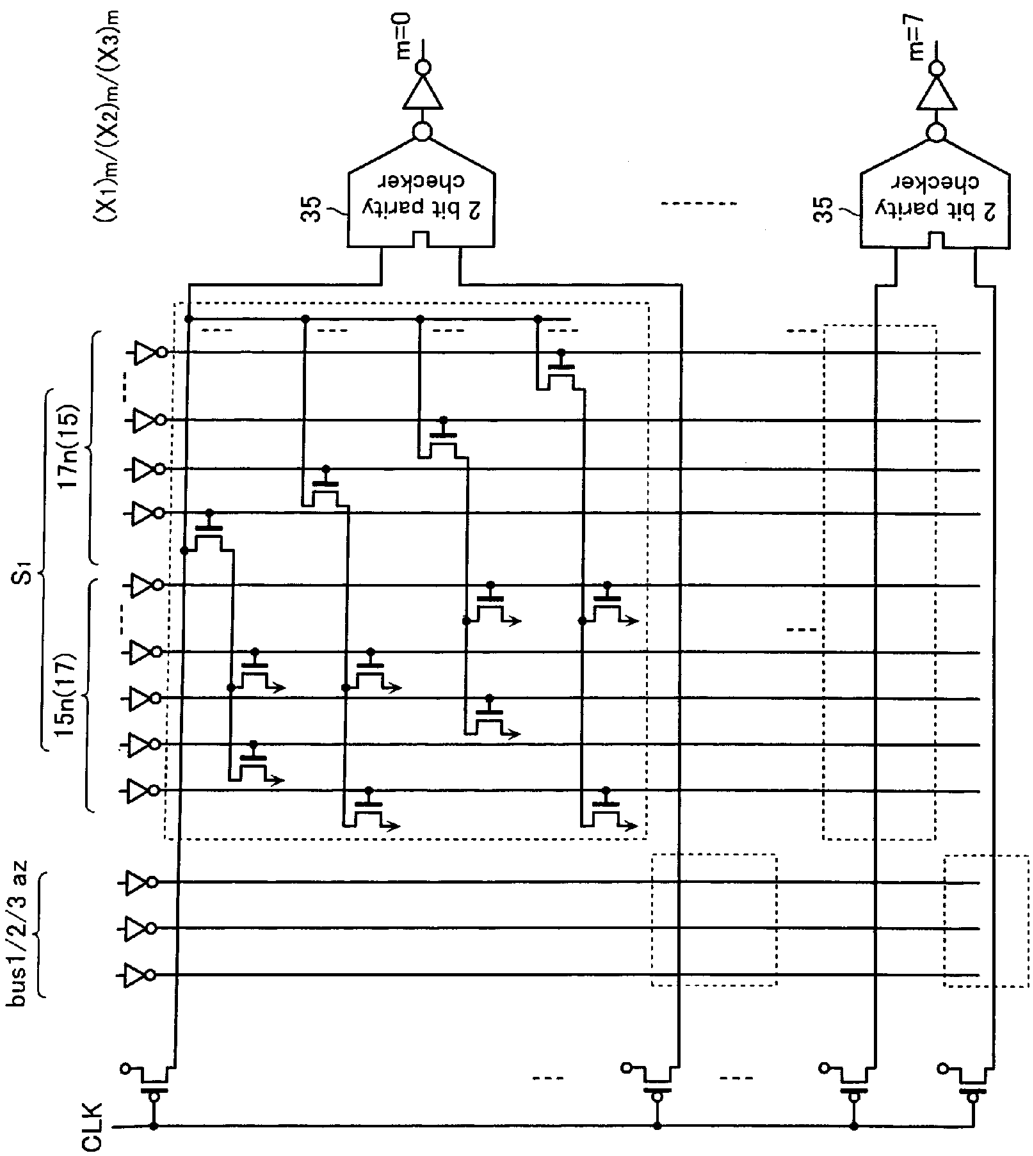
FIG. 53 shows a parity check circuit for calculating $az+S_1$ as the sum of coefficients of the polynomial.

FIG. 53 shows parity checkers 35 and input decode circuits thereof for calculating the actual error bit position as $X=az+S_1$ in accordance with the expression indexes of element az on the three buses bs1, bs2 and bs3. These circuits are prepared for the respective buses bus1, bus2 and bus3, whereby $X_1$, $X_2$ and $X_3$ are obtained for buses bus1, bus2 and bus3, respectively.

The input decode circuits have the same principle as those shown in FIGS. 35 to 37. That is, input signals are the expression indexes of elements az and $S_1$, and there are nodes corresponding to the coefficients of m-degree of the respective elements to be precharged with clock CLK. The input signals' connections to gates of transistors are determined based on the table. Parity checking each two nodes defined by the respective elements for each "m" with 2-bit parity checkers 35, m-degree coefficients of $az+S_1$, $(X_n)_m$, will be obtained.

After searching the m-degree coefficient of the polynomial $X_n$ designating an actual error position, this will be transformed to an expression index. $X_n$ is a 7-degree polynomial, and identical with either one of pn(x), which are elements of GF(256). Therefore the polynomial is transformed to the expression index, which is expressed as a pair of indexes of root α of the polynomial with mode 17 and mod 15, which are obtained by $m_1(x)$. The expression index will be used in the successive calculation.

Figure 54A:
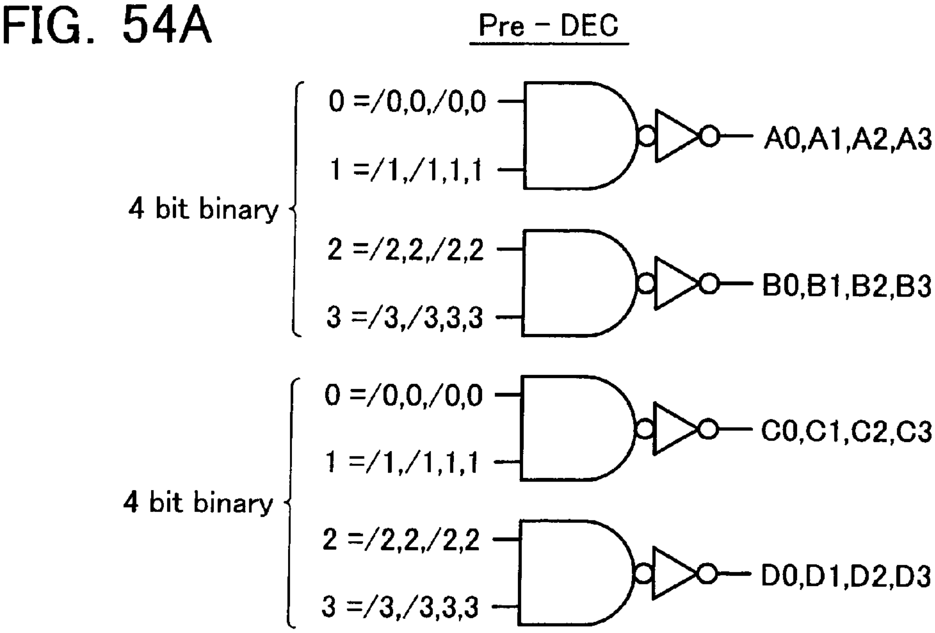
FIGS. 54A and 54B shows the decoder circuit for generating the expression index from the coefficients of the element polynomial.
Figure 54B:
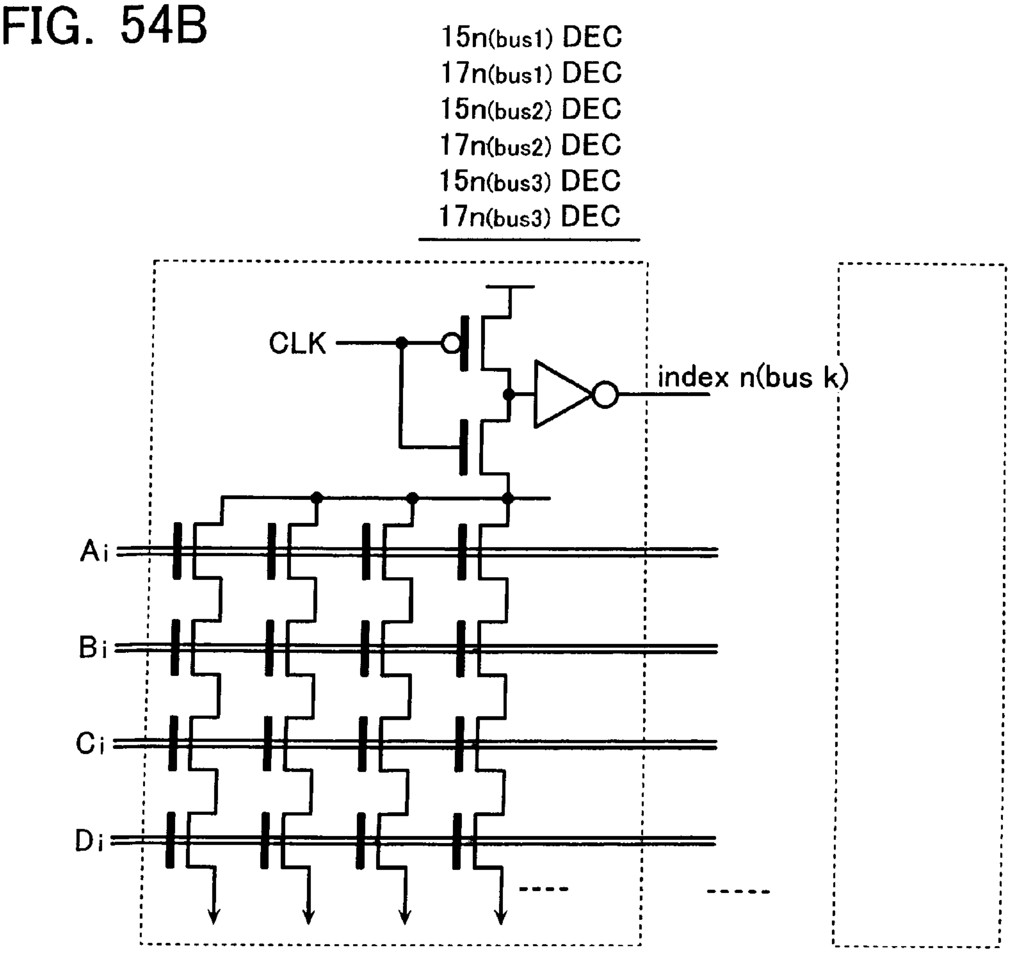

FIGS. 54A and 54B show decode circuit for performing the above-described transformation to the expression index. That is, the decoder circuit is formed of a pre-decoder, Pre-DEC, shown in FIG. 54A and main decoders, 15n(bus1)DEC, 17n (bus1)DEC, 15n(bus2)DEC, 17n(bus2(DEC, 15n(bus3)DEC and 17n(bus3)DEC, shown in FIG. 54B.

The pre-decoder Pre-DEC shown in FIG. 54A is formed of NAND circuits for transforming 256-binary data states of 8-bit coefficients of pn(x) to combinations of signals Ai, Bi, Ci and Di (i=0~3). 8-bit binary signals are divided 2-bit by 2-bit to be expressed as quaternary data Ai, Bi, Ci and Di.

With the pre-decoder, degree numbers m=0 and 1 are transformed to Ai; m=2 and 3 to Bi; m=4 and 5 to Ci; and m=6 and 7 to Di. By use of this pre-decoder, it becomes possible to reduce the number of transistors used in the successive main decoder stage from 8 to 4.

There are six kinds of main index decoder portions (DEC), which are formed of the same circuit configuration except that inputs thereof are different from each other. Therefore, FIG. 54B shows one example of them. Pre-decoded signals are classified into multiple remainder classes, indexes of which are output. That is, there are NAND circuits for decoding Ai, Bi, Ci and Di, and NOR connections for coupling the NAND circuits in parallel. The main decoder has common nodes to be precharged by clock CLK, and in accordance with whether the common node is discharged or not, index signal "n" is output. A signal wiring and the inverted signal wiring constitute a pair, which are selectively coupled to the gates of transistors in each NAND circuit in accordance with the decoded code. Indexes of mod 17 and mod 15 are generated to constitute a pair, which is defined as an expression index "n" for the respective buses bus1, bus2 and bus3.

Figure 55:
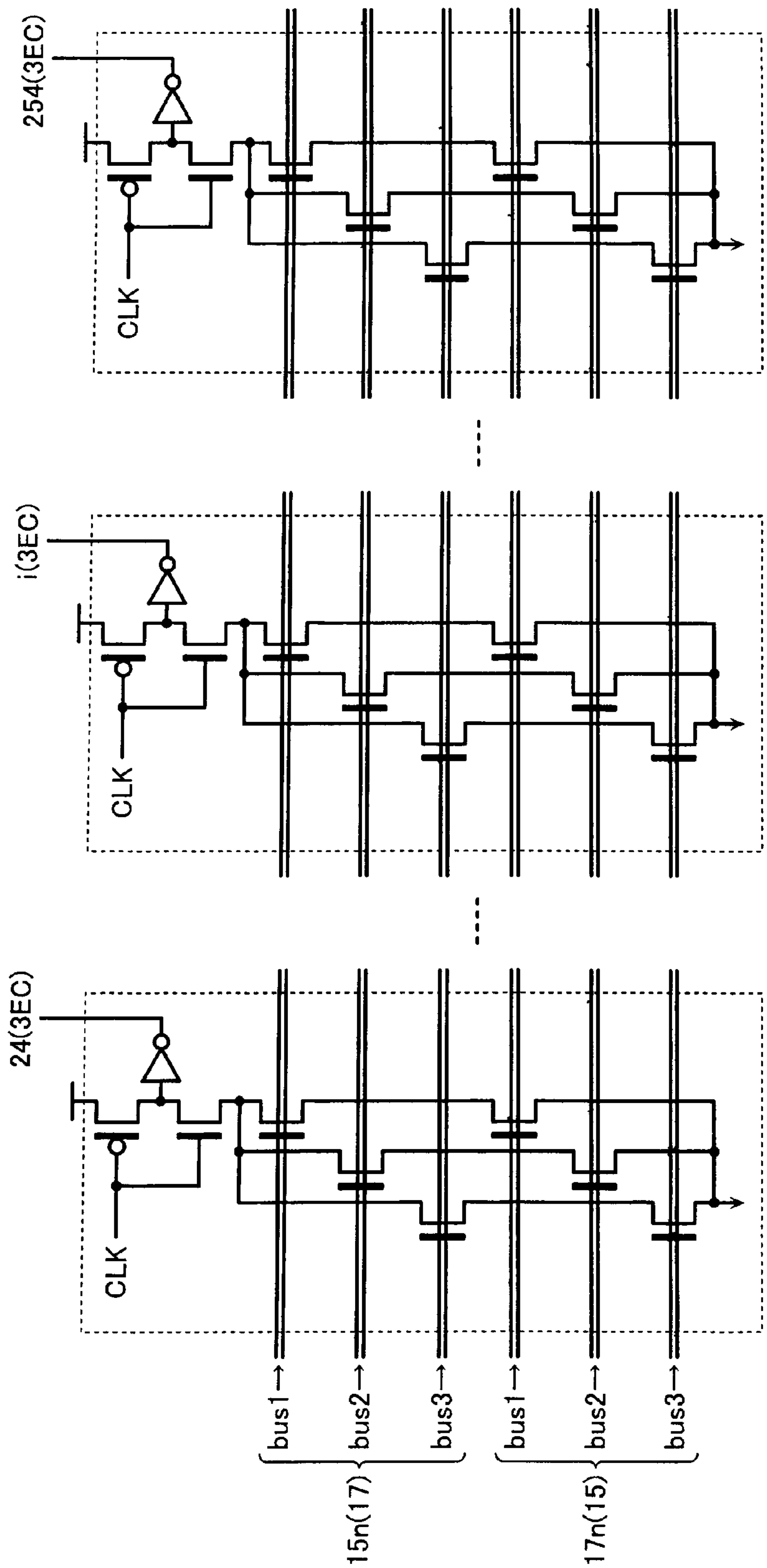
FIG. 55 shows a decoder for generating an error location signal from the error location expression index in 3EC system.

FIG. 55 shows an error location decoder circuit for generating an error signal at an error location based on the expression index of error location "n" output on the respective buses bus1, bus2 and bus3. In this decoder circuit, the expression index components of "n" on the respective buses bus1, bus2 and bus3 are selected by NAND connections.

To generate error location signal n(3EC) (where, n=24~254 are used as information data bits) when an error is generated at an error location "n", the expression indexes of the respective buses bus1, bus2 and bus3 are NOR-connected, and the connection nodes are precharged by clock CLK. The error location signal will be output in accordance with whether the connection nodes are discharged or not.

In case errors are two or less, the error location search is performed with the 2EC system. In this case, the equation of $y^2+y+1=A$ is to be solved. Indexes of $y^2+2+1$ and "y" being "$y_i$" and "i", respectively, the corresponding relationship between "$y_i$" and "i" will be defined.

FIGS. 56A to 56C are tables showing the relationship between "$y_i$" and "i". A column, in which "$y_j$"s are arranged in the order of "i", and another column, in which "1"s are arranged in the order of "$y_j$", are shown in parallel in the tables. The latter designates that two "1"s correspond to one "$y_i$" except the case of $y_i$=0.

Since there is no corresponding "$y_i$" at i=85 and 170 (this corresponds to a case of finite field element zero), the solution will be searched via other systems. It is apparent that the values of "$y_i$" do not extend over all remainders of 255. If there is not a corresponding "$y_i$", it designates that there is no solution of the error location searching equation $\Lambda^R(x)=0$.

FIGS. 57A to 57C are tables showing the relationship between the expression index {$15y_i(17)$, $17y_1(15)$} of "$y_i$" and the expression index component 15i(17) of "i" in the case where there are two or less errors. The relationship between them and decoder buses are also shown in the tables.

The tables are classified into multiple groups defined by the value of 15i(17). With respect to the expression index of "$y_i$" obtained by calculation, forming decoder with the table, the expression index component of "i" will be obtained. Since two "i"s are obtained corresponding to one "$y_i$", decoder output is divided into two parts, and there are two buses bs1 and bs2, to which the two parts are output without conflicting.

For example, i=102 and 221 correspond to $y_i$=17. Therefore, two buses are prepared in such a way that i=102 is generated on bus bs1; and i=221 on bus bs2.

In case of element zero, where the expression index of "$y_i$" is not obtained, i.e., in case of $S_3$=0, i=85 and 170 are output to buses bs1 and bs2, respectively.

Practically used in the decoder is the expression index, and values of the expression index components of "i" output on the buses bs1 and bs2 are corresponded to the expression index of "$y_i$". If there is no corresponding relationship between the expression indexes, it is not a case of one or two errors.

FIGS. 58A to 58C are tables showing the relationship between the expression index {$15y_i(17)$, $17y_i(15)$} of "$y_i$" and the expression index component 15i(17) of "i" in case there are two or less errors (i.e., in case of two errors or one error). The relationship between them and decoder buses are also shown in the tables.

The tables are classified into groups defined by the value of 17i(15). With respect to the expression index of "$y_i$" obtained by calculation, forming decoder with the table, the expression index component of "i" will be obtained. Since two "i"s are obtained corresponding to one "$y_i$", decoder output is divided into two parts, and there are two buses bs1 and bs2, to which the two parts are output without conflicting.

In case of element zero, where the expression index of "$y_i$" is not obtained, i.e., in case of $S_3$=0, i=85 and 170 are output to buses bs1 and bs2, respectively.

Practically used in the decoder is the expression index, and values of the expression index components of "i" output on the buses bs1 and bs2 are corresponded to the expression index of "$y_i$". If there is no corresponding relationship between the expression indexes, it is not a case of one or two errors.

Figure 59:
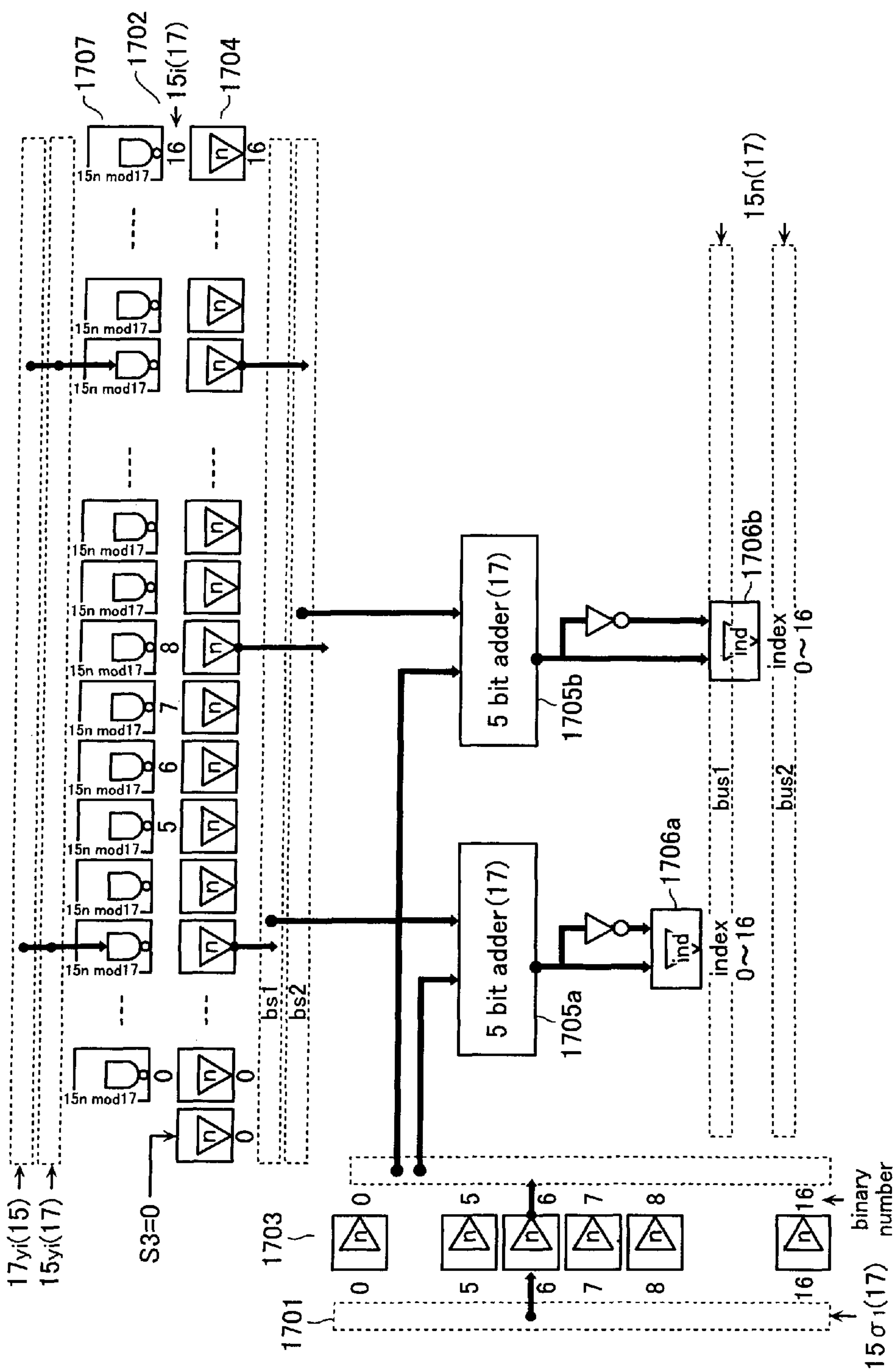
FIG. 59 shows an adder, ay-Adder (mod 17), used for calculating another congruence.

FIG. 59 shows one of adder circuit 30 shown in FIG. 1, ay-Adder (mod 17), which calculates the expression index component 15n(17) of finite field element X=$S_1$y, i.e., calculates the right side of the congruence of $15n \equiv 15\sigma_1 + 15i (\mathrm{mod}\ 17)$ shown in Expression 24.

One input 1701 is the expression index component $15\sigma_1$ (17) of syndrome $S_1$, and the other input 1702 is the expression index component 15i(17), which is obtained from the expression index {$17y_i(15)$, $15y_i(17)$} via the decoder 1707 formed based on the tables shown in FIGS. 57A to 57C, and 58A to 58C.

Input 1701, i.e., $15\sigma_1(17)$, is transformed to binary data via index/binary converting circuit 1703. Input 1702, i.e., 17i (15), is transformed to binary data via index/binary converting circuit 1704 and output to two buses bs1 and bs2 to be input to two 5-bit adders 1705*a* and 1705*b* disposed corresponding to two errors.

These outputs on the buses bs1 and bs2 and the binary data of the input 1701 side are added in the 5-bit adders 1705*a* and 1705*b*, addition outputs of which are obtained as the remainders of mod 17. These addition outputs are restored to the expression index 15n(17) via binary/index converting circuits 1706*a* and 1706*b* and output to buses bus1 and bus1, respectively.

Figure 60:
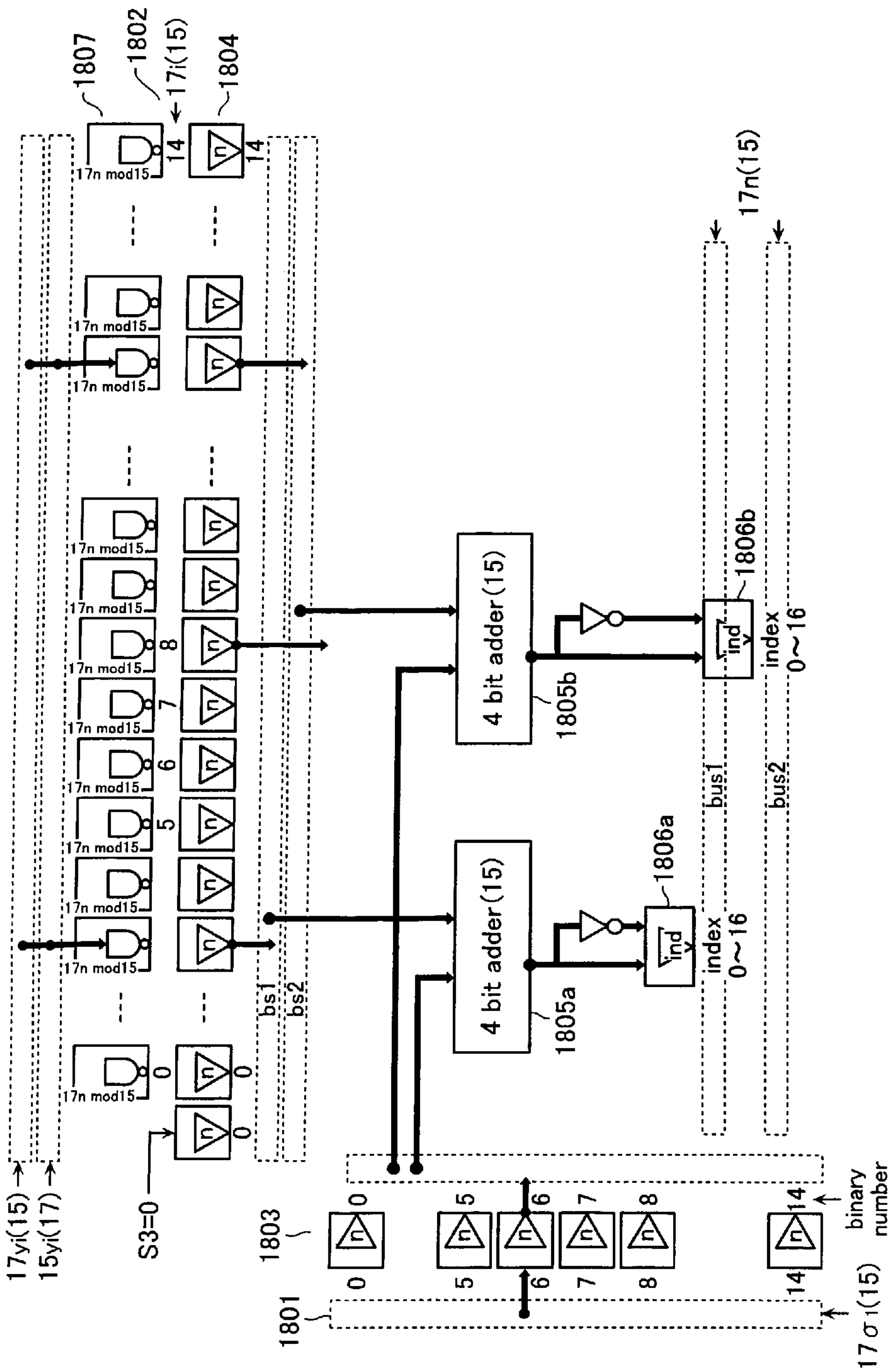
FIG. 60 shows another adder, ay-Adder (mod 15).

FIG. 60 shows another circuit portion of adder circuit 30 shown in FIG. 1, ay-Adder (mod 15), which calculates the expression index component 17n(15) of finite field element X=$S_1$y, i.e., calculates the right side of the congruence of $17n \equiv 17\sigma_1 + 17i (\mathrm{mod}\ 15)$ shown in Expression 24.

One input 1801 is the expression index component $17\sigma_1$ (15) of syndrome $S_1$, and the other input 1802 is the expression index component 17i(15), which is obtained from the expression index {$17y_i(15)$, $15y_i(17)$} via the decoder 1807 formed based on the tables shown in FIGS. 57 and 58.

Input 1801, i.e., $17\sigma_1(15)$, is transformed to binary data via index/binary converting circuit 1803. Input 1802, i.e., 15i (17), is transformed to binary data via index/binary converting circuit 1804 and output to two buses bs1 and bs2 to be input to two 5-bit adders 1805*a* and 1805*b* disposed corresponding to two errors.

These outputs on the buses bs1 and bs2 and the binary data of the input 1801 side are added in the 4-bit adders 1805*a* and 1805*b*, addition outputs of which are obtained as the remainders of mod 15. These addition outputs are restored to the expression index 17n(15) via binary/index converting circuits 1806*a* and 1806*b* and output to buses bus1 and bus1, respectively.

Figure 61:
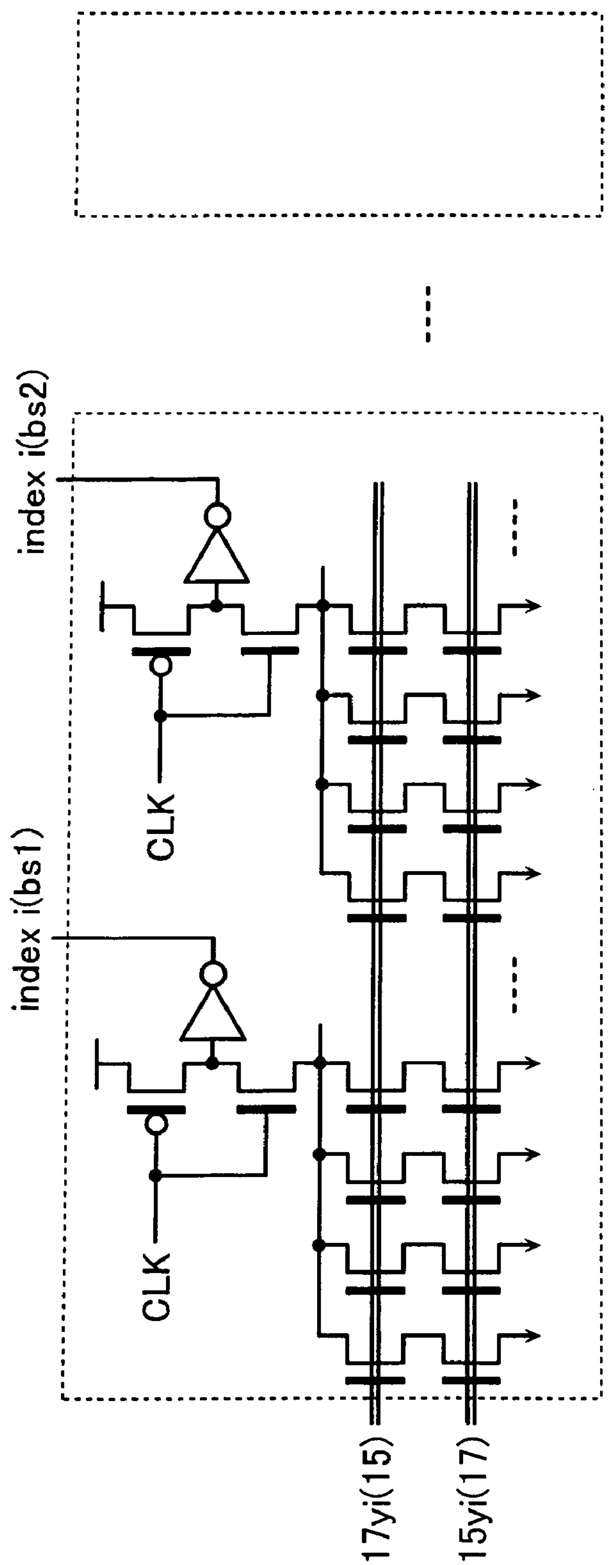
FIG. 61 the decode circuit used in the adders.

FIG. 61 shows an example of the decode circuits 1707, 1807. These decoders yi(17)DEC or yi(15)DEC transform the expression index $y_i$ to that of "i". Since two "i"s correspond to one $y_i$, there are prepared two buses bs1 and bs2, to which the expression of "i" is output.

These expression indexes are distinguished from each other in accordance with NAND connections, gates of which are applied with the expression index components $15y_i(17)$ and $17y_i(15)$ of $y_i$. These NAND connections are NOR-connected for each group defined by the identical index component of "i" in accordance with the above-described table, and their common nodes are precharged by clock CLK, and discharged and inverted, whereby the expression index components 15i(17) and 17i(15) are output to each of buses bs1 and bs2.

Figure 62:
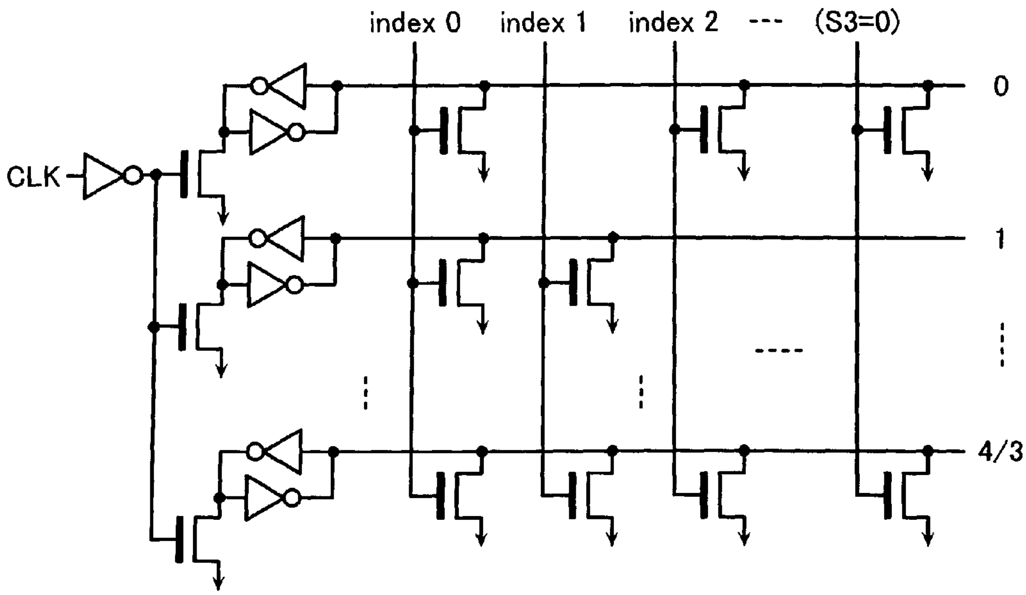
FIG. 62 shows the index/binary converting circuit for converting index to binary data.

FIG. 62 shows an example of index/binary converter circuits 1703, 1704, 1803 and 1804 for converting the index to binary data as being additive in an adder. This is the same as the circuit explained with reference to FIG. 22.

Figure 63:
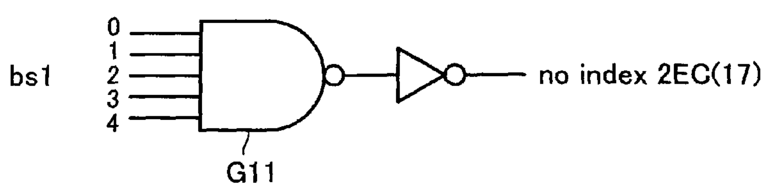
FIG. 63 shows the "no index" signal generating circuit.
Figure 63:
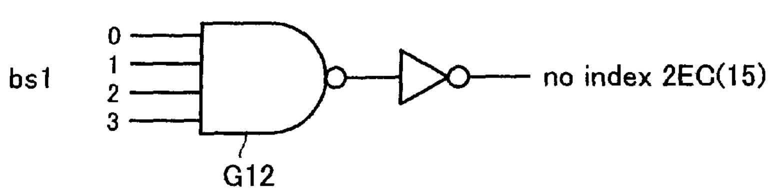

FIG. 63 shows circuits for generating signals "no index 2EC(17)" and "no index 2EC(15), which designate that there is no "i" corresponding to $y_j$, i.e., there is not obtained just two errors. If index is not output, the index/binary converting circuit outputs an all "1" state. The signal generating circuits may be formed to detect the all "1" state with NAND circuits G1 and G2. Since the same signals are output to the buses bs1, bs2 and bs3, it is sufficient to monitor only one bus bs1.

Figure 64:
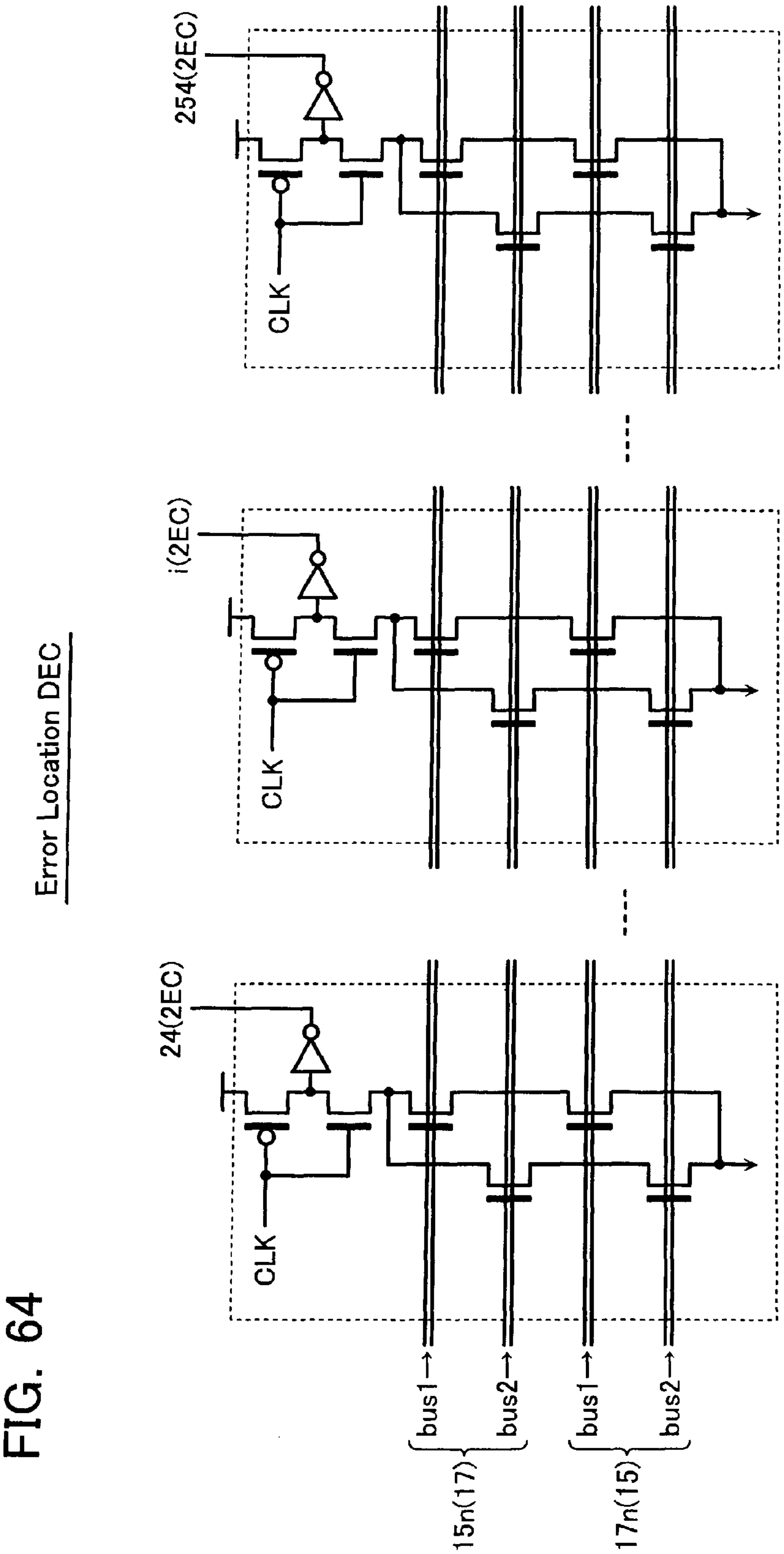
FIG. 64 shows the decoder circuit for generating error location signal from the expression index of the error location in 2EC system.

FIG. 64 shows an error location decoder circuit for generating an error signal at an error location based on the expression index of error location "n" output on the respective buses bus1 and bus2. In this decoder circuit, the expression index components of "n" on the respective buses bus1, bus2 are selected by NAND connections.

To generate error location signal n(2EC) (where, n=24~254 are used as information data bits) when an error is generated at an error location "n", the expression indexes of the respective buses bus1, bus2 are NOR-connected, and the connection nodes are precharged by clock CLK. The error location signal will be output in accordance with whether the connection nodes are discharged or not.

Figure 65:
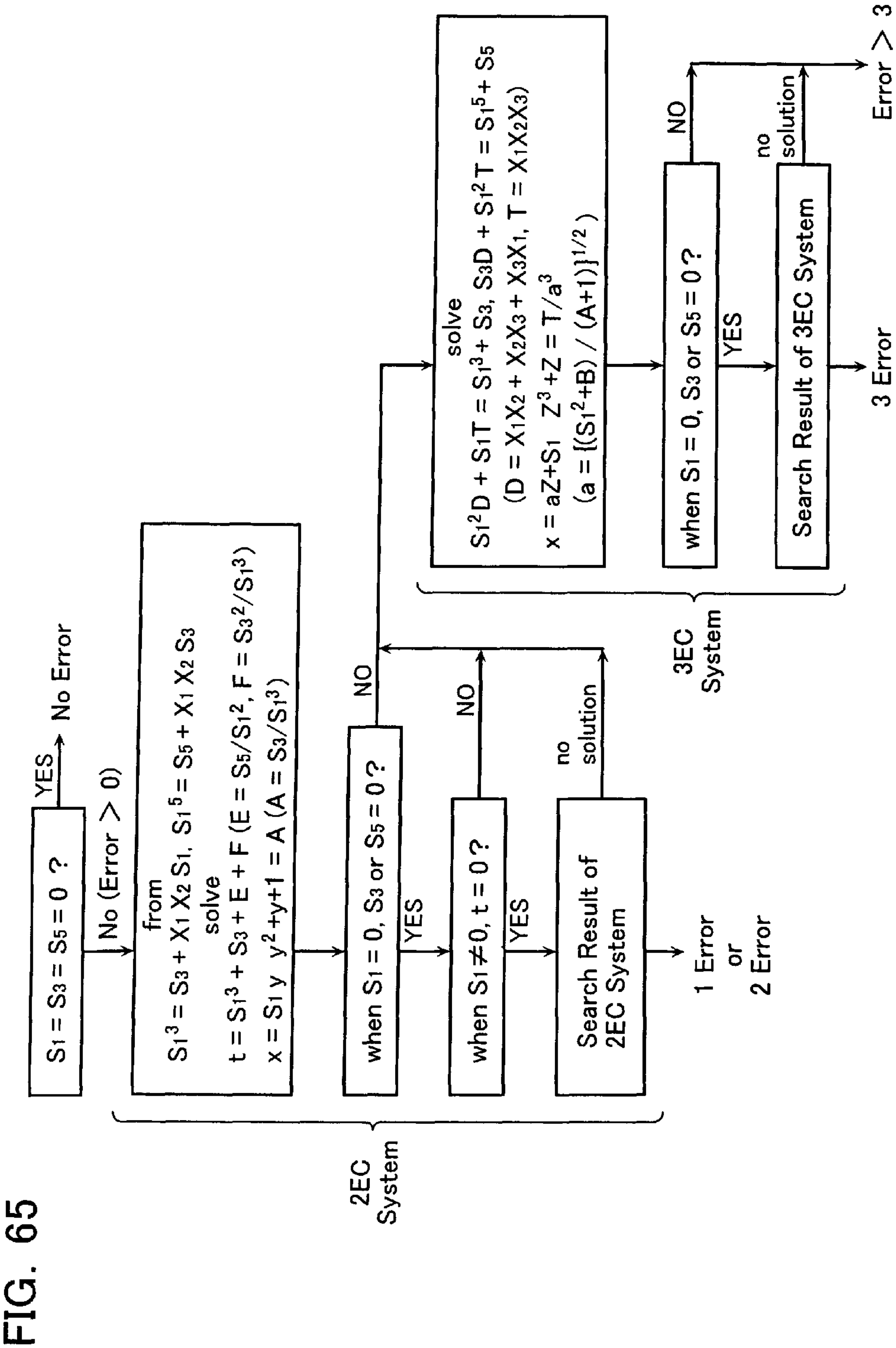
FIG. 65 shows the hierarchic error searching procedure in this embodiment.

FIG. 65 shows how the procedure proceeds up to 3-bit error searching and correcting in this embodiment with 2EC system and 3EC system. Basically, no error is firstly detected, and in case there are some errors, the procedure will proceeds in the direction that the number of errors to be searched is increased.

Explaining in detail, with respect to syndromes $S_1$, $S_3$ and $S_5$ obtained as a result of the syndrome operation, if $S_1=S_3=S_5$, "no error" is output for designating no error. If any one of them is not zero, it designates error-existence.

In case of one error or two errors, 2EC system is adaptable to the situation. In case of two errors, there is such a relationship of $S_1^3=S_3+X_1X_2S_1$ and $S_1^5=S_5+X_1X_2S_3$ between syndromes ($S_1$, $S_3$ and $S_5$) and solutions ($X_1$ and $X_2$). In this case, $t=S_1^3+S_3+E+F$ ($E=S_5/S_1^2$, $F=S_3^2/S_1^3$) is set, and perform such a variable transformation of $x=S_1y$, and solve $y^2+y+1=A$ (where $A=S_3/S_1^3$).

If $S_1=0$ while there is a 1-bit error or 2-bit errors, then $S_3=S_5=0$. Therefore, if $S_1=0$ and $S_3$ or $S_5$ is not zero, the equation may not be solved with 2EC system. If $S_1\neq 0$, then t=0, i.e., there is a solution of 2EC system.

Although 2EC system can also solve a 1-bit error case, the condition is $S_1^3=S_3$, $S_1^5=S_5$, and A=1, t=0, so that the situation corresponds to a special case of 2EC system.

If there are 3-bit errors or more, go to 3EC system. In case of t≠0 or no solution is obtained with 2EC system, there is such a relationship as: $S_1^2D+S_1T=S_1^3+S_3$ and $S_3D+S_1^2T=S_1^5+S_5$ ($D=X_1X_2+X_2X_3+X_3X_1$, $T=X_1X_2X_3$) between syndromes ($S_1$, $S_3$ and $S_5$) and solutions ($X_1$, $X_2$ and $X_3$). Therefore, perform such a variable transformation of $x=az+S_1$, and solve $z^3+z=T/a^3$(where, $a=\{(S_1^2+B)/(A+1)\}^{1/2}$.

If $S_1=0$, then $S_3=S_5=0$. In case of S3#O or $S_5\neq 0$, since there are four or more errors, it is impossible to solve the equation with 3EC system. In case of $S_1\neq 0$, search the solution with 3EC system. If there is not searched a solution in this case, it designates that there are 4-bit or more errors.

Figure 66:
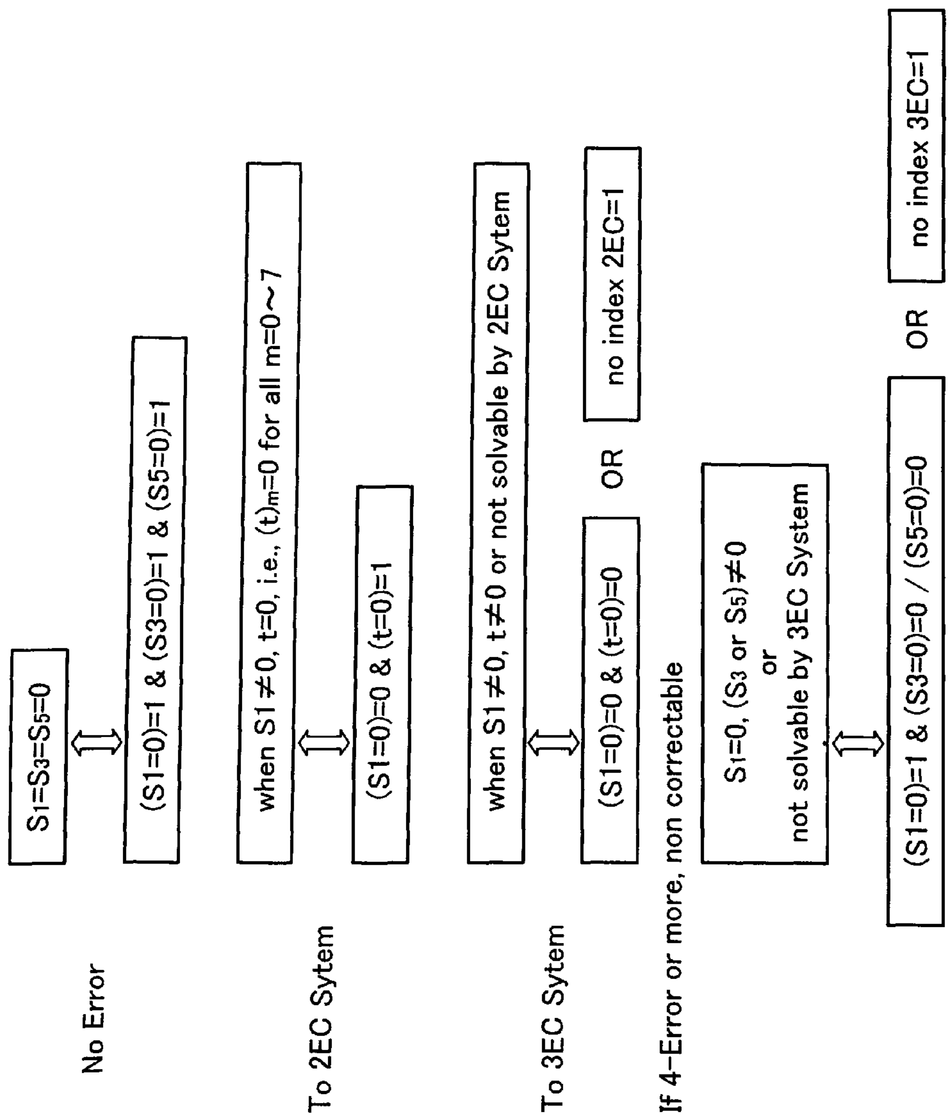
FIG. 66 shows the branching judgment circuit.

FIG. 66 shows summarized branching judgment conditions used in the hierarchic error searching procedure explained with reference to FIG. 65. If there is no error, all syndromes $S_1$, $S_3$ and $S_5$ are "0", i.e., all syndrome coefficients $(S_1)_m$ (m=0~7), $(s_3)_m$ (m=0~7) and $(s_5)_m$ (m=0~7) are zero, so that no error will be judged. This judgment condition is represented as: (s1=0)=1&(s3=0)=1&(s5=0)=1 in FIG. 66.

The branching condition for 2EC system is as follows: when $S_1\neq 0$, then t=0, i.e., $(t)_m=0$ for all degrees "m". This condition may be represented as: (s1=0)=0&(t=0)=1 with the same expression method as described above.

The branching condition for 3EC system is as follows: when $S_1\neq 0$, then t≠0, or there is no solution of 2EC system. This condition may be represented as: (s1=0)=0&(t=0)=0, or no index 2EC=1.

In case of: $S_1=0$ and S3 or $S_5\neq 0$, or there is no solution in 3EC system, there are 4-bit or more errors, and it is judged as non-correctable. The judging condition is as follows: (s1=0)=1&(s3=0)=0/(s5=0)=0, or no index 3EC=1.

In 2EC system and 3EC system, error location searching will be performed in accordance with the respective error numbers.

Figure 67:
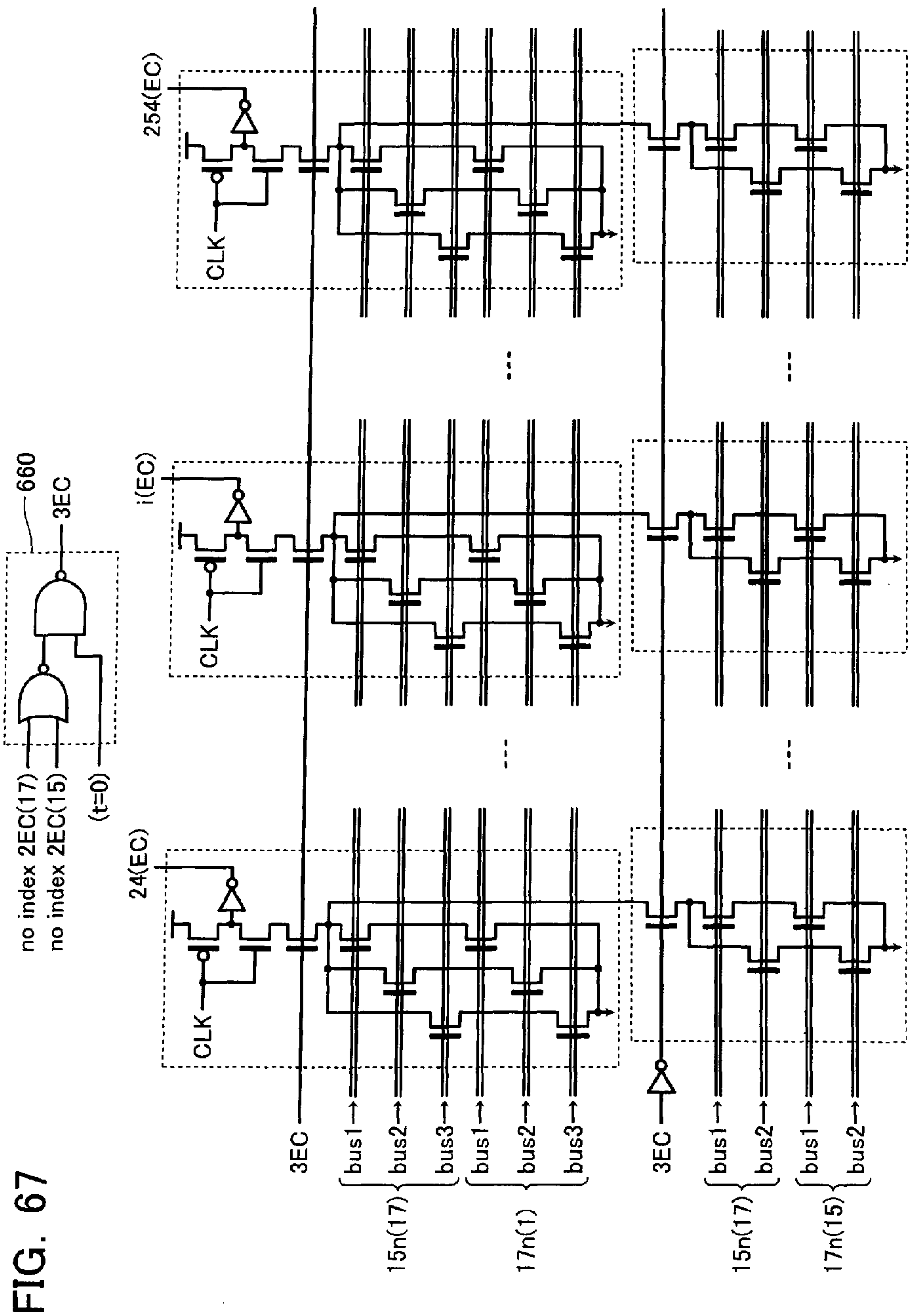
FIG. 67 shows the error location signal generating circuit, in which 2EC system and 2EC system are united.

FIG. 67 shows an error location decoder circuit for generating the error location signal based on the expression indexes of error location "n" obtained at the respective buses, which united the error location DEC of 3EC system shown in FIG. 55 and that of 2EC system shown in FIG. 64.

With a logic circuit 660 for judging the branching condition between 2EC system and 3EC system, judgment signal 3EC="1" is generated in the case of 3EC system. In accordance with this judgment signal 2EC, the discharging path of 3EC system (decoder circuit shown in FIG. 55) and that of 2EC system (decoder circuit shown in FIG. 64) are selectively activated.

To generate error location signal n(EC) obtained at the bit position "n" (n=24~254 are used as information data bits), selected decoders are NOR-connected, and common nodes precharged by CLK are discharged at the error location and inverted in logic, so that the error location signal is output.

Figure 68:
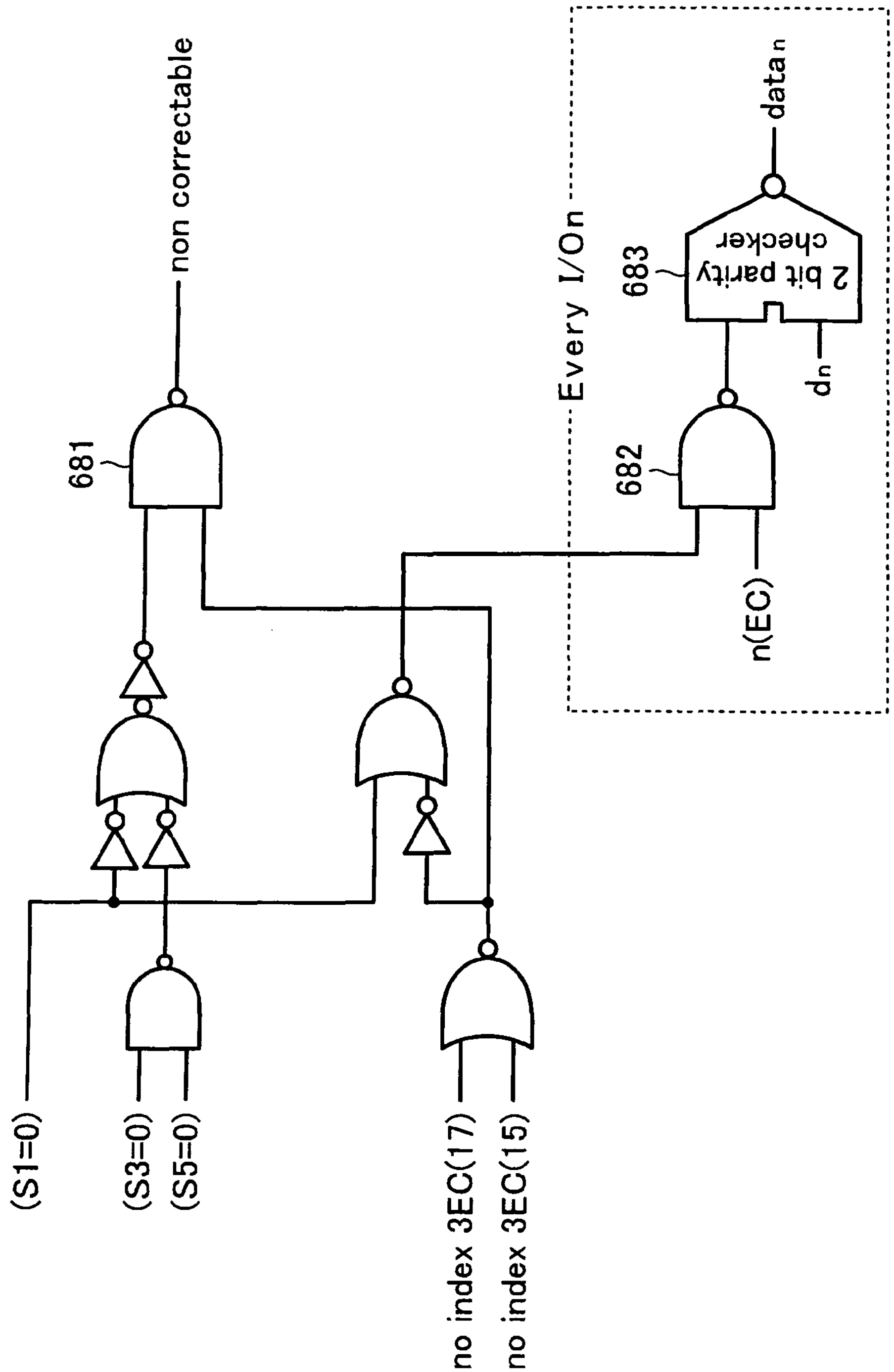
FIG. 68 shows data error correction circuit for each bit.

FIG. 68 shows a data correction circuit for correcting data at the error bit position. In accordance with the above-described branch judgment condition, in case there are 4-bit or more errors (i.e., (s1=0)=1&(s3=0)=0/(s5=0)=0) or in case of no-index 3EC=1, "non-correctable"=1 is output via NAND gate 681 for designating that it is not correctable. At this time, read out data "$d_n$" from the memory is output as it is.

In case of no error, the signal from the data correcting portion is shut off, and data "$d_n$" is output as it is. In case of one error, or two or three errors, the error location signal n(EC) becomes "1" at the corresponding I/O portion, and data "$d_n$" is inverted by 2-bit parity checker 683 to be output as data "$data_n$". Since 2-bit parity checker 683 is equivalent to an XNOR circuit, it operates as an inverter when NAND gate 682 outputs "1".

As described above, according to this embodiment, it becomes possible to perform error correction up to 3-bit errors in an operating time of several tens of [ns], so that it is able to improve the reliability of flash memory and the like without reducing the performance.

(Application Devices)

As an embodiment, an electric card using the non-volatile semiconductor memory devices according to the above-described embodiment of the present invention and an electric device using the card will be described bellow.

Figure 69:
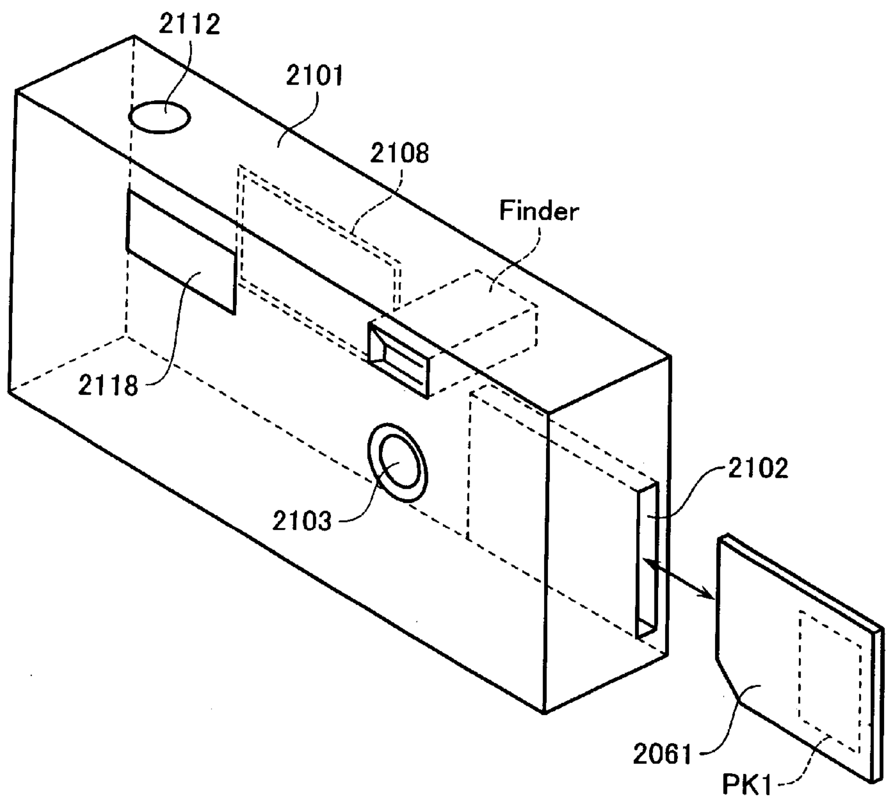
FIG. 69 shows another embodiment applied to a digital still camera.

FIG. 69 shows an electric card according to this embodiment and an arrangement of an electric device using this card. This electric device is a digital still camera 2101 as an example of portable electric devices. The electric card is a memory card 2061 used as a recording medium of the digital still camera 2101. The memory card 61 incorporates an IC package PK1 in which the non-volatile semiconductor memory device or the memory system according to the above-described embodiments is integrated or encapsulated.

The case of the digital still camera 2101 accommodates a card slot 2102 and a circuit board (not shown) connected to this card slot 2102. The memory card 2061 is detachably inserted in the card slot 2102 of the digital still camera 2101. When inserted in the slot 2102, the memory card 2061 is electrically connected to electric circuits of the circuit board.

If this electric card is a non-contact type IC card, it is electrically connected to the electric circuits on the circuit board by radio signals when inserted in or approached to the card slot 2102.

Figure 70:
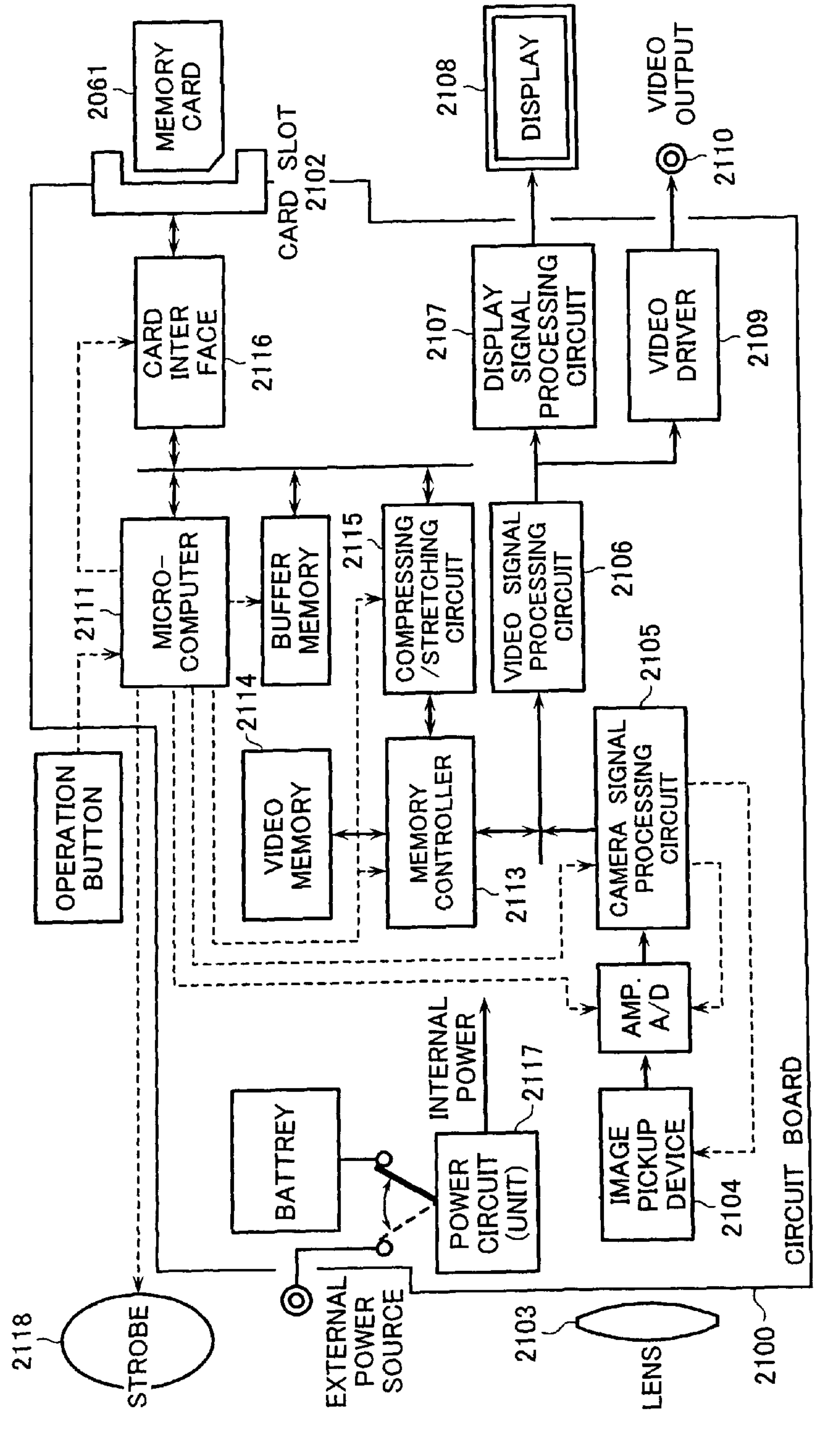
FIG. 70 shows the internal configuration of the digital still camera.
Figure 71A:
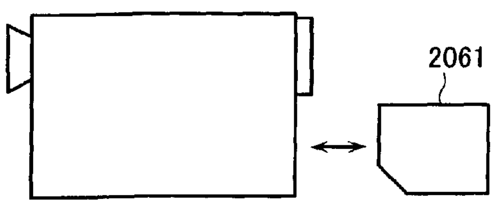
FIGS. 71A to 71J show other electric devices to which the embodiment is applied.
Figure 71B:
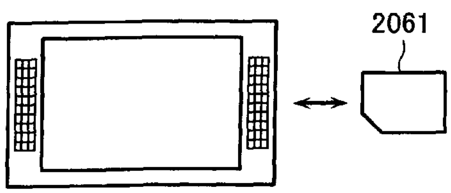
Figure 71C:
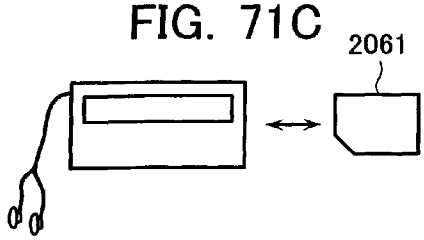
Figure 71D:
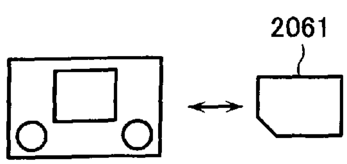
Figure 71E:
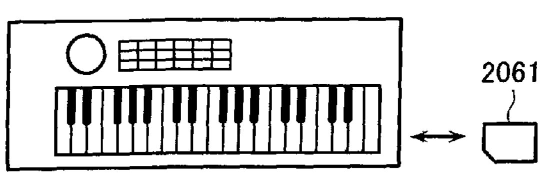
Figure 71F:
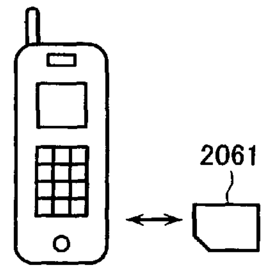
Figure 71G:
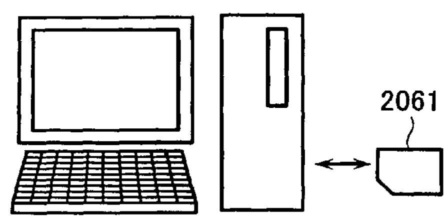
Figure 71H:
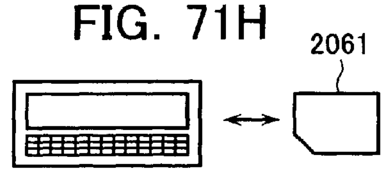
Figure 71I:
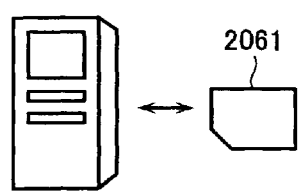
Figure 71J:
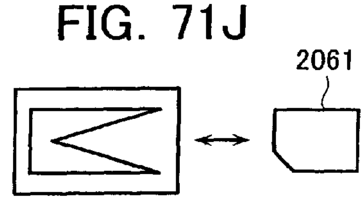

FIG. 70 shows a basic arrangement of the digital still camera. Light from an object is converged by a lens 2103 and input to an image pickup device 2104. The image pickup device 2104 is, for example, a CMOS sensor and photoelectrically converts the input light to output, for example, an analog signal. This analog signal is amplified by an analog amplifier (AMP), and converted into a digital signal by an A/D converter (A/D). The converted signal is input to a camera signal processing circuit 2105 where the signal is subjected to automatic exposure control (AE), automatic white balance control (AWB), color separation, and the like, and converted into a luminance signal and color difference signals.

To monitor the image, the output signal from the camera processing circuit 2105 is input to a video signal processing circuit 2106 and converted into a video signal. The system of the video signal is, e.g., NTSC (National Television System Committee). The video signal is input to a display 2108 attached to the digital still camera 2101 via a display signal processing circuit 2107. The display 2108 is, e.g., a liquid crystal monitor.

The video signal is supplied to a video output terminal 2110 via a video driver 2109. An image picked up by the digital still camera 2101 can be output to an image apparatus such as a television set via the video output terminal 2110. This allows the pickup image to be displayed on an image apparatus other than the display 2108. A microcomputer 2111 controls the image pickup device 2104, analog amplifier (AMP), A/D converter (A/D), and camera signal processing circuit 2105.

To capture an image, an operator presses an operation button such as a shutter button 2112. In response to this, the microcomputer 2111 controls a memory controller 2113 to write the output signal from the camera signal processing circuit 2105 into a video memory 2114 as a flame image. The flame image written in the video memory 2114 is compressed on the basis of a predetermined compression format by a compressing/stretching circuit 2115. The compressed image is recorded, via a card interface 2116, on the memory card 2061 inserted in the card slot.

To reproduce a recorded image, an image recorded on the memory card 2061 is read out via the card interface 2116, stretched by the compressing/stretching circuit 2115, and written into the video memory 2114. The written image is input to the video signal processing circuit 2106 and displayed on the display 2108 or another image apparatus in the same manner as when image is monitored.

In this arrangement, mounted on the circuit board 2100 are the card slot 2102, image pickup device 2104, analog amplifier (AMP), A/D converter (A/D), camera signal processing circuit 2105, video signal processing circuit 2106, display signal processing circuit 2107, video driver 2109, microcomputer 2111, memory controller 2113, video memory 2114, compressing/stretching circuit 2115, and card interface 2116.

The card slot 2102 need not be mounted on the circuit board 2100, and can also be connected to the circuit board 2100 by a connector cable or the like.

A power circuit 2117 is also mounted on the circuit board 2100. The power circuit 2117 receives power from an external power source or battery and generates an internal power source voltage used inside the digital still camera 2101. For example, a DC-DC converter can be used as the power circuit 2117. The internal power source voltage is supplied to the respective circuits described above, and to a strobe 2118 and the display 2108.

As described above, the electric card according to this embodiment can be used in portable electric devices such as the digital still camera explained above. However, the electric card can also be used in various apparatus such as shown in FIGS. 71A to 71J, as well as in portable electric devices. That is, the electric card can also be used in a video camera shown in FIG. 71A, a television set shown in FIG. 71B, an audio apparatus shown in FIG. 71C, a game apparatus shown in FIG. 71D, an electric musical instrument shown in FIG. 71E, a cell phone shown in FIG. 71F, a personal computer shown in FIG. 71G, a personal digital assistant (PDA) shown in FIG. 71H, a voice recorder shown in FIG. 71I, and a PC card shown in FIG. 71J.

This invention is not limited to the above-described embodiment. It will be understood by those skilled in the art that various changes in form and detail may be made without departing from the spirit, scope, and teaching of the invention.

What is claimed is:

1. A semiconductor memory device comprising an error detecting and correcting system for detecting and correcting an error bit of read out data with a BCH code, wherein the error detecting and correcting system includes:

a 3EC system and a 2EC system configured to be able to detect and correct 3-bit errors and up to 2-bit errors, respectively, either solution results of the 3EC system or 2EC system being selected in accordance with an error situation; and a warning signal generating circuit configured to generate a warning signal designating that there are 4-bit or more errors in case syndromes are not in an all "0" state, and in case no error location is searched with whichever of the 3EC system and 2EC system, the 2EC system is configured to perform variable transformation on a 2-degree error searching equation using one parameter to divide it into a first part containing only an unknown number and a second part calculative with syndromes, and compares previously nominated solution indexes collected in a table and syndrome indexes with syndrome indexes to determine error position, and wherein, in the calculation of congruences defined by the nominated indexes and syndrome indexes in both of the 3EC system and 2EC system, each congruence with mod $2^n-1$ is divided into two congruences with modulo of two factors of $2^n-1$, respectively, the two factors being prime to each other, and the two congruences are calculated in parallel.

2. The semiconductor memory device in accordance with claim 1, wherein the 3EC system is configured to perform variable transformation on a 3-degree error searching equation using two or more parameters to divide it into a first part containing only unknown numbers and a second part calculative with syndromes, and compares previously nominated solution indexes collected in a table and syndrome indexes with syndromes indexes to determine error position.

3. The semiconductor memory device according to claim 2, wherein the 3-degree error searching equation is represented as:

$$\Lambda^R(x)=(x-X_1)(x-X_2)(x-X_3)=x^3+S_1x^2+Dx+T=0$$

(where, $S_1$ is a syndrome obtained by dividing a read data polynomial by a basic irreducible polynomial; $D=X_1X_2+X_2X_3+X_3X_1$; and $T=X_1X_2X_3$), and the 3-degree error searching equation is transformed via variable transformation of: $x=az+b$ to $z^3+z=T/a^3$ and serves for index calculating (where $a=C^{1/2}$, $C=(S_1{}^2+B)/(A+1)$, $b=S_1$, $A=S_3/S_1{}^3$, $B=S_5/S_1{}^3$).

4. The semiconductor memory device according to claim 1, wherein in case of $2^n-1=255$, the two factors are selected to be 17 and 15, and the two congruences with mod 17 and 15 are calculated in parallel.

5. The semiconductor memory device according to claim 1, the 2-degree error searching equation is represented as: $\Lambda^R(x)=(x-X_1)(x-X_2)=x^2+S_1x+X_1X_2=0$ (where, $X_1X_2=S_1^2+S_3/S_1$; and $S_1$ and $S_3$ are syndromes obtained by dividing a read data polynomial by a basic irreducible polynomial), and the 2-degree error searching equation transformed via variable transformation of: $x=S_1y$ to $y^2+y+1=A$ (where, $A=S_3/S_1^3$) and serves for index calculating.

* * * * *